(12) United States Patent
Ligtenberg et al.

(10) Patent No.: US 10,656,714 B2
(45) Date of Patent: May 19, 2020

(54) DEVICE HAVING INTEGRATED INTERFACE SYSTEM

(71) Applicant: Apple Inc., Cupertino, CA (US)

(72) Inventors: Christiaan A. Ligtenberg, San Carlos, CA (US); Brett W. Degner, Menlo Park, CA (US); Ron A. Hopkinson, Campbell, CA (US); Asif Hussain, San Jose, CA (US); Dinesh C. Mathew, San Francisco, CA (US); Mikael M. Silvanto, San Francisco, CA (US); Chang Zhang, San Jose, CA (US); Zheng Gao, Sunnyvale, CA (US); Robert Y. Cao, San Francisco, CA (US); Keith J. Hendren, San Francisco, CA (US); Bryan W. Posner, LaSelva Beach, CA (US); Simon R. Lancaster-Larocque, San Jose, CA (US); Alex J. Lehmann, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 97 days.

(21) Appl. No.: 15/939,016

(22) Filed: Mar. 28, 2018

(65) Prior Publication Data
US 2018/0217668 A1    Aug. 2, 2018

Related U.S. Application Data

(60) Provisional application No. 62/478,537, filed on Mar. 29, 2017.

(51) Int. Cl.
*G06F 3/01*    (2006.01)
*G06F 1/16*    (2006.01)
(Continued)

(52) U.S. Cl.
CPC .............. *G06F 3/016* (2013.01); *G06F 1/165* (2013.01); *G06F 1/1616* (2013.01);
(Continued)

(58) Field of Classification Search
CPC ...... G06F 3/016; G06F 3/0488; G06F 3/0416; G06F 3/0414; G06F 3/0412; G06F 3/044;
(Continued)

(56) References Cited

U.S. PATENT DOCUMENTS 4,106,839 A    8/1978   Cooper
4,989,622 A    2/1991   Kozuka et al.
(Continued)

FOREIGN PATENT DOCUMENTS

CN    202281978    6/2012
CN    203054674    7/2013
(Continued)

OTHER PUBLICATIONS

Author Unknown, "Improved Touchscreen Products," Research Disclosure, Kenneth Mason Publications, Hampshire, UK, GB, vol. 428, No. 53, Dec. 1, 1999.
(Continued)

*Primary Examiner* — Muhammad N Edun
(74) *Attorney, Agent, or Firm* — Brownstein Hyatt Farber Schreck, LLP

(57) ABSTRACT

A portable computer includes a display portion comprising a display and a base portion pivotally coupled to the display portion. The base portion may include a bottom case and a top case, formed from a dielectric material, coupled to the bottom case. The top case may include a top member defining a top surface of the base portion and a sidewall integrally formed with the top member and defining a side surface of the base portion. The portable computer may also include a sensing system including a first sensing system
(Continued)

configured to determine a location of a touch input applied to the top surface of the base portion and a second sensing system configured to determine a force of the touch input.

20 Claims, 108 Drawing Sheets

(51) Int. Cl.

| | | |
|---|---|---|
| H03K 17/96 | (2006.01) | |
| H01H 13/785 | (2006.01) | |
| H01H 13/85 | (2006.01) | |
| H01H 13/86 | (2006.01) | |
| G06F 3/0488 | (2013.01) | |
| G06F 3/0354 | (2013.01) | |
| H03K 17/94 | (2006.01) | |
| G06F 3/02 | (2006.01) | |
| G06F 3/044 | (2006.01) | |
| H03K 17/98 | (2006.01) | |
| G06F 3/041 | (2006.01) | |
| G06K 9/00 | (2006.01) | |
| H01L 41/09 | (2006.01) | |
| H01H 13/703 | (2006.01) | |
| H01H 13/705 | (2006.01) | |
| G06F 1/26 | (2006.01) | |
| H01H 3/12 | (2006.01) | |

(52) U.S. Cl.
CPC ............ *G06F 1/1662* (2013.01); *G06F 3/017* (2013.01); *G06F 3/0213* (2013.01); *G06F 3/0216* (2013.01); *G06F 3/03547* (2013.01); *G06F 3/044* (2013.01); *G06F 3/0412* (2013.01); *G06F 3/0414* (2013.01); *G06F 3/0416* (2013.01); *G06F 3/0488* (2013.01); *G06F 3/04886* (2013.01); *G06K 9/00375* (2013.01); *H01H 13/703* (2013.01); *H01H 13/705* (2013.01); *H01H 13/785* (2013.01); *H01H 13/85* (2013.01); *H01H 13/86* (2013.01); *H01L 41/09* (2013.01); *H03K 17/943* (2013.01); *H03K 17/9622* (2013.01); *H03K 17/9643* (2013.01); *H03K 17/9647* (2013.01); *H03K 17/98* (2013.01); *G06F 1/169* (2013.01); *G06F 1/266* (2013.01); *G06F 2203/04102* (2013.01); *G06F 2203/04105* (2013.01); *G06F 2203/04106* (2013.01); *H01H 3/125* (2013.01); *H01H 2201/036* (2013.01); *H01H 2215/05* (2013.01); *H01H 2215/052* (2013.01); *H01H 2219/002* (2013.01); *H01H 2219/004* (2013.01); *H01H 2219/046* (2013.01); *H01H 2219/056* (2013.01); *H01H 2223/002* (2013.01); *H03K 2217/94089* (2013.01); *H03K 2217/96003* (2013.01); *H03K 2217/9653* (2013.01)

(58) Field of Classification Search
CPC .. G06F 3/03547; G06F 3/017; G06F 3/04886; G06F 1/1616; G06F 1/169; G06F 2203/04106; G06F 2203/04105; G06F 2203/04102; G06F 1/1662; G06F 3/0213; G06F 3/0216; G06F 1/266; G06F 1/165; H01L 41/09; G06K 9/00375; G06K 13/705; H03K 17/98; H03K 17/943; H03K 17/9647; H03K 2217/9653; H03K 2217/96003; H03K 17/9643; H03K 17/9622; H03K 2215/05; H01H 2223/002; H01H 2219/056; H01H 2219/004; H01H 2219/046; H01H 2215/052; H01H 2219/002; H01H 2215/05; H01H 3/125; H01H 13/705; H01H 13/703; H01H 13/85; H01H 13/86; H01H 13/785; H01H 2201/036

See application file for complete search history.

(56) References Cited

U.S. PATENT DOCUMENTS

| | | | |
|---|---|---|---|
| 5,055,347 | A | 10/1991 | Bacon, Jr. |
| 5,512,374 | A | 4/1996 | Wallace et al. |
| 6,061,104 | A | 5/2000 | Evanicky et al. |
| 6,093,887 | A | 7/2000 | Ponto et al. |
| 6,189,938 | B1 | 2/2001 | Nakadaira et al. |
| 6,288,330 | B1 | 9/2001 | Chen |
| 6,359,768 | B1 | 3/2002 | Eversley et al. |
| 6,392,873 | B1 | 5/2002 | Honda |
| 6,473,069 | B1 | 10/2002 | Gerpheide |
| 6,483,024 | B1 | 11/2002 | Smithson et al. |
| 6,589,891 | B1 | 7/2003 | Rast |
| 6,654,256 | B2 | 11/2003 | Gough |
| 6,671,160 | B2 | 12/2003 | Hayden |
| 6,940,731 | B2 | 9/2005 | Davis et al. |
| 7,048,242 | B2 | 5/2006 | Oddsen, Jr. |
| 7,491,900 | B1 | 2/2009 | Peets et al. |
| 7,604,377 | B2 | 10/2009 | Yu et al. |
| 7,755,913 | B2 | 7/2010 | He |
| 7,829,812 | B2 | 11/2010 | Tolbert et al. |
| 7,986,525 | B2 | 7/2011 | Wang |
| 8,066,233 | B2 | 11/2011 | Fujikawa et al. |
| D660,193 | S | 5/2012 | Neuner |
| 8,195,244 | B2 | 6/2012 | Smoyer et al. |
| 8,553,907 | B2 | 10/2013 | Thomason et al. |
| 8,654,524 | B2 | 2/2014 | Pance et al. |
| 8,824,140 | B2 | 9/2014 | Prest et al. |
| 9,086,748 | B2 | 7/2015 | Nam et al. |
| 9,135,944 | B2 | 9/2015 | Jenks |
| 9,162,519 | B2 | 10/2015 | Suehiro et al. |
| 9,173,306 | B2 | 10/2015 | Lim et al. |
| 9,218,116 | B2 | 12/2015 | Benko et al. |
| 9,250,659 | B2 | 2/2016 | Tsai et al. |
| 9,429,997 | B2 | 8/2016 | Myers et al. |
| 9,804,635 | B2 | 10/2017 | Kim et al. |
| 9,826,649 | B2 | 11/2017 | Narajowski et al. |
| 9,898,903 | B2 | 2/2018 | Khoshkava et al. |
| 10,013,075 | B2 | 7/2018 | Shipman |
| 2002/0130981 | A1 | 9/2002 | Ma et al. |
| 2007/0195495 | A1 | 8/2007 | Kim et al. |
| 2009/0041984 | A1 | 2/2009 | Mayers et al. |
| 2010/0265182 | A1 | 10/2010 | Ball et al. |
| 2011/0038114 | A1* | 2/2011 | Pance .................. G06F 1/1616 361/679.4 |
| 2011/0047459 | A1 | 2/2011 | Van Der Westhuizen |
| 2011/0065479 | A1 | 3/2011 | Nader |
| 2013/0051000 | A1 | 2/2013 | Yu et al. |
| 2013/0273295 | A1 | 10/2013 | Kenney et al. |
| 2014/0368455 | A1* | 12/2014 | Croisonnier .......... G06F 3/0414 345/173 |
| 2015/0124401 | A1 | 5/2015 | Prest et al. |
| 2015/0183185 | A1 | 7/2015 | Chang |
| 2015/0185946 | A1* | 7/2015 | Fourie .................. G06F 3/0416 345/174 |
| 2016/0098107 | A1 | 4/2016 | Morrell et al. |
| 2017/0010771 | A1 | 1/2017 | Bernstein et al. |
| 2017/0168593 | A1 | 6/2017 | Kwak |
| 2018/0213660 | A1 | 7/2018 | Prest et al. |
| 2018/0217668 | A1 | 8/2018 | Ligtenberg et al. |
| 2018/0217669 | A1 | 8/2018 | Ligtenberg et al. |
| 2019/0101960 | A1 | 4/2019 | Silvanto et al. |

FOREIGN PATENT DOCUMENTS

| | | |
|---|---|---|
| CN | 107221506 | 9/2017 |
| GB | 2516439 | 1/2015 |
| JP | 2001216077 | 8/2001 |
| JP | 2007072375 | 3/2007 |

(56) References Cited

FOREIGN PATENT DOCUMENTS

| | | |
|---|---|---|
| KR | 20110049416 | 5/2011 |
| TW | 201532835 | 9/2015 |
| TW | 201701119 | 1/2017 |
| WO | WO2009/002605 | 12/2008 |
| WO | WO2009/049331 | 4/2009 |
| WO | WO2009/129123 | 10/2009 |
| WO | WO2012/129247 | 9/2012 |
| WO | WO2014/037945 | 3/2014 |
| WO | WO2015/153701 | 10/2015 |
| WO | WO2016/053901 | 4/2016 |

OTHER PUBLICATIONS

Kim et al., "Ultrathin Cross-Linked Perfluoropolyether Film Coatings from Liquid $CO_2$ and Subsequent UV Curing," Chem. Matter, vol. 22, pp. 2411-2413, 2010.
International Search Report and Written Opinion, PCT/US2018/024870, 16 pages, dated Sep. 19, 2018.

\* cited by examiner

DEVICE HAVING INTEGRATED INTERFACE SYSTEM

CROSS-REFERENCE TO RELATED APPLICATION(S)

This application is a nonprovisional patent application of and claims the benefit of U.S. Provisional Patent Application No. 62/478,537, filed Mar. 29, 2017, and titled "Device Having Integrated Interface System," the disclosure of which is hereby incorporated by reference herein in its entirety.

FIELD

The described embodiments relate generally to electronic devices, and more particularly to an electronic device having a transparent, dielectric input surface integrated with the enclosure of the device.

BACKGROUND

Many electronic devices include one or more input devices such as keyboards, trackpads, mice, or touchscreens to enable a user to interact with the device. In some traditional electronic devices, the inclusion of one or more of the input devices may require the formation of a hole, opening, or seam through which liquid or other foreign matter may enter the device enclosure. Additionally, the enclosure of some traditional electronic devices may be formed from materials that are easily scratched or that provide an inferior tactile feel or visual appearance.

The embodiments described herein are generally directed to electronic devices having an enclosure formed at least partially from a transparent, dielectric material such as plastic, glass, or a ceramic material. The transparent dielectric material may form a continuous or seamless input surface that may improve the look and feel of the device without having the drawbacks of some traditional device constructions.

SUMMARY

A portable computer may include a display portion including a display and a base portion pivotally coupled to the display portion. The base portion may include a bottom case and a top case that is formed from a dielectric material and coupled to the bottom case. The top case may include a top member defining a top surface of the base portion and a sidewall integrally formed with the top member and defining a side surface of the base portion. The portable computer may further include a sensing system including a first sensing system configured to determine a location of a touch input applied to the top surface of the base portion, and a second sensing system configured to determine a force of the touch input. The top case may be formed from a transparent material.

The top case may be formed from a single glass member. The sidewall may be a first sidewall, the side surface may be a first side surface, and the top case may further include a second sidewall integrally formed with the first sidewall and the top member and defining a second side surface of the base portion, and a third sidewall integrally formed with the first sidewall, the second sidewall, and the top member and defining a third side surface of the base portion.

The first sensing system may be positioned below the top member and may extend over an entire area of the top member, and the second sensing system may be positioned below the top member and may extend over the entire area of the top member. The top member may define an opening, and the portable computer may further include a keyboard positioned in the opening.

The display may be a first display, and the portable computer may further include a second display within the base portion and viewable through the top case. The second display may be configured to display an image of a keyboard in a keyboard region of the top case. The image of the keyboard may include an image of a key, and the second sensing system may be configured to register a key input in response to detecting an input applied to the key and having a force exceeding a force threshold.

A device may include a display portion that includes a display housing, and a display within the display housing. The device may further include a base portion coupled to the display portion and including a bottom case and a glass top case coupled to the bottom case and defining a top exterior surface of the base portion. The device may further include a sensing system configured to determine a location of a touch input applied to any location on the top exterior surface of the base portion and to determine a force of the touch input applied to any location on the top exterior surface of the base portion. The sensing system may include a touch sensing system configured to determine the location of the touch input and a force sensing system configured to determine the force of the touch input and to determine the location of the touch input. The top case may be configured to locally deform in response to the touch input, and the device may be configured to register an input at the location of the touch input if the determined force exceeds a threshold force.

The device may further include a haptic device configured to produce a haptic output at the top case in response to registering the input at the location of the touch input. The haptic output may produce a localized haptic output such that a magnitude of the haptic output at the location is greater than the magnitude of the haptic output at a different location adjacent to the location. The haptic device may include a piezoelectric material coupled to the top case.

The top case may define an opening, and the device may further include a keyboard positioned at least partially in the opening. The bottom case may define a bottom member, a first sidewall integrally formed with the bottom member, a second sidewall integrally formed with the bottom member, and a third sidewall integrally formed with the bottom member. The top case may be attached to the bottom case via the first, second, and third sidewalls.

A notebook computer may include a display portion that includes a display, and a base portion flexibly coupled to the display portion and including a bottom case and a glass top case coupled to the bottom case and defining substantially an entire top surface of the base portion. The notebook computer may further include a touch sensing system configured to determine a location of a touch event applied to the top case, and a force sensing system configured to cause the notebook computer to register an input in response to a force associated with the touch event exceeding a threshold.

The glass top case may define a keyboard region and a trackpad region, and the notebook computer may be configured to register the input as a key input if the location of the touch event is within the keyboard region. The force sensing system may be configured to determine if a palm of a user is resting on the trackpad region. In response to the force sensing system determining that the palm of the user is not resting on the trackpad region, the notebook computer may set the threshold to a first threshold, and in response to the force sensing system determining that the palm of the user is resting on the trackpad region, the notebook computer may set the threshold to a second threshold different from the first threshold. The notebook computer may be configured to register the input as a trackpad input if the location of the touch event is within the trackpad region. The notebook computer may be configured to take a first action in response to registering the input as the key input and to take a second action different from the first action in response to registering the input as a trackpad input.

The notebook computer may further include a haptic device configured to produce a haptic output at the glass top case in response to registering the input as the trackpad input or the key input.

A device may include a display portion that includes a display housing, a display within the display housing, a base portion flexibly coupled to the display portion and including a glass member defining a keyboard region configured to receive user input, a first haptic actuator configured to produce a first haptic output at a first area of the keyboard region, and a second haptic actuator configured to produce a second haptic output at a second area of the keyboard region that is different from the first area. The device may further include a keyboard region having keys. The first area may correspond to a first key of the keyboard region, and the second area may correspond to a second key of the keyboard region.

The device may further include a touch sensing system configured to determine whether a touch input is applied to the first key, and the first haptic actuator may produce the first haptic output in response to determining that the touch input is applied to the first key.

The device may further include a force sensing system configured to determine a force associated with a touch input applied to the first key, and the first haptic actuator may produce the first haptic output in response to determining that the force exceeds a force threshold. The force threshold may correspond to a force associated with a typing input on the first key.

The glass member may further define a trackpad region, and the device may further include a third haptic actuator configured to produce a third haptic output at any location in the trackpad region. The keyboard region may correspond to a planar surface of the glass member, the first and second haptic actuators may be configured to impart an out-of-plane force to the glass member, and the third haptic actuator may be configured to impart an in-plane force to the glass member.

A notebook computer may include a display portion that includes a display and a base portion pivotally coupled to the display portion and including a bottom case and a glass top case coupled to the bottom case. The glass top case may define a keyboard region and a trackpad region adjacent the keyboard region. The notebook computer may further include a force sensing system configured to detect inputs applied to the glass top case within the keyboard region and the trackpad region, a first haptic actuator configured to produce a first haptic output in response to the force sensing system detecting a first input within the keyboard region, and a second haptic actuator configured to produce a second haptic output different from the first haptic output in response to the force sensing system detecting a second input within the trackpad region.

The first haptic output may include a localized deflection of the glass top case within the keyboard region, and the second haptic output may include a force applied to the glass top case in a direction that is in-plane with a surface of the trackpad region.

The first haptic actuator may include a piezoelectric actuator, and the second haptic actuator may include a mass and an electromagnetic actuator configured to move the mass to produce the second haptic output.

The glass top case may define a planar surface, and the keyboard region and the trackpad region may be defined on the planar surface. The glass top case may define all of a top surface of the base portion.

The keyboard region may include a plurality of keys defined by a mask layer below the glass top case.

The display may be a first display, the notebook computer may further include a second display in the base portion and visible through the glass top case, and the second display may display images of keys within the keyboard region. The second display may display a border around at least a portion of the trackpad region.

A portable computer may include a display housing, a display positioned at least partially in the display housing, and a base portion coupled to and configured to rotate relative to the display housing. The base portion may include a metal member defining a bottom surface of the base portion and a glass member defining a top surface of the base portion. The portable computer may also include a first haptic actuator configured to produce a first type of haptic output in response to a first type of input detected on the glass member, and a second haptic actuator configured to produce a second type of haptic output, different from the first type of haptic output, in response to a second type of input detected on the glass member. The glass member may define a first touch sensitive region and a second touch sensitive region adjacent the first touch sensitive region. The first type of input may correspond to an input detected within the first touch sensitive region, and the second type of input may correspond to an input detected within the second touch sensitive region. The top surface may be an entire top surface of the base portion.

The first haptic actuator may be configured to locally deform the glass member, and the second haptic actuator may be configured to move at least a portion of the glass member along a direction that is parallel to a plane defined by the top surface of the base portion. The first haptic actuator may be a piezoelectric actuator that is configured to locally deform a region of the glass member corresponding to a single key.

A portable computer may include a display portion that includes a display and a base portion pivotally coupled to the display portion and including a glass top case defining an exterior surface and a keyboard opening through the glass top case from the exterior surface to an interior surface. The portable computer may further include a keyboard positioned at least partially within the keyboard opening and including a substrate, a key configured to move relative to the substrate, and a fabric cover disposed over the key and defining a user interface surface of the key. The portable computer may further include a touch sensing system below the glass top case and configured to detect touch inputs applied to the user interface surface of the key. The portable computer may further include a force sensing system configured to determine a force associated with the touch input.

The keyboard may further include a key web defining a key opening and a plurality of additional key openings, and the key may be positioned at least partially in the key opening. The keyboard may further include a plurality of additional keys, each positioned at least partially in a corresponding key opening. The fabric cover may be disposed over the key web and the plurality of additional keys, and the fabric cover may define a keyboard region covering the key and the plurality of additional keys, and an outer region framing the keyboard region.

The outer region may be captured between the glass top case and an underlying component. At least a portion of the fabric cover is adhered to the key.

The glass top case may further define a trackpad region. The keyboard opening may be a rectangular opening, and the trackpad region may include a first portion of the glass top case along a first side of the keyboard opening, a second portion of the glass top case along a second side of the keyboard opening, and a third portion of the glass top case along a third side of the keyboard opening. The portable computer may further include a touch sensing system configured to detect a touch input applied to any of the first portion, the second portion, and the third portion of the glass top case. The glass top case may define a top of the base portion, and at least three sidewalls of the base portion.

A notebook computer may include a display portion that includes a display housing and a display within the display housing. The notebook computer may further include a base portion coupled to the display portion and including a bottom case and a glass top case coupled to the bottom case and defining an opening extending through the glass top case. The notebook computer may further include a touch sensing system below the glass top case and configured to detect a touch input applied to any location on the glass top case, and a keyboard positioned at least partially in the opening. The keyboard may include a plurality of key mechanisms and a fabric cover extending across a gap between two of the key mechanisms. The glass top case may define a surface that extends continuously around the opening.

The plurality of key mechanisms may each include a keycap support and a keycap, and at least a portion of the fabric cover may be disposed between the keycap support and the keycap. The portion of the fabric cover disposed between the keycap support and the keycap may be adhered to the keycap support, and the keycap may be adhered to the fabric cover above the keycap support.

The notebook computer may further include an additional display positioned under at least a portion of the glass top case. The additional display may be configured to display affordances that are selectable by a user touching the glass top case.

The notebook computer may further include a force sensing system configured to determine an amount of force associated with the touch input detected on the glass top case.

A device may include a display portion that includes a display, and a base portion flexibly coupled to the display portion and including a keyboard including keys and having a flexible sheet covering a gap between adjacent keys. The device may further include a continuous glass frame extending around a periphery of the keyboard and defining a first touch-sensitive input region adjacent a first side of the keyboard, and a second touch-sensitive input region adjacent a second side of the keyboard. The device may further include a touch sensing system configured to determine a location of touch inputs applied to the first and second touch-sensitive input regions.

The keyboard may define a first portion of a top of the base portion, and the continuous glass frame defines all remaining portions of the top of the base portion. At least a portion of the flexible sheet may be captive between keycap supports and respective keycaps that are coupled to respective keycap supports. A key of the keys may include an input surface defined exclusively by the flexible sheet.

The display may be a first display, and the device may further include a second display configured to display an affordance on the first touch-sensitive input region. The affordance may be displayed based on content that is displayed on the first display.

BRIEF DESCRIPTION OF THE DRAWINGS

The disclosure will be readily understood by the following detailed description in conjunction with the accompanying drawings, wherein like reference numerals designate like structural elements, and in which:

FIGS. 13M-13O depict portions of example base plates of the base portion of FIG. 13L.

DETAILED DESCRIPTION

Figure 1A:
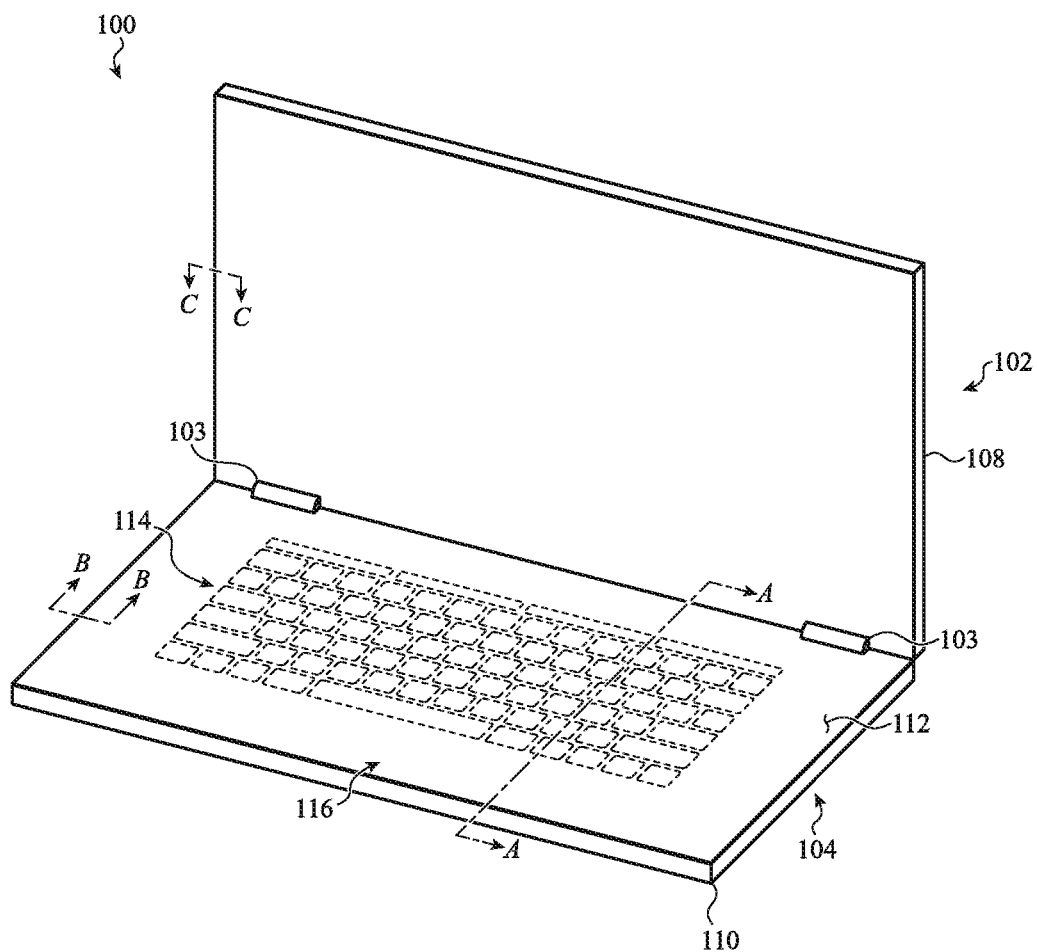
FIG. 1A depicts a simplified example of a computing device.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The embodiments described herein are generally directed to a portable electronic device (e.g., portable computer, notebook computer, laptop computer, etc.) having an upper portion of the enclosure formed from a dielectric material, such as plastic, ceramic, glass, composites, or combinations thereof. The component formed from the dielectric material may define part of an internal volume of the enclosure for housing various components of the portable device, and may also define an input surface of an integrated interface system that allows a wide variety of touch and keyboard inputs. In particular, the integrated interface system may serve as a trackpad, a keyboard, or may provide both trackpad and keyboard functionalities, and the dielectric component may define all or part of the keyboard and trackpad regions.

In some embodiments described herein, the integrated interface system may be integrated with multiple sensors, including touch and force sensors, that can detect various types of inputs applied to various regions of an input surface. In some instances, the touch and/or force sensors are formed into a unified structure that is configured to detect touch inputs applied to a non-keyboard region as well as key inputs applied to a keyboard region (which may include mechanical and/or virtual keys). In accordance with embodiments described herein, the integrated interface system may also be used to detect gestures and multi-touch inputs applied to keycaps of a mechanical keyboard, allowing the keycaps and keyboard region to function as a trackpad.

The integrated interface system may also provide various types of output functionality, including visual outputs, haptic outputs, and the like. For example, images of affordances (e.g., keys, keyboards, buttons, sliders, dials, etc.) may be displayed on the top case (e.g., with a display device) to indicate where a touch or force input may be provided. As another example, the top case of the integrated interface system may be configured to move or oscillate to provide tactile or haptic outputs in response to the detection of touch or force inputs. The integrated interface system may thus provide comprehensive input and output functionality via an integrated input/output surface.

As noted above, a component that defines the input surface of the integrated interface system may be formed from a continuous and/or seamless sheet of a dielectric material, such as glass, plastic, or ceramic (e.g., it may be a single glass member). The sheet may have properties that enable the diverse input and output functions described herein. For example, the sheet may be strong and may have a high resistance to scratching, and may provide a surface finish having a superior appearance and/or tactile feel as compared with other materials or components. The sheet may also be a dielectric and/or substantially nonconductive, allowing touch and force inputs to be detected through the sheet, and allowing electromagnetic waves and/or fields (e.g., radio frequency signals, inductive power, inductive signals, and other wireless communications or electromagnetic energy transfer) to pass through without substantial attenuation. The sheet may be continuous or seamless, which may help prevent the ingress of liquid or other foreign debris. The sheet may also be light transmissive to allow images or light to be visible therethrough. As used herein, light transmissive may be used to refer to something that is transparent or translucent, or otherwise allows light to propagate therethrough. In some cases, transparent materials or components may introduce some diffusion, lensing effects, distortions, or the like (e.g., due to surface textures) while still allowing objects or images to be seen through the materials or components, and such deviations are understood to be within the scope of the meaning of transparent. Also, materials that are transparent may be coated, painted, or otherwise treated to produce a non-transparent (e.g., opaque) component; in such cases the material may still be referred to as transparent, even though the material may be part of an opaque component. Translucent components may be formed by producing a textured or frosted surface on an otherwise transparent material (e.g., clear glass). Translucent materials may also be used, such as translucent polymers, translucent ceramics, or the like.

FIG. 1A depicts a computing device 100 (or simply "device 100") that may include an integrated interface system, as described above. In particular, a base portion 104 of the device 100 may include a top case 112 that defines a portion of an enclosure and also forms or is part of the integrated interface system described herein.

The device 100 may be or may resemble a portable computer, also known as a notebook or laptop computer, that has a display portion 102 and a base portion 104 flexibly or pivotally coupled to the display portion 102 (e.g., so that the display portion 102 is able to rotate, pivot, flex, articular, or otherwise move relative to the base portion 104). The display portion 102 includes a display, also referred to as a primary display, that provides a primary means of conveying visual information to the user, such as by displaying graphical user interfaces. The base portion 104 is configured to receive various types of user inputs, such as keyboard inputs (e.g., typing), touch inputs (e.g., gestures, multi-touch inputs, swipes, taps, etc.), and the like. The base portion 104 may also provide outputs for conveying information to a user, such as with indicator lights, haptic output devices, displays mounted in the base portion 104, or the like. In some cases, providing various types of input and output via the base portion 104 is facilitated or enabled by using a continuous top surface on the base portion 104, as described herein.

The display portion 102 and the base portion 104 may be coupled to one another such that they can be positioned in an open position and a closed position. In the open position, a user may be able to provide inputs to the device 100 via the base portion 104 while simultaneously viewing information on the display portion 102. In the closed position, the display portion 102 and the base portion 104 are collapsed against one another. More particularly, the display portion 102 and the base portion 104 may be hinged together (e.g., via a pivot mechanism or hinge 103) to form a clamshell device that can be moved between an open and a closed configuration.

Information and/or data may be transferred between the display portion 102 and the base portion 104. For example, display data, such as data or signals that cause the display portion 102 to display images, user interfaces, application data, or the like, may be sent to the display portion 102 from the base portion 104. Similarly, input data may be sent from the display portion 102 to the base portion 104. Input data may include data relating to touch inputs applied to a touchscreen within the display portion 102, sensor data (e.g., from sensors in the display portion 102, such as light sensors, accelerometers, etc.), camera data (e.g., from a camera in the display portion 102), or the like. The device 100 may include any appropriate communication system for transferring data between the display portion 102 and the base portion 104, such as wired or wireless communications systems. Wireless communications systems may include a first transmitter/receiver in the display portion 102, and a second transmitter/receiver in the base portion 104 that communicates with the first transmitter/receiver. The first and second transmitter/receiver may communicate in any suitable way and use any suitable wireless frequency or frequencies (e.g., 2.4 GHz, 60 GHz), communication protocol(s), etc. The first and second transmitter/receiver may also communicate via an optical communication link.

Power may also be transferred between the base portion 104 and the display portion 102. For example, either or both of the base portion 104 and the display portion 102 may include batteries or other power sources. Power can be sent from one portion to another portion as needed based on the power demands and power supplies of each portion. For example, the base portion 104 and the display portion 102 may include batteries as well as components that require power. Power may be distributed from any battery to any circuit or component that requires power, regardless of the location of the battery or the circuit or component. Power may be transferred between the base portion 104 and the display potion 102 using any suitable components and techniques. For example, a wired or physical power connection may couple the display portion 102 to the base portion 104. As another example, power may be transferred wirelessly, such as via inductive or capacitive power transfer systems.

As noted above, the base portion 104 may include a top case 112. The top case 112 may define or be part of an integrated interface system of the device 100. For example, the top case 112 may define a top, exterior surface of the base portion 104, and may be configured to receive touch inputs, force inputs, keyboard inputs, and the like. In some cases, the entire top surface of the top case 112 (or substantially all of the top surface) may be touch and/or force sensitive, and may detect touch inputs substantially anywhere along its top surface, including in a keyboard region as well as surrounding regions. In cases where the entire top case 112 is touch and force sensitive, numerous types of inputs are enabled via the top case 112. For example, as described herein, touch inputs including cursor-control gestures may be applied anywhere on the top case, including on the keys of a virtual or mechanical keyboard. As another example, the addition of force sensing across a keyboard region as well as non-keyboard regions may facilitate the detection of typing inputs when multiple fingers are resting on a virtual keyboard, as the force sensing systems may allow the device to differentiate between a finger resting on a key versus a finger actually tapping or pressing on a key.

In addition to receiving or detecting inputs, the top case 112 may be configured to provide outputs to a user. For example, the top case 112 may include or be integrated with displays, light sources, haptic actuators, or the like, that provide outputs that are detectable via the top case 112 (e.g., at any location or substantially any location along a top surface of the top case 112). More particularly, a display may be configured to produce an image on the top case 112, and a haptic actuator may be configured to move the top case 112 in a manner that is detectable by a user in contact with the top case 112. The composition and configuration of the top case 112 may facilitate and integrate these (and other) input and output functions. For example, a continuous, nonconductive top case 112 (e.g., formed from a dielectric such as glass, plastic, ceramic, composites, or combinations of materials) may allow inputs to be detected through the top case 112 while also providing an effective platform for haptic and visual outputs.

The top case 112 may define or include input regions such as a keyboard region 114 and a touch-input region 116. The keyboard region 114 may correspond to or include a virtual keyboard or a mechanical keyboard. Virtual keyboards are discussed herein with respect to FIGS. 16A-17B, and mechanical keyboards are discussed herein with respect to FIGS. 12A-15B and 33A-43C.

The top case 112 may define a continuous top surface of the base portion 104, which may be the top exterior surface of the base portion 104. A continuous top surface (and a continuous top case more generally) may refer to a surface or member that has no seams, openings, through-holes, or other discontinuities. In the context of the top case 112, a continuous top case or continuous top surface may therefore lack seams, openings, through-holes, or other discontinuities in the portion of the top case 112 that forms an exterior top surface of the base portion 104. More particularly, the top case 112 may lack openings for keys, keyboards, trackpads, buttons, or the like. The top case 112 may extend substantially to the outer edges of the base portion 104. Accordingly, the top case 112 may prevent or reduce the possibility of liquid, dust, dirt, or other contaminants or debris from entering the base portion 104 through the top surface of the top case 112. Also, the continuous surface provides a desirable aesthetic and a touch sensitive, haptic, and visual output surface that can utilize the entire exposed top surface of the top case 112.

The top case 112 may be formed from or include a light-transmissive material, such as glass, plastic, or light-transmissive ceramics. In some cases, the top case 112 is a single member, such as a single glass member, a single plastic member, or a single member formed from or including any other suitable material. In other cases, the top case 112 may be formed from multiple members, either of the same material or different materials, that are bonded, adhered, joined, or otherwise coupled together to define the top case 112.

In some cases, all or some of the top case 112 may be masked to form opaque regions. The masking may be formed using any suitable technique such as depositing an ink, dye, film, or otherwise positioning an opaque material below the top case 112 (and above any other components or layers that are intended to remain hidden or occluded). The masking or other opaque material or layer may be any desired color. Indeed, because the top case 112 may be light-transmissive (e.g., transparent), there may be fewer limitations on the achievable colors than with conventional devices. For example, certain colors, finishes, or other optical treatments may be difficult or impossible to achieve in an uncoated opaque plastic material. By using a light-transmissive or transparent top case 112, it may be possible to achieve devices having many more available colors and/or finishes (e.g., mirror finishes, metal flake finishes, etc.). In some cases, images, photographs, paintings, or other graphic content may be visible through the light-transmissive top case 112.

The touch-input region 116 may be configured to detect touch- and/or force-based inputs, and may be or may include any portion of the top case 112, including substantially the entire top case 112, including the keyboard region 114, a trackpad region (e.g., the trackpad region 2003, FIG. 20A), a virtual key region (e.g., the virtual key region 1208, FIG. 12A), optional sidewalls of the top case (e.g., the sidewall 512a-c, FIGS. 5A-5C), or any other portion of the top case 112. In some cases, substantially the entire top case 112, from edge to edge, may define a touch-sensitive input region. In this way, and as discussed herein, touch or trackpad inputs, such as clicks, taps, gestures (e.g., swiping, pinching), and multi-touch inputs, may be detected on any portion of the top case 112, including within the keyboard region 114. Moreover, even where the keyboard region 114 includes mechanical key mechanisms, the touch-input region 116 may detect touch inputs (e.g., gestures) that are applied to the keycaps and not to the top case 112 directly. As used herein, a "key" may refer to a mechanical key, a virtual key (e.g., a key displayed by an underlying display), a key region (e.g., defined by a mask layer on a top case), or any other suitable type of key described herein, as well as any associated mechanisms, keycaps, or support structures.

The device 100, and in particular the top case 112, may also include or define output regions, such as visual-output regions and haptic-output regions. Haptic-output regions include regions of the top case 112 that move or can otherwise induce tactile sensations in a user. Visual-output regions include regions in which visual outputs are produced, such as regions associated with lights or displays (e.g., to display virtual and/or dynamic keys). Example visual- and haptic-output regions, as well as components for producing visual and haptic outputs, are described herein.

Thus, the device 100 may include a top case that defines an integrated interface system, which provides various input and output functions, including keyboard inputs, touch inputs, visual outputs, and haptic outputs.

Figure 1B:
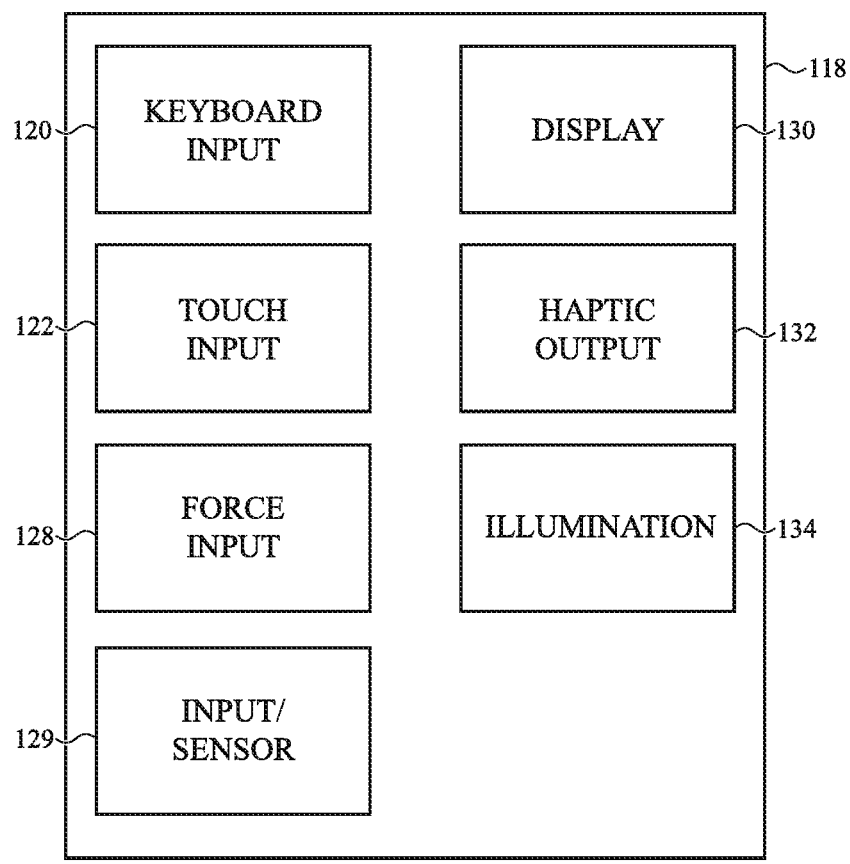
FIG. 1B depicts a simplified function block diagram of the computing device of FIG. 1A.

FIG. 1B is a simplified block diagram showing functional aspects of an example integrated interface system 118. The functions of the integrated interface system 118 may be performed by any of the components and structures described herein, including touch sensors, force sensors, haptic actuators, displays, mechanical keys, light sources, and the like, examples of which are described herein.

With reference to FIG. 1B, the integrated interface system 118 provides a keyboard input function 120. The keyboard input function 120 includes the detection of key-based or similar inputs, including inputs that are typically provided via a keyboard (e.g., alphanumeric and/or symbolic character input, function key selections, arrow key selections). A device (e.g., the device 100) may use any suitable input mechanism(s) to perform the keyboard input function 120, such as mechanical keys, touch sensors, force sensors, displays, or the like. Where the device includes mechanical keys or key mechanisms, the keyboard input function 120 includes the detection of physical movement of the key mechanisms. Where the device includes virtual keys, the keyboard input function 120 may include the detection of touch or force inputs on the virtual keys. In either case, the keyboard input function 120 may detect keyboard inputs through an input surface (such as the top case 112 in FIG. 1A).

The integrated interface system 118 also provides a touch input function 122. The touch input function 122 includes the detection of touch-based inputs, such as clicks, taps, gestures (e.g., swiping, pinching), multi-touch inputs, or the like. These inputs may be similar to or include inputs conventionally detected by a trackpad. For example, these inputs may include gesture inputs that may be used to control a cursor or element of a graphical user interface on a display of the device. A device (e.g., the device 100) may use any suitable input mechanism(s), such as capacitive touch sensors, resistive touch sensors, acoustic wave sensors, or the like, to perform the touch input function 122. Such mechanisms may be associated with or cover substantially the entire user-facing portion of the top case 112. In this way, the touch input function 122 can detect touch inputs applied anywhere on the top case 112 (including, for example, on a mechanical or virtual keyboard, on a trackpad region below a mechanical or virtual keyboard, and/or on the portions of the top case that are adjacent the lateral sides of a mechanical or virtual keyboard).

The touch input function 122 may include the detection of touch inputs that are received in a keyboard region of the top case 112 (e.g., the keyboard region 114, FIG. 1A). The keyboard region may correspond to a keyless surface of a virtual keyboard, or it may correspond to a region of the top case 112 that includes mechanical keys, as described above. In either case, the touch input function 122 may include the detection of touch inputs, such as clicks, taps, gestures (e.g., swiping, pinching), and multi-touch inputs, that are applied to the keyboard region. Where mechanical keys or key mechanisms are used, the touch input function 122 may include the detection of touch inputs through the mechanical keys or mechanisms.

The touch input function 122 may also include the detection of touch inputs that are applied to a non-key region of the top case 112. For example, any region of the top case 112 that does not correspond to a keyboard region (a non-keyboard region) may be configured to receive touch inputs, and the device may detect touch inputs in these regions as well.

The integrated interface system 118 also provides a force input function 128 that includes the detection of force inputs and/or a force component of a touch input. A device (e.g., the device 100) may use any suitable force sensors to provide the force input function 128, such as the force sensors described herein with respect to FIGS. 21A-24B. The force input function 128 may include the detection of force inputs at any location on the top case 112. For example, substantially the entire top surface of the top case 112 may be configured to receive and/or detect force inputs applied to substantially any location of the top surface of the top case 112. Further, where the top case 112 includes a dielectric surface or is formed from a dielectric sheet (e.g., glass, plastic, ceramic, or the like), the dielectric and/or mechanical properties (or other properties) of the dielectric material may facilitate the detection of force inputs at any suitable location on the top case (e.g., in a keyboard region 114, a non-keyboard region, or any other suitable location).

The integrated interface system 118 also provides a display function 130 that includes the output of images or other visual information via the top case 112. For example, a device (e.g., the device 100) may include or communicate with displays that are within the device 100 and that produce images viewable on the top case 112, thereby providing the display function 130. Displays may be used, for example, to produce images of keys (or other affordances) for the keyboard region 114. Displays may also be used to define input regions, buttons, or other affordances anywhere on the top case 112 (e.g., to indicate the location and/or function of an input), or to display other graphical objects (e.g., images, videos, text, user interfaces, or the like). Because the top case 112 may be formed from a glass or other transparent material, displays may be integrated with the top case 112 such that the top case 112 acts as a screen, even on surfaces that in conventional computing devices are opaque, such as a trackpad or a portion bordering a keyboard.

The integrated interface system 118 also provides a haptic output function 132 that includes the production of haptic or tactile outputs at the top case 112. A device (e.g., the device 100) may use haptic actuators, such as those discussed herein with reference to FIGS. 25-30B, to perform the haptic output function 132. The haptic actuators may be coupled to the top case 112 or otherwise cause the top case 112 to physically move to produce haptic outputs at the top case 112. Haptic outputs may be used for various purposes, such as to indicate that a touch input (e.g., a key selection or a trackpad selection) has been detected by the device 100.

The integrated interface system 118 also provides an illumination function 134 that includes the illumination of regions or elements of the top case 112. A device (e.g., the device 100) may use light sources, such as those discussed herein with reference to FIGS. 37A-40B, to provide the illumination function. For example, a glass, plastic, or otherwise light-transmissive top case (e.g., the top case 112) may act as a light guide. For example, a glass or light-transmissive (e.g., transparent or translucent) top case 112 may act as a light guide to direct light from a light source to other regions of the device 100, such as under or around keycaps or other key mechanisms. Also, where the top case 112 is entirely transparent or has transparent portions, the transparent portions allow images from underlying displays to pass through the top case 112, which would not be possible with opaque top cases. The illumination function 134 may also provide backlighting or other illumination for the displays.

The integrated interface system 118 also provides one or more additional input and/or sensor functions 129. A device (e.g., the device 100) may use any suitable components to receive inputs (e.g., from a user or another computer, device, system, network, etc.) or to detect any suitable property or parameter of the device, the environment surrounding the device, people or things interacting with the device (or nearby the device), or the like. For example, a device may include accelerometers, temperature sensors, position/orientation sensors, biometric sensors (e.g., fingerprint sensors, photoplethysmographs, blood-oxygen sensors, blood sugar sensors, or the like), eye-tracking sensors, retinal scanners, humidity sensors, buttons, switches, lid-closure sensors, or the like. Such sensors and/or input devices may be located in any suitable portion of or location in the device. For example, sensors and/or input devices maybe located in the display portion 102 or the base portion 104 (or it may include components in both the display portion 102 and the base portion 104). An input and/or sensor function 129 may use network and/or communications systems to provide input and/or sensing functionality, such as to receive commands, data, information, content (e.g., audio, video, images, webpages), or the like, from other devices or systems.

Figure 2A:
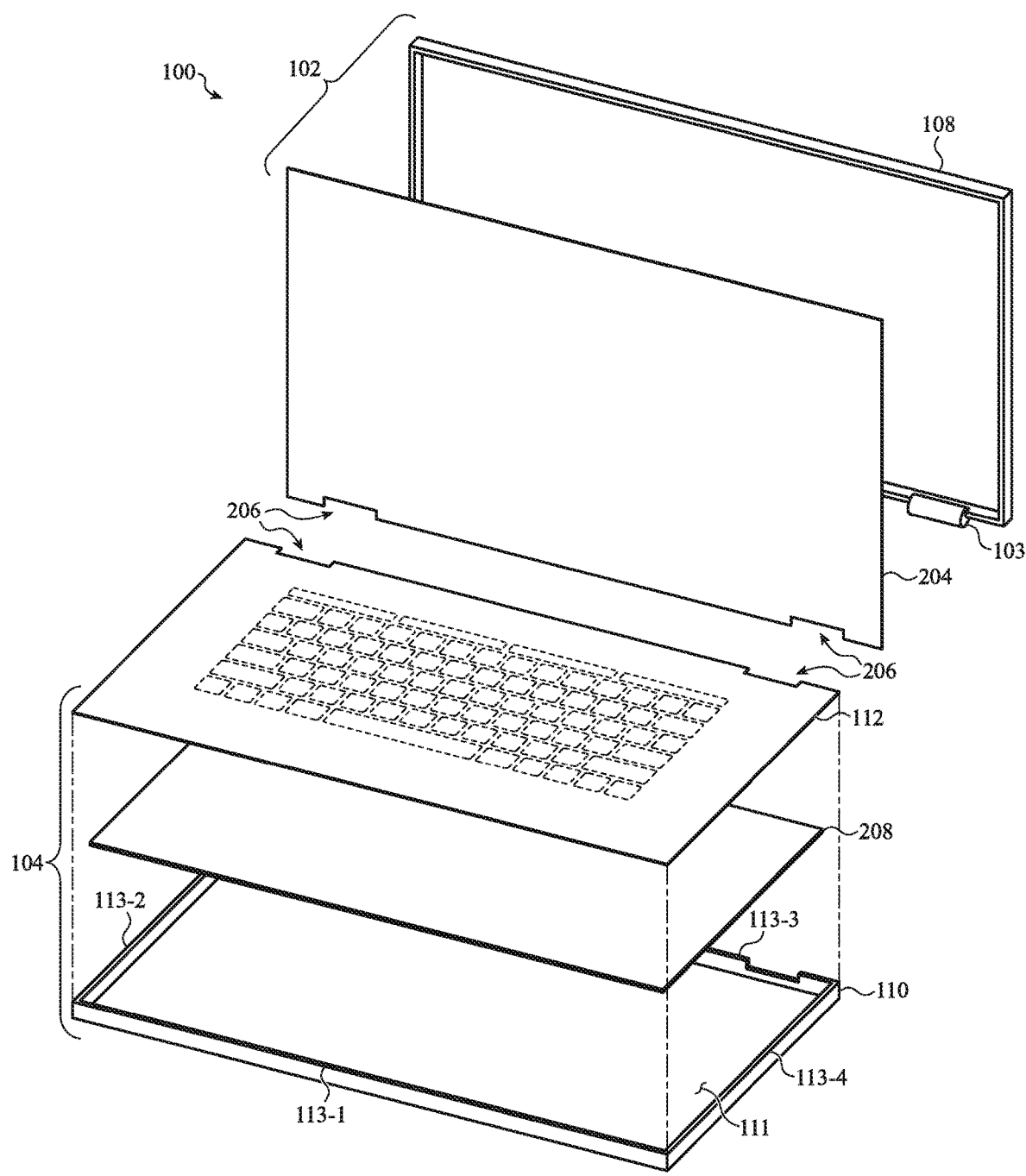
FIG. 2A depicts an exploded view of the computing device of FIG. 1A.

FIG. 2A is a partial exploded view of the device 100. As described above, the device 100 includes a top case 112 that forms part of the enclosure defining the base portion 104, and also defines a top exterior surface of the base portion 104, which may also act as an input surface of an integrated interface system for receiving user input. As shown in FIG. 2A, the base portion 104 is pivotally coupled to a display portion 102 to form a foldable or clam-shell type notebook computer.

As shown in FIG. 2A, the display portion 102 includes a display 204 coupled to the display housing 108. The display 204 may include various display components, such as liquid crystal display (LCD) components, light source(s) (e.g., light emitting diodes (LEDs), organic LEDs (OLEDs)), filter layers, polarizers, light diffusers, covers (e.g., glass or plastic cover sheets), and the like. More particularly, in some cases, the display 204 includes a display stack (including, for example, an LCD, polarizing films, light diffusing films, and/or a back or side light) and a cover disposed over the display stack and forming an exterior, user-facing surface of the display 204. In other cases, the display 204 includes a display stack as described above, but does not include a separate cover. In such cases, a side or surface of the LCD panel of the display stack may form the exterior, user-facing surface of the display 204. The display portion 102 may also include other components such as structural components that support any of the aforementioned components, batteries, wired or wireless communication components, processors, memory, or the like.

The display portion 102 may include mechanisms 103, or portions thereof, coupled to or integrally formed with the display portion 102. For example, the display housing 108 may include hinges (or portions thereof) welded, brazed, adhered, or otherwise attached to the display housing 108. The display 204 and the top case 112 may include features 206 (such as the notches shown in FIG. 2A) to allow for the placement of the mechanisms 103 while allowing the display 204 and the top case 112 to define substantially the entire user interface surfaces of the display portion 102 and the base portion 104.

The base portion 104 may include a bottom case 110 and the top case 112, described above, which together define an interior volume of the base portion 104. The base portion 104 may also include components 208 within the interior volume, such as processors, memory devices, circuit boards, input/output devices, haptic actuators, wired and/or wireless communication devices, communication ports, disk drives, and the like. As described above, the top case 112 may be a continuous surface (e.g., having no holes or openings in its top surface) to prevent or limit ingress of liquid, debris, or other contaminants into the interior volume, thereby reducing the chance of damage to the components 208.

The bottom case 110 may include a bottom member 111 and one or more sidewalls 113-1 through 113-4. In some cases, the bottom case 110 has one, two, three, or four sidewalls. Where the bottom case has three sidewalls, the sidewall 113-3 may be omitted. Where the bottom case has two sidewalls, the sidewalls 113-2, 113-4 may be omitted. Where the bottom case has one sidewall, the sole sidewall may be the sidewall 113-1. Of course, other configurations of sidewalls are also possible.

The bottom case 110 may be formed from or include any suitable material. For example, the bottom case 110 may be formed from or include metal (e.g., steel, aluminum, titanium), glass, plastic, ceramic, composite, or any other suitable other material or combination of these or other materials. In some cases, the bottom case 110 is a single (e.g., monolithic) component or member, such as a single sheet of glass, metal, plastic, or the like. For example, the bottom case 110 may be a single component formed from a single piece of metal, and may be formed by stamping, drawing, machining, hydroforming, molding, or any other suitable process. Where the bottom case 110 is a single component, the bottom member 111 and the sidewall(s) 113 may be an integral structure (e.g., a monolithic component).

The top case 112 may be coupled to the bottom case 110 in any suitable way. Various examples of the coupling between the top case 112 and the bottom case 110, as well as various configurations and shapes of the top and bottom cases 112, 110 are described herein. Similarly, example configurations of the display 204 and the display housing 108 (and techniques for joining them) are described herein.

Figure 2B:
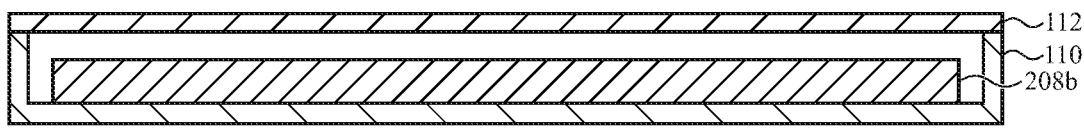
FIGS. 2B-2F depict partial cross-sectional views of a portion of the computing device of FIG. 1A, viewed along section A-A in FIG. 1A.

FIGS. 2B-2F are cross-sectional views of the base portion 104, viewed along section A-A in FIG. 1A, illustrating example placements of the components 208 within the base portion 104. As shown in FIG. 2B, components 208*b* may be coupled to the bottom case 110. Some of the components 208*b* may contact the top case 112 without being attached or fixed to the top case 112. Alternatively, the components 208*b* may be separated from the top case 112 by a space or a layer of material, or they may be coupled to both the bottom interior surface of the top case and the top interior surface of the bottom case.

Figure 2C:
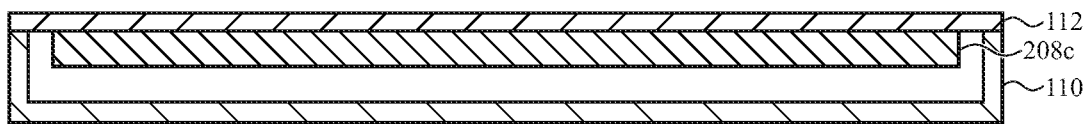

In another example shown in FIG. 2C, components 208c may be coupled to the top case 112. The components 208c may be set apart from the bottom case 110 by a space (as shown), or some or all of the components 208c may contact the bottom case 110 without being attached or fixed to the bottom case 110.

Figure 2D:
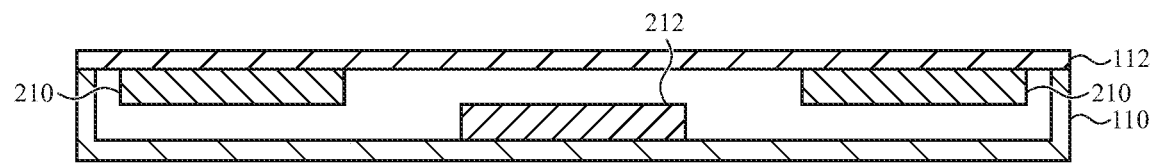

In another example shown in FIG. 2D, first components 210 (e.g., a first subset of the components 208, FIG. 2A) may be coupled to the top case 112, while second components 212 (e.g., a second subset of the components 208, FIG. 2A) may be coupled to the bottom case 110. The first components 210 may include components that facilitate input and output functionality via the top case 112, such as haptic actuators, displays, touch sensors, force sensors, and the like. The second components 212 may include other components, such as batteries, processors, circuit boards, communication ports, or the like. Other component distributions and configurations are also contemplated.

The first and second components 210, 212 may be positioned so that they do not interfere with one another when assembled. For example, as shown in FIG. 2D, the second components 212 are configured to fit in a space defined between the first components 210. This allows effective utilization of the interior volume of the base portion 104, and may reduce one or more dimensions (e.g., the height) of the base portion 104 as compared to other component placements.

Figure 2E:
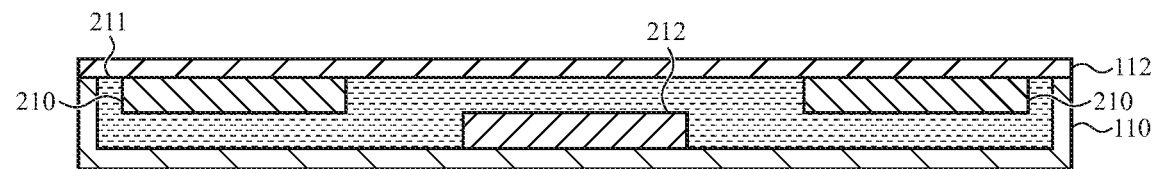
Figure 2F:
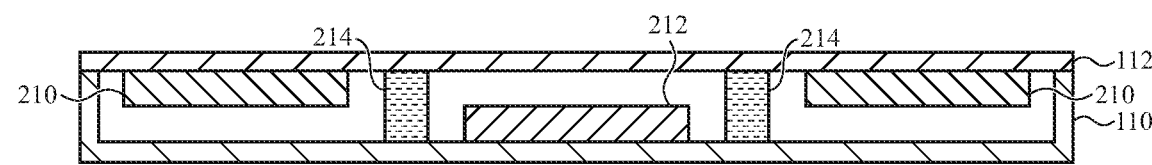

FIG. 2E shows the example component arrangement of FIG. 2D, with a potting material 211 disposed between the top and bottom cases 110, 112 and filling the spaces between the components 210, 212. Potting may be used to refer to a material that is disposed in a volume or region as a liquid, foam, or other flowable state, and then cured to a non-flowable state (e.g., a solid). The potting may be formed from an insulating or dielectric material to prevent shorting of or interference with internal electrical components. Example potting materials include but are not limited to polyurethane, silicone, epoxy, or the like.

The potting material 211 may support the top case 112 and may help reduce or prevent deflection of the top case 112 in response to applied forces, such as forces associated with touch inputs, force inputs, keyboard inputs, trackpad inputs, hands resting on the top case 112, and the like. The potting material 211 may be any suitable material, such as silicone, epoxy, polyurethane, aerogel, or any other suitable polymer or other material. FIG. 2E shows the potting material 211 occupying all of the otherwise empty space between the top and bottom cases 110, 112. In other examples, such as the example shown in FIG. 2F, the potting material 211 may occupy less than all of the otherwise empty space, such that gaps, openings, air pockets/bubbles, cavities, or the like are present in the base portion 104. In such cases, there may be multiple discrete pieces or volumes of potting material 211 (e.g., pillars 214) in the base portion 104.

Components 208b, 208c, 210, and 212 may correspond to the components 208 shown in FIG. 2A, or they may be different components. Also, the placements of the components shown in FIGS. 2B-2F are merely examples, and other configurations and placements of the components may also be used. For example, some of the components (or portions thereof) may be positioned between the top case 112 and the bottom case 110 without contacting either the bottom interior surface of the top case 112 or the top interior surface of the bottom case 110. Such components may be coupled to a side surface or wall of the bottom case 110, for example.

Figure 3A:
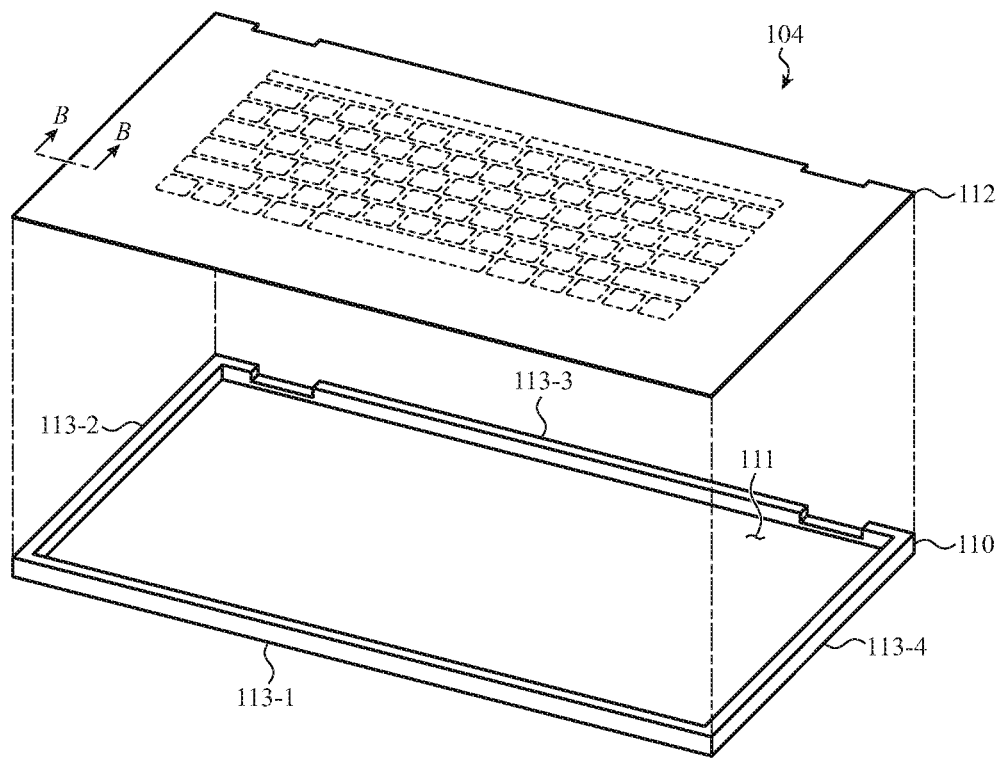
FIG. 3A depicts an exploded view of a base portion of the computing device of FIG. 1A.
Figure 3B:
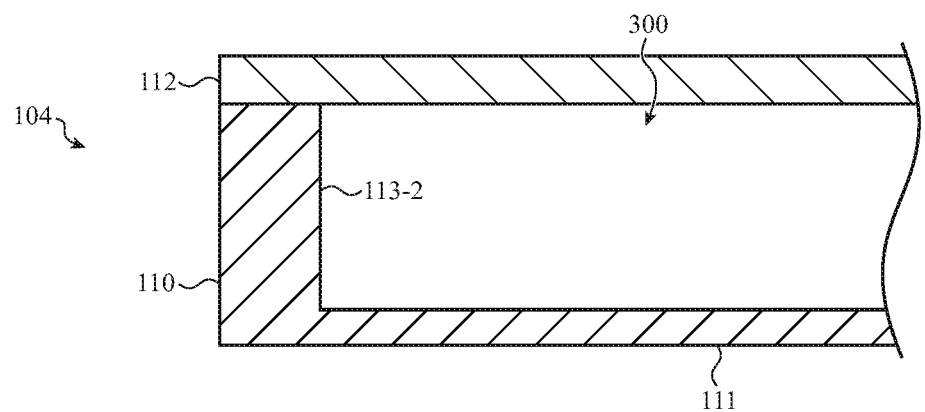
FIG. 3B depicts a partial cross-sectional view of the base portion of the computing device of FIG. 1A, viewed along section B-B in FIG. 1A.

FIG. 3A is a partial exploded view of the base portion 104, showing the top case 112 separated from the bottom case 110. FIG. 3B is a partial cross-sectional view of the base portion 104, viewed along section B-B in FIGS. 1A and 3A. The components 208 (FIG. 2A) of the device 100, which are disposed in the interior volume between the top case 112 and the bottom case 110 are omitted from FIGS. 3A-3B for clarity. As shown, the top case 112 is coupled to the bottom case 110 to define an interior volume 300 of the base portion 104. FIGS. 3A-3B are schematic illustrations of the structural integration of the top case 112 and the bottom case 110, while FIGS. 4A-5D illustrate several example embodiments.

Figure 4A:
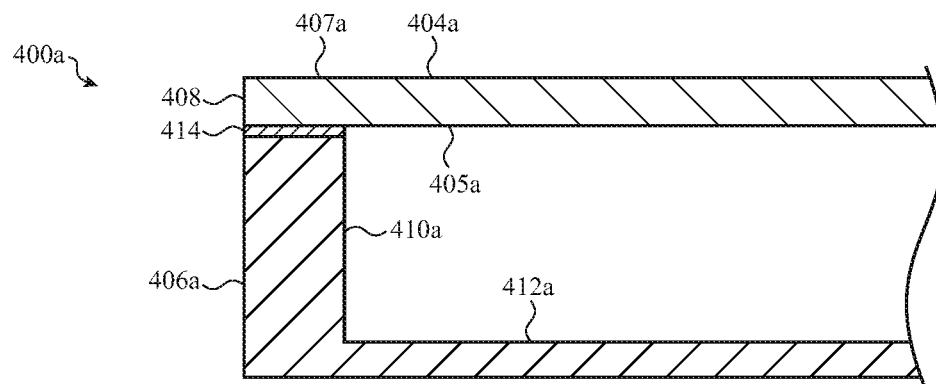
FIGS. 4A-5D depict partial cross-sectional views of the base portion of the computing device of FIG. 1A, viewed along section B-B in FIG. 1A.

FIG. 4A is a partial cross-sectional view of a base portion 400a of a computing device (which may correspond to the base portion 104, FIG. 1A), viewed along section B-B in FIG. 3A, showing an example configuration of a bottom case 406a and a top case 404a (which may correspond to the bottom case 110 and the top case 112, respectively). The top case 404a may be attached to the bottom case 406a via sidewalls of the bottom case 406a. For example, a portion of a bottom surface 405a of the top case 404a is coupled to a top of a sidewall 410a of the bottom case 406a via a joining member 414. As shown, the top case 404a may extend to the outer edge of the bottom case 406a, and an edge or side 408 of the top case 404a may form a portion of the side of the base portion 400a. The top case 404a may have a rounded or contoured transition (e.g., a filleted corner or edge) from a top surface 407a of the top case 404a to the edge or side 408 of the top case 404a. The rounded or contoured transition may define part of a smooth continuous surface that includes the rounded or contoured transition and at least part of the side of the bottom case 406a. In other cases, the top case 404a may have any other appropriate shape, such as a substantially perpendicular angle (as shown), a chamfered edge, or the like. A filleted or chamfered edge may resist chipping, cracking, or other damage to the top case 404a, and may also provide an attractive or desired appearance and tactile feel of the base portion 400a.

The joining member 414 may be any appropriate material or combination of materials. The joining member 414 may be an adhesive, such as a pressure sensitive adhesive (PSA), heat sensitive adhesive (HSA), epoxy, cyanoacrylate, or any other suitable adhesive. In addition to securing the top case 404a to the bottom case 406a, the joining member 414 may also act as a seal between the top case 404a and the bottom case 406a, preventing material (e.g., liquids, dust, or other contaminants) from entering the base portion 400a.

In some cases, the joining member 414 may be substantially rigid, such that the distance between the interfacing surfaces of the top case 404a and the bottom case 406a does not change substantially when a force is applied to the top case 404a (e.g., as a result of typing or other input forces applied to the top case 404a). Alternatively, the joining member 414 may be formed from or may include a compliant material, such as a foam, rubber, polyurethane, or other suitable material, that allows the top case 404a to move relative to the bottom case 406a in response to application of force on the top case 404a and/or the bottom case 406a. Such forces may be in response to user inputs (e.g., typing or interacting with a trackpad), they may be produced by haptic actuators, they may be due to the device being dropped or objects being dropped on the device, or the like. Moreover, such forces may be compressive or tensile forces, shear forces, or the like. As described herein, compliant materials may be used for the joining member 414 in order to allow a haptic actuator to more easily move the top case 404a relative to the bottom case 406a (as compared to more rigid joining members), thereby providing greater efficiency in transferring haptic outputs through the top case 404a to a user.

A compliant joining member 414 may be used where force sensors determine an amount of force applied to the top case 404a based on the amount of deflection or movement of the top case 404a relative to the bottom case 406a. Such force sensors, or components thereof, may be incorporated in the joining member 414. For example, electrodes for detecting changes in capacitance due to deflection of the top case 404a relative to the bottom case 406a may be included in the joining member 414.

The joining member 414 may be a single piece of material (e.g., a single layer of adhesive), or it may include multiple components, layers, or other elements. For example, a multiple layered joining member 414 may include a compliant member positioned between (and bonded to) two adhesive layers, with the first adhesive layer bonding to the top case 404a and the second adhesive layer bonding to the bottom case 406a. Part of the joining member may form part of the side (e.g., the exterior surface) of the base portion, as shown in FIG. 4A.

As shown in FIG. 4A, the bottom case 406a includes a sidewall 410a extending away (or upward, as shown in FIG. 4A) from a bottom member 412a (which may be similar to or an embodiment of the bottom member 111, FIGS. 3A-3B). Thus, the bottom case 406a defines at least a bottom and a side of an interior volume of the base portion 400a, and the top case 404a defines a top of the interior volume. In some cases, a bottom case (e.g., the bottom case 406a) includes multiple sidewalls that define the exterior sides and/or side surfaces of a base portion of a device. For example, FIG. 3A shows a bottom case 110 that includes first, second, third, and fourth sidewalls extending around the front, left, right, and back areas of the base portion. The sidewalls may be integrally formed with the bottom member (e.g., the bottom member 412a) of the bottom case. The bottom case (e.g., the bottom case 110, 406a, or any other bottom case described herein) may be formed of a single piece of metal, glass, ceramic, or the like. In some cases, the bottom case (including a bottom surface and one, two, three, or four sidewalls) may be a metal member, which may be machined or otherwise formed from a single piece of metal. Other configurations are also possible, such as configurations where the top case defines the top and sides of the interior volume, and the bottom case defines the bottom of the interior volume. Examples of such configurations are discussed herein.

The top case 404a, the bottom case 406a, and the joining member 414 may have a substantially similar appearance. For example, these components may be configured to have the same or similar color, texture, tactile feel, etc. This may include applying paint, ink, dye, or other coatings to the components, and/or applying the same finishing processes (e.g., machining, polishing, etc.) to the components.

Figure 4B:
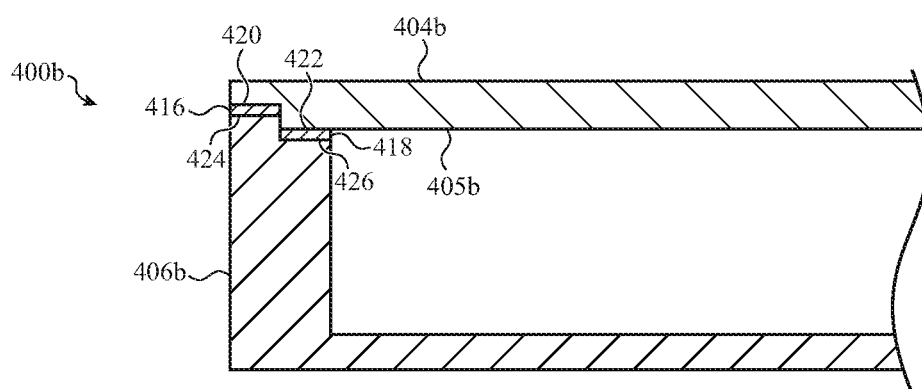

FIG. 4B is a partial cross-sectional view of a base portion 400b of a computing device (which may correspond to the base portion 104, FIG. 1A), viewed along section B-B in FIG. 3A, showing another example configuration of a bottom case 406b and a top case 404b. The top case 404b and the bottom case 406b each define corresponding stepped interface regions. In particular, the top case 404b may define a first interface surface 420 and a second interface surface 422 that is offset from (e.g., not in the same plane as) the first interface surface 420. Correspondingly, the bottom case 406b may define a third interface surface 424 that is opposite the first interface surface 420, and a fourth interface surface 426 that is opposite the second interface surface 422.

The first and third interface surfaces 420, 424 may be coupled to one another via a first joining member 416, and the second and fourth interface surfaces 422, 426 may be coupled to one another via a second joining member 418. The first and second joining members 416, 418 may be similar in structure, material, function, etc., to the joining member 414 discussed above. The first and second joining members 416, 418 may be substantially identical to one another, or they may be different. For example, the first joining member 416 may have a different stiffness than the second joining member 418. As another example, the first joining member 416 may form a better seal (e.g., to prevent ingress of liquids or other contaminants), while the second joining member 418 may be less effective at sealing but may provide a stronger bond or holding force as compared to the first joining member 416. As yet another example, the first joining member 416 may lack force sensors or force sensing components, while the second joining member 418 may include electrodes or other components to act as a force sensor (or a portion of a force sensor). Other optimizations are also possible, and each joining member may be selected or optimized for any desirable or suitable property or combination of properties. Examples of properties that may be selected or optimized for include strength, hardness, scratch resistance, chemical resistance, ultraviolet radiation resistance, water resistance, bond strength, color, surface finish, machinability, and the like.

Figure 4C:
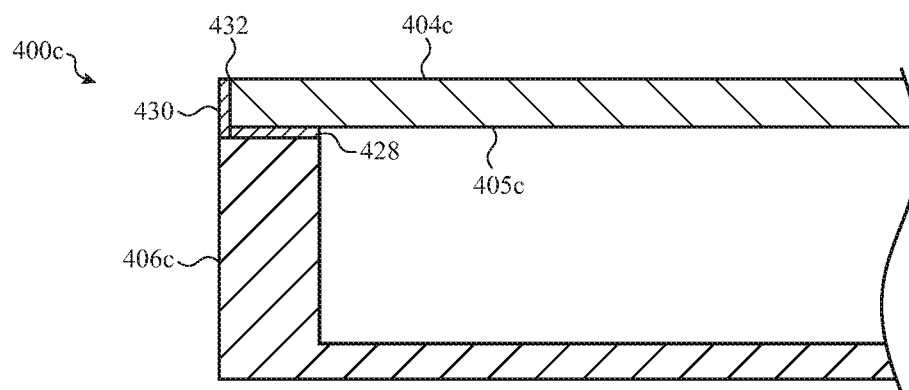

FIG. 4C is a partial cross-sectional view of a base portion 400c (which may correspond to the base portion 104, FIG. 1A), viewed along section B-B in FIG. 3A, showing an example configuration of a bottom case 406c and a top case 404c. The top case 404c may be coupled to the bottom case 406c via a joining member 428, which may be similar in structure, material, function, etc., to the joining member 414 discussed above.

The top case 404c may not extend all the way to the edge 432 of the bottom case 406c. For example, an edge 432 of the top case 404c may be recessed relative to the exterior side of the bottom case 406c. An edge trim 430 may be disposed on and/or attached to the edge 432 of the top case 404c, and may substantially surround the top case 404c along the edge 432 (e.g., it may be applied to all otherwise exposed edges of the top case 404c). The edge trim 430 may be formed from or include any suitable material or materials. For example, the edge trim 430 may be epoxy, plastic, paint, ink, dye, a rubber coating or strip, or the like. The edge trim 430 may be a single material that is adhered to the top case 404c and/or the bottom case 406c, or it may comprise multiple elements or materials, such as a trim material and a separate adhesive.

The edge trim 430 may protect the edge of the top case 404c from scratches, chips, or other damage. The edge trim 430 may also prevent light from entering or leaving the top case 404c through the edge 432. For example, the top case 404c may be used as a light guide or light pipe for illuminated components, such as keycaps, integrated displays, or the like. In such cases, the edge trim 430 may prevent light leaks from the edge 432. Where the top case 404c is a light guide or light pipe, the edge trim 430 may include or be applied over a reflective material or coating that is disposed on the edge 432 and that is configured to reflect light back into the top case 404c.

The edge trim 430 may be configured to have a similar appearance to the bottom case 406c. For example, the edge trim 430 may have the same or similar color, texture, tactile feel, or other property as the bottom case 406c. Accordingly, the side of the base portion 400c may have a consistent appearance, and may appear to be formed from a single component (or the edge trim 430 and the bottom case 406c may appear to be formed from the same material). The edge trim 430 and the bottom case 406c may be subjected to a common finishing process, such as polishing, grinding, or machining, to produce similar textures and appearances on both components. For example, the same polishing step may be applied to the edge trim 430 and the bottom case 406c after these components are assembled. In some cases, the same tool (e.g., a polishing tool) may be applied to the edge trim 430 and the bottom case 406c substantially simultaneously.

Figure 4D:
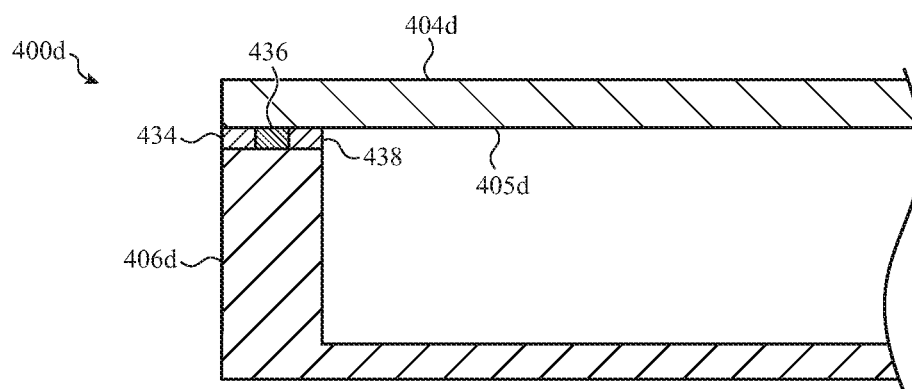

FIG. 4D is a partial cross-sectional view of a base portion 400d (which may correspond to the base portion 104, FIG. 1A), viewed along section B-B in FIG. 3A, showing an example configuration of a bottom case 406d and a top case 404d. The top case 404d may be coupled to the bottom case 406d via multiple joining members. The first and second joining members 434, 438 may be applied first to define a trough or cavity in which a third joining member 436 may be positioned. In some cases, the first and second joining members 434, 438 may be an adhesive foam, tape, film, or other material that may be applied in solid or semi-solid form to define the trough or cavity. After the first and second joining members 434, 438 are applied and the trough or cavity is defined, the third joining member 436 may be introduced into the trough or cavity. For example, the third joining member 436 may be a curable adhesive in a liquid or other flowable form that is poured, injected, or otherwise introduced into the trough or cavity defined by the first and second joining member 434, 436. (The trough or cavity may be continuous around a joining surface of the top case 404d or bottom case 406d, and may fully contain the flowable material of the third joining member 436 in a desired location or position.) After the third joining member 436 is introduced into the trough or cavity, the top case 404d and the bottom case 406d may be brought together and bonded to one another by the joining members (e.g., by allowing any or all of the joining members 434, 436, 438 to cure and/or harden.

In some cases, the first, second, and third joining members 434, 438, and 436 may have different physical and/or mechanical properties. For example, the first and second joining members 434, 438 may be in a solid or semi-solid form and may have a dimensional stability such that the size or shape does not change significantly after being applied to the top case 404d and/or bottom case 406d. Accordingly, they may be used to define a physical and/or dimensional relationship between the top and bottom cases 404d, 406d (e.g., to maintain a specified distance therebetween), as well as to define the trough or cavity in which the material for the third joining member 436 may be introduced. The first and second joining members 434, 438 may also adhere or otherwise secure the top case 404d to the bottom case 406d. Instead of or in addition to using the first and second joining members 434, 438 to define or maintain the distance between the top and bottom cases 404d, 406d, spacers may be positioned between the top and bottom cases 404d, 406d. Spacers may be any suitable material, such as foam, tape, film, solidified/cured adhesive, or the like. Spacers may be any suitable shape, such as pillars, disks, domes, etc., and may be positioned at spaced intervals along the interface between the top and bottom cases 404d, 406d.

The third joining member 436 may be a high shear adhesive (or any other suitable adhesive or material), and as such may provide a high-strength adhesive bond between the top case 404d and the bottom case 406d and may prevent or reduce delamination or detachment or relative movement of the top and bottom cases 404d, 406d. High shear adhesives may have a higher resistance to shear loads than other adhesives.

Figure 4E:
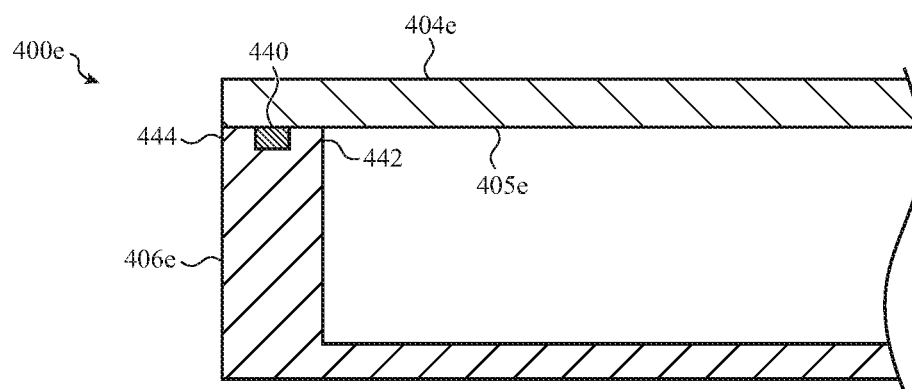

FIG. 4E is a partial cross-sectional view of a base portion 400e (which may correspond to the base portion 104, FIG. 1A), viewed along section B-B in FIG. 3A, showing an example configuration of a bottom case 406e and a top case 404e. The top case 404e may be coupled to the bottom case 406e via a joining member 440. The joining member 440 may be formed from a liquid or flowable adhesive that is introduced into a trough or cavity defined by walls 442, 444 of the bottom case 406e. As shown, the walls 442, 444 are integral with the bottom case 406e. For example, the trough or cavity may be machined (or laser ablated or otherwise formed) into the bottom case 406e to form the walls 442, 444. Alternatively, the walls 442, 444 may be separate components from the bottom case 406e and may be secured (e.g., welded, bonded, adhered, etc.) to the bottom case 406e to form the walls 442, 444. As noted above, the joining member 440 may be formed by flowing, injecting, or otherwise introducing an adhesive (e.g., a high shear adhesive or any other suitable adhesive) into the space between the walls 442, 444. Where the joining member 440 is formed from a liquid or flowable material, the walls 442, 444 may contain the flowable material in place so that it can adequately bond to the top and bottom cases 404e, 406e.

Figure 4F:
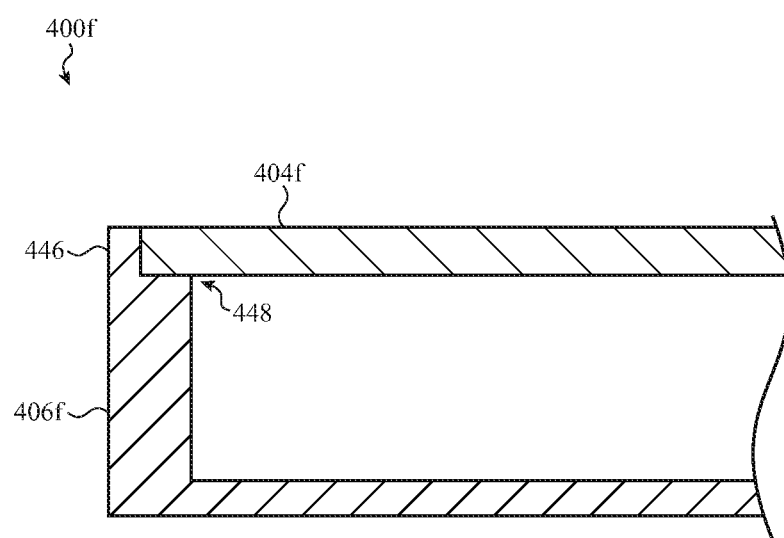

FIG. 4F is a partial cross-sectional view of a base portion 400f (which may correspond to the base portion 104, FIG. 1A), viewed along section B-B in FIG. 3A, showing an example configuration of a bottom case 406f and a top case 404f. The bottom case 406f may define a surface or ledge 448, with a portion of a sidewall of the bottom case 406f extending past the ledge 448 and defining a flange 446. The top case 404f may rest on or otherwise interface with the ledge 448, and the flange 446 may be adjacent a peripheral side of the top case 404f, as shown in FIG. 4F. In some cases, the flange 446 may extend above or past the ledge 448 by a distance that is substantially the same as the thickness of the top case 404f (e.g., the height of the peripheral side of the top case 404f), such that the top surface of the flange 446 (as viewed in FIG. 4F) is substantially flush or even with the top surface of the top case 404f. The top case 404f may be affixed or secured to the bottom case 406f with adhesive, or any other suitable bonding technique or material.

FIGS. 4A-4F show techniques for joining an example top case to an example bottom case. Any of the techniques, joining materials, top and bottom case geometries, and the like, may equally apply to other example top and bottom cases, such as top and bottom cases with different geometries (e.g., different wall thicknesses, different shapes, different wall angles, different sizes), different materials, different physical properties, or the like. For example, the teachings shown and described with respect to FIGS. 4A-4F may be used with top and bottom cases as shown in FIGS. 2A-2F.

FIGS. 5A-5D are partial cross-sectional views of base portions of a computing device in which the top cases include a top member that forms a top surface of the base portion as well as a sidewall that forms a side of the base portion. FIGS. 5A-5D show different configurations of an interface and coupling between a bottom case and a top case where the top case includes the sidewalls, rather than the bottom case.

Figure 5A:
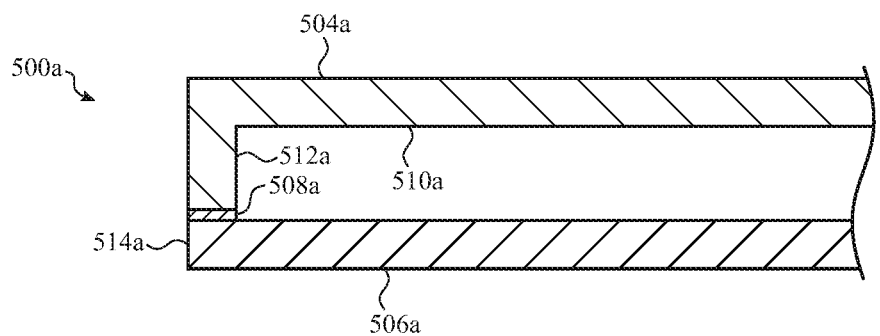

FIG. 5A is a partial cross-sectional view of a base portion 500a of a computing device (which may correspond to the base portion 104, FIG. 1A), viewed along section B-B in FIG. 3A. As noted above, a top case 504a of the base portion 500a includes a top member 510a and a sidewall 512a. The sidewall 512a may extend substantially perpendicularly from the top member 510a, or it may extend at a different angle. The sidewall 512a defines an exterior side surface of the base portion 500a. While one sidewall is shown, it will be understood that the top case 504a (as well as other top cases described herein) may include multiple sidewalls, such as one, two, three, or four (or more) sidewalls. In some cases, the top cases described herein include three sidewalls that are integrally formed with a top member (e.g., the top member 510a) to form front, left, and right sides of a base portion of an electronic device. The sidewalls may also be continuous along the corners between two sidewalls, producing in some cases a continuous band of sidewall that extends along at least three sides of the base portion. Features of any of the sidewalls described herein may be applied to other sidewalls as well. For example, while FIG. 5A shows a cross section of one sidewall, some or all other sidewalls of the top case 504a (which may correspond to and/or replace the sidewalls 113 in FIGS. 3A-3B) may have similar features and be coupled to the bottom case 506a in a similar way.

The top case 504a may be formed from any suitable material, such as glass, ceramic, metal, plastic, or the like. For example, the top case 504a may be a single piece of glass that has been molded (e.g., slumped) to form the top member 510a and the sidewall 512a. The single, continuous glass (or other material) top case may be devoid of upward facing seams, holes, openings, or the like, thus forming a highly spill-resistant base portion.

The top case 504a may include one or more openings in the sidewalls (e.g., the sidewall 512a) to allow access to interior components of the device. For example, a device may include connectors (e.g., for charging, communications, and the like), and the top case 504a may include openings to allow cables or other components to connect to the connectors. Example connectors include universal serial bus (USB) connectors, card readers, power cable connectors, and the like. The opening(s) may have other functions or be associated with other components as well. For example, an opening may correspond to a disk drive to allow a disk (e.g., a DVD or CD) to be inserted into the drive, or an opening may be used for a fastener (e.g., a screw, bolt, etc.) to secure the top case 504a to another component (e.g., a bottom case 506a).

Openings may be formed in the sidewalls (or other portions) of the top case 504a in any suitable way. For example, openings may be machined, laser cut, plasma cut, sawed, chemically etched, or the like. Openings may also be formed into the top case 504a during a molding process, thus reducing or eliminating the need to form the openings after the top case 504a is formed and hardened.

The top case 504a is coupled to a bottom case 506a via a joining member 508a. The bottom case 506a forms a bottom of an interior volume of the base portion 500a, and may be formed from any suitable material, such as metal, glass, plastic, ceramic, or the like.

The sidewall 512a of the top case 504a may be coupled to a top surface of the bottom case 506a such that an edge 514a of the bottom case 506a is substantially flush with the exterior surface of the sidewall 512a. Accordingly, the edge 514a of the bottom case 506a defines part of the exterior side surface of the base portion 500a.

The joining member 508a couples the top case 504a to the bottom case 506a. The joining member 508a may be the same or similar in structure, material, function, etc., to the joining member 414 described above.

Figure 5B:
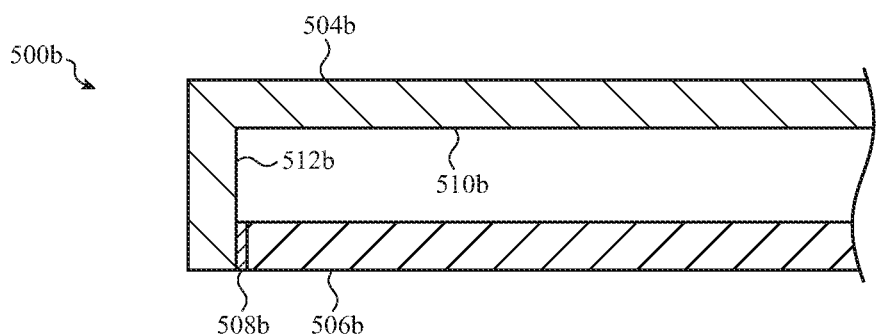

FIG. 5B is a partial cross-sectional view of a base portion 500b of a computing device (which may correspond to the base portion 104, FIG. 1A), viewed along section B-B in FIG. 3A. The base portion 500b includes a top case 504b coupled to a bottom case 506b via a joining member 508b. The joining member 508b may be the same or similar in structure, material, function, etc., to the joining member 414 described above.

The base portion 500b is similar to the base portion 500a in that the top case 504b includes both a top member 510b and a sidewall 512b, while the bottom case 506b is substantially flat. In the base portion 500b, however, an edge of the bottom case 506b does not extend to the exterior surface of the sidewall 512b. Rather, an edge of the bottom case 506b is coupled to an interior side of the sidewall 512b, and the bottom case 506b does not form part of the exterior side of the base portion 500b.

Figure 5C:
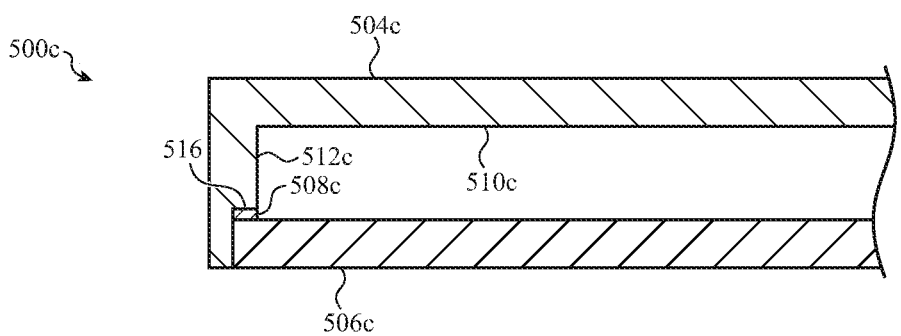

FIG. 5C is a partial cross-sectional view of a base portion 500c of a computing device (which may correspond to the base portion 104, FIG. 1A), viewed along section B-B in FIG. 3A. The base portion 500c includes a top case 504c coupled to a bottom case 506c via a joining member 508c. The joining member 508c may be the same or similar in structure, material, function, etc., to the joining member 414 described above.

The base portion 500c is similar to the base portion 500b in that the top case 504c includes both a top member 510c and a sidewall 512c, while the bottom case 506c does not extend to or form part of the exterior side surface of the base portion 500c. However, in the base portion 500c, the bottom case 506c is received in a notch 516 in the sidewall 512c. The notch 516 allows a top surface of the bottom case 506c, rather than or in addition to an edge of the bottom case 506c, to interface with and/or be coupled to the sidewall 512c.

Figure 5D:
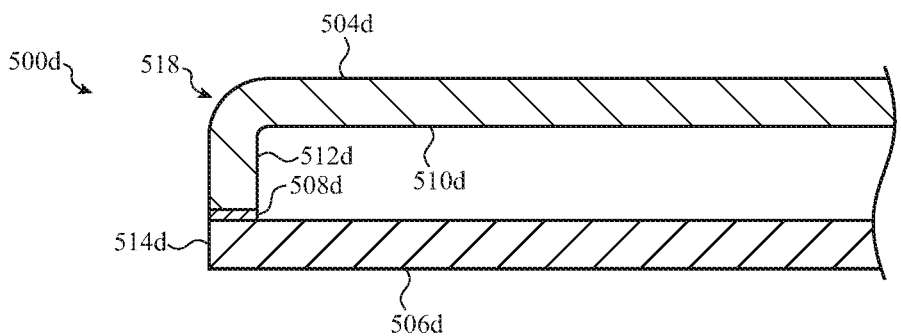

In the foregoing examples, the top cases are shown having substantially sharp edges (e.g., sharp 90 degree angles where the top and side surfaces meet). However, these depictions should not be taken as limiting to the shapes and/or configurations of the top cases described herein. Indeed, the top cases may have other shapes and/or edge profiles. For example, FIG. 5D is a partial cross-sectional view of a base portion 500d of a computing device (which may correspond to the base portion 104, FIG. 1A), viewed along section B-B in FIG. 3A. The base portion 500d includes a top case 504d coupled to a bottom case 506d via a joining member 508d. The joining member 508d may be the same or similar in structure, material, function, etc., to the joining member 414 described above.

In FIG. 5D, the top case 504d has an edge 518 that has a rounded, curved, or radiused profile. The radius may be any suitable radius, such as about 0.25 mm, about 0.5 mm, about 1.0 mm, or any other suitable radius. In some cases, the edge 518 may have a curved profile that follows a spline or curve that is not defined by a single radius. Other edge shapes are also contemplated, such as chamfers, coves, steps, or any other suitable shape.

FIGS. 6A-6G are partial cross-sectional views of display portions of a computing device, viewed along section C-C in FIG. 1A, illustrating various configurations of a display portions. The display portions depicted in FIGS. 6A-6G may define internal volumes for holding display components (or other components of a computing device), including backlights, side lights, covers, display stacks, LED layers, OLED layers, circuit boards, batteries, processors, memory, antennas, and the like. In FIGS. 6A-6G, the display housings (e.g., the display housings 602a-g) may be similar in structure, material, function, etc., to the display housing 108 discussed above. Similarly, the joining members (e.g., the joining members 606a-606g) that join covers and/or displays to the display housings may be similar in structure, material, function, etc., to the joining member 414 (or any other joining members) discussed above.

Figure 6A:
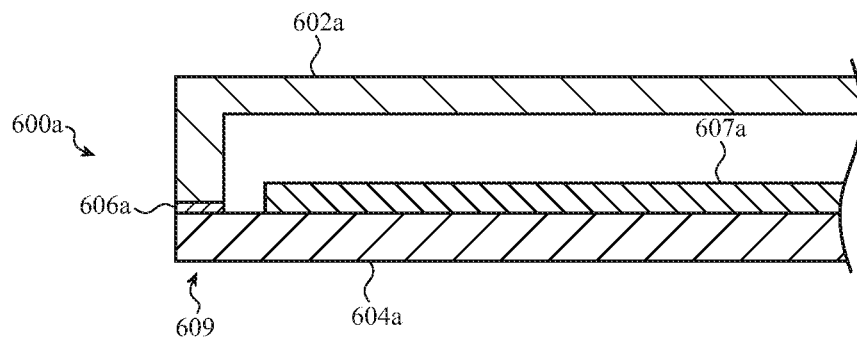
FIGS. 6A-6H and 6J depict partial cross-sectional views of a display portion of the computing device of FIG. 1A, viewed along section C-C in FIG. 1A.

FIG. 6A depicts a partial cross-sectional view of a display portion 600a in which a cover 604a is coupled to a display housing 602a. The cover 604a may be a transparent protective sheet that is in front of and optionally bonded or adhered to a display stack 607a. The cover 604a may be formed from or include any suitable material, such as glass, plastic, ceramic, polycarbonate, etc. The cover 604a may be a single (e.g., monolithic) component, such as a single sheet of glass, plastic, or ceramic, or it may comprise multiple components or layers, such as multiple layers of glass, plastic, filters, coatings, or the like. The display stack 607a may include any suitable components, including LED layers, OLED layers, light diffusers, light guides, light sources, reflectors, polarizers, filters, or the like. While the display stack 607a is shown in FIG. 6A as a single component, it will be understood that the display stack 607a may have multiple components and/or layers.

As shown in FIG. 6A, the cover 604a may extend to and form part of an exterior side of the display portion 600a. In this configuration, the entire user-facing surface 609 of the display portion 600a may be defined by a single surface, without any visible bezel, frame, or other surrounding component. For example, the display housing 602a may not be visible around the outer perimeter of the cover 604a during normal operation of the computing device (e.g., when the computing device is in use and/or the display is being viewed by a user).

The cover 604a and the display housing 602a may be formed from or may include the same material. For example, the cover 604a may be formed from or may include a glass, and the display housing 602a may also be formed from glass (e.g., the same or a different glass than the cover 604a). Alternatively, the cover 604a and the display housing 602a may be formed from different materials. For example, the display housing 602a may be aluminum (or another metal), while the cover 604a may be formed from or include glass.

The cover 604a may be attached to the display housing 602a via a joining member 606a. The joining member 606a may be or may include an adhesive that bonds the cover 604a to the display housing 602a. The cover 604a, display housing 602a, and joining member 606a may have a substantially similar appearance. For example, these components may be configured to have the same or similar color, texture, tactile feel, etc. This may include applying paint, ink, dye, or other coatings to the components, and/or applying the same finishing processes (e.g., machining, polishing, etc.) to the components.

Figure 6B:
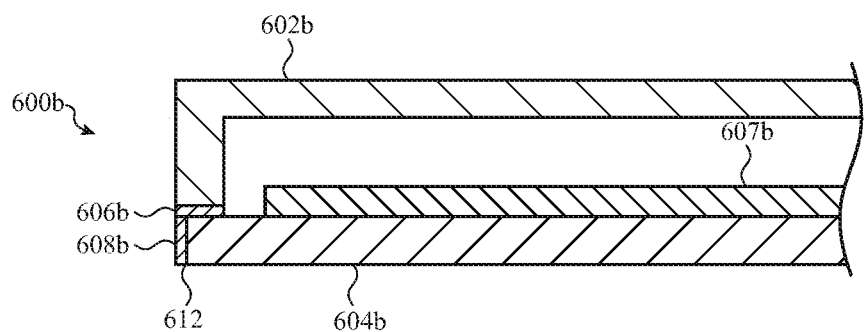

FIG. 6B depicts a partial cross-sectional view of a display portion 600b in which a cover 604b is coupled to a display housing 602b. The cover 604b is attached to the display housing 602b via a joining member 606b. The display portion 600b also includes a display 607b, which may be similar in structure, material, function, etc., to the display 607a discussed above.

The cover 604b may extend substantially to the edge of the display housing 602b, except that an edge trim 608b may be disposed on and/or attached to an edge 612 of the cover 604b. The edge trim 608b may cover the edge 612 of the cover 604b and the joining member 606b, and may protect these components from damage. The edge trim 608b may also prevent light from entering or leaving the cover 604b through the edge 612. Furthermore, in instances where the cover 604b includes multiple layers, the edge trim 608b may cover the ends or edges of the layers. This may improve the appearance of the display portion 600b (by covering unsightly seams) and may help prevent delamination or other damage to the multiple layers of the cover 604b. The edge trim 608b may be similar in structure, material, function, etc., to the edge trim 430 discussed above.

The edge trim 608b may be configured to have a similar appearance to the display housing 602b. For example, the edge trim 608b may have the same or similar color, surface texture, tactile feel, or other property as the display housing 602b. Accordingly, the side of the display portion 600b may have a consistent appearance, and may appear to be formed from a single component (or the edge trim 608b and the display housing 602b may appear to be formed from the same material). The edge trim 608b and the display housing 602b may be subjected to a common finishing process, such as polishing, grinding, or machining, to produce similar textures and appearances on both components. For example, the same polishing step may be applied to the edge trim 608b and the display housing 602b after these components are assembled. In some cases, the same tool (e.g., a polishing tool) may be applied to the edge trim 608b and the display housing 602b substantially simultaneously, or during a common processing operation.

Figure 6C:
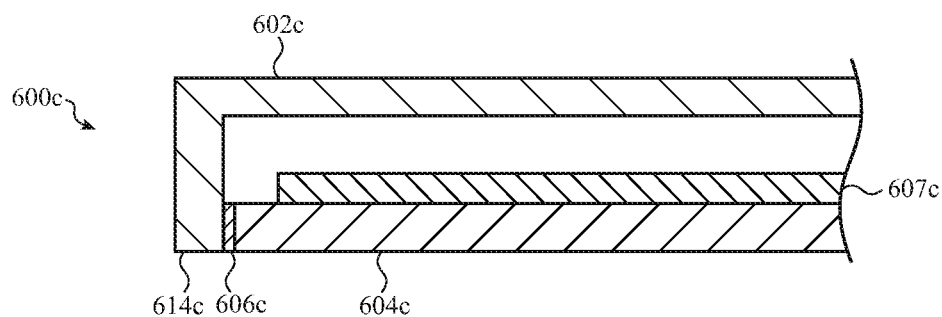

FIG. 6C depicts a partial cross-sectional view of a display portion 600c in which a cover 604c is coupled to a display housing 602c. The cover 604c is attached to the display housing 602c via a joining member 606c. The display portion 600c also includes a display 607c, which may be similar in structure, material, function, etc., to the display 607a discussed above.

As shown in FIG. 6C, the cover 604c may be set into the display housing 602c (e.g., portions of the display housing 602c at least partially extend over a side of the cover 604c). In some cases, an exterior surface of the cover 604c may be substantially flush with an edge 614c of the display housing 602c. In this configuration, the edge 614c (and optionally the joining member 606c) may define a bezel or frame that surrounds or frames at least part of the cover 604c. Moreover, the part of the display housing 602c that surrounds the edges of the cover 604c may protect the edges of the cover 604c from chips, breaks, contaminants, or other potential damage.

Figure 6D:
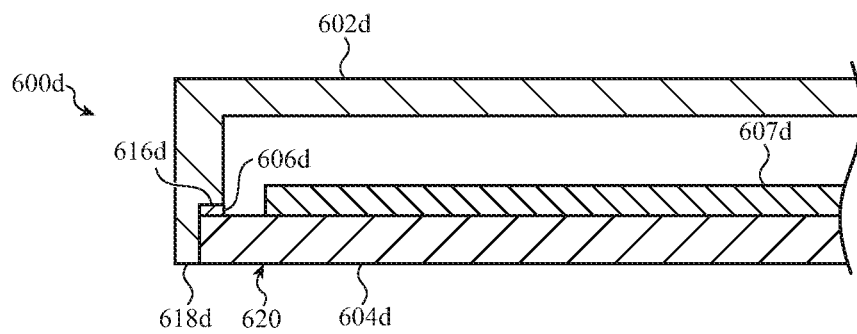

FIG. 6D depicts a partial cross-sectional view of a display portion 600d in which a cover 604d is coupled to a display housing 602d. The display portion 600d also includes a display 607d, which may be similar in structure, material, function, etc., to the display 607a discussed above.

The cover 604d is attached to the display housing 602d via a joining member 606d. The display housing 602d includes a notched region that defines a shelf 616d to which the cover 604d is attached (via the joining member 606d). This configuration allows the cover 604d to be at least partially surrounded or framed (around its outer edge) by an edge 618d of the display housing 602d, similar to the configuration in the display portion 600c (FIG. 6C), without a joining member that is visible on a user-facing, exterior surface 620 of the display portion 600d. For example, the joining member 606d couples the interior or back surface of the cover 604d to the shelf 616d. Accordingly, the joining member 606d does not form part of the surface 620.

The shelf 616d shown in FIG. 6D also allows the cover 604d to be secured by the display housing 602d along multiple directions. For example, the cover 604d may engage the display housing 602d along the outer edge of the cover 604d and along a perimeter of a back surface of the cover 604d. Accordingly, the cover 604d is retained along an in-plane direction and along an out-of-plane direction. This may improve the strength, rigidity, and/or durability of the display portion 600d.

Figure 6E:
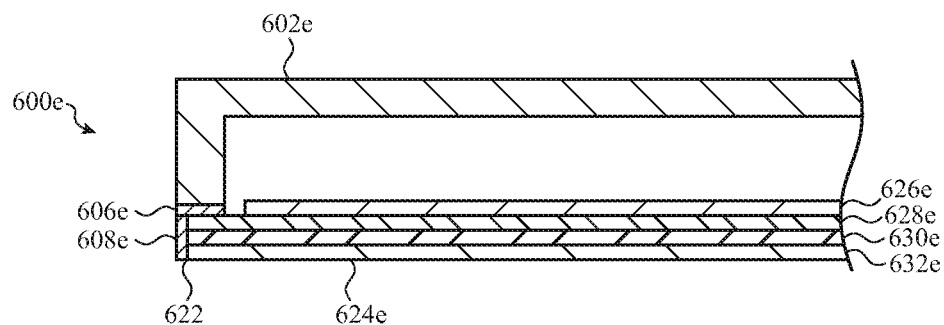

FIG. 6E depicts a partial cross-sectional view of a display portion 600e in which a display stack 624e is coupled to the display housing 602e without a separate cover (e.g., without a cover glass). The display stack 624e may include various components arranged in a stack or laminate, including, for example, a back polarizer 626e, a bottom glass 628e, a top glass 630e, and a front polarizer 632e. These are merely exemplary components or layers of the display stack 624e, and more, fewer, or different components may be included in the display stack 624e, including a backlight, illumination panel(s), light guide panel(s), organic light emitting diodes, liquid crystal layers, or the like.

The display stack 624e may be attached to the display housing 602e via a joining member 606e. The display stack 624e may extend substantially to the edge of the display housing 602e, except that an edge trim 608e may be disposed on and/or attached to an edge 622 of the display stack 624e. The edge trim 608e may cover the edge 622 of the display stack 624e and the joining member 606e, and may protect these components from damage. The edge trim 608e may also prevent light from entering or leaving the display stack 624e through the edge 622. Furthermore, the edge trim 608e may cover the ends or peripheral sides of the layers of the display stack 624e (e.g., bottom glass 628e, top glass 630e, and front polarizer 632e). This may improve the appearance of the display portion 600e (by covering unsightly seams) and may help prevent delamination or other damage to the multiple layers of the display stack 624e. The edge trim 608e may be similar in structure, material, function, etc. to, and may be formed or finished in the same way as, the edge trim 430 and 608b discussed above.

Figure 6F:
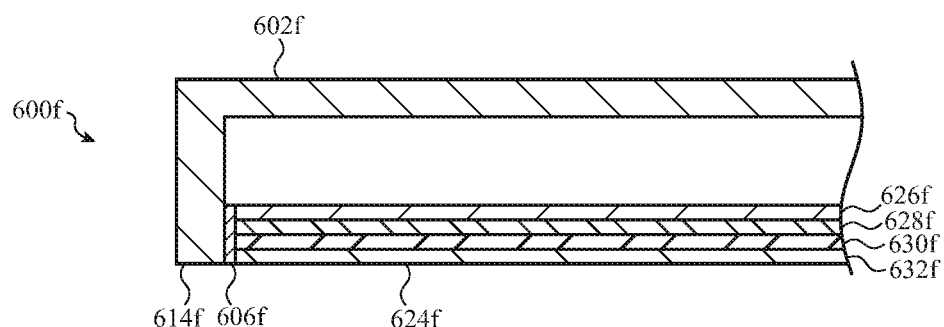

FIG. 6F depicts a partial cross-sectional view of a display portion 600f in which a display stack 624f is coupled to a display housing 602f. The display stack 624f is attached to the display housing 602f via a joining member 606f. The display stack 624f may be similar in structure, material, function, etc., to the display stack 624e discussed above. For example, the display stack 624f may include a back polarizer 626f, a bottom glass 628f, a top glass 630f, and a front polarizer 632f.

As shown in FIG. 6F, and similar to the display housing 602c in FIG. 6C, the display stack 624f may be set into the display housing 602f. In some cases, an exterior surface of the display stack 624f may be substantially flush with an edge 614f of the display housing 602f, and the edge 614f (and optionally the joining member 606f) may define a bezel or frame that surrounds or frames at least part of the display stack 624f. Moreover, the part of the display housing 602f that surrounds the edges of the display stack 624f may protect the edges of the display stack 624f from delamination, chips, breaks, contaminants, or other potential damage.

Figure 6G:
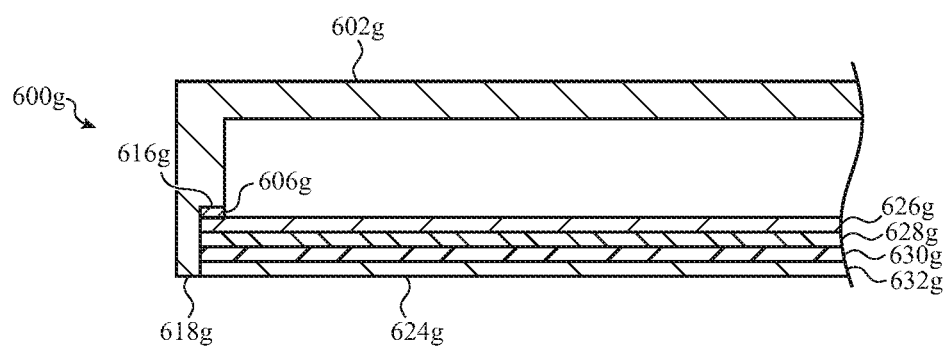

FIG. 6G depicts a partial cross-sectional view of a display portion 600g in which a display stack 624g is coupled to a display housing 602g. The display stack 624g may be similar in structure, material, function, etc., to the display stack 624e discussed above. For example, the display stack 624g may include a back polarizer 626g, a bottom glass 628g, a top glass 630g, and a front polarizer 632g.

The display stack 624g is attached to the display housing 602g via a joining member 606g. The display housing 602g includes a notched region that defines a shelf 616g to which the display stack 624g is attached (via the joining member 606g). This configuration allows the display stack 624g to be at least partially surrounded or framed (around its outer edge) by an edge 618g of the display housing 602g, similar to the configuration in the display portion 600d (FIG. 6D).

Figure 6H:
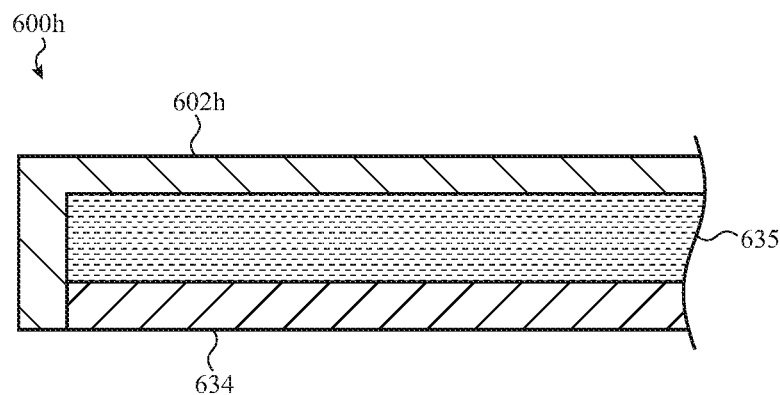

FIG. 6H depicts a partial cross-sectional view of a display portion 600h in which a display 634 is coupled to a display housing 602h (which may be similar to other display housings described herein). The display 634 may be an organic light emitting diode (OLED) display, or any other suitable display or display stack, and may include a cover (e.g., a glass, sapphire, or plastic protective cover) and/or other suitable components.

The display 634 is attached to the display housing 602h via any suitable attachment technique. Space between the display 634 and an interior surface of the display housing 602h may be filled with a potting material 635 (which may be similar to the potting material 211 described above, and may include polyurethane, silicone, epoxy, or any other suitable potting material). The potting material 635 may support the display 634 and the display housing 602h. The potting material 635 may be any suitable material, such as silicone, epoxy, polyurethane, aerogel, or any other suitable polymer or other material. FIG. 6H shows the potting material 635 occupying all of the otherwise empty space between the display 634 and the display housing 602h. In other examples, the potting material 635 may occupy less than all of the otherwise empty space. The potting material 635 may also adhere, bond, or otherwise retain the display 634 to the display housing 602h. In some cases, the potting material 635 may be the exclusive mechanical attachment between the display 634 and the display housing 602h.

Figure 6J:
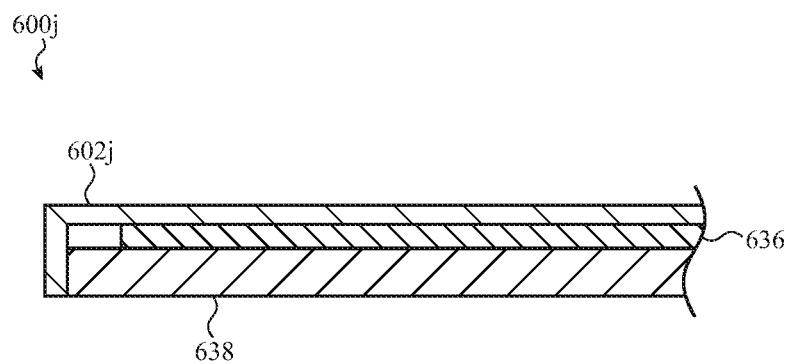

FIG. 6J depicts a partial cross-sectional view of a display portion 600j in which a display 638 is coupled to a display housing 602j (which may be similar to other display housings described herein). The display 638 may be an organic light emitting diode (OLED) display, or any other suitable display or display stack, and may include a cover (e.g., a glass, sapphire, or plastic protective cover) and/or other suitable components.

The display 638 may be attached to the display housing 602j via an adhesive 636. The adhesive 636 may retain the display 638 to the display housing 602j. In some cases, the display 638 and the adhesive 636 add structural strength and rigidity to the display housing 602j, allowing for a thinner display housing 602j to be used, relative to display portions that do not have a display 638 adhered directly to the display housing 602j. In some cases, a large area of a back of the display 638 (e.g., about 50%, about 60%, about 75%, about 85%, about 90%) may be adhered to the display housing 602j, which may increase rigidity of the overall structure as compared to a joining technique where the display 638 is attached to the display housing 602j at the periphery of the display.

Figure 7A:
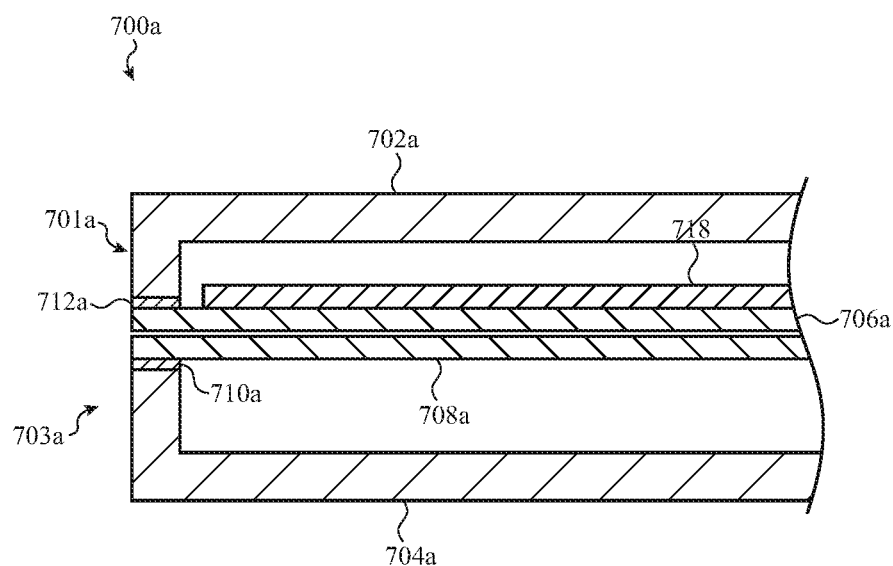
FIGS. 7A-7B depict partial cross-sectional views of the computing device of FIG. 1A, viewed along sections B-B and C-C in FIG. 1A.
Figure 7B:
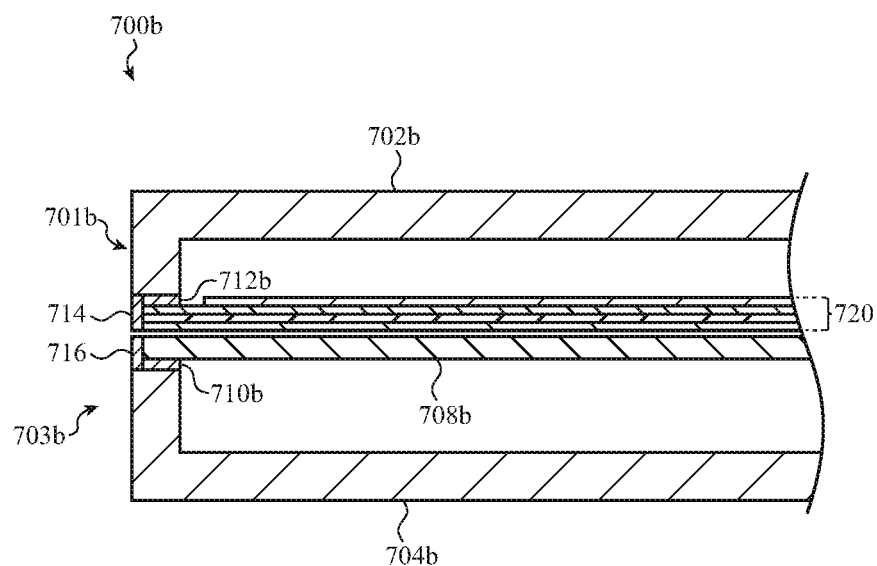

FIGS. 7A-7B depict partial cross-sectional views of computing devices having various combinations of the base portions and display portions described above, viewed along sections B-B and C-C in FIG. 1A. FIGS. 7A-7B depict the computing device in a closed configuration, rather than the open configuration shown in FIG. 1A.

FIG. 7A depicts a partial cross-sectional view of a computing device 700a that includes a display portion 701a and a base portion 703a. The display portion 701a includes a cover 706a attached to a display housing 702a via a joining member 712a, and a display stack 718 within the display housing 702a. The display portion 701a is similar to the display portion 600a (FIG. 6A), and the materials, structure, and function of the display portion 701a (or the components thereof) may be the same as or similar to those of the display portion 600a.

The computing device 700a also includes a base portion 703a that includes a top case 708a coupled to a bottom case 704a via a joining member 710a. The base portion 703a is similar to the base portion 400a (FIG. 4A), and the materials, structure, and function of the base portion 703a (or the components thereof) may be the same as or similar to those of the base portion 400a.

The cover 706a of the display portion 701a and the top case 708a of the base portion 703a may both be formed from the same or similar material, and may be coupled to the display housing 702a and the bottom case 704a, respectively, in similar ways. Accordingly, the side of the computing device 700a may have a consistent and uniform appearance. For example, the common materials and physical integration between the display portion 701a and the base portion 703a provide a substantially symmetric structure (although the exact thicknesses and sizes of the components may vary between the display portion 701a and the base portion 703a). Moreover, where the top case 708a and the cover 706a are formed from the same material, the edges of those components may be similar or identical in appearance (e.g., color, texture, surface polish, etc.).

The components shown in FIG. 7A may be subjected to the same finishing process. For example, the edge of the top case 708a and the edge of the cover 706a may be subjected to the same polishing process and/or may be polished to the same or similar degree of polish (or surface roughness). Further, as noted above, the joining members 710a and 712a may be co-finished along with the top case 708a and the cover 706a so that all of these components have the same or a similar appearance, surface finish, etc.

FIG. 7B depicts a partial cross-sectional view of a computing device 700b that includes a display portion 701b and a base portion 703b. The display portion 701b includes a display stack 720 attached to a display housing 702b via a joining member 712b. The display portion 701b is similar to the display portion 600a (FIG. 6A), and the materials, structure, and function of the display portion 701b (or the components thereof) may be the same as or similar to those of the display portion 600a. The display stack 720 may be the same as or similar to the display stack 624e (FIG. 6E), and may include, for example, a back polarizer, a bottom glass, a top glass, and a front polarizer. These are merely exemplary components or layers of the display stack 720, and more, fewer, or different components may be included in the display stack 720. In some cases, the display portion 701b does not include a separate cover in front of or covering the display stack 720. In such cases, the front-most layer of the display stack 720 may define the user interface surface (e.g., the external surface) of the display portion 701.

The computing device 700b also includes a base portion 703b that includes a top case 708b coupled to a bottom case 704b via a joining member 710b. The base portion 703b is similar to the base portion 400a (FIG. 4A), and the materials, structure, and function of the base portion 703b (or the components thereof) may be the same as or similar to those of the base portion 400.

The display portion 701b and the base portion 703b also include edge trims 714, 716 (respectively) disposed on and/or attached to the edges of the display stack 720 and the top case 708b. The materials, structure, and function of the edge trims 714, 716 may be the same as or similar to those of the edge trim 430. The edge trims 714, 716 may protect the display stack 720 and the top case 708b, for example, by preventing or reducing chipping, cracking, or other damage to the edge of the display stack 720 and the top case 708b. Further, where the display stack 720 and/or the top case 708b include multiple layers, the edge trims 714, 716 may help to prevent delamination of (as well as hide) those layers.

The edge trims 714, 716 may have a same or similar appearance (including color, surface polish, etc.) to each other and/or to other parts of the computing device 700b. For example, the edge trims 714, 716 may be formed from or include the same materials as the joining members 710b, 712b, such that the edge trims 714, 716 and the joining members 710b, 712b have substantially the same appearance (e.g., color, surface finish, etc.) to one another, furthering the uniformity and consistency of the sides of the computing device 700b.

As noted above, a top case for a computing device may be formed from a single, continuous sheet of material, such as glass or ceramic. Where a top case has a relatively large surface area as compared to its thickness, as might be seen in a top case for a notebook computer, reinforcements may be added to or otherwise incorporated with the top case to increase the stiffness, strength, toughness, or other property of the top case (and/or a computing device as a whole). For example, reinforcements may increase the torsional stiffness of the top case, which may in turn increase the torsional stiffness of the computing device as a whole. Such reinforcements may also define regions of higher stiffness and regions of lower stiffness to define input regions having different structural properties, as described herein.

Figure 8A:
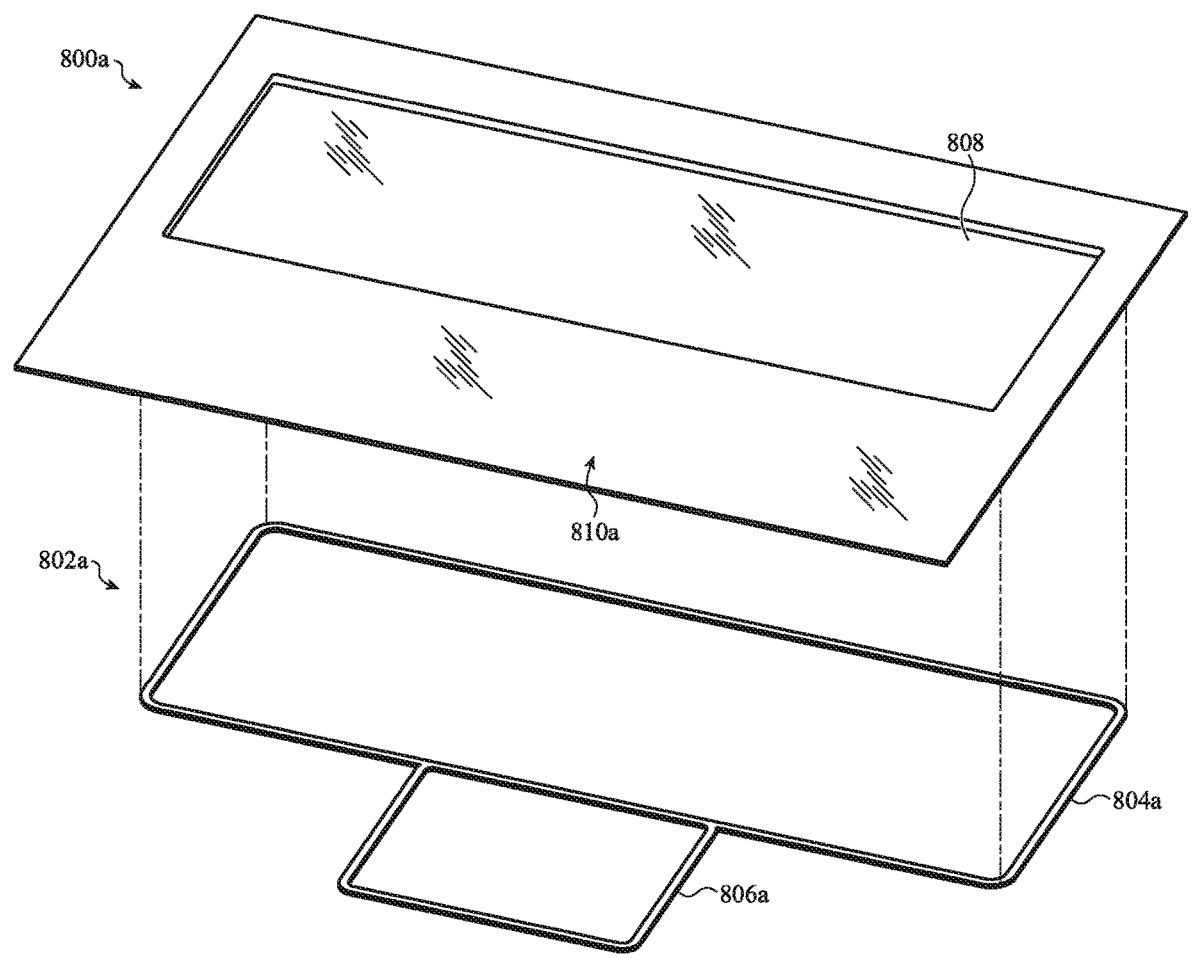
FIGS. 8A-8B depict exploded views of example top cases of a computing device.

FIG. 8A is an exploded view of a top case 800a and a reinforcement frame 802a that may be applied to the top case 800a. As noted above, a top case 800a may define an input surface of an integrated interface system that receives various types of inputs, such as touch and force inputs. Moreover, the integrated interface system may include touch sensors, force sensors, displays, haptic actuators, and the like, that may be attached to or otherwise integrated with the top case 800a. The top case 800a with the reinforcement frame 802a may help define a structural platform for the components integrated interface system, as well as providing an input surface for the integrated interface system. Further, as described herein, reinforcements such as the reinforcement frame 802a may help define input regions or define the physical or mechanical response of the top case 800a to various types of inputs.

The top case 800a may be similar in structure, material, function, etc., to the top case 112 discussed above. For example, the top case 800a may be formed from or include glass, polycarbonate, ceramic, or any other suitable material. In some cases, the top case 800a is a single glass member (e.g., a sheet of glass). The top case 800a may have no seams, holes, or other openings in a top surface of the top case 800a.

The reinforcement frame 802a may be formed from or include any suitable material, such as glass, plastic, carbon fiber, metal, or the like. The reinforcement frame 802a may have any suitable shape. As shown, the reinforcement frame 802a defines a first frame region 804a and a second frame region 806a. The first frame region 804a may be under a keyboard region 808 of the top case 800a. The keyboard region 808, shown here as a recessed portion (which may be rectangular or any other suitable shape) formed in the top case 800a, may be configured to have keys or key mechanisms disposed therein. In other implementations, such as where a virtual keyboard is implemented, the keyboard region 808 may not be defined by or use a recessed portion in the top case 800a. Nevertheless, the reinforcement frame 802a may be used despite the frame not surrounding or corresponding to a recessed portion of the top case 800a.

The reinforcement frame 802a also defines a second frame region 806a, which may be under a palm rest region 810a. The palm rest region 810a may correspond to a region where hands are typically rested when interacting with a notebook computer, and may be part of or define part of a touch-input region of the top case 800a. The palm rest region 810a may include a trackpad region that is differentiated from other portions of the top case 800a. The trackpad region may be a region that receives touch and/or force inputs, such as inputs for cursor control, gesture inputs, multi-touch inputs, and the like. For example, the trackpad region may be defined by a border on the top case 800a, and the second frame region 806a may be positioned under the border. Alternatively, the entire top case 800a (e.g., both keyboard and non-keyboard regions of the top case 800a) may be a touch-input region. In such cases, the second frame region 806a may not correspond to any particular functional or physical borders on the top case 800a. Rather, the second frame region 806a may generally reinforce the palm rest region 810a. Nonetheless, the second frame region 806a may have the shape shown in FIG. 8A. Other shapes and configurations for the reinforcement frame 802a are also contemplated.

The reinforcement frame 802a may also help to limit force or touch inputs that are applied to one region of the top case 800a (e.g., the keyboard region 808) from affecting the top case 800a in another region (e.g., the palm rest region 810a). For example, where a force is applied within the keyboard region 808 (as a result of a user striking a virtual or mechanical key within the keyboard region 808), the reinforcement frame 802a may prevent that force from resulting in a deflection or deformation of the top case 800a in the palm rest region 810a (or it may reduce the deflection or deformation as compared to a top case 800a without a reinforcement frame 802a).

The reinforcement frame 802a may be attached to the top case 800a in any suitable manner. For example, the reinforcement frame 802a may be glued or adhered to the top case 800a with an adhesive (e.g., an HSA, PSA, epoxy, cyanoacrylate, or the like). As another example, the reinforcement frame 802a may be fused to the top case 800a by a sintering and/or annealing process. More particularly, the reinforcement frame 802a may be disposed on the top case 800a, and then the reinforcement frame 802a and top case 800a may be heated to a temperature and for a duration sufficient to cause the reinforcement frame 802a to fuse to the top case 800a.

Figure 8B:
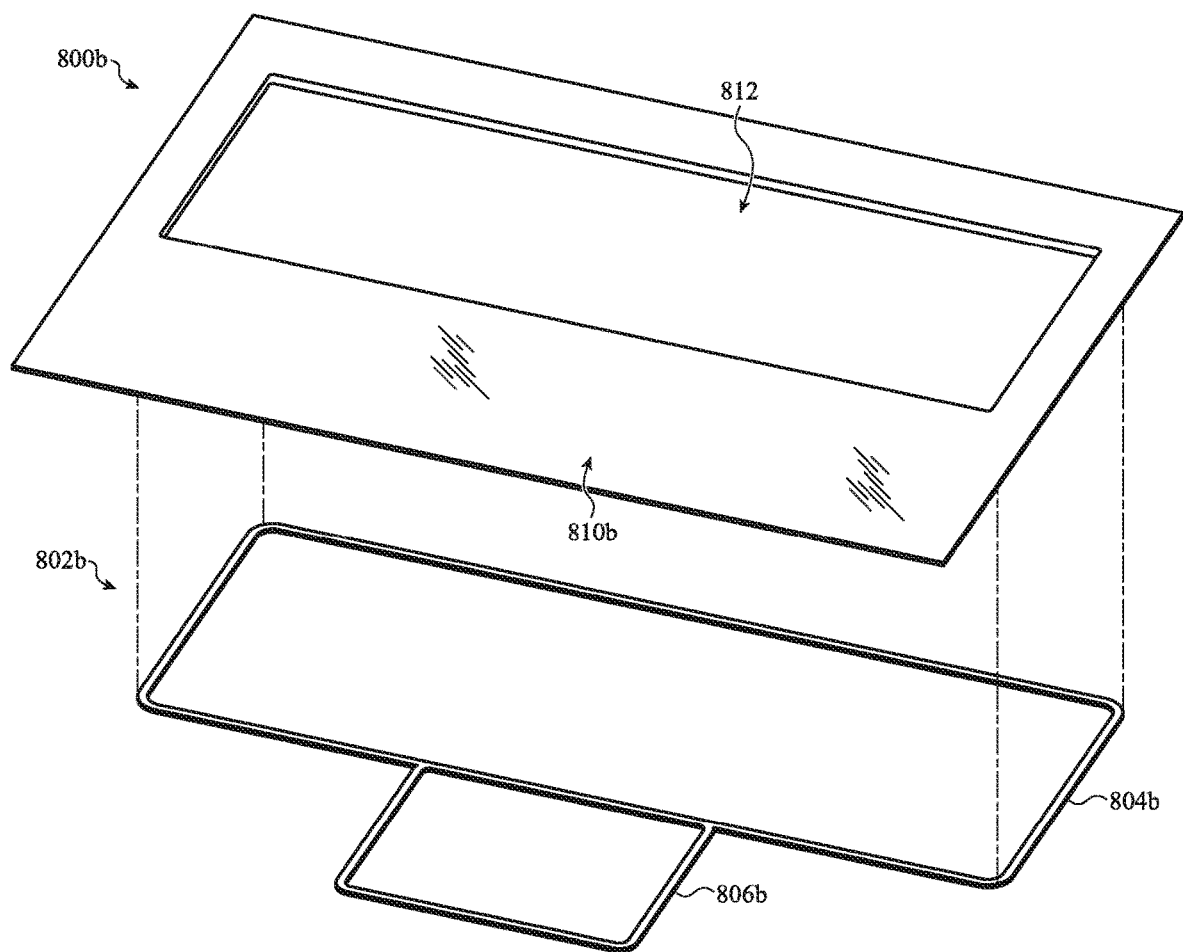

FIG. 8B is an exploded view of a top case 800b and a reinforcement frame 802b that may be applied to the top case 800b. The materials, structure, and function of the top case 800b and the reinforcement frame 802b may be the same as or similar to the top case 800a and the reinforcement frame 802a discussed above with respect to FIG. 8A. However, as shown in FIG. 8B, the top case 800b may include an opening 812 (e.g., a rectangular opening) instead of a recessed portion of the top case 800a. The opening 812 may correspond to a keyboard region, and it may be configured to accommodate or receive a keyboard. For example, a keyboard that includes a plurality of key mechanisms (e.g., keycaps, keycap support mechanisms, key-make sensors or switches, or the like) coupled to a carrier plate (e.g., a circuit board or other substrate) may be positioned in the opening 812. Where an opening in a top case is configured to at least partially receive and/or frame a keyboard, the opening may be referred to as a keyboard opening. In embodiments where a top case has a keyboard opening, the keyboard opening may be the only opening in the top surface of the top case, and the remaining portions of the top case may be continuous (e.g., have no additional openings, seams, gaps, discontinuities, or the like).

Figure 9A:
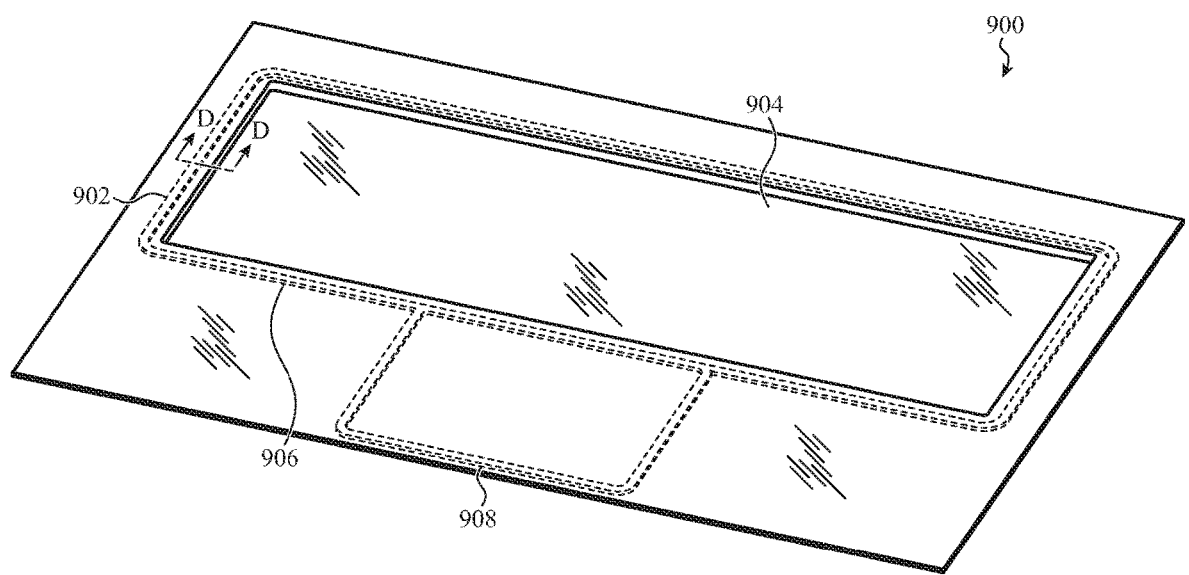
FIG. 9A depicts an exploded view of another example top case for a computing device.

FIG. 9A depicts an example top case 900 with a reinforcing rib structure 902 integrally formed with the top case 900. The reinforcing rib structure 902 may perform the same or similar function as the reinforcement frame 802a in FIG. 8A. As shown in FIG. 9A, the rib structure 902 has a shape that is substantially similar to the reinforcement frame 802a in FIG. 8A, with a first rib portion 906 under a keyboard region 904, and a second rib portion 908 under a palm rest region.

Figure 9B:
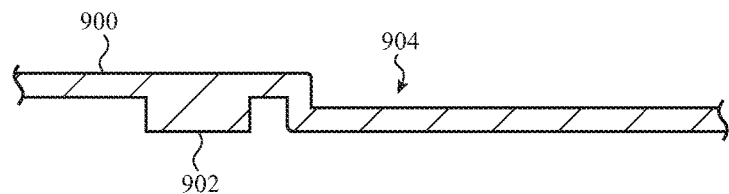
FIG. 9B depicts a partial cross-sectional view of the top case of FIG. 9A, viewed along section D-D in FIG. 9A.

FIG. 9B depicts a partial cross-sectional view of the top case 900, viewed along section D-D in FIG. 9A. FIG. 9B depicts a portion of the reinforcing rib structure 902 that supports or reinforces the keyboard region 904. As shown, the reinforcing rib structure 902 and the top case 900 form a monolithic structure. For example, the reinforcing rib structure 902 may be formed by machining, etching, ablating, or otherwise removing material from a single sheet of material (e.g., glass). As another example, the reinforcing rib structure 902 may be formed by a molding or slumping process in which the top case 900 is heated and conformed to a mold that defines the reinforcing rib structure 902 (as well as other features and/or shapes of the top case 900, such as the keyboard region 904 or other areas of high or low relief).

Figure 10:
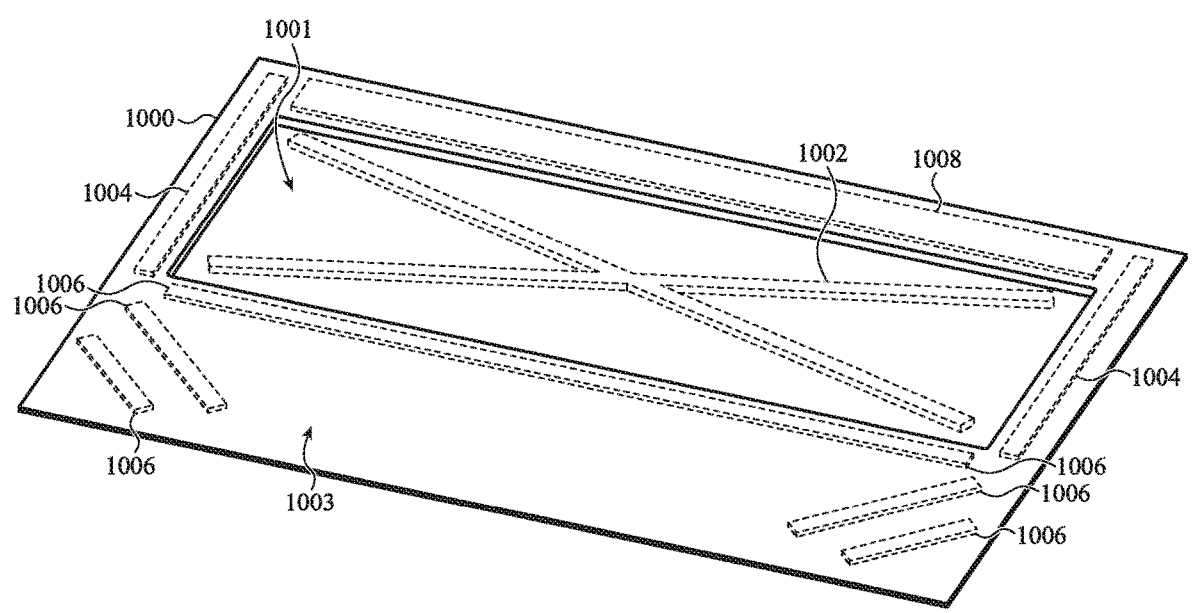
FIG. 10 depicts another example top case for a computing device.

FIG. 10 depicts an example top case 1000 with multiple reinforcing members 1002, 1004, 1006, and 1008 attached to the bottom surface of the top case 1000. For example, the reinforcing members 1002 are attached to an area of the top case 1000 that corresponds to a keyboard region 1001. The reinforcing members 1002 may stiffen or otherwise reinforce the keyboard region 1001. For example, the reinforcing members 1002 may help prevent or reduce deformation or deflection of the keyboard region 1001 as a result of typing inputs (either applied directly to the top case 1000 or to a key mechanism coupled to the top case 1000). As shown, the reinforcing members 1002 form an "x" shape, though other configurations and shapes are also possible. Also, while the keyboard region 1001 in FIG. 10 is recessed relative to other parts of the top case 1000, the reinforcing members shown and described in FIG. 10 may be used with other top case configurations, such as substantially flat (e.g., planar) top cases that do not have a recessed keyboard region.

Other reinforcing members may be attached to other areas of the top case 1000. For example, the reinforcing members 1004 are attached to the top case 1000 along the sides of the keyboard region 1001, and the reinforcing member 1008 is attached to the top case 1000 along the top of the keyboard region 1001. These reinforcing members may similarly provide added stiffness or strength to the top case 1000 (and to the computing device more generally), and may help isolate forces applied to one region of the top case 1000 (e.g., to the keyboard region 1001) from causing deformations or deflections in other regions of the top case.

The reinforcing members 1006 are coupled to the top case 1000 in a palm rest region 1003 that is below the keyboard region 1001. The reinforcing members 1006 are positioned to leave a relatively large central region unreinforced. The unreinforced region may correspond to or define a trackpad or other touch or force sensitive input region that is configured to receive touch and/or force based inputs, such as gestures (e.g., swipes, pinches), multi-touch inputs, clicks, and the like. In some cases, a trackpad or other touch/force sensitive input region is configured to deform or deflect in response to certain inputs. These deflections or deformations may be used to determine an amount of force applied to the input region and to determine when a user input corresponds to a selection or a "click." In such cases, leaving the input region substantially unreinforced may facilitate and permit the input region to deform sufficiently for the touch and/or force detection. Reinforcing members may also be included (or strategically omitted) to create haptic or tactile feedback regions, such as by isolating haptic outputs from a particular haptic actuator or device to a localized region that is less than the entire top case of a device.

As noted above, a glass (or other light-transmissive material) top case on a computing device, such as the top case 112, may be used as a light guide or light pipe for illuminating portions of the top case, such as keys, a keyboard region, displays, and the like. More particularly, an integrated interface system that includes a glass or light-transmissive top case may illuminate portions of the top case to improve the visibility, readability, or otherwise produce a desired appearance for the integrated interface system. FIGS. 11A-11E show how a light source may be integrated with a computing device to illuminate a top case of an integrated interface system.

Figure 11A:
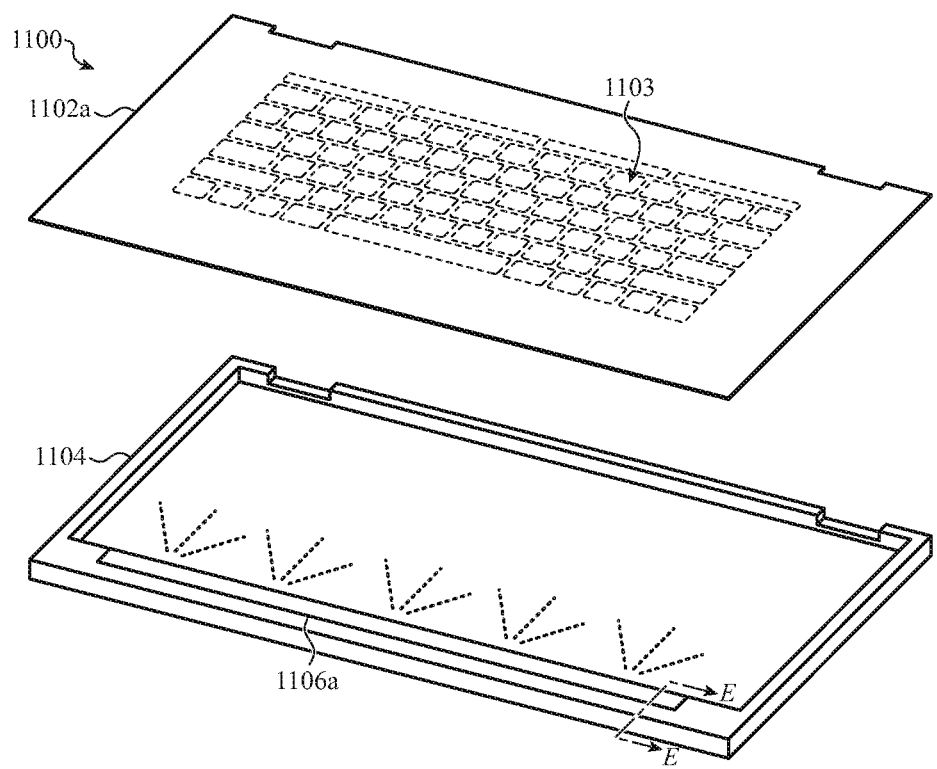
FIG. 11A depicts an exploded view of an illuminated base portion for a computing device.

FIG. 11A depicts an exploded view of a base portion 1100 of a computing device (e.g., a notebook computer) that includes a top case 1102a and a bottom case 1104. The top case 1102a and the bottom case 1104 may be similar in structure, material, function, etc., to any of the top cases and bottom cases described herein. For example, the top case 1102a may be formed from or include a glass, ceramic, or other light-transmissive material.

The base portion 1100 also includes a light source 1106a. The light source 1106a may include one or more individual lighting elements, such as LEDs, OLEDs, incandescent elements, fluorescent elements, or the like. The light source 1106a is configured as a light bar, and is positioned along a side of the base portion 1100 that is adjacent the bottom of a keyboard region 1103 on the top case 1102a (e.g., along a side of the base portion 1100 that is opposite the side that joins a display portion of the device).

Figure 11B:
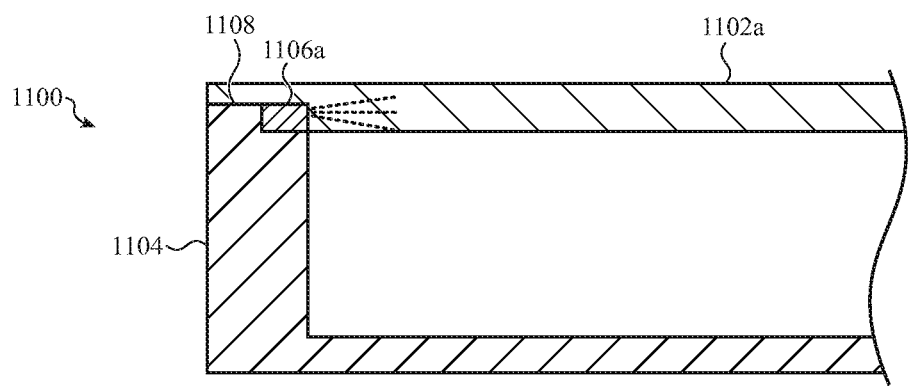
FIG. 11B depicts a partial cross-sectional view of the base portion of FIG. 11A, viewed along section E-E in FIG. 11A.

FIG. 11B depicts a partial cross-sectional view of the base portion 1100, viewed along section E-E in FIG. 11A. The light source 1106a is positioned in a recess 1108 formed into the edge of the top case 1102a, though other locations are also possible. In particular, the light source 1106a may be positioned in any position such that light emitted from the light source 1106a is directed or coupled into the top case 1102a (e.g., into an edge of the top case 1102a). In some cases, the light source 1106a may be positioned away from the edge of the top case 1102a, and light guides, light pipes, or other mechanisms may direct the light from the light source to the edge of the top case 1102a.

Figure 11C:
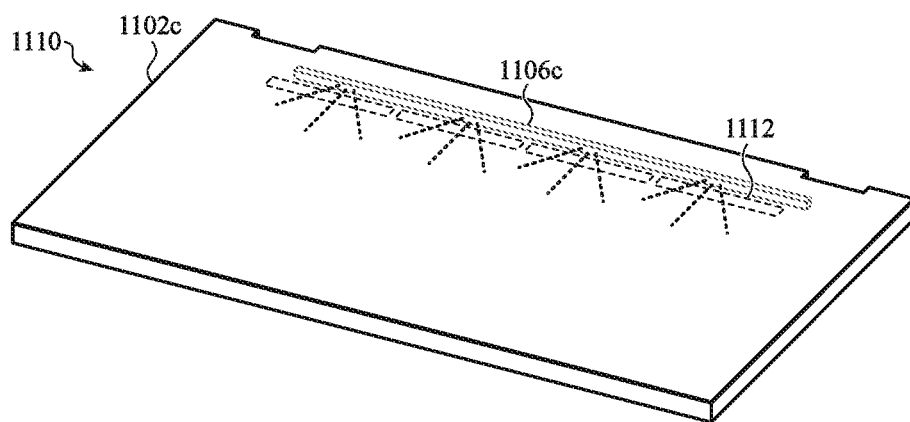
FIGS. 11C-11E depict example illuminated base portions in accordance with FIGS. 11A-11B.

By directing light into a top case, a light source may be used to illuminate various regions and/or components of a device. FIG. 11C, for example, depicts an example computing device 1110 with a light source 1106c. The computing device 1110 includes a top case 1102c and a display 1112, which may be positioned to display buttons and/or other affordances on a top case 1102c in a region above a keyboard (e.g., between the keyboard and a display portion of the device). This region may be referred to as a virtual key region, and may replace or complement a conventional row of "function" keys on a conventional keyboard. Moreover, the virtual key region may be configured to present different keys, buttons, or affordances depending on an operational state of the device, such as the particular program that is being executed, what is being displayed on an associated display screen, or the like. For example, the affordances may be selected, from a group of candidate affordances, based on their relevance to and/or ability to control a user interface that is being displayed on a primary display of a device (e.g., the display 204). The display 1112 may include components such as liquid crystal layers (which may be coupled to the top case 1102c), and the light source 1106c may provide illumination for the display 1112. As shown, the virtual key region includes multiple segments. These segments may correspond to a single underlying display, or multiple displays (e.g., a separate display for each segment). The display 1112 may represent a single display that spans multiple segments, or one display, of a group of displays, that corresponds to a single segment.

Because the display 1112 is positioned above a keyboard, the light source 1106c is positioned along the edge of the top case 1102c that is above the keyboard (e.g., proximate a display portion of a notebook computer). In some cases, the display 1112 may not require a separate back light, such as where the display 1112 is an OLED display. In such cases, the light source 1106c may be positioned elsewhere to illuminate other areas of the top case 1102c, such as a keyboard region, which may include mechanical keys, virtual keys, or a combination of mechanical and virtual keys.

Figure 11D:
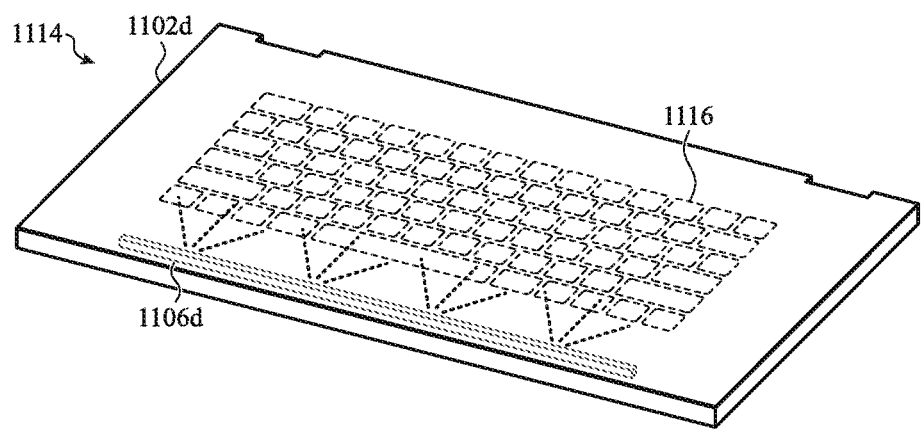

FIG. 11D depicts an example computing device 1114 with a light source 1106d positioned as shown in FIGS. 11A-11B. The computing device 1114 includes a top case 1102d and a keyboard region 1116. The keyboard region 1116 may include or be associated with a display that displays virtual keys and/or other affordances, or it may include or be associated with a mechanical keyboard (e.g., key mechanisms coupled to the keyboard region 1116 of the top case 1102d). Where the keyboard region 1116 includes or is associated with a display, the light source 1106d may provide illumination for the display. Where the keyboard region 1116 includes or is associated with a mechanical keyboard, the light source 1106d may illuminate keycaps, portions of the top case that frame (or that are visible between) the keycaps, or other portions of the keyboard region 1116.

In some cases, the keyboard region 1116 may include individual key regions that are not associated with traditional mechanical keys. For example, individual key regions may be defined by paint, etching, textures, masked regions, or other indicators disposed or formed on the top case 1102d. As one specific example, individual key regions in the keyboard region 1116 may be defined by masked (e.g., substantially opaque) regions framed or otherwise visually distinguished by unmasked (e.g., transparent or translucent) regions. When illuminated by the light source 1106d, light may pass through the unmasked regions (and/or unmasked glyphs or characters within the masked regions), thereby visually defining and distinguishing the keys.

Figure 11E:
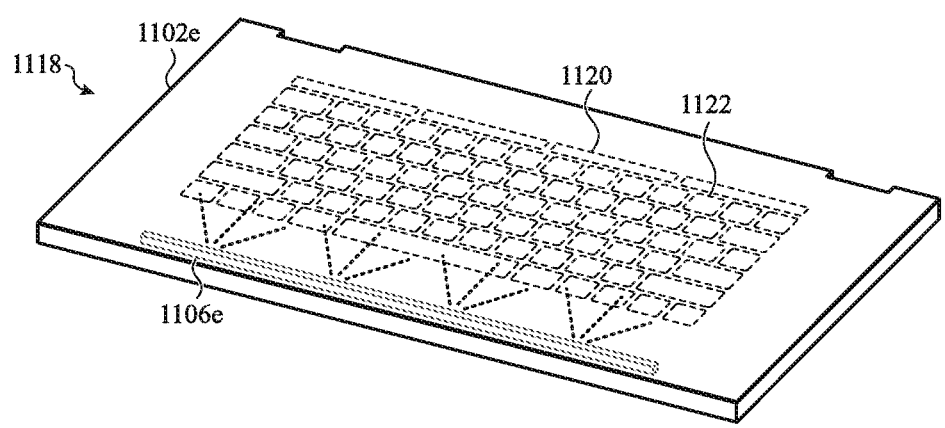

FIG. 11E depicts an example computing device 1118 with a light source 1106e positioned along a bottom side of the top case 1102e. As shown, the top case includes a keyboard 1122, which may be a mechanical keyboard or a virtual keyboard. Where the keyboard 1122 is a virtual keyboard, the computing device 1118 may include a display below the top case 1102e to produce images of the keys. The display may be configured to produce images of keys for a virtual key region 1120, which may be above a keyboard (e.g., between the keyboard and a display portion of the device) and may be configured to present different keys in the virtual key region depending on an operational state of the device, as described above. The light source 1106e may be configured to provide illumination to the display to illuminate the keyboard 1122 and the virtual key region 1120. Alternatively, in cases where the virtual key region 1120 is associated with its own display and light source (e.g., where the virtual key region 1120 includes an OLED display), the light source 1106e may be configured only to illuminate the keyboard 1122 or the display that produces the key images of the keyboard 1122.

Figure 11F:
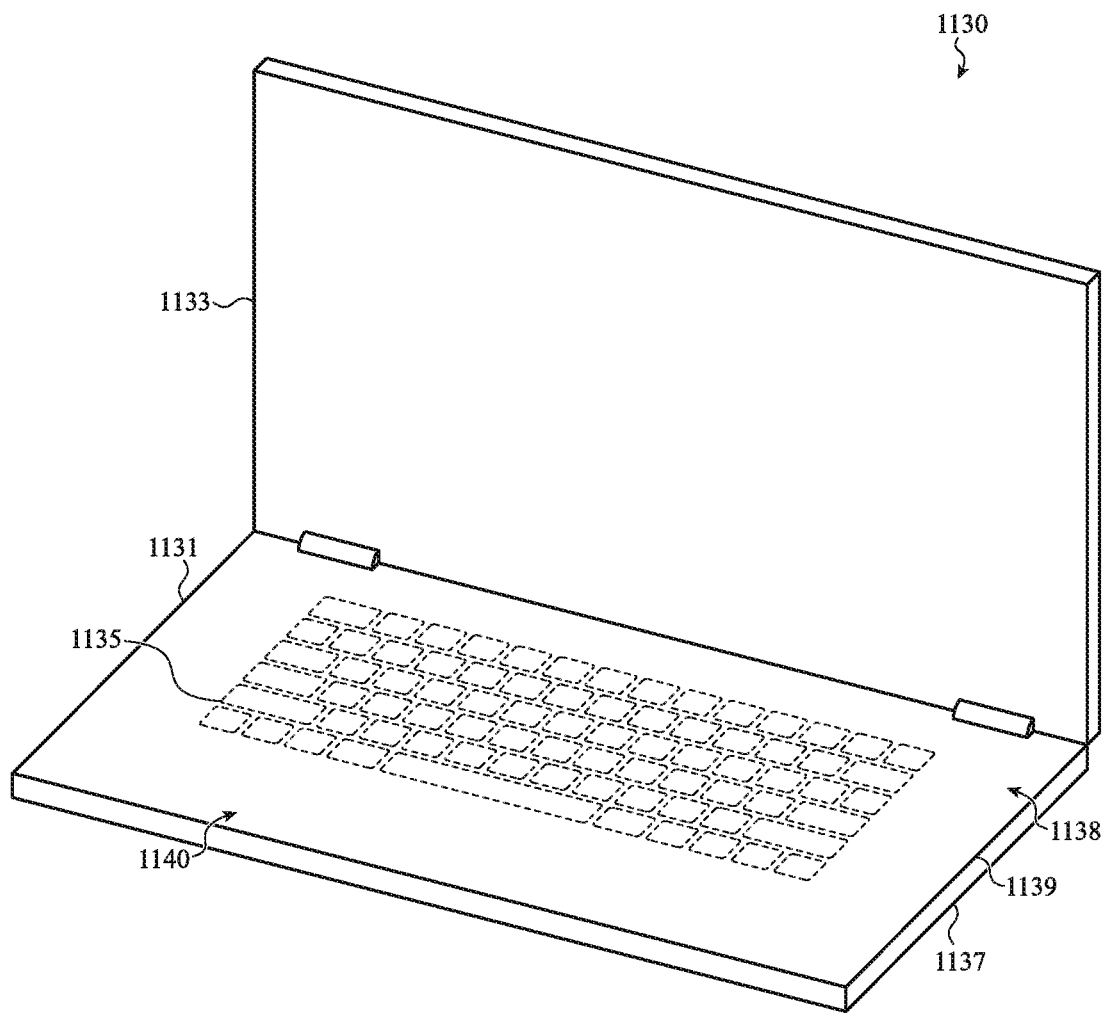
FIGS. 11F-11G depict an example illuminated computing device.
Figure 11G:
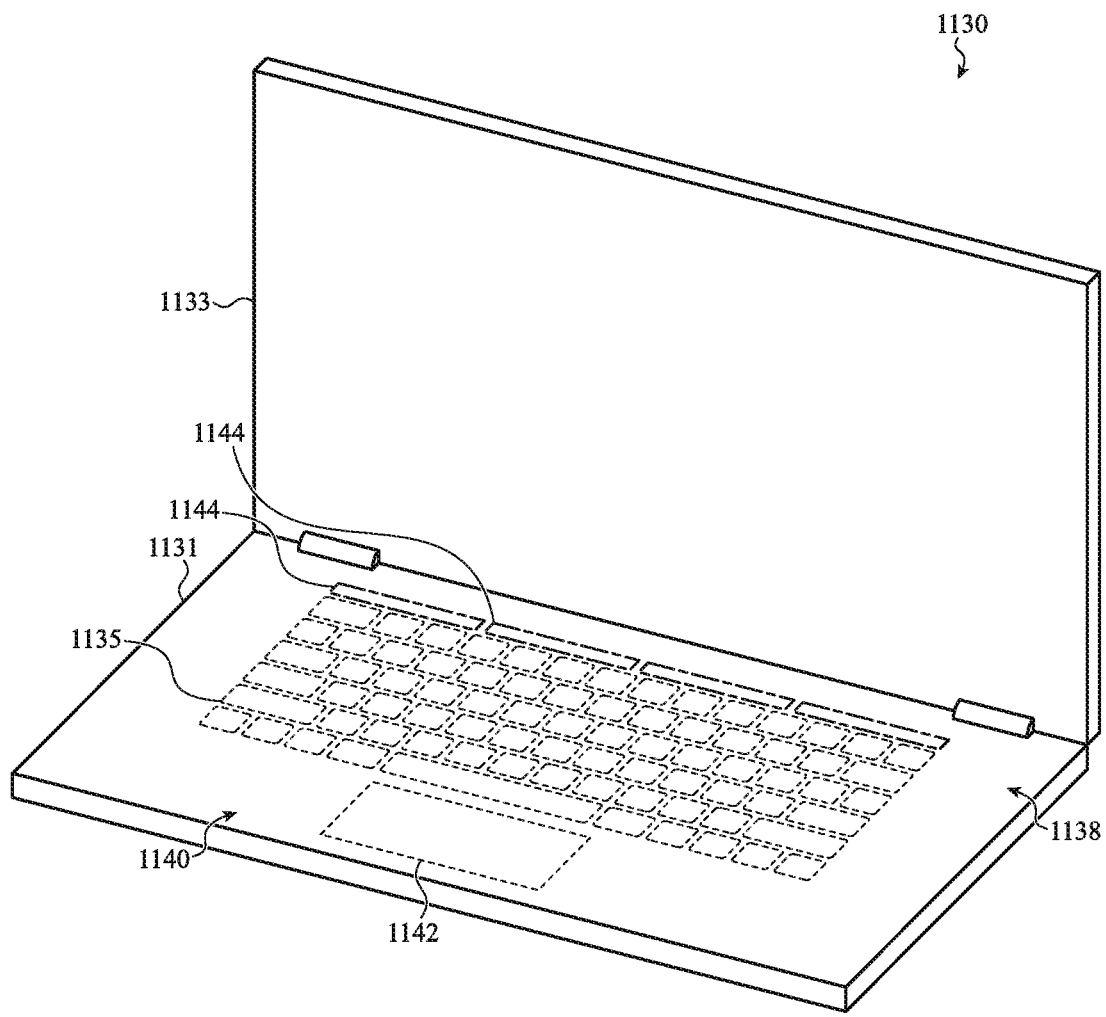

In some cases, keys, virtual key regions, trackpad regions, and/or other input regions (or other graphics, glyphs, symbols, or the like) may be shown by backlighting a masked surface with openings that define the keys, regions, and/or other graphics. FIGS. 11F-11G depict an example computing device 1130 in which various regions on a top case are defined by openings in an opaque mask, which are made visible by supplying light below the opaque mask.

FIGS. 11F-11G depict an example computing device 1130 that includes a base portion 1131 coupled to a display portion 1133. The base portion 1131 may include a bottom case 1137 and a top case 1139. The top case 1139 and the bottom case 1137 may be similar in structure, material, function, etc., to any of the top cases and bottom cases described herein. The top case 1139 may be formed of a light-transmissive material, and may be associated with a patterned mask, as described herein. The computing device 1130 also includes a keyboard 1135, which may be a mechanical keyboard, a display that produces images of keys, or, as described herein, a keyboard defined by openings in an opaque masking region.

The computing device 1130 also includes a first region 1138 above the keyboard 1135 and a second region 1140 below the keyboard 1135. The first and second regions 1138, 1140 may be touch and/or force sensitive input regions, as described herein, and may be associated with a patterned mask that defines input region borders, glyphs, symbols, or the like. As shown in FIG. 11F, the first and second regions 1138, 1140 are substantially featureless, corresponding to a mode in which no illumination is provided below a patterned mask that is associated with the top case 1139. FIG. 11G shows the computing device 1130 with active illumination, revealing virtual input regions 1144 in the first region 1138 and a trackpad region 1142 in the second region 1140. The virtual input regions 1144 and the trackpad region 1142 may be defined by openings (e.g., perforations or micro-perforations) in an opaque mask material associated with the top case 1139, which are illuminated from below the mask. Light guides, light extraction features, or other optical components underlying or integrated with the top case 1139 may help couple light to the openings in the patterned mask to facilitate illumination of the patterns.

Because the mask and illumination are positioned below the top case 1139, the virtual input regions 1144 and the trackpad region 1142 may be not visible when the illumination is inactive, thus allowing the first and second regions 1138, 1140 to be operative to receive touch and/or force inputs without any borders or boundaries. When the illumination is active, however, the additional input region definitions may correspond to different functionality. For example, when illumination is not present, substantially all of the second region 1140 may act as a touch and/or force sensitive track pad. When illumination is present, the device 1130 may respond differently to touch and/or force inputs applied within the trackpad region 1142 than inputs applied to portions of the second region 1140 outside the trackpad region 1142.

Figure 11H:
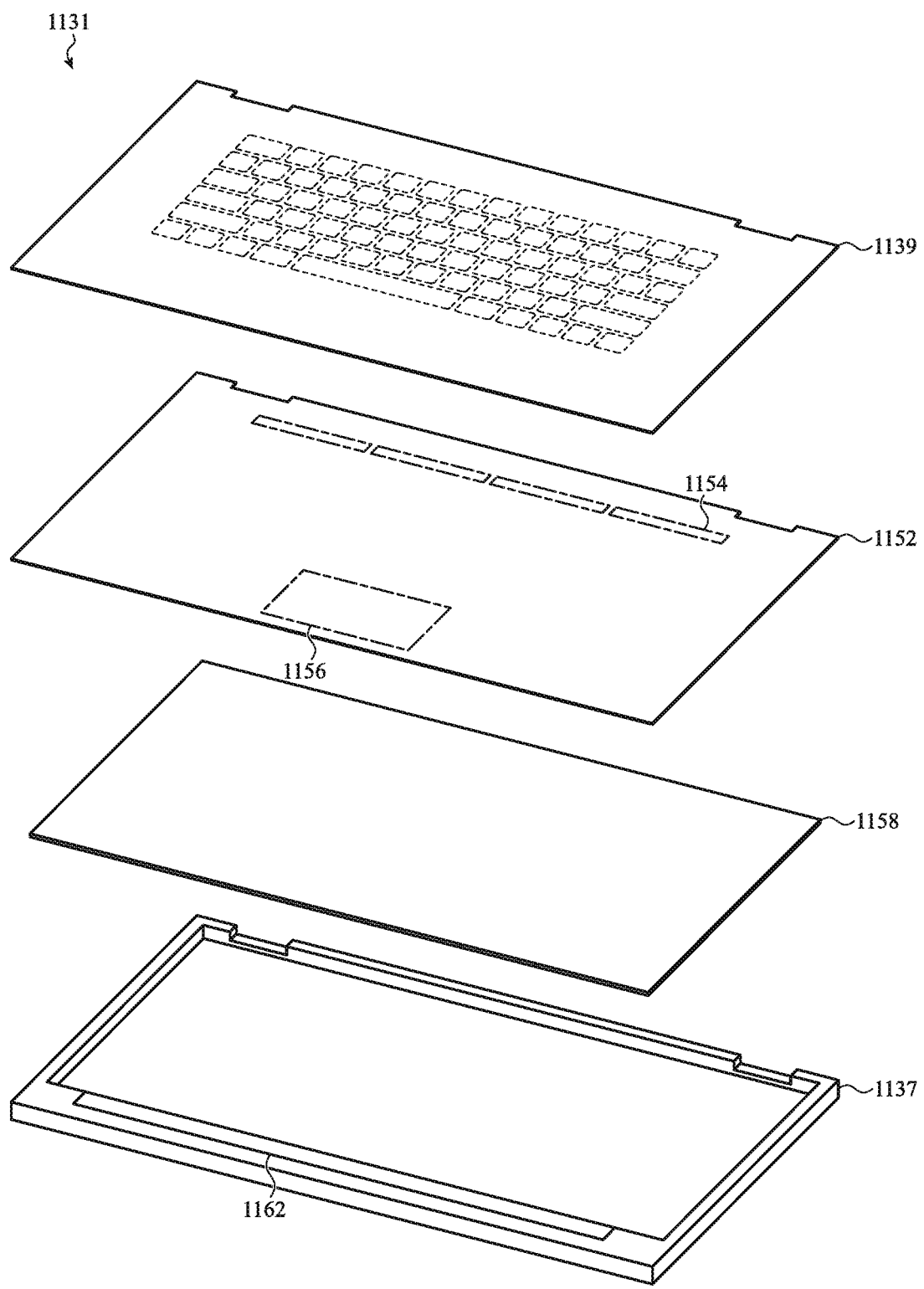
FIG. 11H depicts an example illuminated base portion in accordance with FIGS. 11F-11G.

FIG. 11H is an exploded view of the base portion 1131 of FIG. 11F. The base portion 1131 includes the top case 1139, the bottom case 1137, a mask layer 1152, and a light guide 1158. The base portion 1131 also includes a light source 1162 that is configured to direct light, when the base portion 1131 is assembled, into the light guide 1158.

As noted above, the top case 1139 may be formed from a light-transmissive material, such as glass, plastic, ceramic, or the like. The mask layer 1152 may be an opaque or substantially opaque material, such as an ink, dye, polymer layer, or other material. The mask layer 1152 may have patterns 1154, 1156 defining the virtual input regions 1144 and the trackpad region 1142, respectively. The patterns 1154, 1156 may be or may include a series of perforations or micro-perforations, or larger gaps in the mask material. The mask layer 1152 may be deposited on a bottom surface of the top case 1139 or a top surface of the light guide 1158. For example, the mask layer 1152 may be an ink, dye, or adhesive sheet that may be bonded or otherwise applied to the light guide 1158 or the top case 1139. In other cases, the mask layer is a separate component (e.g., an opaque polymer sheet) that may have at least some surfaces that are not bonded or adhered to the top case 1139 or the light guide 1158.

The light guide 1158 may be a light-transmissive material that receives light from the light source 1162 and directs the light toward the patterns 1154, 1156 of the mask layer 1152. The light guide 1158 is shown having substantially a same area as the mask layer 1152 and top case 1139. In some cases, the light guide 1158 may be configured and shaped to direct light substantially only to the patterns 1154, 1156 of the mask layer 1152.

As shown, the mask layer 1152 includes patterns 1154, 1156 that correspond to the virtual input regions 1144 and the trackpad region 1142. In other cases, it may define additional or other input regions, graphics, keys (e.g., all or some of the keys of the keyboard 1135), symbols, or the like. Further, while a single light guide 1158 and a single light source 1162 are shown, multiple light guides and/or light sources may be implemented to allow for selective illumination of the illuminable features. For example, the virtual input regions 1144 may be illuminable separately from the trackpad region 1142 (e.g., one can be on while the other is off). Further, the mask layer 1152 may also include patterns that correspond to the keys of the keyboard, which also may be selectively illuminated. When the keys, trackpad region 1142, and the virtual input regions 1144 are all unilluminated, the top case 1139 may have a substantially uniform appearance (e.g., it may appear to be a uniform glossy black surface).

As described above, key input functionality may be provided by an integrated interface system in various ways. For example, an integrated interface system may include or be configured to detect inputs from a keyboard having mechanical keys. Alternatively or additionally, an integrated interface system may include or be configured to detect inputs from a virtual keyboard displayed on a top case of the integrated interface system. More particularly, the integrated interface system may include a display that produces images of keys or other affordances on an otherwise featureless (e.g., flat) surface, such as the top case of an integrated interface system. A virtual keyboard may also or instead include static key regions (e.g., defined by paint, masks, or other visual indicia) on a featureless surface of a top case. Also, various combinations of these types of keyboards may be used in a single integrated interface system. For example, one portion of a keyboard for an integrated interface system may include mechanical keys, while another portion may include a virtual keyboard (or one or more virtual keys, buttons, or other affordances).

Top cases of integrated interface systems as described herein, such as continuous top cases formed of glass or ceramic materials, may be configured to accommodate any one or any combination of these types of keyboards. For example, FIGS. 12A-15B relate to example computing devices that include integrated interface systems with both mechanical keys and virtual keys, while FIGS. 16A-17B relate to example computing devices that include integrated interface systems with only virtual keys. As another example, an integrated interface system may include only mechanical keys.

Figure 12A:
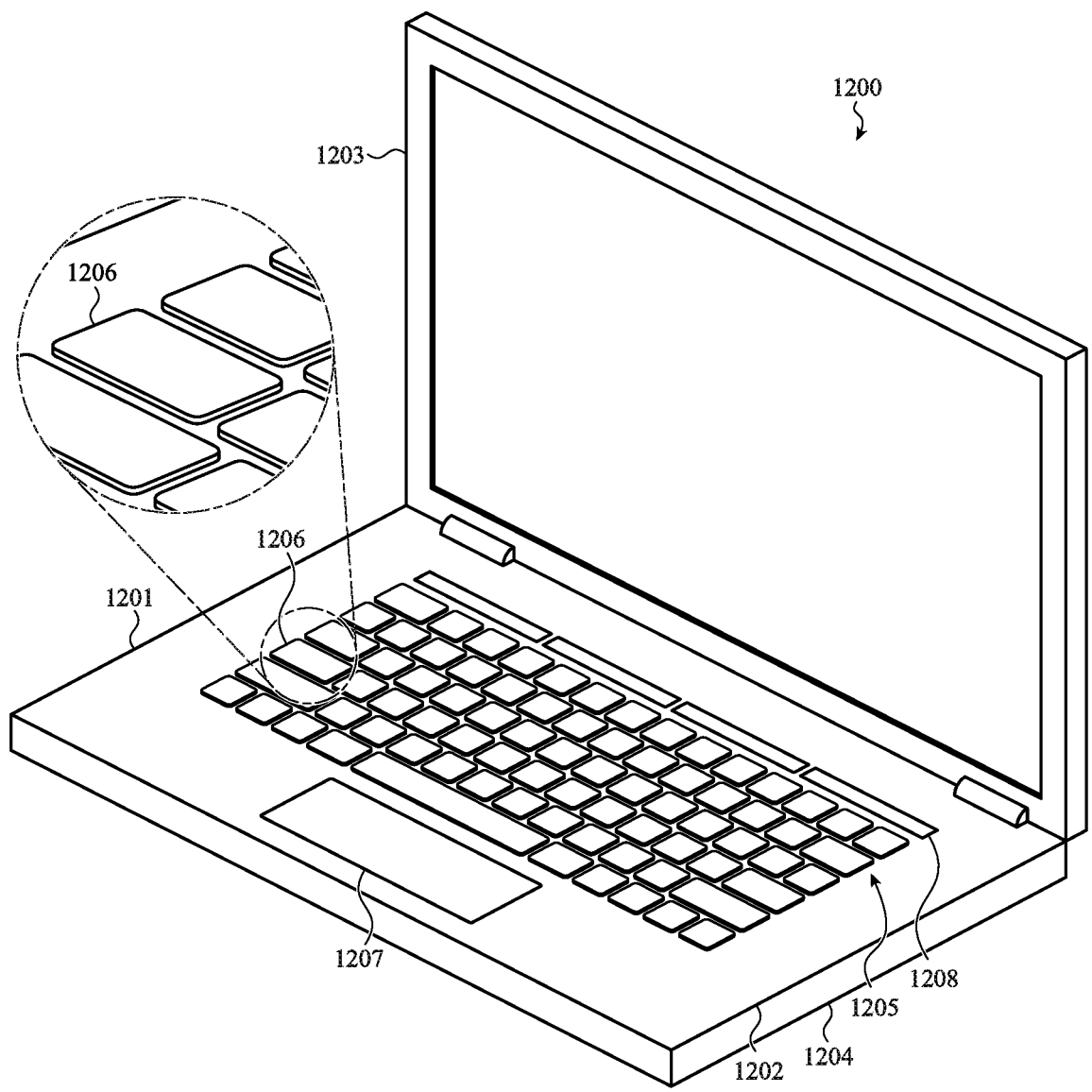
FIG. 12A depicts an example computing device having a flat top case.

FIG. 12A depicts an example computing device 1200 that includes a base portion 1201 coupled to a display portion 1203. The base portion 1201 may include a bottom case 1204 and a top case 1202. The top case 1202 and the bottom case 1204 may be similar in structure, material, function, etc., to any of the top cases and bottom cases described herein. The computing device 1200 also includes a mechanical keyboard 1205 and a virtual key region 1208. (The virtual key region 1208 may be omitted and/or replaced with additional mechanical keys, such as with a row of mechanical "function row" keys.) The computing device 1200 may also include a conventional trackpad 1207, or it may omit the trackpad 1207. In the latter case, a trackpad region may encompass larger areas of the base portion 1201 than the trackpad 1207, including substantially the entire area of the top case 1202 below the keyboard (e.g., the palm rest region), the areas along the lateral sides of the keyboard, and even the keyboard itself.

The keys of the mechanical keyboard 1205 (such as a representative key 1206) may include suitable mechanisms and components for receiving inputs, providing a tactile response and/or motion in response to the inputs, and for allowing the computing device 1200 to detect key actuations. The keys may be coupled to the top case 1202 in any suitable way, such as with adhesive, mechanical clips, fasteners, or the like. Example key mechanisms and attachment techniques are discussed herein.

The virtual key region 1208 (which may include multiple segments) may include or be associated with one or more displays that is positioned under the top case 1202 (e.g., within an interior volume of the base portion 1201). The virtual key region 1208 may also include or be associated with touch sensors that detect touch inputs applied to the virtual key region 1208, as described herein. The virtual key region 1208 may dynamically display different buttons, keys, affordances, images, or the like, based on different operating modes of the device 1200. For example, the virtual key region 1208 may display a first set of affordances (and optionally other information) when a user of the device 1200 is interacting with a first application, and a second set of affordances (and optionally other information) when the user is interacting with a second application. When an input, such as a touch or force input, is detected at a position on the virtual key region 1208, the device 1200 will take a particular action based on the affordance that is displayed on that position at the time the input was detected. Thus, if the virtual key region 1208 is displaying function keys (e.g., F1-F12 keys), an input on a particular function key may cause the device 1200 to take actions associated with that particular function key. If the virtual key region 1208 is displaying a slider for controlling a volume of the device 1200, an input on the slider (e.g., a swipe or gesture input) may result in the device 1200 adjusting its output volume.

The top surface of the top case 1202 may be substantially flat (e.g., planar). In particular, the top case 1202 may be substantially featureless, lacking substantial recesses, openings, or areas of high and/or low relief. For example, the top case 1202 may be a substantially smooth, planar sheet of glass or ceramic. In such cases, the keys of the mechanical keyboard 1205 may extend above the top surface of the top case 1202, which may interfere with the display portion 1203 when the computing device 1200 is in a closed configuration. In such cases, the top case 1202 (e.g., the entire top case) may be recessed relative to a rim or edge of the bottom case 1204, such that a gap exists between the top case 1202 and the display portion 1203 when the device 1200 is closed. The mechanical keyboard 1205 may have a size or height to fit inside the gap without contacting the display portion 1203.

Where a transparent glass or ceramic (or other material) is used, the top case 1202 may be suited for use with keyboards that have both mechanical keys and virtual keys, as the transparency allows the top case 1202 to act as a cover (and input surface) for a display of a virtual keyboard.

Figure 12B:
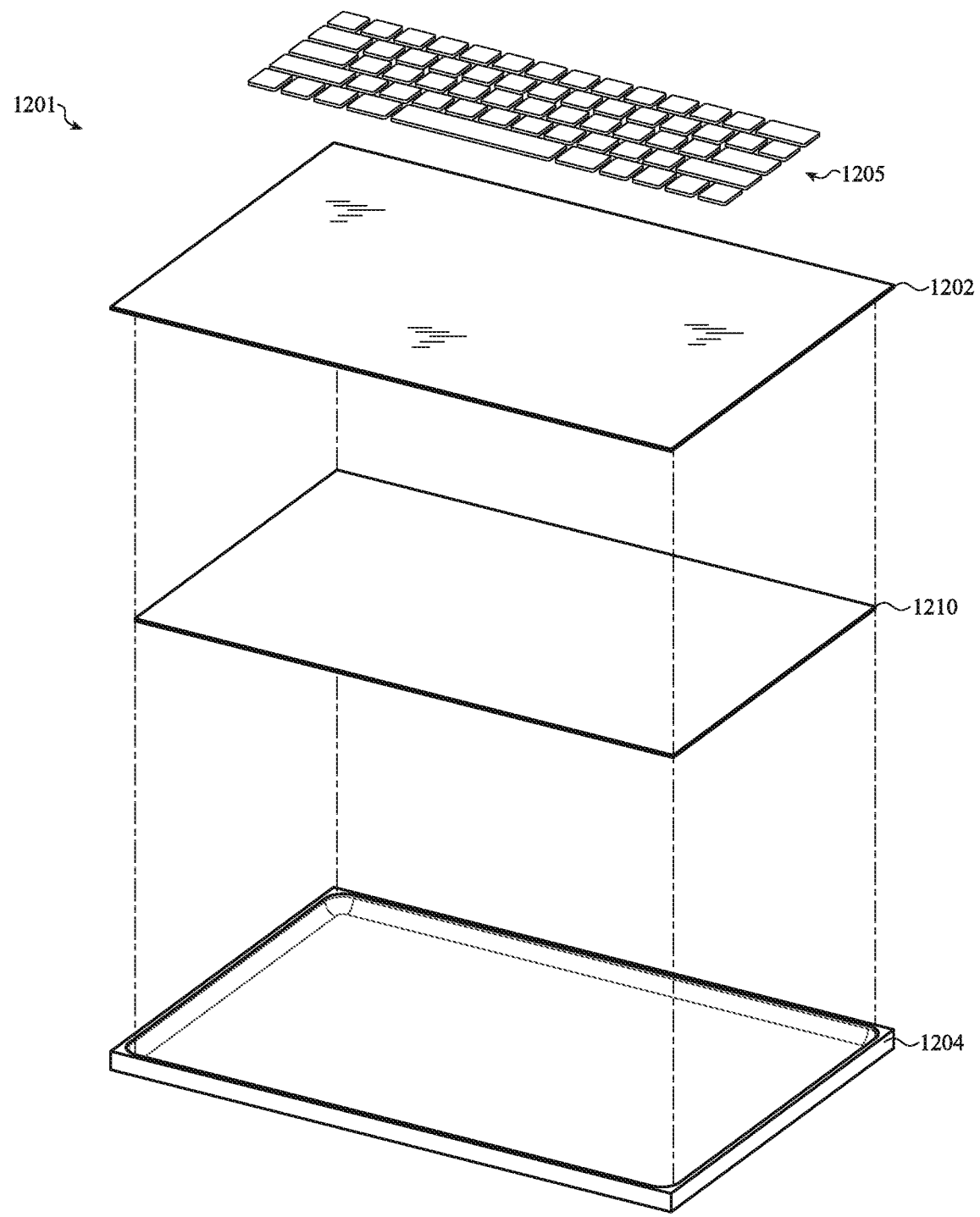
FIG. 12B depicts an exploded view of a base portion of the example computing device of FIG. 12A.

FIG. 12B is an exploded view of the base portion 1201 of FIG. 12A. The base portion 1201 shows the mechanical keyboard 1205, the top case 1202, the bottom case 1204, and a touch and/or force sensor 1210 below the top case 1202. The touch and/or force sensor 1210 may be disposed within an interior volume defined by the top case 1202 and the bottom case 1204.

The keyboard 1205 may comprise multiple discrete keys and/or key mechanisms, or it may be a pre-assembled structure that includes the keys held captive to a base plate or otherwise coupled together. The discrete keys or the pre-assembled key structure may be coupled directly to a top surface of the top case 1202, as described herein.

The touch and/or force sensor 1210 may include various touch and/or force sensing components, such as capacitive sensing elements, resistive sensing elements, or the like. The touch and/or force sensor 1210 may be configured to sense inputs applied to the top case 1202, and may sense selections of keys of the keyboard 1205, selections of affordances on the virtual key region 1208 (FIG. 12A), and/or touch inputs (e.g., clicks, taps, gestures, multi-touch inputs) applied to other areas of the top case 1202. The touch and/or force sensor 1210 may be configured to detect inputs without regard to a force component, such as detecting only a location of one or more touch inputs. The touch and/or force sensor 1210 may also or instead be configured to detect a force component of one or more touch inputs, such as by determining an amount of deflection of the top case 1202 caused by a touch input. For simplicity, the touch and/or force sensor 1210, as well as the touch and/or force sensors 1310, 1311, 1321, 1347, 1372, 1410, and 1510, are referred to herein simply as touch sensors. It will be understood that these sensors may provide touch input functionality, force input functionality, or both.

With respect to detecting selections of mechanical keys, the top case 1202 may be a continuous sheet of material, and as such may lack openings or holes allowing the keys to mechanically couple to components within the base portion 1201. As a result, it may not be possible to use traditional key mechanisms for detecting key presses, because there is no direct access to the electronic components of the device 1200 through the top case 1202. Accordingly, the touch and/or force sensor 1210 may use the same sensing technology (e.g., capacitive sensing) that is used to detect touch inputs in non-keyboard regions (e.g., a trackpad region) to determine when a key has been selected. Where the top case 1202 is glass or ceramic or another dielectric material, the dielectric properties of the top case 1202 may permit the touch and/or force sensor 1210 to detect the presence and/or location of fingers on the keyboard 1205 as well as the non-keyboard regions of the base portion 1201.

The touch sensor 1210 may be substantially planar, or may include a substantially planar assembly, that is adjacent (or otherwise proximate) the top case 1202. The planar shape of the touch sensor 1210 may complement the planar surface of the top case 1202. In cases where the top case 1202 has ribs, frames, or other reinforcements on the interior-facing surface of the top case 1202, the touch sensor 1210 may have openings, discontinuities, recesses, or other features that accommodate the reinforcements while allowing substantially planar portions of the touch sensor 1210 to be adjacent corresponding planar portions of the top case 1202.

Figure 13A:
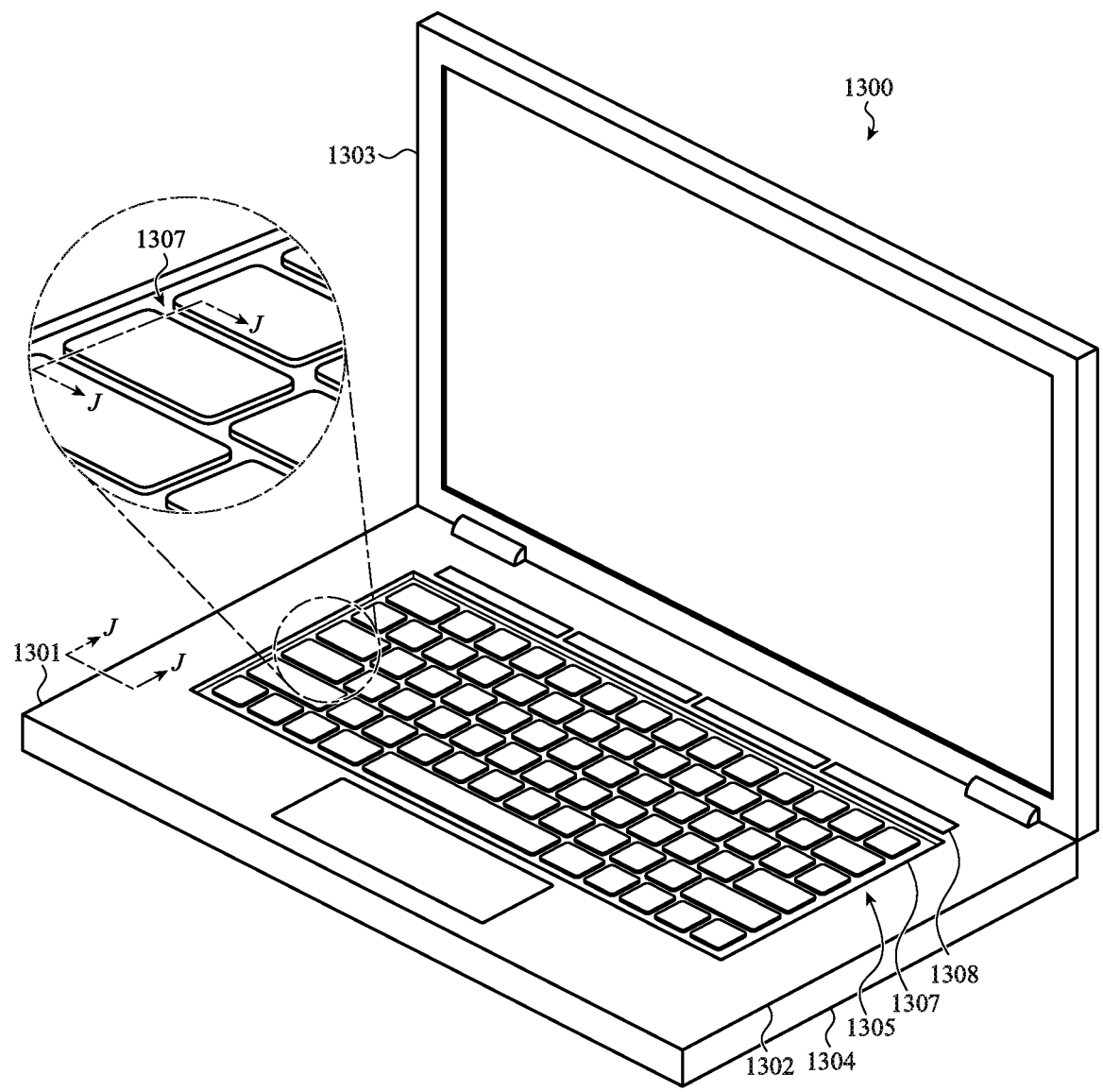
FIG. 13A depicts an example computing device having a contoured top case.

FIG. 13A depicts an example computing device 1300 that includes a base portion 1301 coupled to a display portion 1303. The base portion 1301 may include a bottom case 1304 and a top case 1302. The top case 1302 and the bottom case 1304 may be similar in structure, material, function, etc., to any of the top cases and bottom cases described herein. The computing device 1300 also includes a mechanical keyboard 1305 and a virtual key region 1308, which may be similar in structure, material, function, etc., to the keyboard 1205 and the virtual key region 1208 discussed above. Like the top case 1202, the top case 1302 may be a continuous member (e.g., lacking any openings or holes in the top surface).

The top surface of the top case 1302 may define a recessed region 1307 in which the keyboard 1305 may be positioned. The recessed region 1307 may have any suitable depth. For example, the recessed region 1307 may be between about 0.5 mm and 5.0 mm deep. In some cases, the recessed region 1307 has a depth that results in the tops of the keycaps of the keyboard 1305 being substantially flush with or set slightly below non-recessed or surrounding areas of the keyboard. In such cases, the keycaps may not contact the display portion 1303 when the display portion 1303 is in a closed position relative to the base portion 1301 (e.g., when the device 1300 is closed).

Figure 13B:
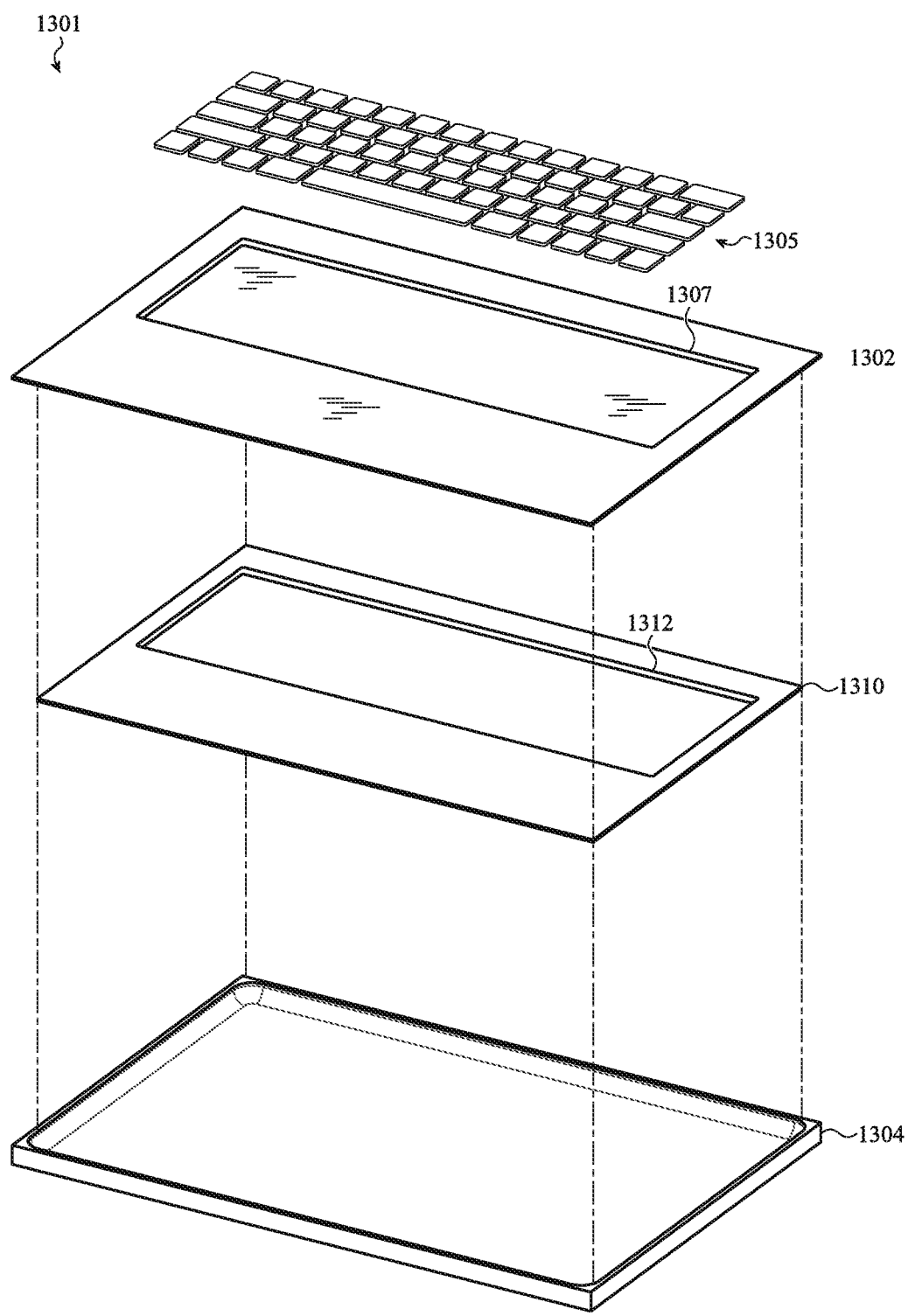
FIG. 13B depicts an exploded view of an example base portion of the computing device of FIG. 13A.

The recessed region 1307 may have any suitable dimensions. As shown in FIGS. 13A-13B, the recessed region 1307 defines an area that is only slightly larger than the keyboard 1305. However, the recessed region 1307 may be larger. For example, the recessed region 1307 may provide more clearance (e.g., a larger gap) between the keyboard 1305 and the surrounding non-recessed regions of the top case 1302 (e.g., along the outer perimeter of the keyboard 1305). Moreover, the recessed region 1307 may be deeper or shallower than is shown. The recessed region 1307 is also shown as defining a substantially planar recessed surface. The surfaces of other recessed regions may not be planar, and may define additional recesses, protrusions, features, or the like.

FIG. 13B is an exploded view of the base portion 1301 of FIG. 13A. The base portion 1301 shows the keyboard 1305, the top case 1302, the bottom case 1304, and a touch sensor 1310 below the top case 1302 (e.g., disposed within the interior volume defined by the top case 1302 and the bottom case 1304). The touch sensor 1310 may be similar in structure, material, function, etc., to the touch sensor 1210 discussed above. The keyboard 1305 may include key mechanisms that are coupled directly to the top case 1302, or it may be a keyboard assembly such as the keyboard assembly 1314 described with respect to FIG. 13C. A force sensing system may also be integrated with the base portion to facilitate detection of key presses, clicks, or the like, applied to the keyboard and/or non-keyboard regions of the base portion The top case 1302 may be formed in any suitable manner to produce the recess 1307. For example, if the top case 1302 is glass, it may be slumped over a mold that has a shape corresponding to the desired shape of the top case 1302. More particularly, a sheet of glass may be heated and then placed in contact with a mold, and the glass may be conformed to the shape of the mold. Pressure may or may not be applied to the glass sheet during the slumping or molding process. Other forming processes may also be used, such as grinding, lapping, machining, blowing, etching, sintering, or the like.

The touch sensor 1310 may define a recessed region 1312 that substantially corresponds to and/or conforms to the recessed region 1307 in the top case 1302. Accordingly, the touch sensor 1310 may conform to the shape of the top case 1302, allowing the touch sensor 1310 to be in close proximity with (e.g., in direct contact with) an underside of the top case 1302. By maintaining the surfaces of the touch sensor 1310 in close proximity with both the keyboard and the non-keyboard regions of the top case 1302, touch and/or force sensing can be provided across substantially all of the top case 1302. More particularly, the touch sensor 1310 can detect inputs in the keyboard region (e.g., key presses, gestures on or over the keys, etc.) as well as outside the keyboard region (e.g., clicks, taps, gestures, and other touch inputs applied to a palm rest region or any other touch or force sensitive region). A force sensing system may also be integrated with the base portion 1301 to facilitate detection of key presses, clicks, or the like, applied to the keyboard and/or non-keyboard regions of the base portion.

Figure 13C:
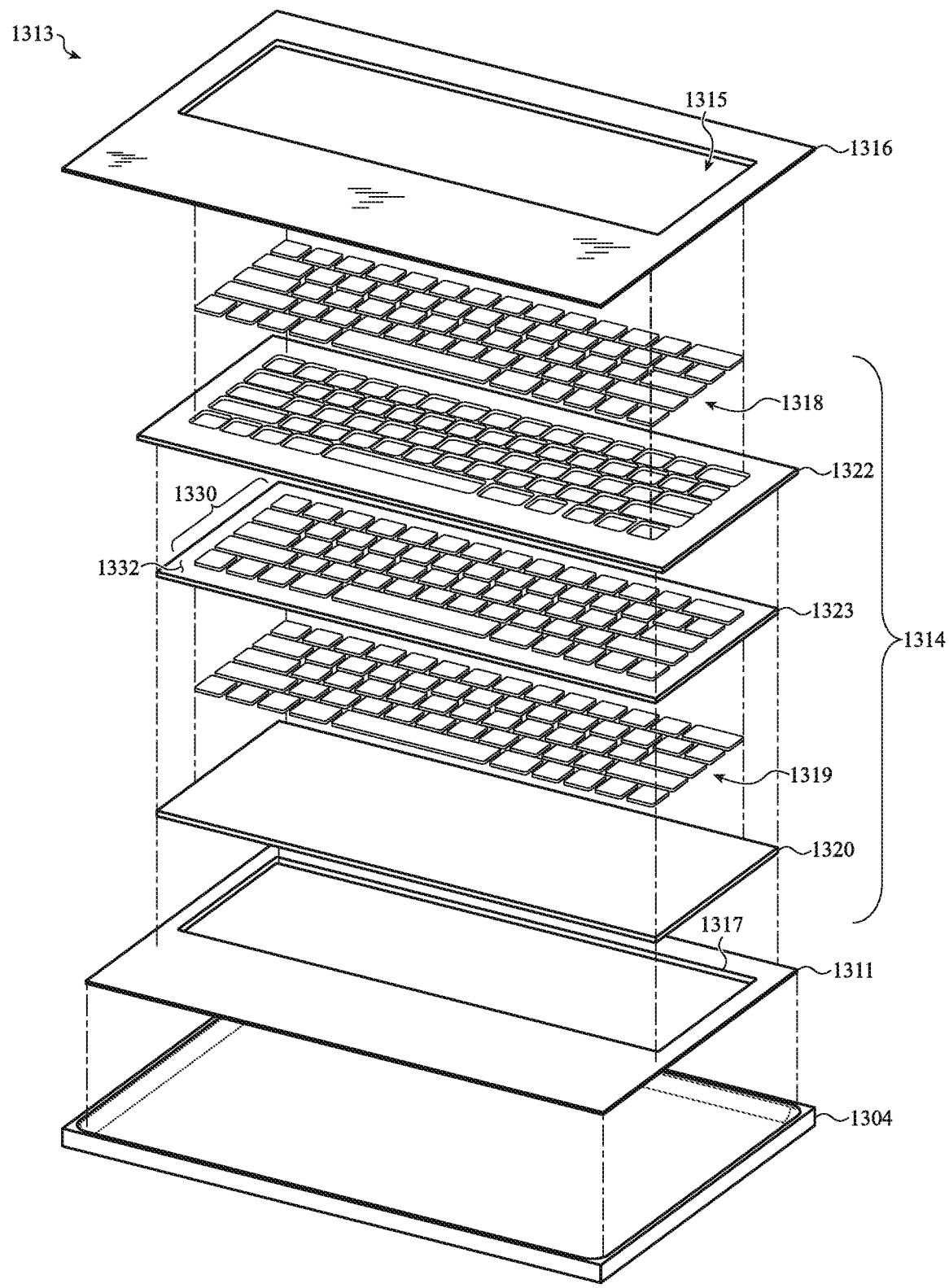
FIG. 13C depicts an exploded view of another example base portion of the computing device of FIG. 13A.

FIG. 13C is an exploded view of a base portion 1313, which may be an embodiment of the base portion 1301 of FIG. 13A, in which a keyboard assembly 1314 is positioned in or accessible through an opening 1315 (e.g., a keyboard opening) in a top case 1316. The top case 1316 may be similar to the top case 1302, except that instead of the recess 1307, the opening 1315 is formed in the top case 1316 to accommodate and allow access to the keyboard assembly 1314. The base portion 1313 also includes the bottom case 1304 and a touch sensor 1311 below the top case 1316 (e.g., disposed within the interior volume defined by the top case 1316 and the bottom case 1304). The touch sensor 1311 may be similar in structure, material, function, etc., to the touch sensor 1310 discussed above. Moreover, the touch sensor 1311 may include a recess 1317 to accommodate the keyboard assembly 1314. Alternatively, the touch sensor 1311 may omit the recess 1317 (e.g., it may be substantially flat or planar). The touch sensor 1311 may detect touch and/or force inputs applied anywhere to the top case 1316, including touch inputs applied to the keyboard assembly 1314 and actuations of the keys of the keyboard assembly 1314. A force sensing system may also be integrated with the base portion to facilitate detection of key presses, clicks, or the like, applied to the keyboard and/or non-keyboard regions of the base portion.

The keyboard assembly 1314 may include key mechanisms 1319, which may include keycap support mechanisms, domes, switches, scissor mechanisms, biasing mechanisms, springs, butterfly hinges, and/or other suitable components. The key mechanisms 1319 may provide electrical and/or mechanical functionality (e.g., a tactile, moving key mechanism) for the keys of the keyboard assembly 1314. The keyboard assembly 1314 may also include a base plate 1320 to which the key mechanisms 1319 may be coupled and an optional key web 1322 that defines key openings that frame the keys. The key web 1322 may also help prevent debris from entering the base portion 1313 from the keyboard. The keyboard assembly 1314 may also include a cover 1323 positioned over the key mechanisms 1319. The cover 1323 may be a flexible sheet, layer, or membrane, and may be formed of or include plastic, a fabric, or the like. Where the cover is a fabric cover, the fabric may be organic materials, synthetic materials, woven materials, knit materials, composite materials, coated fabrics, sealed fabrics, watertight fabrics, multi-layer fabrics, or the like.

The cover 1323 may be attached to the base plate 1320 and/or the key mechanisms 1319. The cover 1323 may substantially seal the keyboard assembly 1314 from the ingress of liquids, debris, or other contaminants. The cover 1323 may be sufficiently flexible to allow the key mechanisms 1319 to travel in response to actuation of a corresponding key. For example, the material of the cover 1323 may be sufficiently flexible, or an otherwise substantially inflexible material may include seams, folds, channels, crenellations, or other features or configurations that allow the key mechanisms 1319 to travel in response to an actuation of a key.

The keyboard assembly 1314 may further include keycaps 1318 that are positioned in key openings in the key web 1322 and coupled to the cover 1323. The keycaps 1318 may be adhered to the cover 1323 directly over corresponding key mechanisms 1319. For example, a key mechanism 1319 may include or define a keycap support that is movably supported relative to the base plate 1320 by a support mechanism (e.g., a butterfly hinge, scissor mechanism). The cover 1323 may overlie the keycap support (and may be adhered or otherwise affixed to the keycap support). A keycap may be affixed to the portion of the cover 1323 that overlies the keycap support. For example, the keycap may be affixed to the cover 1323 using ultrasonic welding, adhesive, mechanical engaging features, or the like. Accordingly, the cover 1323 may be sandwiched between the keycap support and the keycap. By adhering, bonding, or otherwise attaching the cover 1323 to the keycap supports and the keycaps, a substantially continuous, unbroken cover 1323 may be used, thereby maintaining the sealing function of the cover 1323 while still allowing a mechanical coupling between the key mechanisms 1319 and the keycaps 1318.

The cover 1323 may have openings therethrough to allow a mechanical engagement between the keycap supports and the keycaps. In such cases, the openings may be smaller than the keycaps and the keycap supports, such that the keycaps and keycap supports cover and/or seal the openings. Accordingly, the exposed areas of the cover 1323 (e.g., the areas between the keycaps) may be substantially continuous and/or unbroken, thereby sealing the keyboard and preventing or limiting ingress of liquids, debris, or other contaminants into the key mechanisms and/or the base portion 1313.

The base plate 1320 may be a circuit board with electrical interconnects that couple the keyboard assembly 1314 to components of the device such as a processor, memory, input interfaces, and the like. The electrical interconnects may allow electrical signals from the key mechanisms 1319 to be detected by the device to register key inputs. In cases where the touch sensor 1311 detects key presses or actuations, the key mechanisms 1319 may not include switches or other make-sensing components, and the base plate 1320 may not include electrical interconnects. In such cases, the key mechanisms 1319, the base plate 1320, and, optionally, the key web 1322 may be formed from or include dielectric or nonconductive materials such that fingers or other objects can be sensed by the touch sensor 1311 through the keyboard assembly 1314.

Figure 13D:
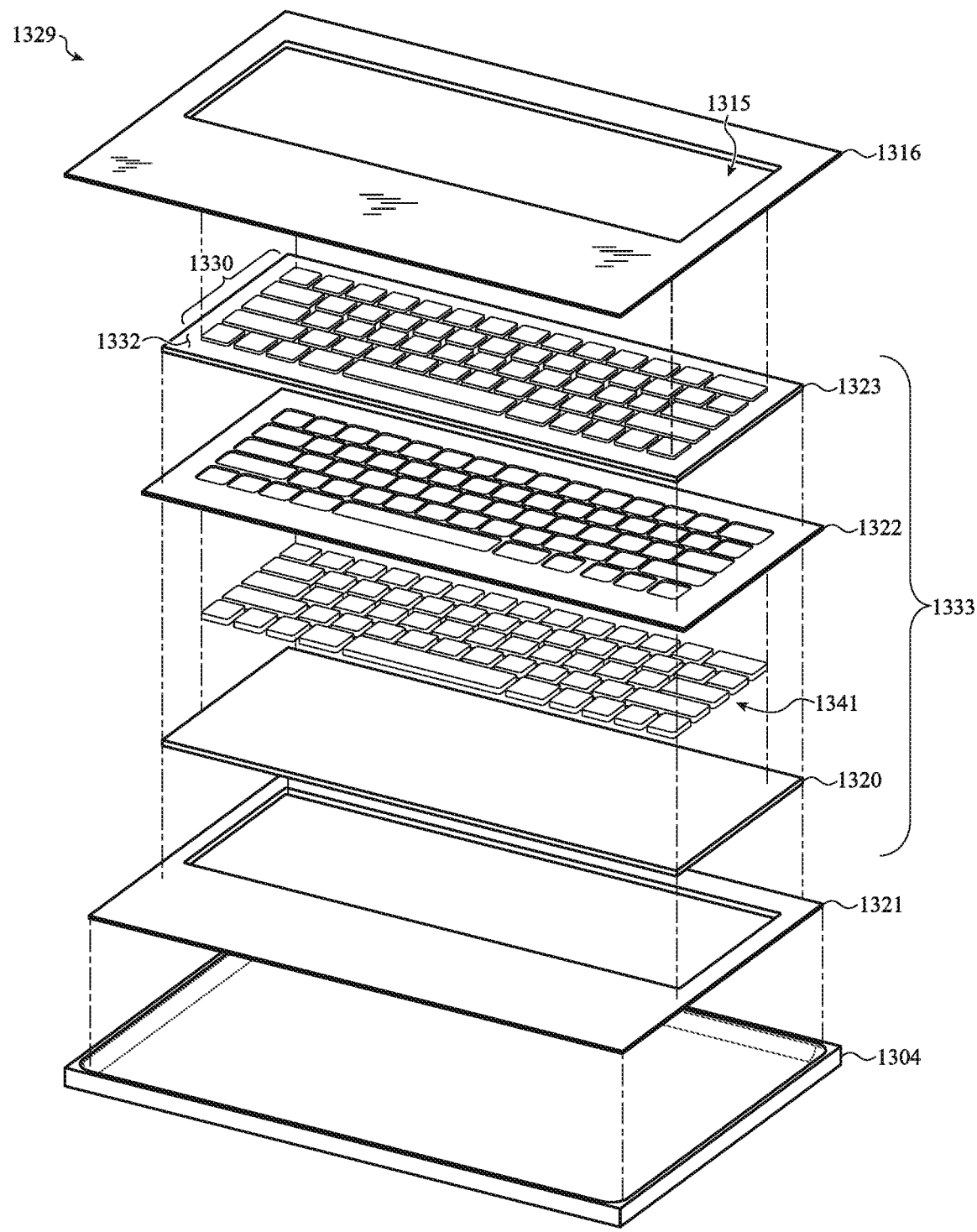
FIG. 13D depicts an exploded view of another example base portion of the computing device of FIG. 13A.

FIG. 13D is an exploded view of a base portion 1329, similar to the base portions 1301, 1313, showing another example arrangement of a keyboard assembly 1333 (which may otherwise be similar to or include similar components to the keyboard assembly 1314). In particular, in the embodiment shown in FIG. 13D, the optional key web 1322 may be positioned below the cover 1323. Also, FIG. 13D shows an embodiment where the cover 1323 defines the interface or user-contact surfaces of the keys (e.g., each key includes an underlying key mechanism but does not include an additional keycap on top of the cover 1323). In other cases, additional keycaps (similar to the keycaps 1318 in FIG. 13C) may be coupled to the cover 1323 to define the interface or user-contact surfaces of the keys. In other aspects, the embodiment of the base portion 1329 in FIG. 13D may be the same as or similar to the base portion 1313 of FIG. 13C. For example, the base portion 1329 shown in FIG. 13D may include the bottom case 1304, a touch sensor 1321 (which may be the same as or similar to the touch sensors 1310, 1311), and key mechanisms 1341 (which may be similar to the key mechanisms 1319, but may include additional keycaps or other upper components due to the lack of separate keycaps in the keyboard assembly 1333).

In FIGS. 13C-13D, a portion of the cover 1323 may be captured between two components of the keyboard assemblies 1314, 1333 or the device more generally. For example, in some cases, the cover 1323 has a keyboard region 1330 that covers the keys of the keyboard assembly, and an outer region 1332 that frames and/or surrounds the keyboard region 1330. The outer region 1332 may extend sufficiently beyond the keyboard region 1330 such that at least a portion of the outer region 1332 is positioned and captured between an overlying component and an underlying component. In some cases, the overlying component is the top case 1316. The underlying component may be any component of the keyboard assembly 1314, 1333 or the device with which the keyboard assembly is integrated. For example, the underlying component may be a key web (e.g., the key web 1322), a keyboard substrate (e.g., the base plate 1320), a circuit board, a support substrate or layer that provides structural and/or other support to the top case 1316, a portion of the bottom case 1304, a frame that is coupled to the bottom case 1304, or the like. As a specific example, with reference to FIG. 13D, the optional key web 1322 may be omitted and the outer region 1332 of the cover 1323 may be captured between a portion of the top case 1316 and a portion of the base plate 1320.

Capturing the outer region 1332 of the cover 1323 between the top case 1316 and an underlying component may help to secure the cover 1323 to the device, may help seal the keyboard assembly, and may prevent the cover 1323 from shifting or sliding during use. In some cases, the captured outer region 1332 of the cover 1323 may be adhered or otherwise bonded to the top case and/or the underlying component where the cover 1323 is captured.

Figure 13E:
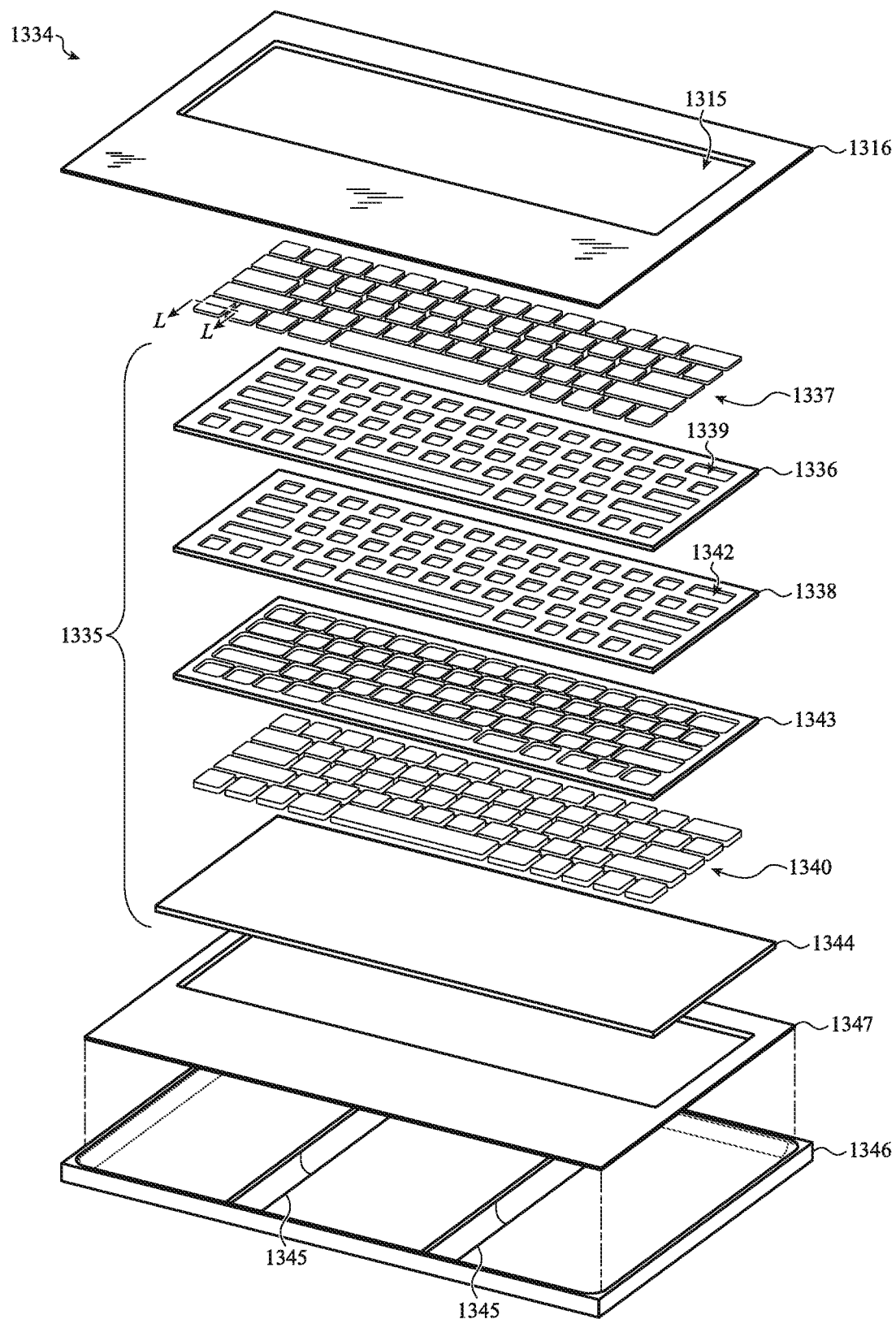
FIG. 13E depicts an exploded view of another example base portion of the computing device of FIG. 13A.

FIG. 13E is an exploded view of a base portion 1334, which may be an embodiment of the base portion 1301 of FIG. 13A, showing an alternative arrangement of the components of a keyboard assembly 1335 (which may otherwise be similar to or include similar components to the keyboard assembly 1314). In particular, in the embodiment shown in FIG. 13E a cover 1336 (e.g., a fabric cover as described above) is positioned below keycaps 1337, and a membrane 1338 is positioned below the cover 1336. In the arrangement shown in FIG. 13E, there is no rigid key web or other component that has exposed members between adjacent keycaps. Rather, the space between adjacent keycaps is open such that the cover 1336 is visible and/or exposed between the keycaps 1337.

With reference to FIG. 13E, the illustrated embodiment of the keyboard assembly 1314 includes the top case 1316 that defines the opening 1315. The keyboard assembly 1314 may be positioned in the opening 1315 when the base portion 1313 is assembled. The keyboard assembly 1314 also includes keycaps 1337 (which may be similar to the keycaps 1318) that define exposed input surfaces of the keys. The cover 1336 may be positioned below the keycaps 1337, and may define openings 1339. The keycaps 1337 may be configured to mechanically couple to key mechanisms 1340 (which may be the same as or similar to the key mechanisms 1319, 1341 described above) that are positioned below the cover 1336 and are coupled to the base plate 1344 (which may be the same as or similar to the base plate 1320). For example, the key mechanisms 1340 may include support mechanisms (e.g., springs, butterfly hinges, scissor mechanisms) that mechanically couple to the keycaps 1337 to allow the keycaps 1337 to move and be actuated by a user. The key mechanisms 1340 may also include key-make sensing components, such as dome switches, capacitive or other sensors, or the like. The openings 1339 in the cover 1336 allow the keycaps 1337 to directly contact, mate with, and/or mechanically engage the key mechanisms 1340. In other examples, the openings 1339 are omitted and the keycaps 1337 may be secured directly to the top of the cover 1336, and the key mechanisms 1340 (or portions thereof) may be secured to the bottom of the cover 1336 or another component that is below the cover 1336.

The keyboard assembly in FIG. 13E also includes a membrane 1338 positioned below cover 1336. The membrane 1338 may also define openings 1342 through which the keycaps 1337 may engage with the key mechanisms 1340. The membrane 1338 may be configured to help support the cover 1336 (e.g., to prevent the cover 1336 from sagging or drooping). The membrane 1338 may also help prevent debris from entering sensitive areas of the key mechanisms 1340 or other areas of the device. The membrane 1338 may be formed from any suitable material, such as silicone, polyurethane, polyisoprene, or any other suitable material.

The cover 1336 and the membrane 1338 may be secured to the keycaps 1337 (e.g., adhered, fused, etc.), or they may be detached from the keycaps 1337. Various different example arrangements between the cover 1336, the membrane 1338, and the keycaps 1337 are described in greater detail with reference to FIGS. 13F-13H and 13J-13K. Also, because at least parts of the cover 1336 and the membrane 1338 are below the keycaps 1337, the cover 1336 and the membrane 1338 may be configured to deform, deflect, stretch, or otherwise allow the keycaps 1337 to move when actuated.

A support 1343 may be positioned below the membrane 1338 to maintain the membrane 1338 in a desired location, and may also provide structural support and/or increase the rigidity of the keyboard assembly. The support 1343 may be positioned on the base plate 1344 (which may be the same as or similar to the base plate 1320), and may be formed of or include any suitable material, including polymer, metal, metal alloy, composite (e.g., carbon fiber composites, reinforced plastics), or the like.

The base portion 1313 shown in FIG. 13E also includes ribs 1345 in the bottom case 1346 (which may be an embodiment of the bottom case 1304). The ribs 1345 may provide structural support to the bottom case 1346 and may generally increase the strength and/or stiffness of the base portion 1313 relative to a bottom case without the ribs. The ribs 1345 may be separate components that are attached to the bottom case 1346, or they may be integrally formed with the bottom case 1346 (e.g., the bottom case 1346 may be molded, machined, cast, forged, or otherwise formed to have the ribs 1345 formed from the same piece of material as the rest of the bottom case 1346. The ribs 1345 may also structurally support the keyboard assembly 1335 by contacting or otherwise being structurally engaged with the base plate 1344. This arrangement may increase the strength and/or stiffness of the keyboard assembly 1335. The ribs 1345 may also contact the underside of the top case 1316 (or otherwise support the top case 1316 through interstitial layers or components such as a touch sensor layer) to increase the strength and/or stiffness of the top case 1316. The keyboard assembly 1335 may also include a touch sensor 1347 (which may be the same as or similar to the touch sensors 1310, 1311, described above). A force sensing system may also be integrated with the base portion 1313 to facilitate detection of key presses, clicks, or the like, applied to the keyboard and/or non-keyboard regions of the base portion.

FIGS. 13F-13H and 13J-13K depict cross-sectional views of keys that may represent keys of the keyboard assembly 1335 in FIG. 13E, viewed along section L-L in FIG. 13E. In these figures, some components of keyboard assembly 1335 may be omitted or positioned in a different location, and some other components may be added. It will be understood that such differences are shown and described with relation to each cross-sectional view, and the differences may be understood to be capable of being applied to the keyboard assembly 1335 shown in FIG. 13E.

Figure 13F:
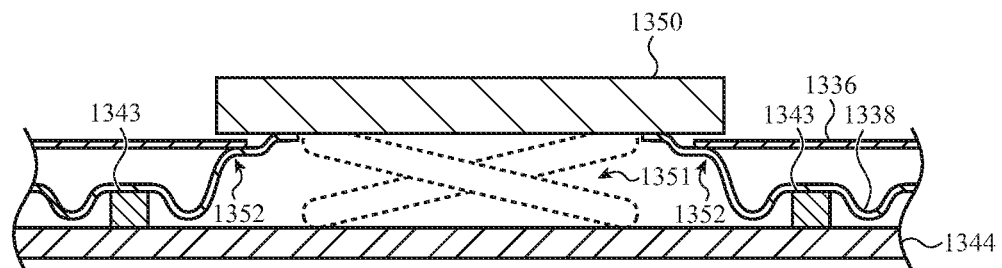
FIGS. 13F-13H and 13J-13K depict partial cross-sectional views of example arrangements of components in the base portion of FIG. 13E.

FIG. 13F depicts a cross-sectional view of a key that may be used in the keyboard assembly 1335 of FIG. 13E. The keycap 1350, which may be one of the keycaps 1337 of FIG. 13E, is positioned above the cover 1336. As shown in FIG. 13F, the keycap 1350 may be larger than the opening in the cover 1336 (e.g., one of the openings 1339), such that a portion of the keycap 1350 (e.g., a peripheral portion) overlaps the cover 1336. The keycap 1350 may be not secured (e.g., adhered) to the cover 1336, thereby allowing the keycap 1350 and the cover 1336 to move independently of one another. For example, when the keycap 1350 is actuated (e.g., depressed), the portions of the keycap 1350 that overlap the cover 1336 may contact and deflect the cover 1336.

The keycap 1350 may engage a key mechanism (e.g., one of the key mechanisms 1340 in FIG. 13E) through an opening in the cover 1336 (e.g., one of the openings 1339, FIG. 13E). For example, the keycap 1350 may clip to or otherwise engage a support mechanism 1351 of a key mechanism. The support mechanism 1351 may be a scissor mechanism, butterfly hinge, or any other suitable support mechanism, and may movably support the keycap 1350 relative to the base plate 1344.

The membrane 1338 may be positioned below the cover 1336. The membrane 1338 may provide several functions to the key shown in FIG. 13F. For example, the membrane 1338 may have a portion that contacts the cover 1336 in a region 1352 proximate (e.g., immediately surrounding or adjacent) the opening. The membrane 1338 may be formed of a material that has sufficient rigidity to impart a force on the cover 1336 in the region 1352 to help prevent or limit sagging of the cover 1336. More particularly, the membrane 1338 may contact the cover 1336 as shown in FIG. 13F at each key of a keyboard (or at least a subset of the keys), thereby forming an array of support areas, across the whole keyboard, for the cover 1336. In this way the membrane 1338 ultimately provides a dimensional support for the cover 1336. The membrane 1338 may be secured to the cover 1336 in the region 1352 with an adhesive or other suitable attachment technique, or it may contact the cover 1336 without being securely attached to the cover 1336. The membrane 1338 may have any suitable shape, profile, contouring, etc. to allow the membrane 1338 to support the cover 1336 while also being able to deform and/or deflect when the keycap 1350 is depressed.

The membrane 1338 may also help prevent ingress of contaminants (e.g., dust, liquid, etc.) into the area below the keycaps. For example, as shown in FIG. 13F, the membrane 1338 may contact or be attached to the keycap 1350 (e.g., with adhesive), thus forming a barrier between the external environment and the internal area of the device. Further, by securing the membrane 1338 to the keycap 1350 (e.g., via adhesive, radio frequency (RF) welding, fusing, or the like), the membrane 1338 will not separate from the keycap 1350 during keycap actuation, thus allowing the membrane 1338 to perform its barrier function during key actuation.

The membrane 1338 may be formed of any suitable material. In some cases, the membrane 1338 is formed of a material that has sufficient dimensional stability and/or stiffness to provide physical support to the cover 1336. Further, the membrane 1338 may be formed of a material that has a tackiness or other material property that tends to cause debris, crumbs, dust, or other particulates to stick to the membrane 1338. This may further increase the effectiveness of the barrier function of the membrane 1338, as contaminants that come into contact with the membrane 1338 may stick to the membrane 1338 and therefore be prevented from moving around and becoming lodged in an undesirable location. Example materials for the membrane 1338 include silicone, polyurethane, polyisoprene, or the like.

As described above, the support 1343 may be positioned below the membrane 1338 to maintain the membrane 1338 in a desired location. Optionally, an additional support (e.g., the additional support 1353, FIG. 13G) may be positioned above the support 1343 and the membrane 1338 (and in contact with or otherwise close to the cover 1336) to help maintain the shape and/or position of the cover 1336. The support 1343 and the additional support 1353 may be formed of or include any suitable material, such as metal, polymer, silicone, adhesive, or the like. Also, the membrane 1338 may be adhered or otherwise secured to the support 1343 and the additional support 1353, or it may be not adhered/secured.

Figure 13G:
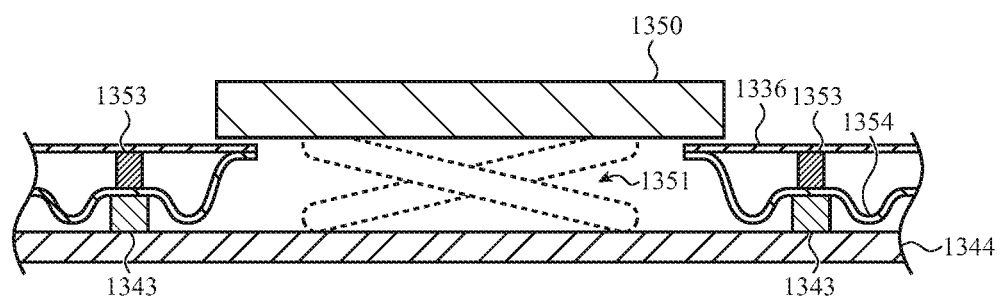

FIG. 13G depicts a cross-sectional view of another key that may be used in the keyboard assembly 1335 of FIG. 13E. It will be understood that an entire keyboard may be formed using the structure shown in FIG. 13G for each key or a subset of keys of the keyboard. The key shown in FIG. 13G is substantially similar to that shown in FIG. 13F. Accordingly, details of the key structure that are described with respect to that key structure apply equally and/or by analogy to the key structure shown in FIG. 13G, and will not be repeated here (e.g., with reference to the keycap 1350, the cover 1336, the support 1343, the additional support 1353, the key mechanism 1351, etc.). In FIG. 13G, however, the membrane 1354 (which may otherwise be the same as the membrane 1338) may terminate before contacting the keycap 1350. Thus, the membrane 1354 may contact and/or support the cover 1336 as described above, but may not form a barrier that prevents ingress of contaminants to the key mechanism 1351.

Figure 13H:
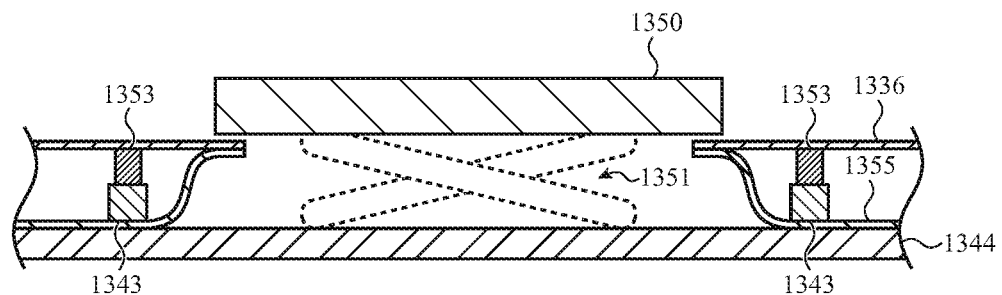

FIG. 13H depicts a cross-sectional view of another key that may be used in the keyboard assembly 1335 of FIG. 13E. It will be understood that an entire keyboard may be formed using the structure shown in FIG. 13H for each key or a subset of keys of the keyboard. The key shown in FIG. 13H is substantially similar to that shown in FIG. 13F. Accordingly, details of the key structure that are described with respect to that key structure apply equally and/or by analogy to the key structure shown in FIG. 13H, and will not be repeated here (e.g., with reference to the keycap 1350, the cover 1336, the support 1343, the additional support 1353, the key mechanism 1351, etc.). In FIG. 13H, however, the membrane 1355 (which may otherwise be the same as the membrane 1338) terminates before contacting the keycap 1350 (similar to the key in FIG. 13G), and the support 1343 is positioned above the membrane 1355. Thus, the support 1343 may apply a force on the membrane 1355 that maintains the membrane 1355 in a particular position and prevents or reduces lateral and vertical movement of the membrane 1355. Similar to the other key mechanisms shown, an additional support 1353 may be positioned above the support 1343 and may contact the cover 1336. In other cases, the additional support 1353 may be omitted and the support 1343 may extend fully to the cover 1336. In yet other cases, the additional support 1353 may be omitted and the support 1343 may be set apart from (e.g., not contact) the cover 1336, at least while the key is in an unactuated state.

Figure 13J:
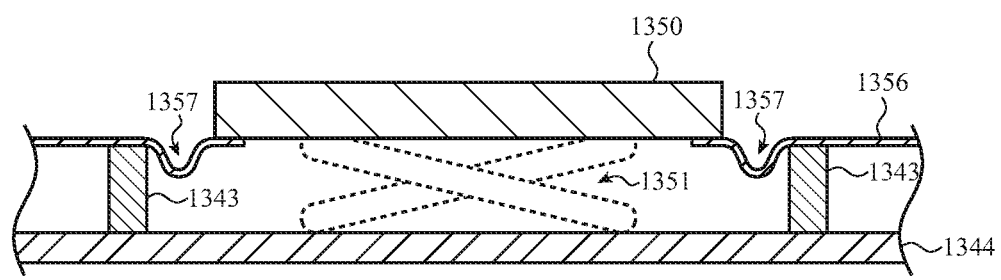

FIG. 13J depicts a cross-sectional view of another key that may be used in the keyboard assembly 1335 of FIG. 13E. It will be understood that an entire keyboard may be formed using the structure shown in FIG. 13J for each key or a subset of keys of the keyboard. The key shown in FIG. 13J is substantially similar to that shown in FIG. 13F. Accordingly, details of the key structure that are described with respect to that key structure apply equally and/or by analogy to the key structure shown in FIG. 13J, and will not be repeated here (e.g., with reference to the keycap 1350, the support 1343, the key mechanism 1351, etc.). In FIG. 13J, however, the cover 1356 (which may otherwise be the same as the cover 1336) is in contact with and optionally attached to the keycap 1350, and a membrane may be omitted. The cover 1356 may be adhered or otherwise secured to the keycap 1350, and may thus form a barrier to debris or other contaminants, performing a similar function to the membrane 1338 of FIG. 13F. In order to avoid undesirable interference between the cover 1356 and the keycap 1350 (which may make the cover 1356 deform, may increase the actuation force of the keycap, or the like), the cover 1356 may include relief sections 1357 partially or completely surrounding the keycap 1350. The relief sections 1357 may have any suitable shape and may be formed in any suitable manner (e.g., molding, embossing, etc.).

Figure 13K:
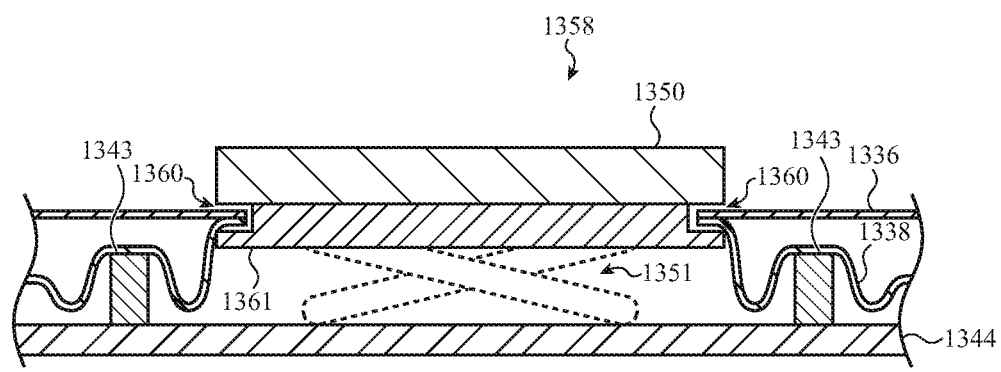

FIG. 13K depicts a cross-sectional view of another key that may be used in the keyboard assembly 1335 of FIG. 13E. It will be understood that an entire keyboard may be formed using the structure shown in FIG. 13K for each key or a subset of keys of the keyboard. The key shown in FIG. 13K is substantially similar to that shown in FIG. 13F. Accordingly, details of the key structure that are described with respect to that key structure apply equally and/or by analogy to the key structure shown in FIG. 13K, and will not be repeated here (e.g., with reference to the cover 1336, the support 1343, the membrane 1338, the key mechanism 1351, etc.). In FIG. 13K, however, the keycap 1358 may include a recess 1360. The ends of the cover 1336 and membrane 1338 that are adjacent to or define the openings may be received in the recess 1360. This may help produce a seamless appearance to the keyboard, as there may be no visible gap around the perimeter of the keycaps and into the interior area of the keyboard. Moreover, the additional interlocking structure may help prevent ingress of contaminants under the keycap 1358.

The keycap 1358 may include a top portion 1359 and a bottom portion 1361. The top portion 1359 and the bottom portion 1361 may cooperate to define the recess 1360. Accordingly, the key may be assembled by placing the top portion 1359 above the cover 1336 and membrane 1338 (and aligned with the openings in the cover 1336 and membrane 1338), and then attaching the bottom portion 1361 to the top portion 1359 through the openings, thus capturing portions of the cover 1336 and membrane 1338 in the recess 1360. The top portion 1359 and the bottom portion 1361 may be attached in any suitable manner, including adhesives, mechanical interlocks, fasteners, welding, or the like. In other cases, the keycap 1358 may be a monolithic component that defines the recess 1360 (e.g., it may be a single molded polymer member).

Where the keycap 1358 includes a top portion 1359 and a bottom portion 1361, these may be formed of or include any suitable materials, such as polymer, metal, glass, sapphire, or the like. Moreover, they may be the same material (e.g., the top and bottom portions 1359, 1361 may be formed from the same polymer material), or they may be different materials (e.g., the top portion 1359 may be glass and the bottom portion 1361 may be polymer).

As noted above, variations on the key shown in FIG. 13K are also possible. For example, the membrane 1338 may be omitted. Also, the membrane 1338 and/or the cover 1336 may be adhered or otherwise secured to the keycap 1358 within the recess. Other variations are also possible.

As noted above, FIGS. 13F-13H and 13J-13K depict cross-sectional views of keys that may represent keys of the keyboard assembly 1335 in FIG. 13E. It will be understood that components, structures, structural relationships, and/or functions shown or described in one figure may be applied to other figures as well. For example, it will be understood that the extension of the membrane 1338 to the keycap 1350 in FIG. 13F may be applied to the key shown in FIG. 13H (which shows its membrane 1355 not contacting the keycap 1350). Other such modifications, variations, exclusions, and combinations of the disclosed concepts are also contemplated.

Figure 13L:
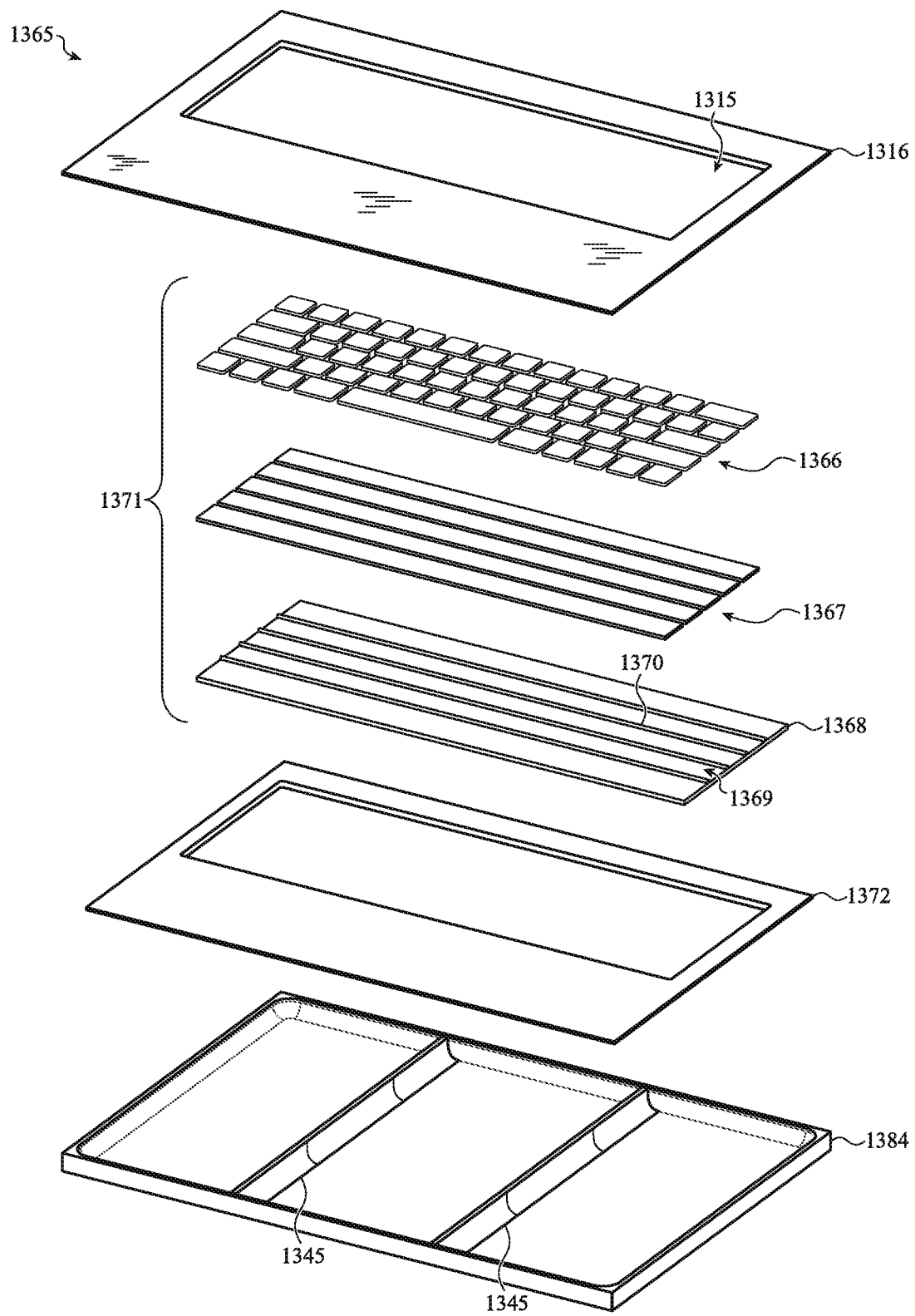
FIG. 13L depicts an exploded view of another example base portion of the computing device of FIG. 13A.

FIG. 13L is an exploded view of a base portion 1365, which may be an embodiment of the base portion 1301 of FIG. 13A. In the base portion 1365, a base plate 1368 is shaped to provide segments that extend upwards in the area between key caps of the keyboard, thus forming a key web like appearance.

With reference to FIG. 13L, the base portion 1365 includes the top case 1316 that defines the opening 1315. A keyboard assembly 1371 may be positioned in the opening 1315 when the base portion 1365 is assembled. The keyboard assembly 1371 also includes key mechanisms 1366 (including, for example, keycaps, support mechanisms, domes (or other components for providing tactile feedback), key make sensors (e.g., electrical switches, domes, capacitive sensing elements, etc.), and the like).

The key mechanisms 1366 may be electrically (and optionally mechanically) coupled to circuit substrates 1367. The circuit substrates 1367 may be electrically coupled, through openings in the shaped base plate 1368 or around a peripheral side of the shaped base plate 1368, to one or more components within the device to allow the device to detect key actuations.

The circuit substrates 1367 may be positioned in recesses 1369 (e.g., elongated troughs) that are defined by the shaped base plate 1368. The circuit substrates 1367 may be secured to the shaped base plate 1368 (or to another component of the device) in any suitable way, including adhesives, fasteners, mechanical interlocks, heat stakes, or the like. The circuit substrates 1367 may be rigid or flexible circuit boards, or any other suitable component for facilitating detection of key actuations by the device and optionally mechanically supporting the key mechanisms.

The shaped base plate 1368 may be formed to define the recesses 1369 in which the keys may be positioned. The recesses 1369 may be at least partially defined by protrusions 1370 that extend upwards and are visible in the gaps between respective keys. As shown in FIG. 13L, the recesses 1369 may be elongated trough-shaped recesses that receive a row of multiple keys. In other cases, as shown in FIGS. 13M-13O, the recesses may have other configurations, such as separate recesses for each key.

The shaped base plate 1368 may be formed of any suitable material. For example, it may be metal, polymer, composite, metal alloy, glass, or any other suitable material. In some cases, the shaped base plate 1368 is stamped or drawn metal (e.g., a metal sheet that is subjected to stamping, drawing, or other forming operations), machined metal, or the like.

The keyboard assembly 1371 may also include a touch sensor 1372 (which may be the same as or similar to the touch sensors 1310, 1311, 1347 described above). A force sensing system may also be integrated with the base portion 1365 to facilitate detection of key presses, clicks, or the like, applied to the keyboard and/or non-keyboard regions of the base portion 1365. The base portion 1365 may also include a bottom case 1384, which may be the same as or similar to other bottom cases described herein, such as the bottom case 1346 in FIG. 13E.

Figure 13M:
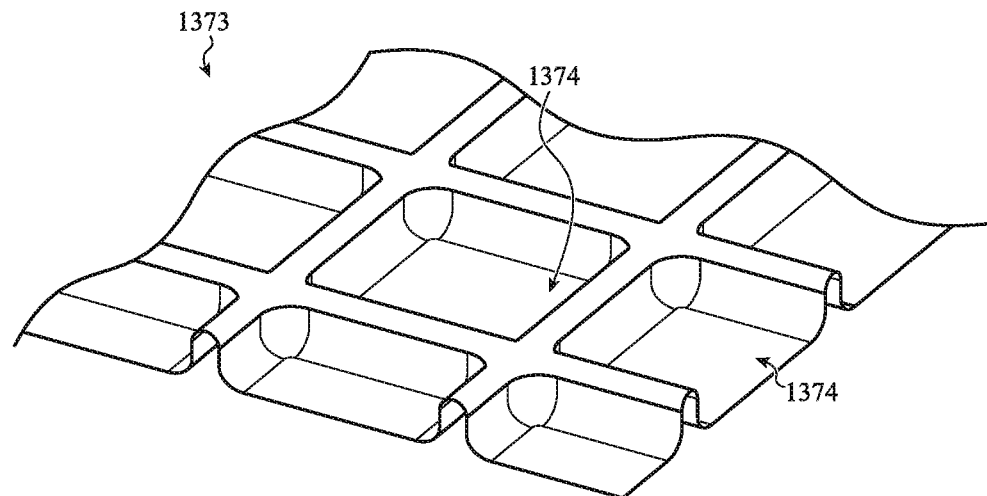
Figure 13N:
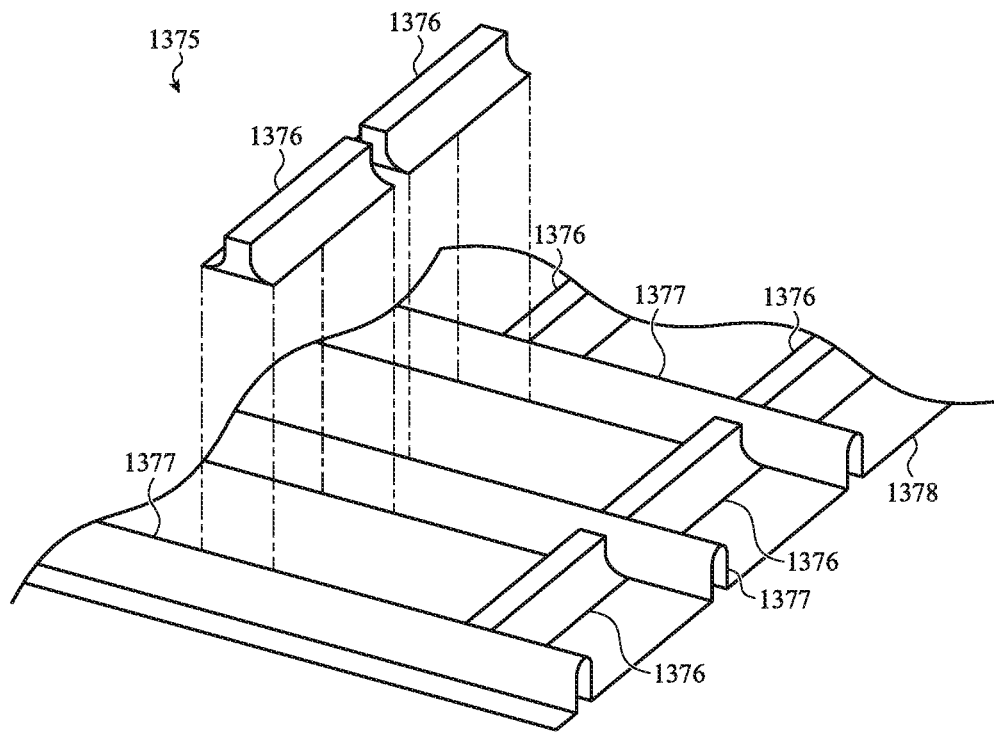
Figure 130:
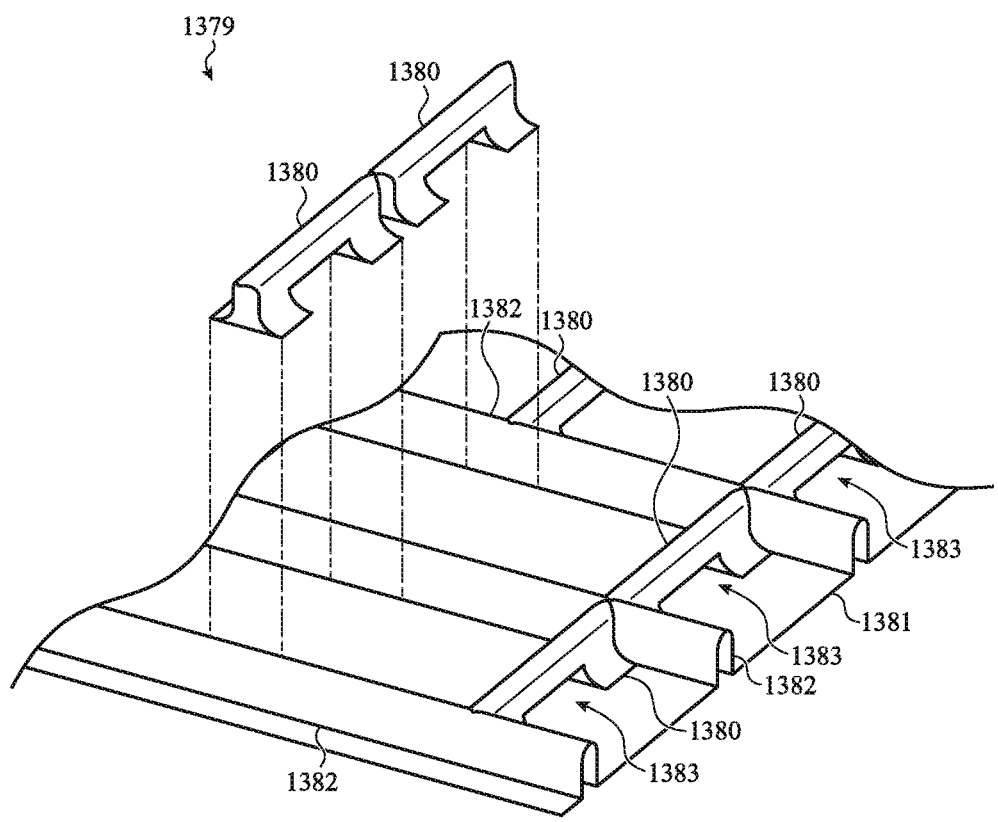

FIG. 13M depicts a portion of another embodiment of a shaped base plate 1373. Whereas the shaped base plate 1368 in FIG. 13L defines elongated recesses 1369 (e.g., troughs), the shaped base plate in FIG. 13M depicts recesses 1374 that are sized and shaped for individual keys (though some groups of keys, such as directional or arrow keys, may share single recess which may be larger than and/or shaped differently than the recesses 1374). In such cases, key mechanisms positioned in the recesses 1374 may be electrically coupled to components within the device through openings in the shaped base plate, wirelessly, or the like. In some cases, as described herein, key actuations may be sensed through the shaped base plate (as well as any mechanical key components), such as with capacitive sensing. In other respects, such as the material(s) used and the method(s) of forming the shaped base plate, the shaped base plate 1373 may be the same as or similar to the shaped base plate 1368 of FIG. 13L.

FIG. 13N depicts a detail view of another embodiment of a base plate 1375. In FIG. 13N, additional wall segments 1376 are added to a shaped base 1378 that includes trough-shaped recesses, similar to those shown in FIG. 13L. The shaped base 1378 may be the same as or similar to the shaped base plate 1368 of FIG. 13L.

The additional wall segments 1376 extend from one protrusion 1377 to an adjacent protrusion 1377 and cooperate with the protrusions 1377 to form recesses defined by four walls. The additional wall segments and the protrusions formed in the shaped base 1378 may thus frame individual keys, providing a key web like appearance and structure around the keys. The additional wall segments 1376 may be configured to have a height that is less than the height of the protrusions 1377. This may allow circuit substrates (such as the circuit substrates 1367 in FIG. 13L) to pass over the additional wall segments 1376 without protruding above the height of the protrusions 1377. In other cases, the additional wall segments 1376 have substantially the same height as the protrusions 1377.

The additional wall segments 1376 may be formed from any suitable material and may be formed in any suitable way. For example, the additional wall segments 1376 may be formed from metal, polymer, glass, composite materials, or the like. The additional wall segments 1376 may be attached to the shaped base plate 1378 via adhesives, fasteners, interlocking structures, or the like. In some cases, the additional wall segments 1376 may be formed and attached to the shaped base 1378 by a molding operation (e.g., co-molding, insert molding, overmolding, etc.).

FIG. 13O depicts a detail view of another embodiment of a base plate 1379. In FIG. 13O, like FIG. 13N, additional wall segments 1380 are added to a shaped base 1381 that includes trough-shaped recesses. The shaped base 1381 may be the same as or similar to the shaped base plate 1368 of FIG. 13L.

In FIG. 13O, however, the tops of the additional wall segments 1380 are substantially even with protrusions 1382, while underpasses 1383 are defined below the additional wall segments 1380 and above the surface of the shaped base 1381. The underpasses 1383 may allow for the circuit substrates (such as the circuit substrates 1367 in FIG. 13L) to pass below the additional wall segments 1380. The additional wall segments 1380 may otherwise be similar in material and formation process to the additional wall segments 1376 in FIG. 13N.

The key web like structure formed by the shaped base plates and optional additional wall segments, as described above, may be exposed (e.g., uncovered), and may be visible between keys. In other cases, the key web like structure may be covered by a fabric, membrane, or other cover, such as those described above with respect to FIGS. 13C-13E. Indeed, a shaped base plate as described may be used in other keyboard configurations described herein. Similarly, features of other keyboard configurations may be incorporated into the keyboard configuration shown in FIG. 13L.

Figure 14A:
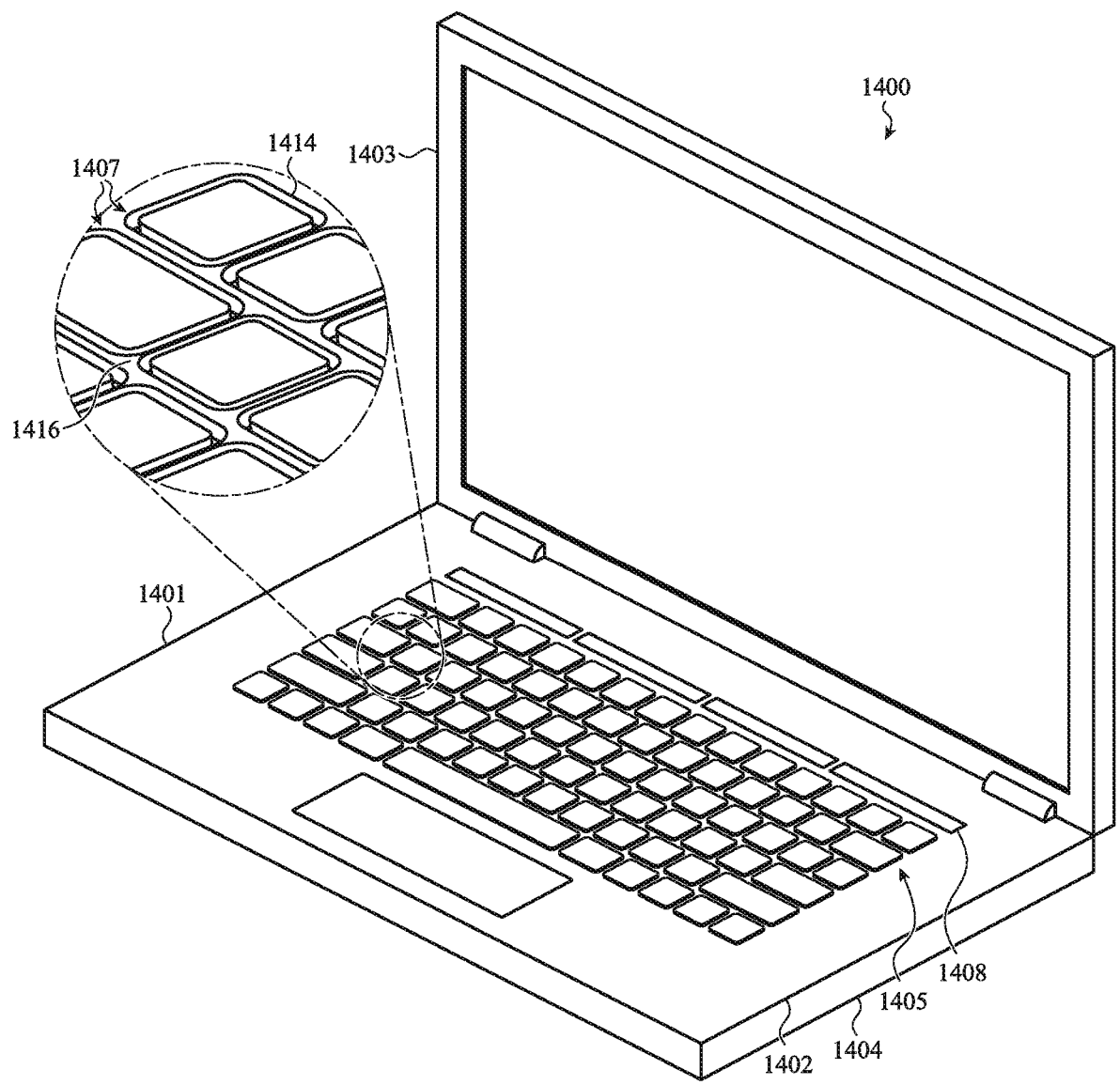
FIG. 14A depicts another example computing device having a contoured top case.

FIG. 14A depicts an example computing device 1400 that includes a base portion 1401 coupled to a display portion 1403. The base portion 1401 may include a bottom case 1404 and a top case 1402. The top case 1402 and the bottom case 1404 may be similar in structure, material, function, etc., to any of the top cases and bottom cases described herein. The computing device 1400 also includes a mechanical keyboard 1405 and a virtual key region 1408, which may be similar in structure, material, function, etc., to the keyboard 1205 and the virtual key region 1208 discussed above. Like the top case 1202, the top case 1402 may be a continuous member (e.g., lacking any openings or holes).

The top surface of the top case 1402 may define a plurality of recessed regions 1407 in which one or more keys of the keyboard 1405 (but less than all of the keys of the keyboard 1405) may be positioned. In some cases, the top case 1402 defines a distinct recess for each key of the keyboard 1405. In other cases, the top case 1402 defines a distinct recess region for each of a subset of keys, and other recessed regions that accommodate more than one key. For example, each of the letter, character, and number keys of a keyboard may be disposed in a distinct recess region, while all of the arrow keys may be disposed in one common recessed region.

The recessed regions 1407 may have any suitable depth, as described above with respect to the recessed region 1307. Moreover, the recessed regions 1407 may have any suitable dimensions. For example, the recessed regions 1407 may be configured to define a uniform gap (e.g., a gap 1414) between the walls of the recessed regions 1407 and the outer sides (e.g., the perimeter) of the keys that are positioned in the recessed regions 1407. The gap 1414 may be any suitable distance, such as between about 0.1 mm and 1.0 mm.

Figure 14B:
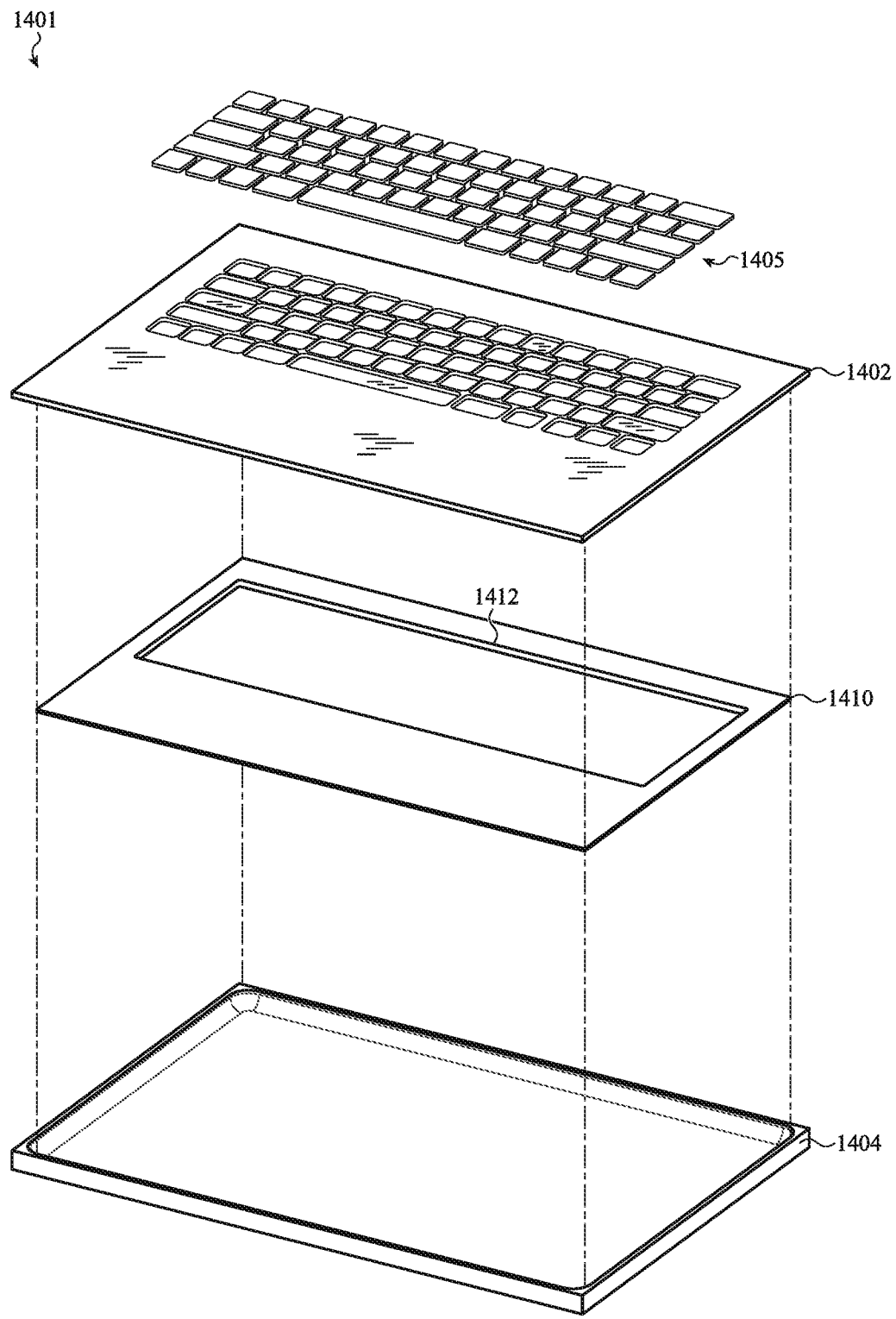
FIG. 14B depicts an exploded view of a base portion of the example computing device of FIG. 14A.

FIG. 14B is an exploded view of the base portion 1401 of FIG. 14A. The base portion 1401 shows the keyboard 1405, the top case 1402, the bottom case 1404, and a touch sensor 1410 below the top case 1402 (e.g., disposed within the interior volume defined by the top case 1402 and the bottom case 1404).

The touch sensor 1410 may be similar in structure, material, function, etc., to the touch sensors 1210, 1310, 1311 discussed above (or other touch sensors described herein). More particularly, the touch sensor 1410 may include a recessed region 1412 that substantially corresponds to and/or conforms to the various recessed regions 1407 in the top case 1402. For example, the recessed region 1412 may be a single recessed region that accommodates all of the recessed regions 1407 of the top case 1402. While this may increase the distance between some parts of the top case 1402 and the underlying touch sensor 1410, such as between the web portions 1416 (FIG. 14A) of the top case 1402 and the touch sensor 1410, these areas may be sufficiently small that the operation or effectiveness of the touch sensor 1410 is not unduly compromised.

The top case 1402 may be formed in any suitable manner, such as those described above with respect to the top case 1302. For example, the top case 1402 may be slumped, molded, machined, etched, or the like, to form the recesses or recessed regions 1407.

Figure 15A:
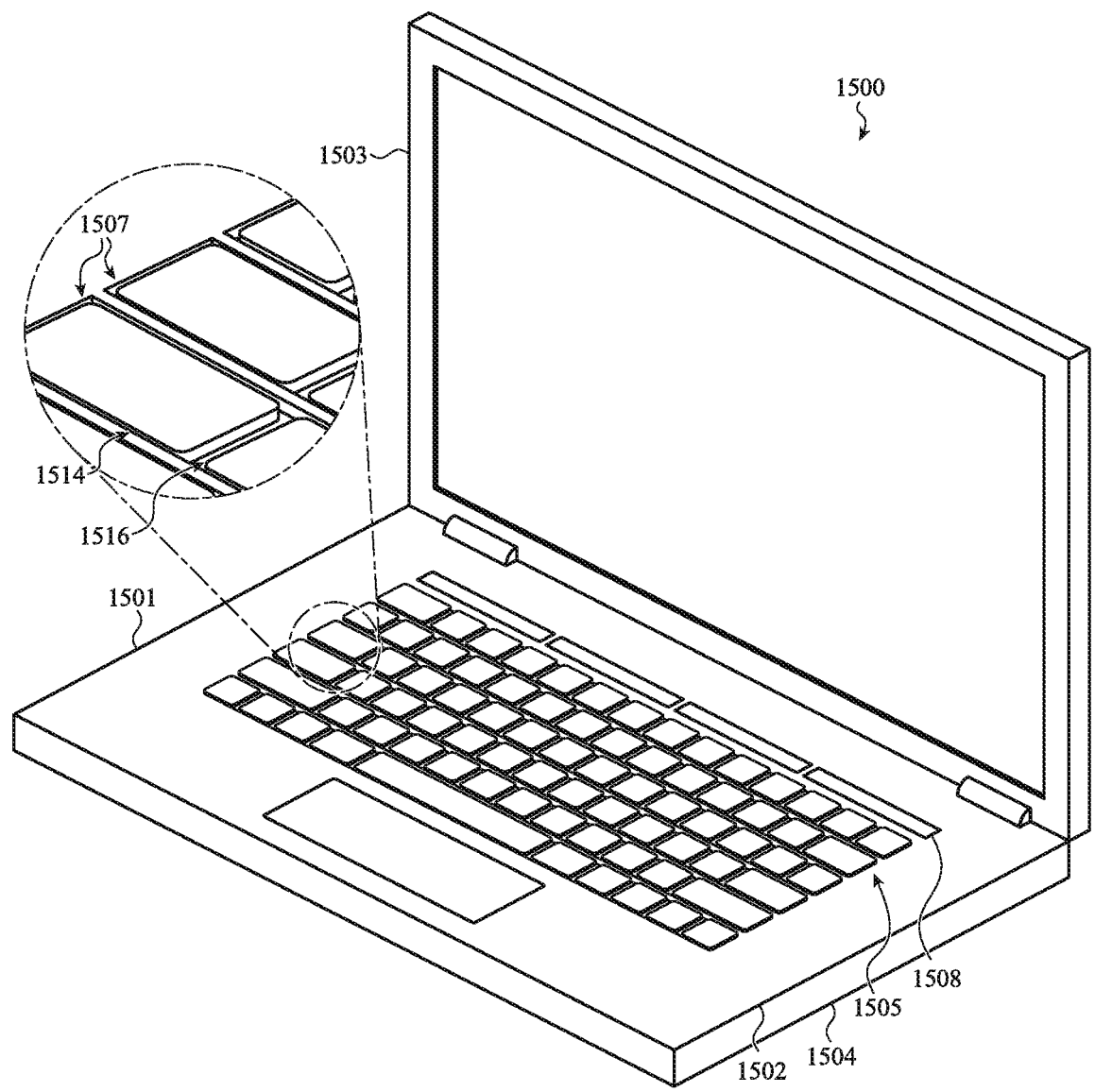
FIG. 15A depicts another example computing device having a contoured top case.

FIG. 15A depicts an example computing device 1500 that includes a base portion 1501 coupled to a display portion 1503. The base portion 1501 may include a bottom case 1504 and a top case 1502. The top case 1502 and the bottom case 1504 may be similar in structure, material, function, etc., to any of the top cases and bottom cases described herein. Like the top case 1202, the top case 1502 may be a continuous member (e.g., without any openings or holes). The computing device 1500 also includes a mechanical keyboard 1505 and a virtual key region 1508, which may be similar in structure, material, function, etc., to the keyboard 1205 and the virtual key region 1208 discussed above.

The top surface of the top case 1502 may define a plurality of recessed regions 1507 in which rows of keys of the keyboard 1505 may be positioned. In some cases, the top case 1502 defines a distinct recess for each key row of the keyboard 1505. In other cases, the top case 1502 defines a distinct recess region for a subset of keys in a particular key row, and other recessed regions that accommodate other keys in the particular key row. For example, each of the letter, character, and/or number keys of a key row may be disposed in a recessed region, while function keys (e.g., caps lock, return, tab, shift, etc.) may be disposed in another recessed region.

The recessed regions 1507 may have any suitable depth, as described above with respect to the recessed region 1307. Moreover, the recessed regions 1507 may have any suitable dimensions. For example, the recessed regions 1507 may be configured to define a uniform gap (e.g., a gap 1514) between the walls of the recessed regions 1507 and the outer sides of the keys that are positioned in the recessed regions 1507. The gap 1514 may be any suitable distance, such as between about 0.1 mm and 1.0 mm. Because the recessed regions 1507 are row-shaped, keys in the same recessed region 1507 may be separated by a substantially uniform distance, such as between about 1.0 mm and 7.0 mm.

Figure 15B:
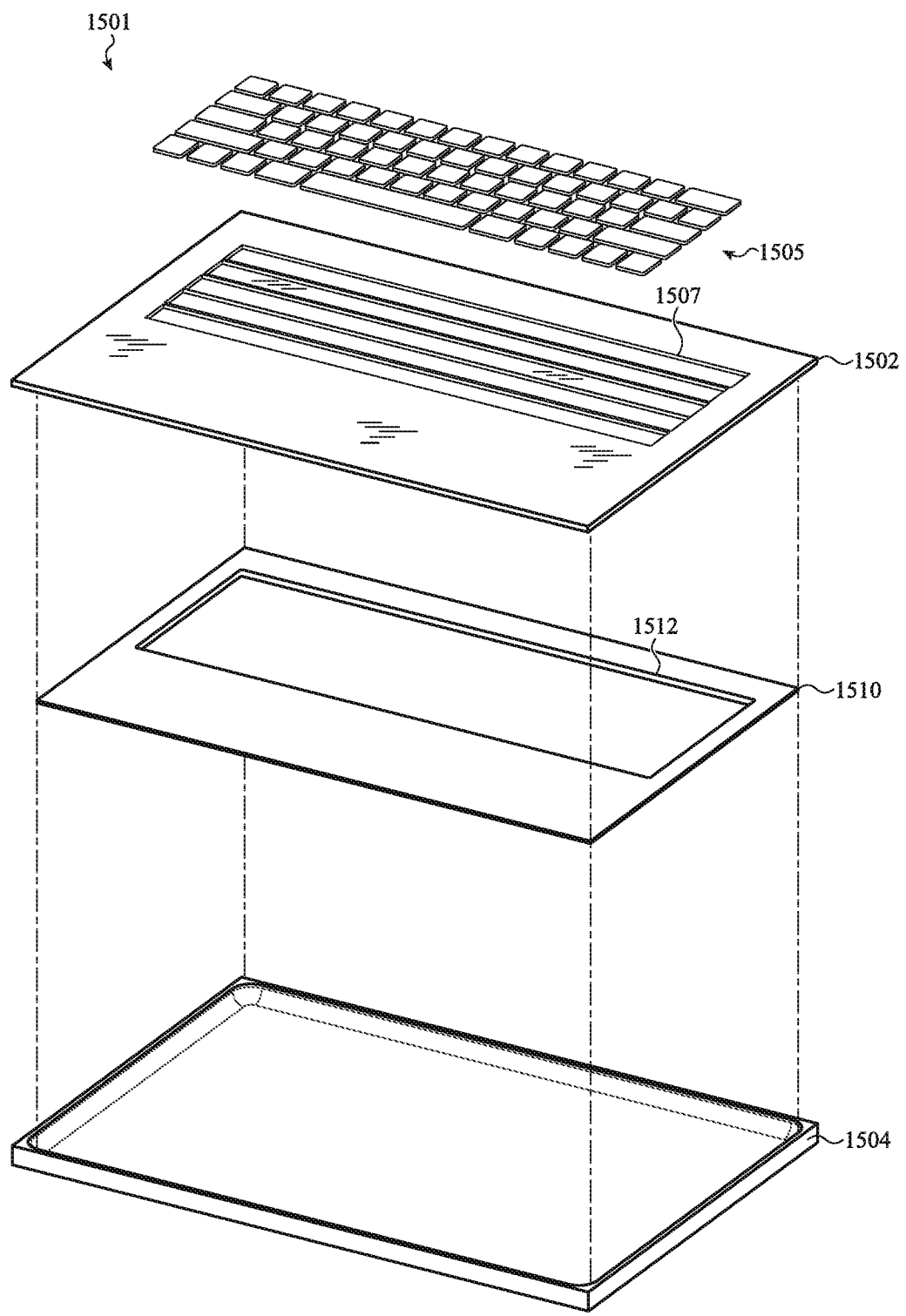
FIG. 15B depicts an exploded view of a base portion of the example computing device of FIG. 15A.

FIG. 15B is an exploded view of the base portion 1501 of FIG. 15A. The base portion 1501 shows the keyboard 1505, the top case 1502, the bottom case 1504, and a touch sensor 1510 below the top case 1502 (e.g., disposed within the interior volume defined by the top case 1502 and the bottom case 1504).

The touch sensor 1510 may be similar in structure, material, function, etc., to the touch sensors 1210, 1310, 1311, and 1410 discussed above. More particularly, the touch sensor 1510 may include a recessed region 1512 that substantially corresponds to and/or conforms to the various recessed regions 1507 in the top case 1502. For example, the recessed region 1512 may be a single recessed region that accommodates all of the recessed regions 1507 of the top case 1502.

The top case 1502 may be formed in any suitable manner, such as those described above with respect to the top case 1302. For example, the top case 1502 may be slumped, molded, machined, etched, or the like, to form the recesses or recessed regions 1507.

FIGS. 12A-15B illustrate computing devices that include a mechanical keyboard and a virtual keyboard. As noted above, computing devices as described herein, and in particular computing devices with an integrated interface system as described herein, may include one or more displays under the top case to produce images of buttons, icons, affordances, or any other visual output. For example, displays may be used to produce images of buttons or other affordances on the virtual keyboard. Displays may be integrated with the top case, and with touch and/or force sensors, in various ways.

Figure 16A:
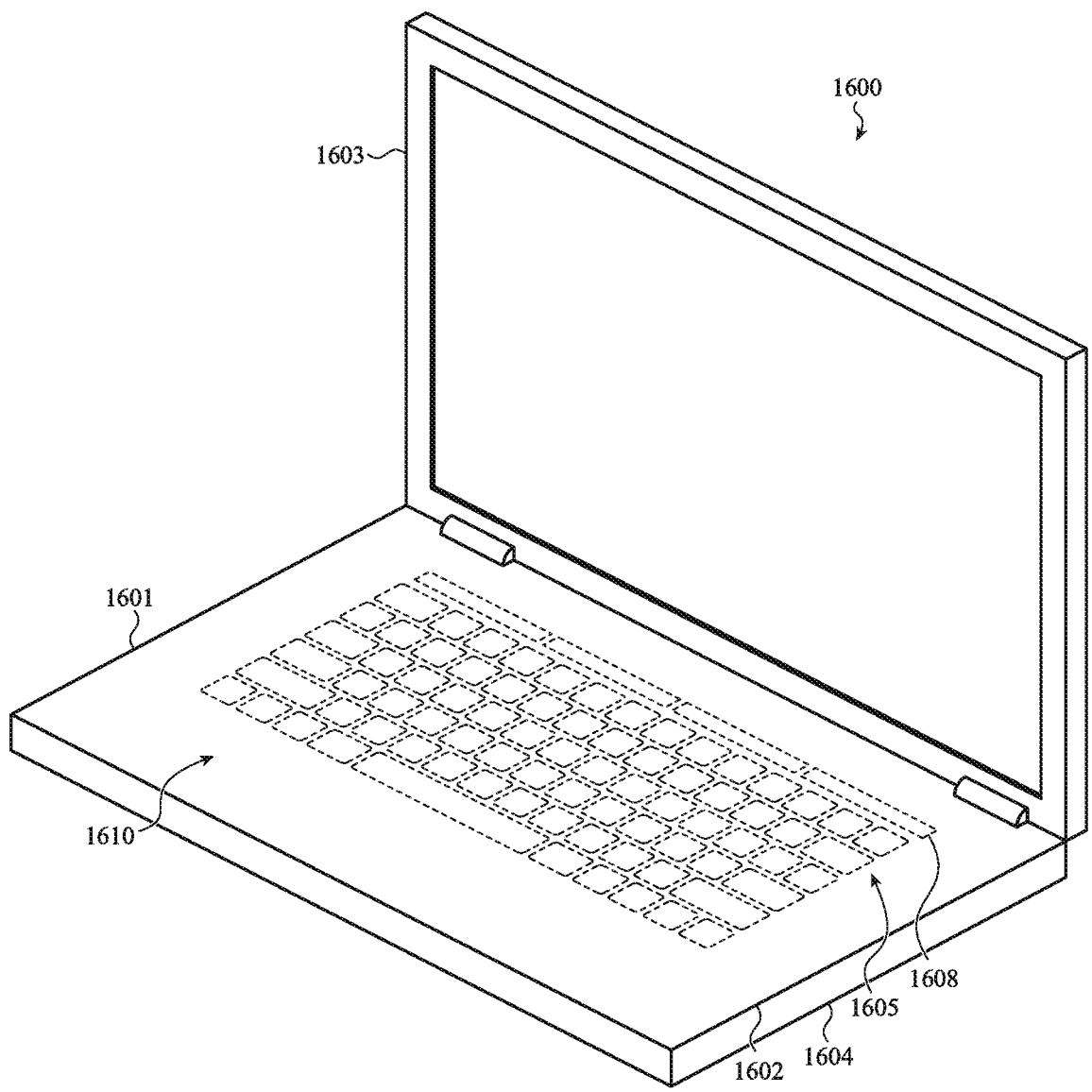
FIGS. 16A-16C depict an example computing device having a virtual keyboard.

FIG. 16A depicts an example computing device 1600 that includes a base portion 1601 and a display portion 1603 coupled to the base portion 1601 (e.g., via a hinge). The base portion 1601 may include a bottom case 1604 and a top case 1602, with the top case 1602 defining an input surface of an integrated input system. The top case 1602 and the bottom case 1604 may be similar in structure, material, function, etc., to any of the top cases and bottom cases described herein.

The computing device 1600 includes a virtual keyboard 1605 and a virtual key region 1608 on the top case 1602. The virtual keyboard 1605 and virtual key region 1608 may include one or more displays, described herein, that produce images of buttons, keys, or other affordances that can be selected by the user. Force and/or touch sensors are used in conjunction with the virtual keyboard 1605 and virtual key region 1608 to detect selections of the affordances that are displayed on the virtual keyboard 1605 and virtual key region 1608.

The computing device 1600 also includes a trackpad region 1610, which may correspond to any location on the top case 1602 other than the virtual keyboard 1605 and virtual key region 1608 (e.g., including a palm rest region below the virtual keyboard 1605 and/or the areas along the lateral sides of the virtual keyboard 1605). The virtual keyboard 1605, the virtual key region 1608, and the trackpad region 1610 may all be part of or define a touch-input region of the computing device 1600. For example, touch and/or force inputs may be detected on any of these regions, and inputs that span regions (e.g., gestures starting in the virtual key region 1608 and ending in the trackpad region 1610) may be detected.

The trackpad region 1610 may optionally include or be associated with a display or an illuminated mask layer as well. A display may be used, for example, to display input areas, buttons, keys, or other affordances. As one example, a display underlying the trackpad region 1610 may produce an image of a border (e.g., representing or replicating an image of a trackpad) that indicates where a user may provide touch inputs. As another example, the display may produce an image of a slider that a user can select and/or move to change a volume setting of the computing device 1600. These are merely some examples, and numerous other images and objects can be displayed, and inputs to the trackpad region 1610 may affect numerous settings and operations of the computing device 1600.

The different regions of the top case 1602, including the trackpad region 1610, the virtual keyboard 1605, and the virtual key region 1608, may have the same or different textures, finishes, colors, or other physical properties or appearances. In some cases, substantially the entire surface of the top case 1602 has a uniform texture and appearance. In other cases, different regions have different textures or appearances. For example, the virtual key region 1608 may have a polished, smooth surface, while the virtual key region 1608 and the trackpad region 1610 may have a textured surface (e.g., dimpled, roughened, or the like).

The particular textures of these regions may be selected to produce a desired tactile feel during user interactions. For example, the virtual keyboard 1605 may be used for tap or touch inputs (e.g., without sliding or gesture inputs), and as such may have a smooth, polished surface. Smooth surfaces may, for example, prevent unintentional slipping of fingers or other input devices. The trackpad region 1610 and the virtual key region 1608, on the other hand, may be used for gesture inputs, such as finger or stylus swipes, and may have a roughened, textured, or otherwise less smooth surface. Such surface textures may reduce friction and/or sticking of fingers or other input devices during such inputs. Regions of different textures may be formed on a single, continuous top case 1602 (e.g., a continuous glass sheet) using any suitable techniques, such as abrasive blasting (e.g., sand blasting), chemical or physical etching, laser etching, grinding, polishing, lapping, or the like. In some cases, masks or shields may be used during processing to define areas which are to have different textures. For example, a mask may be applied to the virtual keyboard region 1605 while an etching or grinding operation is applied to the virtual key region 1608 and the trackpad region 1610.

The boundaries between the textures of different regions may indicate the boundaries of the input and/or output functionality provided by those regions. For example, the trackpad region 1610 (or a portion thereof) may be textured only in the area where touch inputs are actually sensed. Thus, the user will be able to differentiate, tactilely and/or visually, between a touch-sensitive trackpad input area and a non-touch-sensitive portion of the top case 1602. While the textured top case regions are described with respect to FIG. 16A, it will be understood that the same concepts and processes may apply equally to any of the top cases described herein.

Figure 16B:
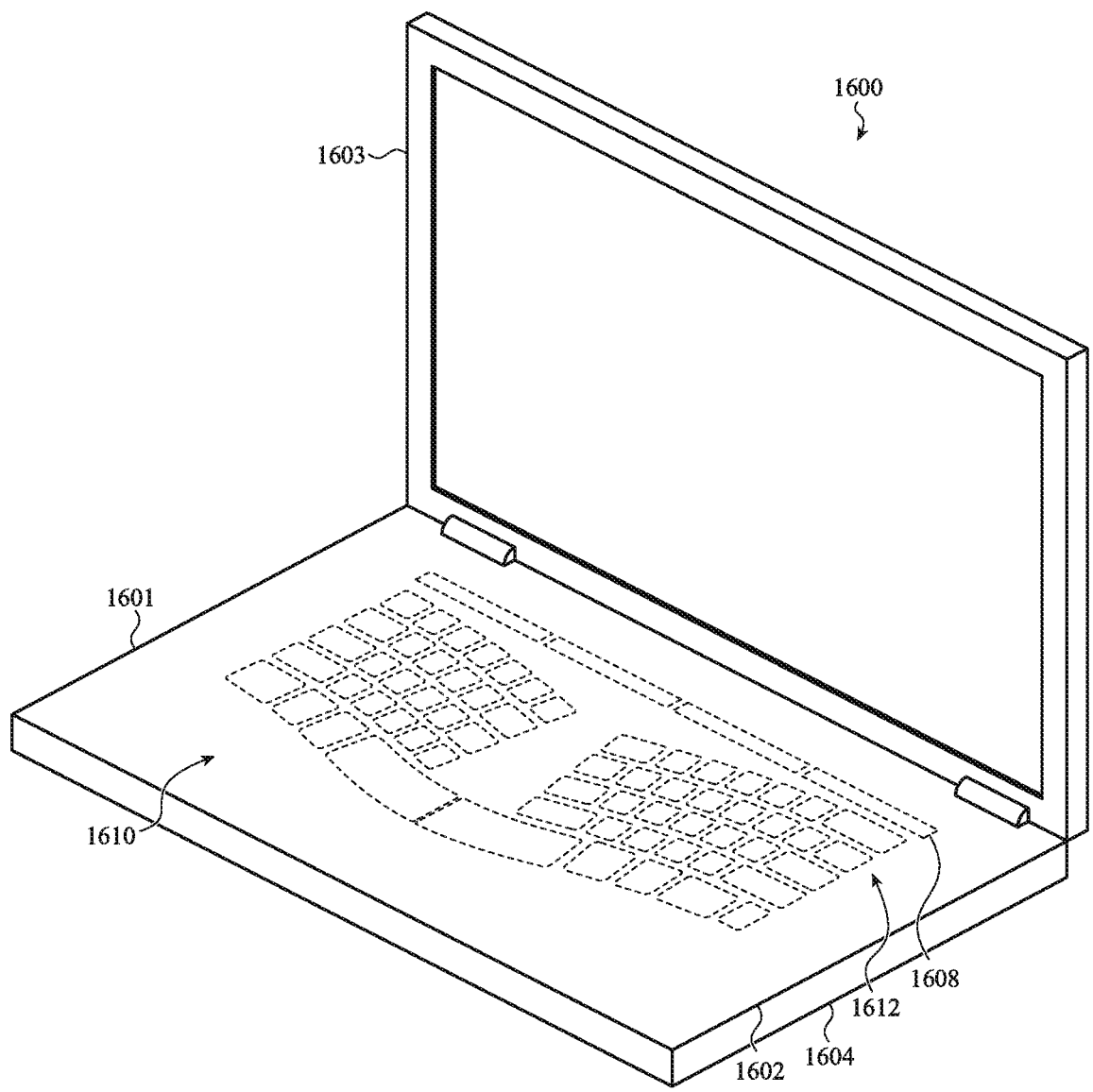
Figure 16C:
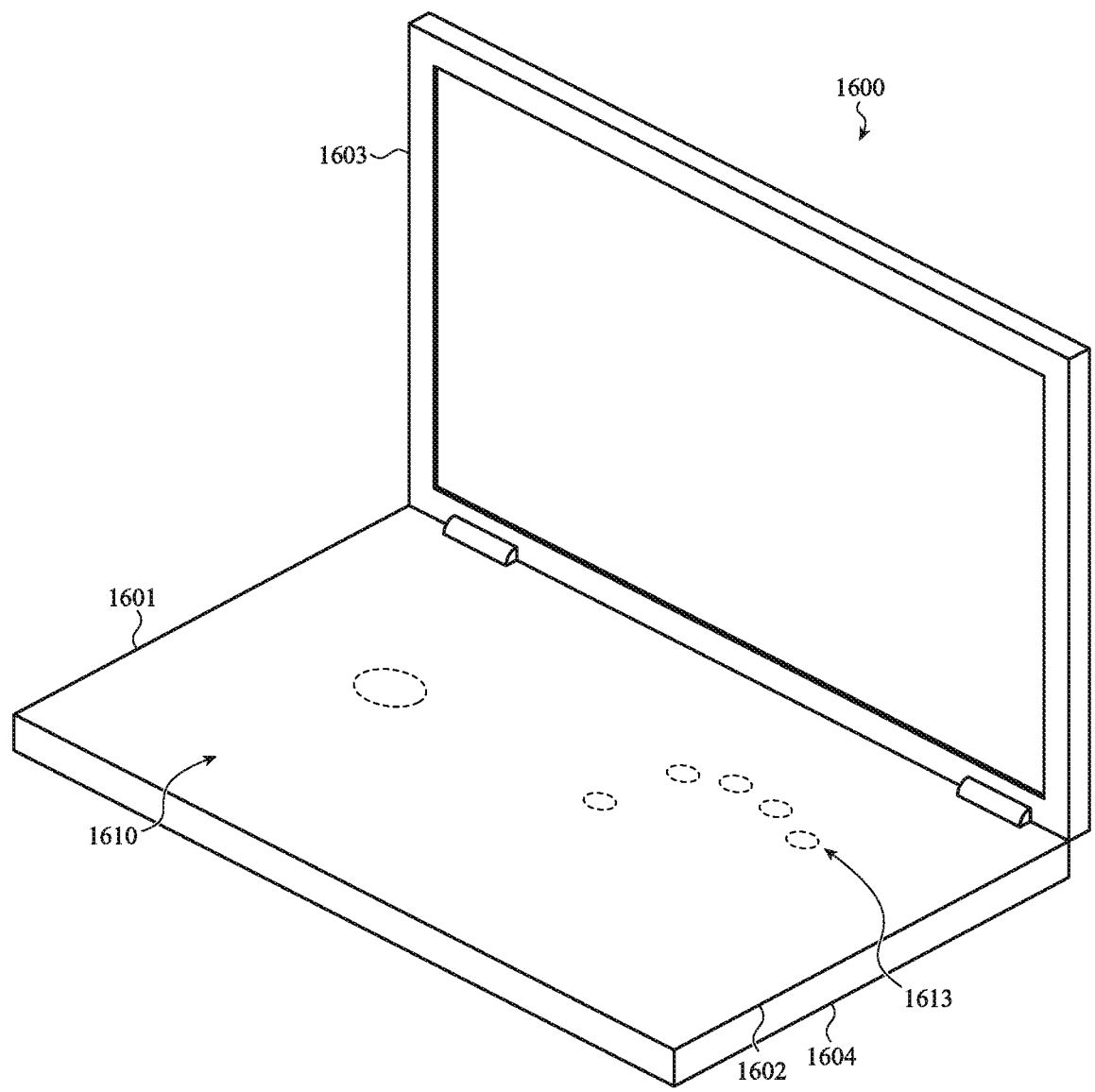

FIG. 16A illustrates the virtual keyboard 1605 in a traditional layout. However, because the images of the keys of the virtual keyboard 1605 are produced by a display below the top case, different keyboards may be displayed instead. For example, FIG. 16B depicts the computing device 1600 with a virtual keyboard 1612 in an alternate configuration (e.g., an ergonomic configuration). As another example, FIG. 16C depicts the computing device 1600 with a virtual keyboard 1613 in yet another alternate configuration. In this particular example, instead of a character-input layout, the virtual keyboard 1613 defines areas for other types of inputs and/or manipulations. Such an input may be used for controlling a game, where one input area (e.g., on the left side of the computing device 1600) controls a direction input, while other input areas (e.g., on the right side of the computing device 1600) may control discrete inputs. As shown, the input areas on the left side of the computing device 1600 define regions that may correspond to the fingertips of a user's hand, but this is merely one example configuration.

Other keyboard configurations are also possible, such as positioning a keyboard nearer the front of the computing device 1600 (e.g., the locations of the virtual keyboard 1605 (FIG. 16A) and the trackpad region 1610 may be swapped), or displaying keyboards with different alphabets or symbols, or the like. Also, the particular keyboard that is displayed (and/or the location of the keyboard) may be automatically selected by the computing device 1600 based on an operational state of the device, such as the particular program that is being executed, what is being displayed on an associated display screen, or the like.

Figure 16D:
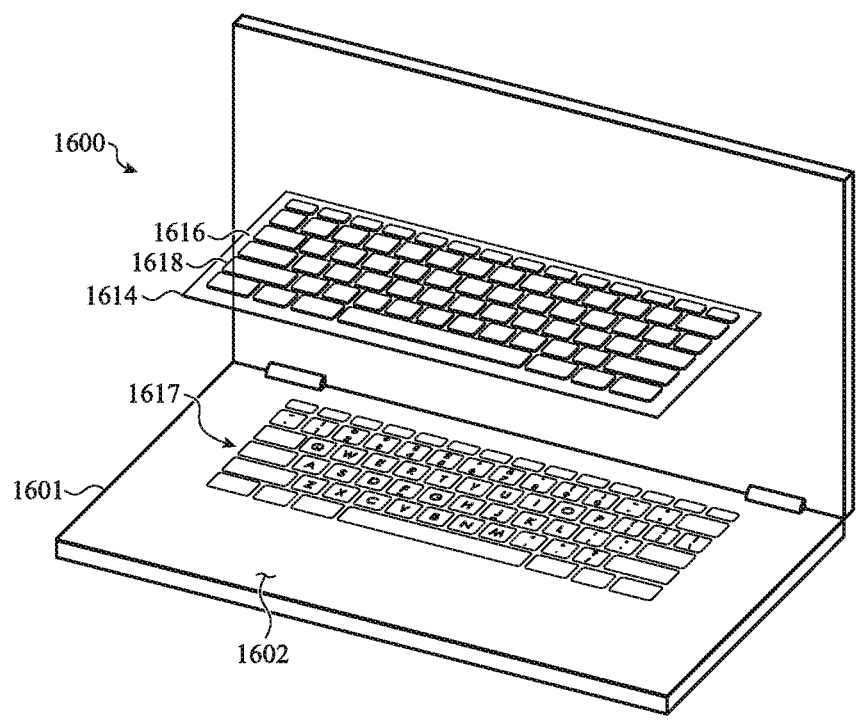
FIGS. 16D-16G depict the example computing device of FIGS. 16A-16C in conjunction with a keyboard accessory.

In order to actuate keys of a virtual keyboard as described above, a user may simply tap or press on a portion of the surface of the top case 1602 on which a key is displayed. In some cases, however, a virtual keyboard may be used in conjunction with a keyboard accessory that can be applied to the top case 1602. FIG. 16D illustrates the computing device 1600 with a keyboard accessory 1614 shown above the top case 1602. The keyboard accessory 1614 may include a base portion 1616 and keys 1618. The base portion 1616 and the keys 1618 may be a monolithic component, such as a molded silicone accessory. In some cases, the material may deform under a typical typing force to provide a tactile feedback or sensation of typing on a mechanical or movable keycap. Alternatively, the material may not deform under typical typing pressures, and the keys 1618 may simply provide raised, nonmoving key pads for a user to strike during typing.

In some cases, the keyboard accessory 1614 may include mechanical key mechanisms for the keys 1618, including, for example, keycaps, mechanisms, domes (or other components for providing tactile feedback), key make sensors (e.g., electrical switches, domes, capacitive sensing elements, etc.), and the like. The keyboard accessory 1614, and in particular the keys 1618, may also include components that facilitate key make sensing by a sensor underlying the top case 1602, such as metal or conductive elements that can be sensed by a capacitive sensor inside the computing device 1600.

Figure 16E:
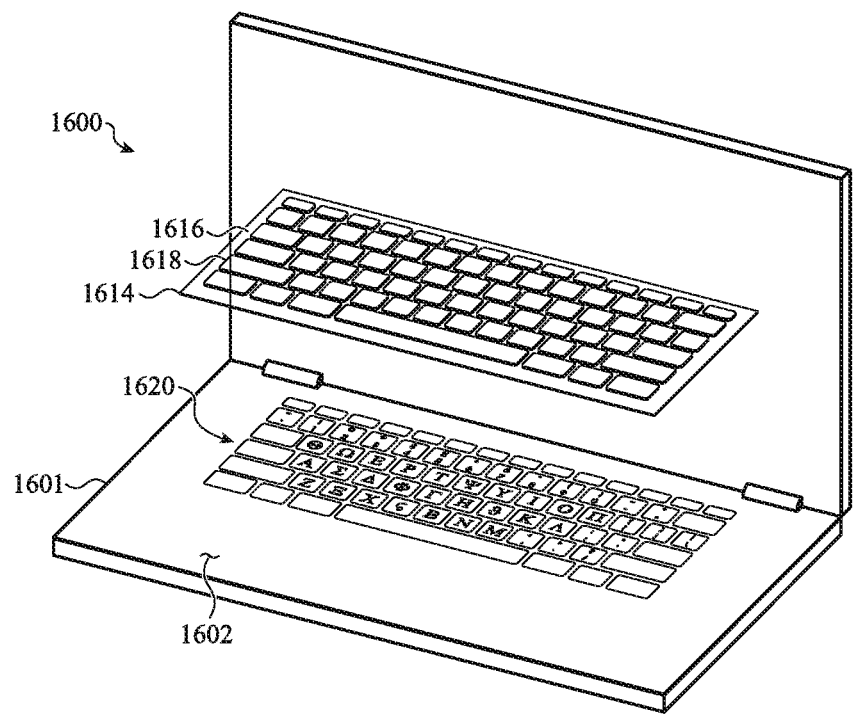
Figure 16F:
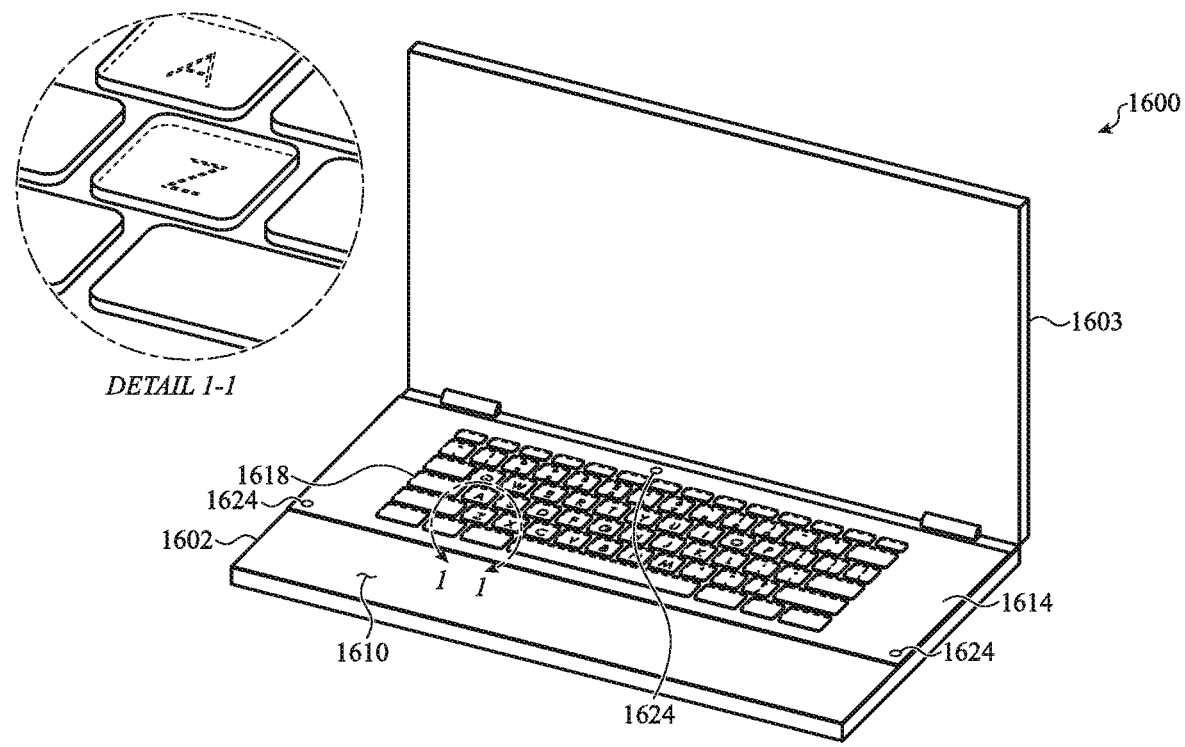

The keyboard accessory 1614 may be light-transmissive (e.g., transparent) such that glyphs, symbols, characters, or other images may be displayed on the top case 1602 by a display within the base portion 1601 and visible through the keys 1618. Accordingly, while the keyboard accessory 1614 may provide fixed, physical keys on which users may type, the function of those keys (e.g., what character will appear when a particular key is struck) may be changed dynamically. For example, FIG. 16D shows a standard QWERTY keyboard 1617 displayed on the top case 1602, which may be visible through the keyboard accessory 1614, as shown in FIG. 16F. FIG. 16E shows the computing device 1600 displaying an alternative keyboard 1620 (e.g., alternative glyphs or characters), which may be visible through the keyboard accessory 1614 when the keyboard accessory 1614 is applied to the top case 1602. In order to allow images on the display to be visible through the keyboard accessory 1614, the keyboard accessory 1614 may be made from materials that have a same or similar refractive index as the top case 1602. Moreover, where the keyboard accessory 1614 includes multiple components (e.g., keycaps, keyboard substrates or base portions, elastomeric biasing members, etc.), the multiple components may have the same or similar refractive indices. In this way, bending, diffraction, distortion, magnification (or other optical phenomena) of the images displayed through the top case 1602 and the keyboard accessory 1614 may be reduced or eliminated.

The keyboard accessory 1614 may be configured to be positioned in one location on the top case 1602. In such cases, the keyboard accessory 1614 and/or the top case 1602 (and/or any other portion or area of the computing device 1600) may include optical and/or physical guides to help a user position the keyboard accessory 1614 on the top case 1602. For example, the top case 1602 and the keyboard accessory 1614 may have complementary protrusions and recesses (or any other suitable alignment features) that engage with each other to properly locate the keyboard accessory 1614. As another example, the top case 1602 and/or the keyboard accessory 1614 may have registration marks, lines, arrows, or other visual indicators that indicate where and/or how the keyboard accessory 1614 is to be positioned. Of course, the computing device 1600 may be configured to be used with or without the keyboard accessory 1614. For example, if a keyboard without physical keys is desired, a user may simply forgo use of the keyboard accessory 1614 and instead type directly on the top case 1602.

Figure 16G:
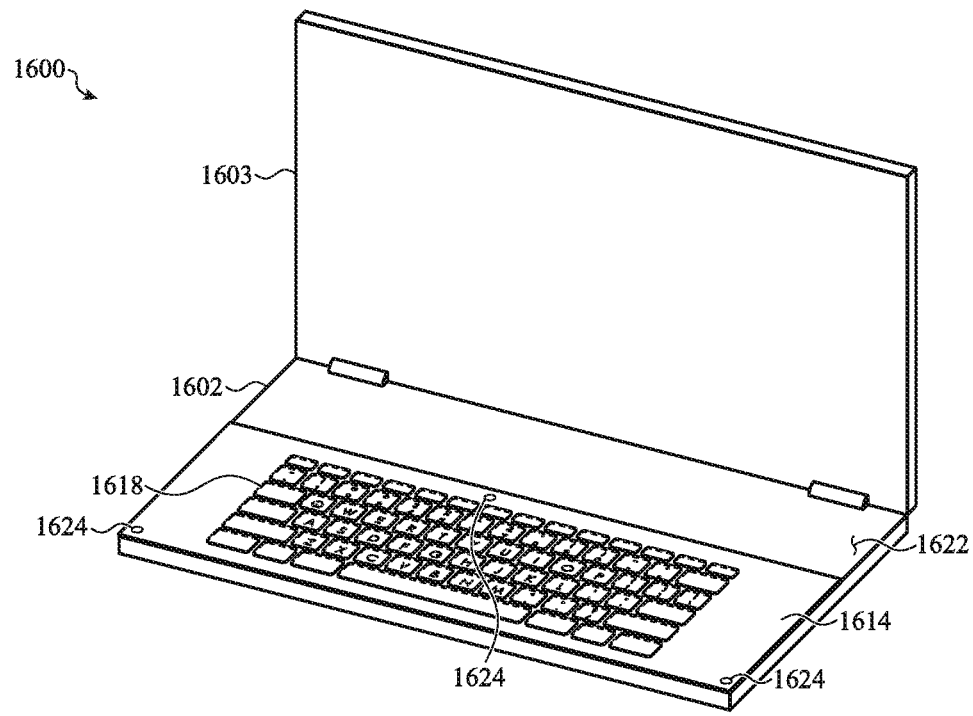

In some cases, the keyboard accessory 1614 may be applied anywhere on the top case 1602. For example, FIG. 16F shows the computing device 1600 with the keyboard accessory 1614 applied to the top case 1602 above the trackpad region 1610, and nearer to the display portion 1603 than the front edge of the computing device 1600. FIG. 16G, on the other hand, shows the keyboard accessory 1614 applied to the top case 1602 below a trackpad region 1622, and further from the display portion 1603.

The computing device 1600 may detect a particular location and/or positioning of the keyboard accessory 1614 and display glyphs, symbols, or other images in suitable positions below the keyboard accessory 1614 to coincide with the keys 1618 of the keyboard accessory 1614. For example, the keyboard accessory 1614 may include components 1624, such as magnets, metal or conductive pieces, radio-frequency tags, or the like, that can be sensed or otherwise detected by the computing device 1600. When the keyboard accessory 1614 is applied to the computing device 1600, the computing device 1600 may determine information from the components 1624, such as the location of the keyboard accessory 1614 on the top case 1602 and the key layout of the keyboard accessory 1614 (e.g., by consulting a lookup table to correlate information detected from the keyboard accessory 1614 with a particular model, keyboard layout, or other information about the keyboard accessory 1614). Once the computing device 1600 has determined the key layout and the location of the keyboard accessory 1614, it can display images on the top case 1602 at locations that coincide with the keys 1618 and that are visible through the keys 1618.

Figure 17A:
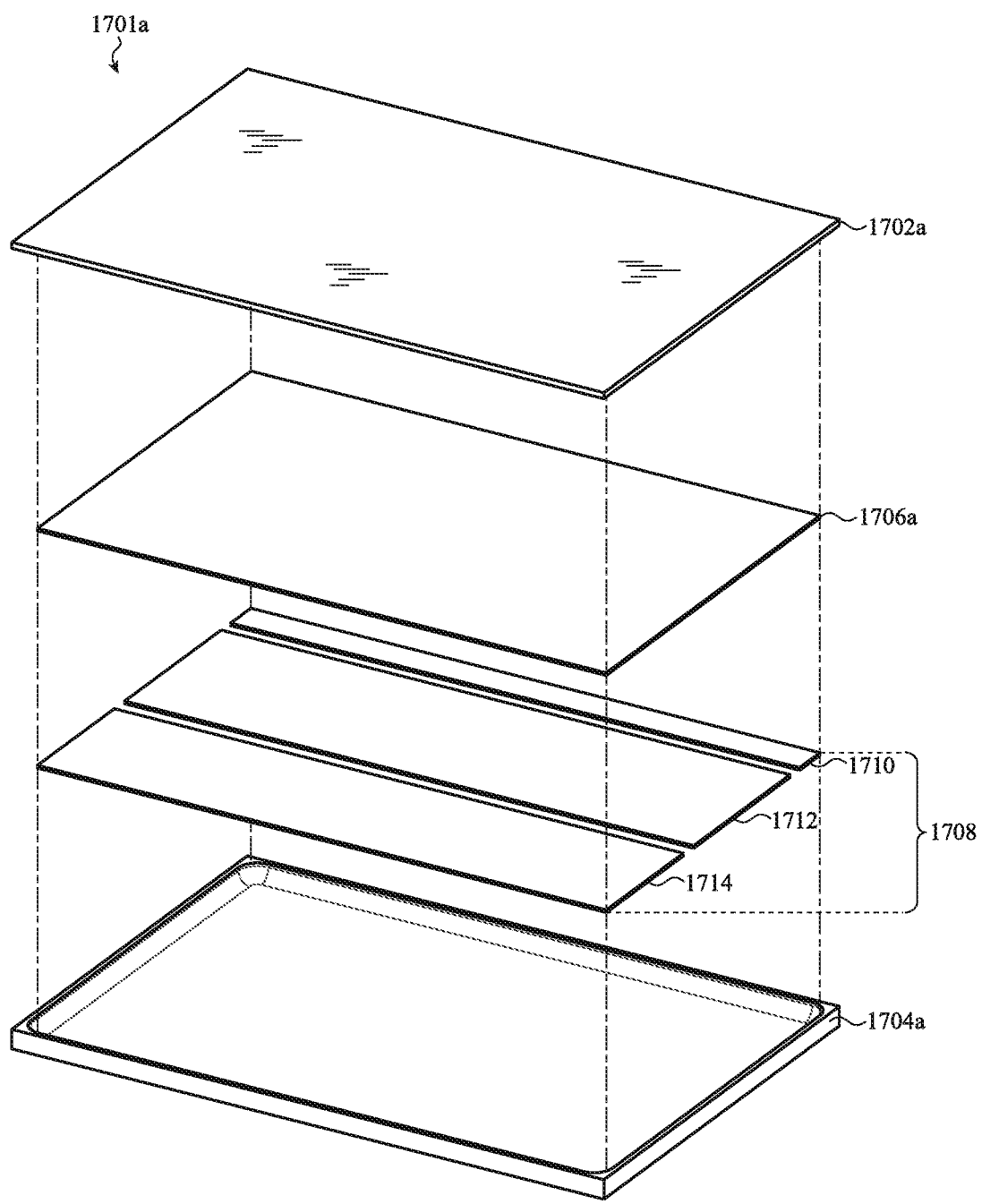
FIGS. 17A-17B depict exploded views of example base portions of the computing device of FIGS. 16A-16C.

FIG. 17A depicts an exploded view of an example base portion 1701*a*, which may generally correspond to the base portion 1601 of FIG. 16A. The base portion 1701*a* includes a top case 1702*a* (corresponding to the top case 1602), a bottom case 1704*a* (corresponding to the bottom case 1604), and a touch sensor 1706*a* below the top case 1702*a* (e.g., disposed within the interior volume defined by the top case 1702*a* and the bottom case 1704*a*). The base portion 1701*a* also includes a display 1708 below the touch sensor 1706*a*.

Portions of the touch sensor 1706*a* and the top case 1702*a* may be transparent to allow the display 1708 to be viewed through the top case 1702*a* and the touch sensor 1706*a*. Some portions of the top case 1702*a* and/or the touch sensor 1706*a* may be substantially opaque, for example to define and visually distinguish regions that are not touch sensitive, or to cover or occlude internal components.

The display 1708 has a first display component 1710, a second display component 1712, and a third display component 1714. The first display component 1710 is positioned under the virtual key region 1608 (FIG. 16A) and displays images for the virtual key region 1608. The second display component 1712 is positioned under the virtual keyboard region 1605 (FIG. 16A), and displays images for the virtual keyboard region 1605, such as images or representations of keys. The third display component 1714 may be used in implementations where the trackpad region 1610 (FIG. 16A) is transparent and/or is configured to display images. Where a trackpad region 1610 is not associated with a display, the third display component 1714 may be omitted. The first, second, and third display components may include or be associated with any suitable display components, such as LCDs, LEDs, OLEDs, backlights, side lights, filter layers, light diffusor layers, light guides, or the like.

The first, second, and third display components may be separated physically and operationally, each including its own unique hardware and software components, such as its own LCD array and light source, or its own OLED array. Alternatively, they may share one or more components, such as a processor, a backlight, or the like. Providing discrete display components for the different display regions may increase the space available for other components, as regions that do not require a display can be free of display components, leaving more space for other components. Also, when one of the discrete displays is not being used it can be turned off or blacked out independent of the other displays.

Figure 17B:
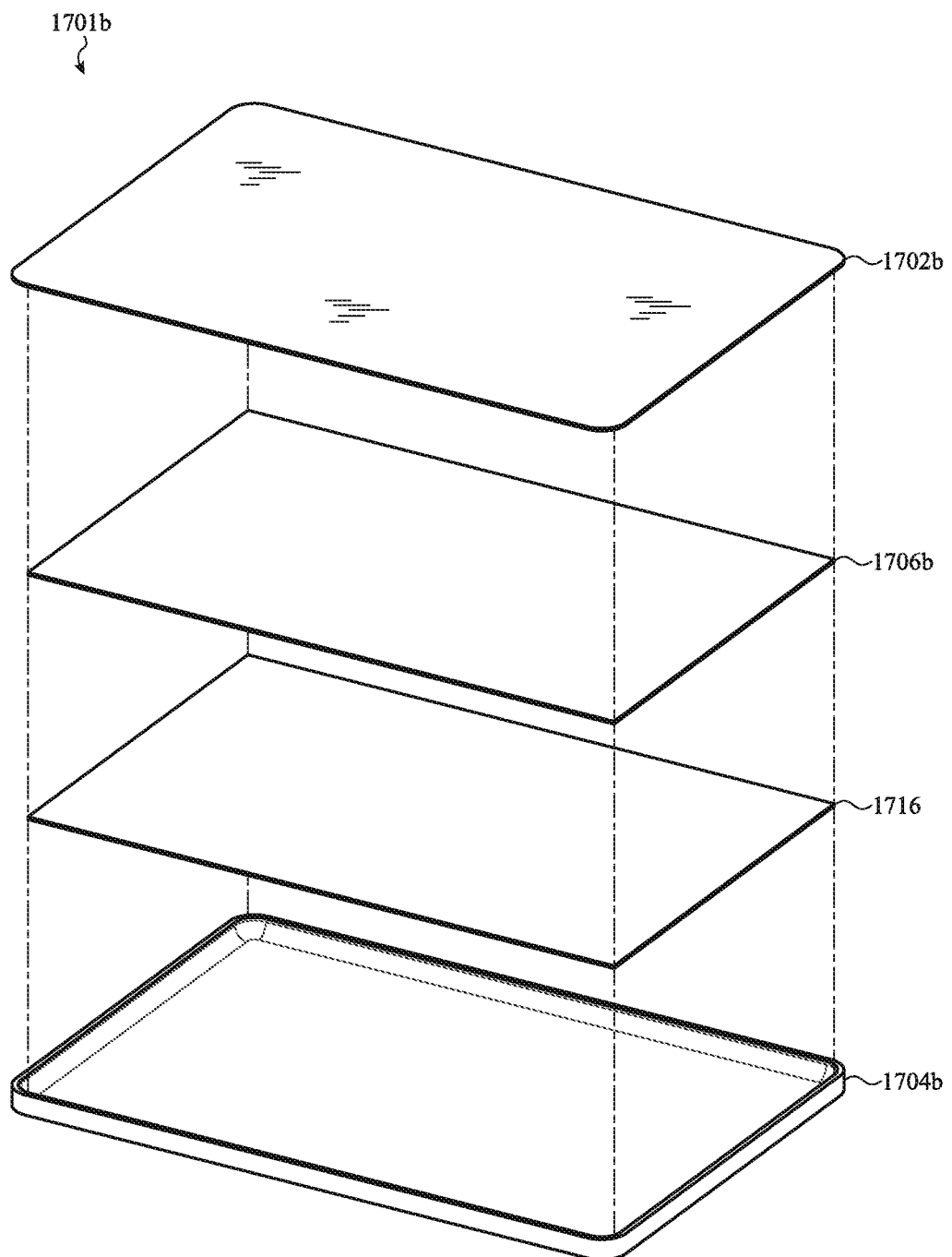

FIG. 17B depicts an exploded view of another example base portion 1701*b*, which may generally correspond to the base portion 1601 of FIG. 16A. The base portion 1701*b* includes a top case 1702*b* (corresponding to the top case 1602), a bottom case 1704*b* (corresponding to the bottom case 1604), and a touch sensor 1706*b* below the top case 1702*b* (e.g., disposed within the interior volume defined by the top case 1702*b* and the bottom case 1704*b*). As noted above, portions of the touch sensor 1706*b* and the top case 1702*b* may be transparent, while some portions of the top case 1702*b* and/or the touch sensor 1706*b* may be substantially opaque, for example to define and visually distinguish regions that are not touch sensitive, or to cover or occlude internal components.

The base portion 1701*b* also includes a display 1716 below the touch sensor 1706*b*. Whereas the display 1708 in FIG. 17A had three distinct displays (each corresponding to a different input/output region), the base portion 1701*b* includes only a single display 1716 that spans all of the input/output regions. For example, the display 1716 may be substantially coextensive with the top case 1702*b*. Different regions of the display 1716 can be used to produce images or other graphical objects on different regions of the top case 1702*b*, such as a keyboard region (e.g., the virtual keyboard region 1605, FIG. 16A), a virtual key region (e.g., the virtual key region 1608, FIG. 16A), and a trackpad region (e.g., the trackpad region 1610, FIG. 16A).

In conventional computing devices with keyboards, key mechanisms, which are exposed on the outside of the device, mechanically couple to components within the device. For example, a keycap may physically connect to a dome switch (or other component) that is attached to a circuit board within the device. A top case of such a device may have openings or holes through which the keycap physically engages the component(s). As noted above, however, an integrated interface system as described herein may include a continuous top case, such as a glass top case, that does not include any openings or holes in the input surface. Such continuous top cases, however, do not permit a physical connection between keys and interior circuit boards. Such top cases thus prevent the use of traditional physical couplings between keys and interior circuit boards to detect key presses. As noted above, one technique for detecting key presses, as well as other touch inputs applied to the top case of an integrated interface system, is to include a touch sensor below portions of the top case that are configured to receive touch inputs. This may include, for example, a keyboard region, a non-keyboard region, a virtual key region, or other regions of the top case.

Figure 18A:
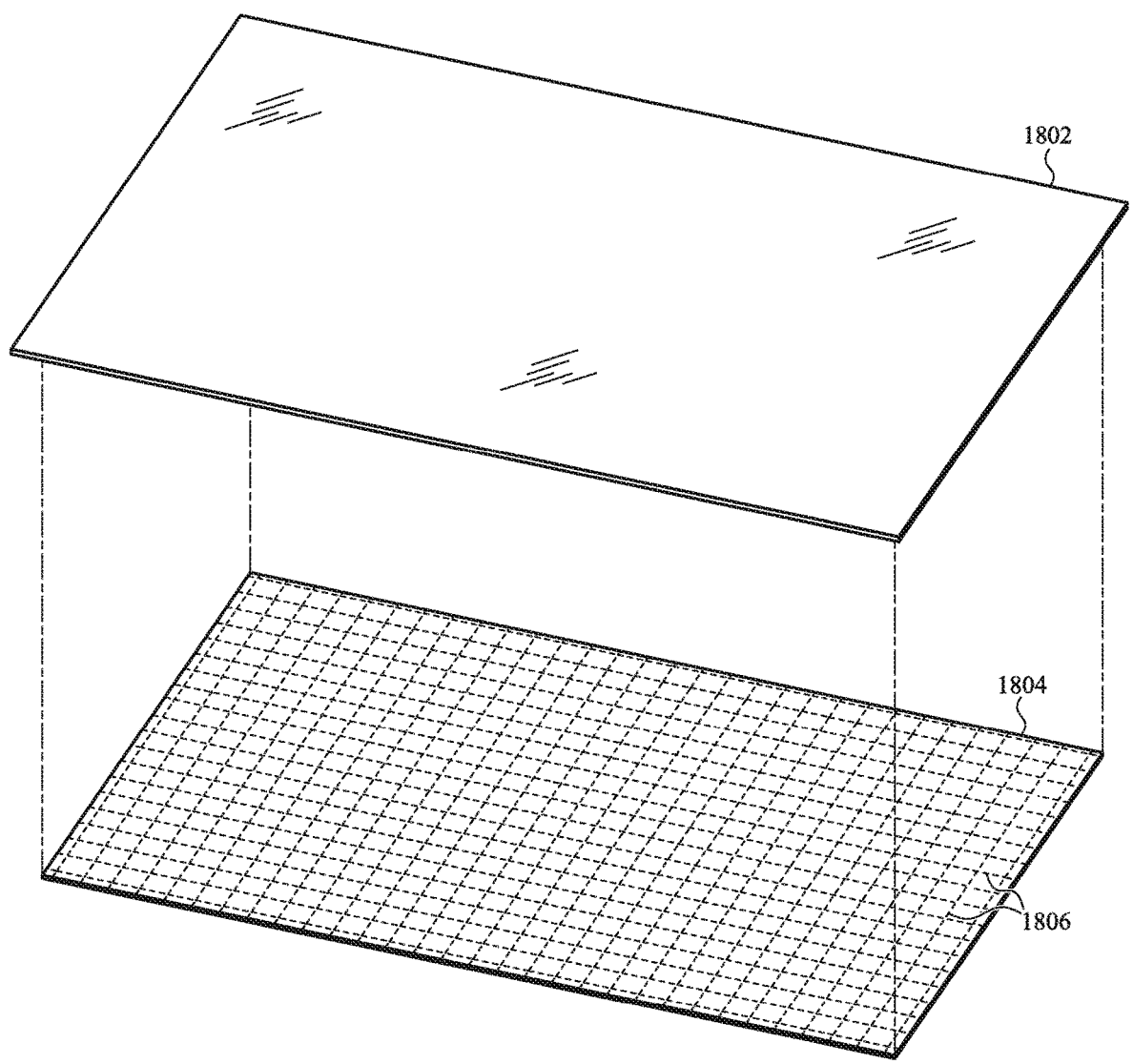
FIGS. 18A-18B depict partial exploded views of example base portions of a computing device having a touch-sensitive input surface.

FIG. 18A depicts an exploded view of part of a base portion of a computing device. More particularly, FIG. 18A depicts an example top case 1802 and a touch sensor 1804. The top case 1802 may be formed from glass, ceramic, or any other suitable material, and may not have any openings or holes. The top case 1802 may include mechanical or virtual keys, or a combination of mechanical and virtual keys.

Below the top case 1802 is a touch sensor 1804. The touch sensor 1804 may be any suitable type of touch sensor, and may use any suitable touch-sensing technology. For example, the touch sensor 1804 may be a capacitive touch sensor that detects touch inputs by detecting a change in capacitance caused by the presence of a finger (or other implement) on or near the top case 1802. In such cases, the touch sensor 1804 may include one or more layers with conductive traces 1806 disposed thereon. The conductive traces 1806 may act as plates of capacitors, between which capacitance is measured. The conductive traces 1806 may be conductive material, such as indium tin oxide (ITO), indium gallium oxide, gallium zinc oxide, indium gallium zinc oxide, metal nanowire, nanotube, carbon nanotube, graphene, conductive polymers, a semiconductor material, a metal oxide material, copper, gold, constantan, or any other suitable material, and may be disposed on a substrate such as a circuit material (e.g., a flex circuit). In cases where the top case 1802 is transparent and the conductive traces 1806 are in a display path (e.g., between a display and the top case 1802, the conductive traces 1806 may be substantially transparent (e.g., using ITO). In cases and/or regions where the top case 1802 is not transparent, is painted, or where transparency of the conductive traces 1806 is otherwise not necessary, the conductive traces 1806 may be formed from a non-transparent material, such as solid metal traces (e.g., copper, gold, silver, etc.). The touch sensor 1804 may include other layers or components, including dielectric materials, substrates, connectors, electrodes, and the like.

The touch sensor 1804 may be substantially transparent, such as where a display (e.g., the display 1708 or 1716, FIGS. 17A-17B) is positioned under the touch sensor 1804 and displays images through the touch sensor 1804. Where no display is used or where light or images do not need to pass through the touch sensor 1804, it may be non-transparent. The touch sensor 1804 may be in contact with the top case 1802, attached to the top case 1802, or it may be set apart from the top case 1802 by a gap (which may be a layer of material or an empty space).

The touch sensor 1804 may be sized to provide touch sensing to substantially the entire top surface of the top case 1802 (e.g., the touch sensor 1804 may extend over substantially an entire area of the top case 1802, or at least an entire area of the top case 1802 that defines a top surface of a base portion). Accordingly, the touch sensor 1804 may be used to detect touch inputs applied to anywhere on the top case 1802. More particularly, the touch sensor 1804 can detect touch inputs that are similar to those typically detected by a trackpad, such as taps, swipes, gestures, and multi-touch inputs. By disposing the touch sensor 1804 below a keyboard, similar inputs may be detected when applied to the keys of a keyboard (whether it is a virtual or a mechanical keyboard). For example, in addition to detecting key presses of a keyboard, the touch sensor 1804 may detect swipes, gestures, and multi-touch inputs that are applied to the keys of a keyboard. Also, because the touch sensor 1804 spans both key and non-key regions, swipes, gestures, and multi-touch inputs can begin on the keys (or even the keycaps of a mechanical key) and end outside the keyboard region (or vice versa). Accordingly, the entire top case of a computing device effectively acts as a trackpad, even the surfaces of the keys (e.g., the keycaps) themselves. Techniques for detecting inputs applied to keys, including both key presses and touch inputs (e.g., gestures), are discussed herein. Touch sensors as described herein may also be used to detect the location of fingers or other implements that are not in physical contact with the top case 1802. For example, touch sensors may detect the presence or location of a finger that is hovering above the top case 1802. As described herein, this information may be used for various purposes, such as to determine intended key targets for the purposes of spelling suggestions, automatic spelling/grammar corrections, or any other suitable purpose.

Figure 18B:
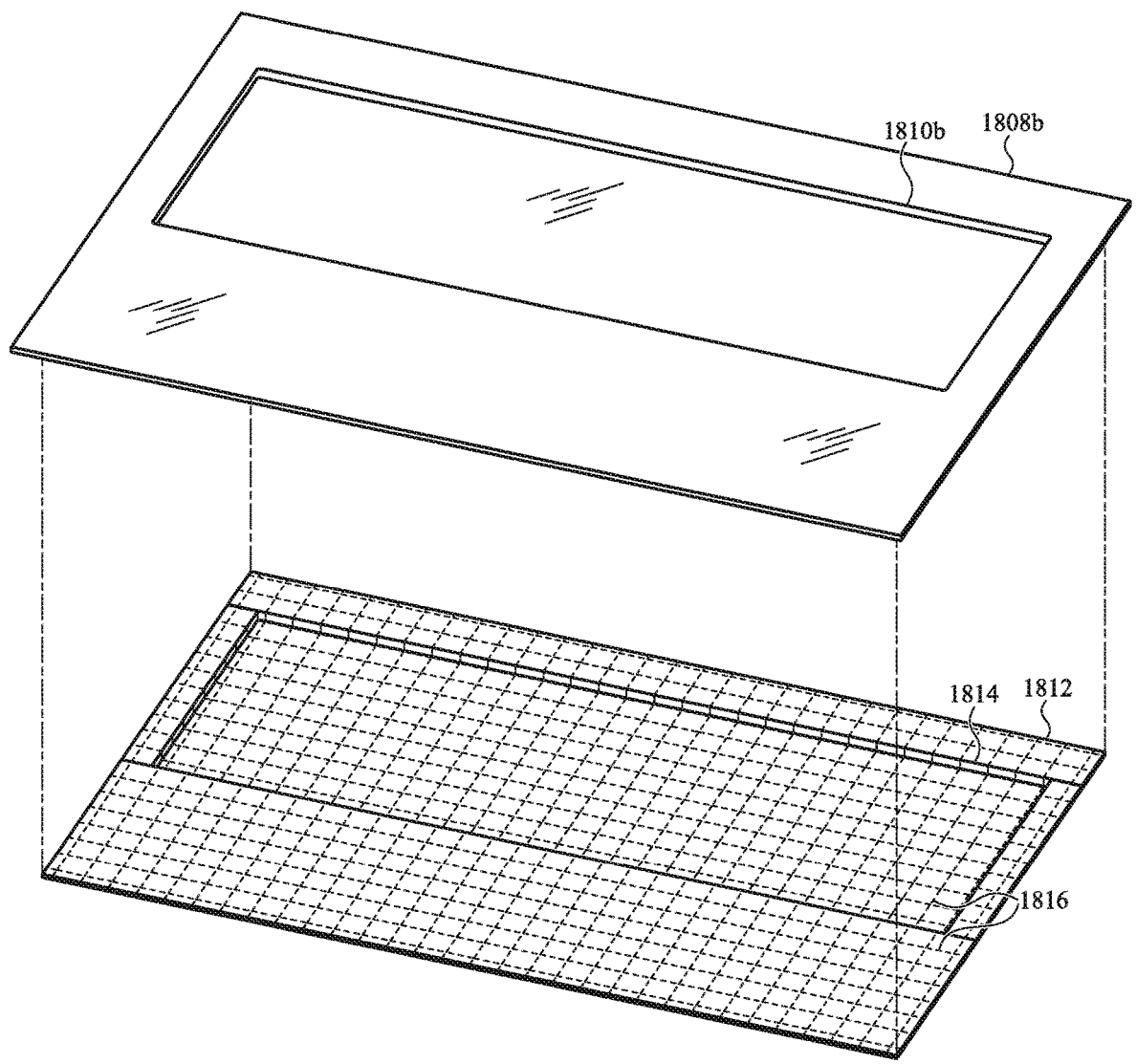

The top case 1802 in FIG. 18A is substantially flat or planar (e.g., it defines a planar top exterior surface of the top case 1802 and thus of a base portion of a computing device). Accordingly, the touch sensor 1804 is also substantially planar, allowing a close coupling between the top case 1802 and the touch sensor 1804. As noted above, however, a top case may have one or more recesses, such as a recessed region in which a keyboard may be positioned. FIG. 18B illustrates a top case 1808b having a recessed region 1810b, and a touch sensor 1812 having a recessed region 1814. The top case 1808b and touch sensor 1812 are similar to the top case 1302 and touch sensor 1310 described with respect to FIG. 13B. Conductive traces 1816, similar to the conductive traces 1806 described above, may be disposed on the touch sensor 1812. The conductive traces 1816 may extend continuously across the recessed region 1814 and surrounding non-recessed regions, thus forming a single, integrated touch sensor over the whole top case.

Figure 18C:
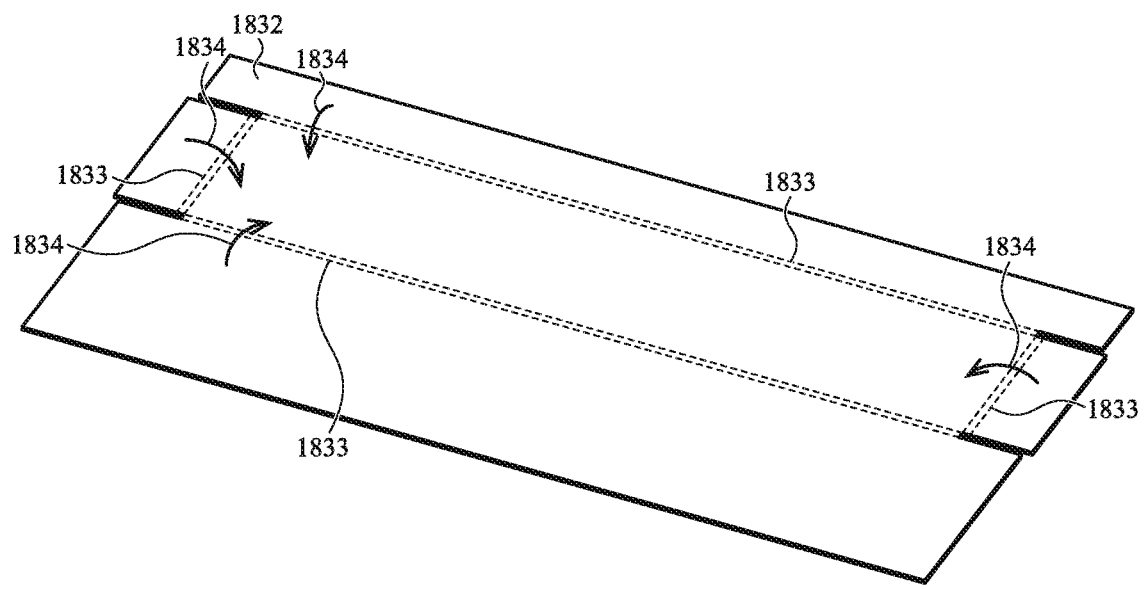
FIGS. 18C-18D depict portions of the touch sensor of FIG. 18B
Figure 18D:
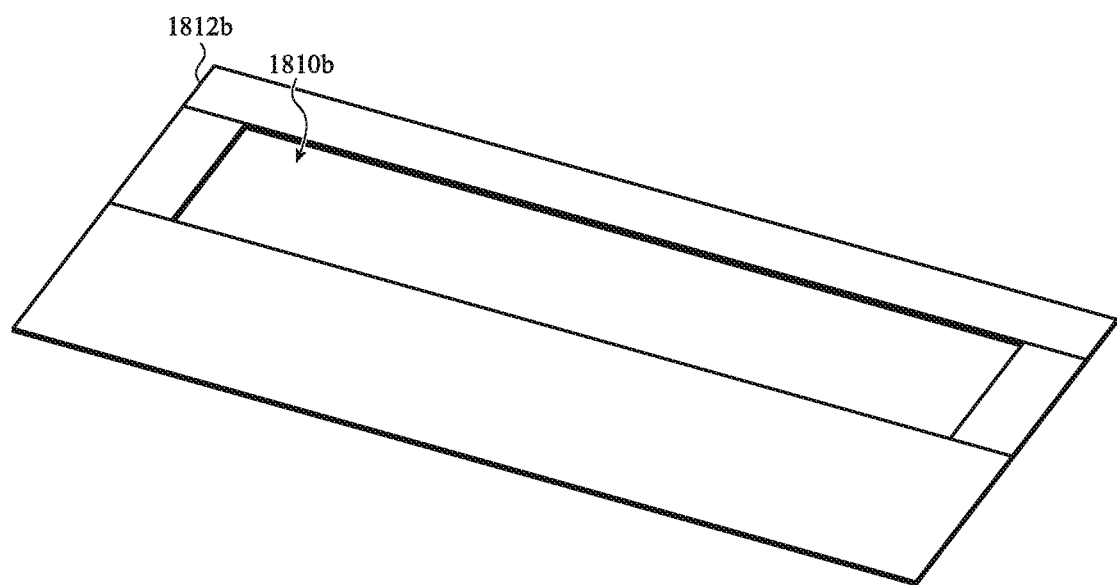

The recessed region 1814 of the touch sensor 1812 may be formed by folding a flat substrate (e.g., flexible circuit material, Mylar, etc.) that has been cut or shaped to produce the desired three-dimensional shape. For example, FIG. 18C shows a portion of a substrate 1832 having a shape that, when folded along fold lines 1833 (according to the arrows 1834), produces the touch sensor 1812 shown in FIG. 18B. FIG. 18C shows the same portion of the substrate 1832 after it has been folded. The substrate 1832 may be folded after being partially coupled to the top case 1808b. For example, the substrate 1832 may be attached to the bottom of the recessed region 1810b, and then the remainder of the substrate 1832 may be folded to conform to the other regions of the top case 1808b.

Figure 18E:
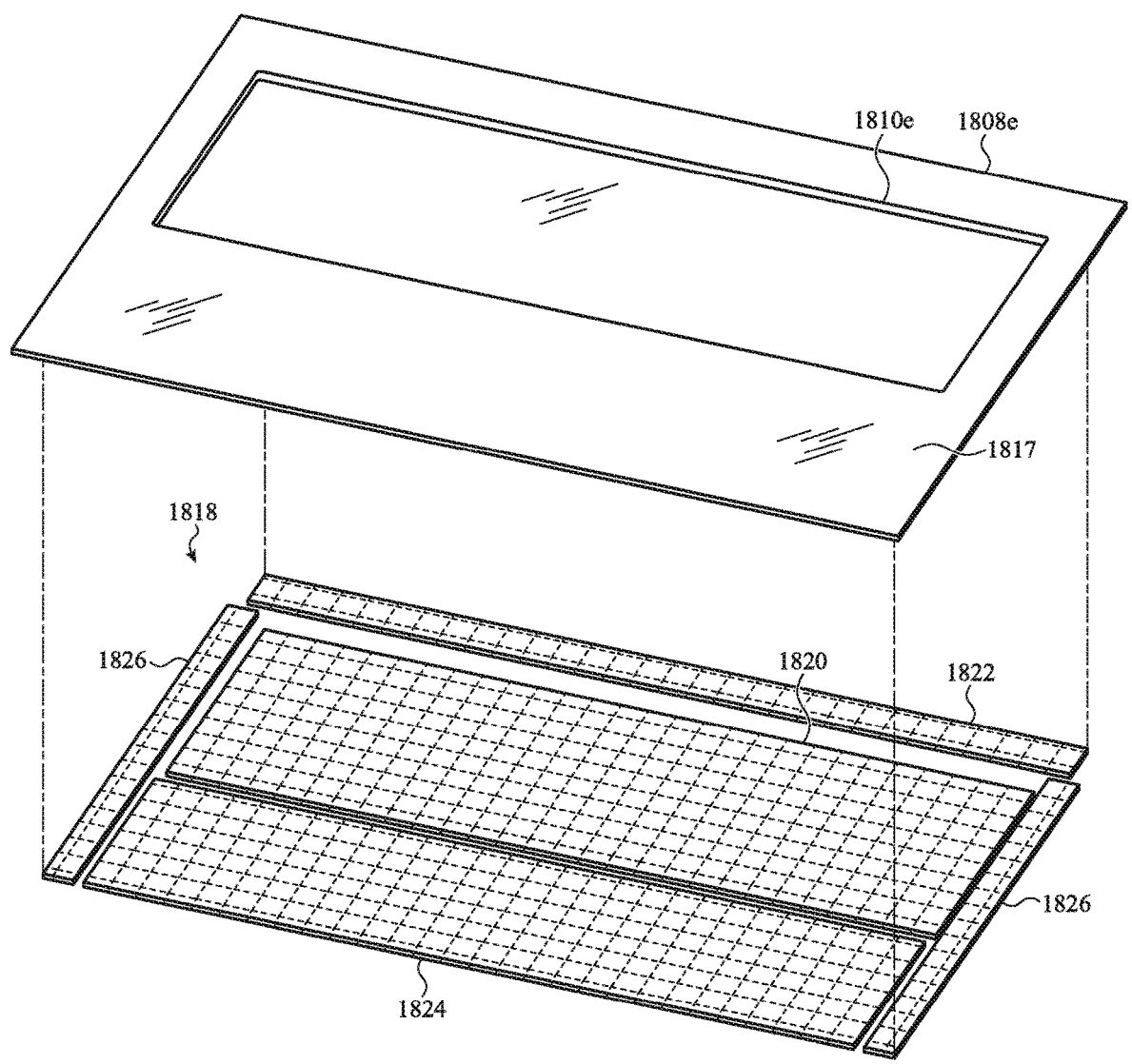
FIGS. 18E-18F depict other examples of top cases of a computing device having a touch-sensitive input surface.

FIG. 18E depicts another example top case 1808e, similar to the top case 1808b, having a recess or recessed region 1810e. Instead of a single, continuous touch sensor, however, FIG. 18E depicts a touch-sensing system 1818 having several discrete touch sensors that, together, provide touch input capabilities to substantially the entire top case 1808e. In particular, the touch-sensing system 1818 includes a first touch sensor 1820 positioned below the recess 1810e, and provides touch sensing (including key press sensing, gesture sensing, and multi-touch sensing) to a keyboard that is positioned in the recess 1810e. The touch-sensing system 1818 also includes a second touch sensor 1822 positioned below and provides touch sensing to a region where a virtual key region (e.g., the virtual key region 1208, FIG. 12A) may be located. The touch-sensing system 1818 also includes a third touch sensor 1824 positioned below a palm rest or trackpad region 1817, and fourth touch sensors 1826 positioned along the sides of the recessed region 1810e. Any of the forgoing touch sensors may be omitted if no touch sensing functionality is to be provided for a particular region.

Figure 18F:
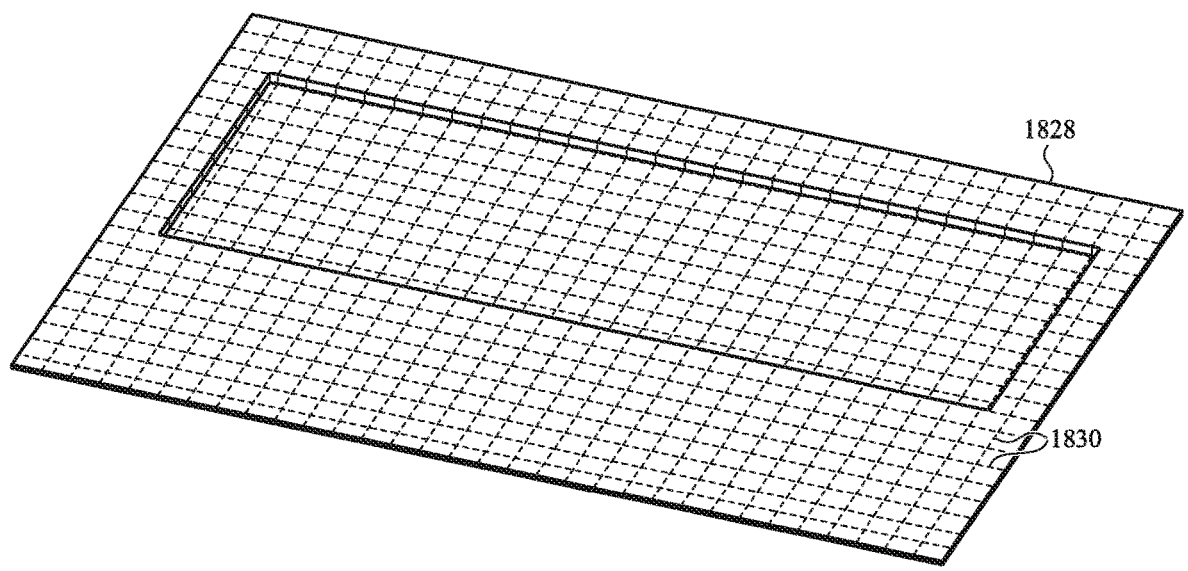

FIG. 18F depicts an example top case 1828 that has conductive traces 1830 disposed directly thereon. For example, the top case 1828 may be formed from a glass, ceramic, or other light-transmissive dielectric material. Instead of applying conductive traces to a separate substrate and positioning the substrate on or near the top case 1828, conductive traces 1830 may be disposed directly on the bottom surface of the top case 1828. The conductive traces 1830 may be formed from or include any suitable material, such as ITO, indium gallium oxide, gallium zinc oxide, indium gallium zinc oxide, metal nanowire, nanotube, carbon nanotube, graphene, conductive polymers, a semiconductor material, a metal oxide material, copper, gold, constantan, or the like. Where the top case 1828 is transparent, such as when it is used in conjunction with one or more displays to produce virtual keys or other images on the top case 1828, the conductive traces 1830 may be transparent or substantially transparent. Where the top case 1828 is not transparent, the conductive traces 1830 may be transparent or not transparent. The conductive traces 1830 may be disposed on the top case 1828 in any appropriate manner, such as lithography, chemical or physical vapor deposition, nozzle deposition (e.g., printing), or the like.

While the foregoing examples show touch sensors positioned under a top member of a top case, and thus configured to detect touch inputs on the top surface of the top case, touch sensors may also be positioned and configured to detect touch inputs on side surfaces of a top case. For example, in cases where a top case defines sidewalls, touch sensors and/or touch sensing components (e.g., electrode layers) may be positioned against or otherwise near the interior surfaces of the sidewalls. Touch inputs applied to the sidewalls, such as taps, swipes, etc., may be detected by the touch sensors to cause the device to perform one or more operations.

As noted above, top cases, such as single-sheet glass top cases, may be reinforced to increase the structural integrity (e.g., stiffness, strength, etc.) of the top case and the computing device overall. Additionally, top cases may include reinforcing and/or stiffening features that help define distinct touch and/or force input regions. For example, reinforcements, ribs, or other features may help prevent a touch or force input that is applied to one region of the top case from causing deflection or deformation in another region of the top case.

Figure 19A:
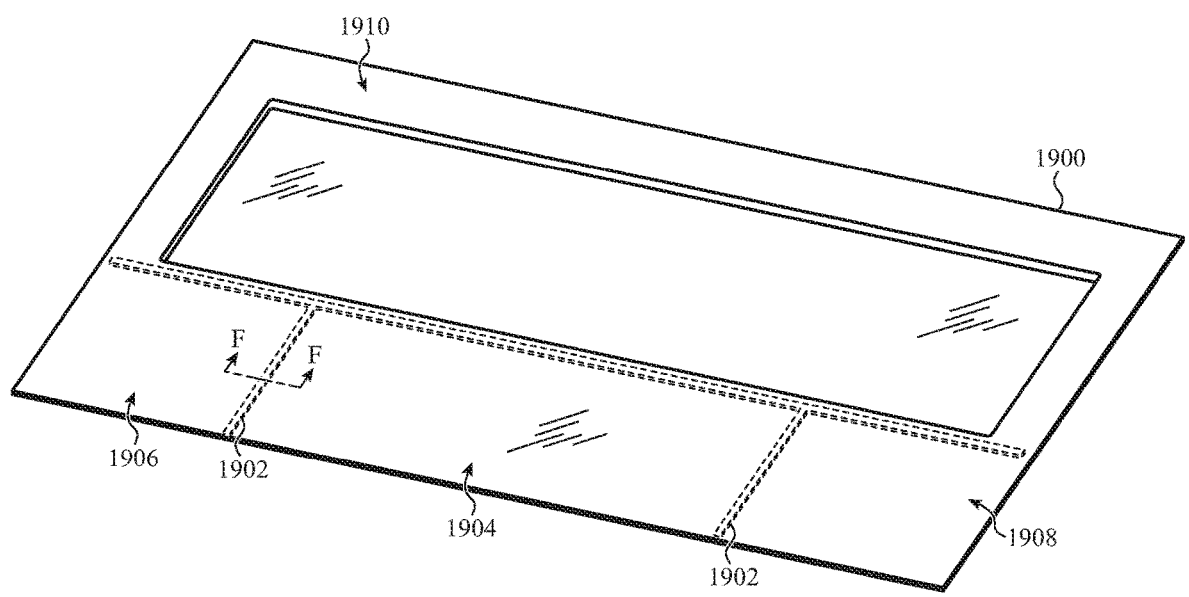
FIG. 19A depicts an example top case for a computing device.

FIG. 19A depicts an example top case 1900 that includes reinforcements 1902 on the bottom surface of the top case 1900. The reinforcements are shown as integral to the top case 1900, though they may be separate components that are attached to the top case, as described above with respect to FIGS. 8A-9B.

The reinforcements 1902 define several distinct regions. A first region 1910 may correspond to a portion of the top case 1900 on which a keyboard is disposed (either a virtual or mechanical keyboard). A second region 1904 may correspond to a trackpad region. Third and fourth regions 1906, 1908 may be additional touch-input regions, and may correspond to a palm rest area where users may rest their hands during typing. These regions are merely examples, and other configurations of the reinforcements 1902 are also contemplated.

The regions defined by the reinforcements 1902 may be configured to isolate the effects of touch and/or force inputs to particular regions. For example, the reinforcements 1902 may help prevent forces applied within the first region 1910, such as selections of mechanical keys, from causing deflections in the second or trackpad region 1904 that could be incorrectly identified as clicks or touch inputs to the second region 1904. Similarly, the reinforcements 1902 may reduce the deflection caused in the first or second regions 1910, 1904 from a user's palms resting on the third and fourth regions 1906, 1908.

Figure 19B:
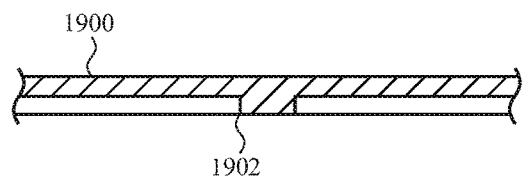
FIGS. 19B-19D depict partial cross-sectional views of the top case of FIG. 19A, viewed along section F-F in FIG. 19A.

FIG. 19B depicts a partial cross-sectional view of the top case 1900 viewed along section F-F in FIG. 19A. As shown, the reinforcement 1902 forms a rib that extends from a bottom surface of the top case 1900. The reinforcement 1902 may be formed by any suitable process, including machining, etching, ablating, or the like.

Figure 19C:
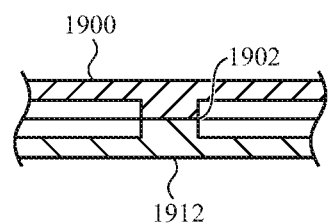
Figure 19D:
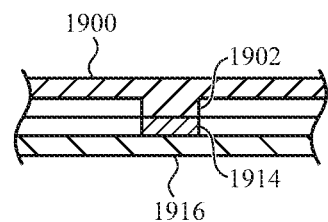

The reinforcements 1902 may contact or engage structures positioned below the top case 1900 (e.g., within the interior volume of the device) to provide additional support to the top case and further isolate the various regions. FIG. 19C, for example, depicts a partial cross-sectional view of the top case 1900 viewed along section F-F in FIG. 19A, showing a component 1912 below the top case 1900 and in contact with the reinforcement 1902. The component 1912 may be any component, such as a bottom case (e.g., the bottom case 110, FIG. 1A), or any other component within a base portion of a computing device. As another example, FIG. 19D depicts a partial cross-sectional view of the top case 1900 viewed along section F-F in FIG. 19A, showing a shim 1914 below the top case 1900 and in contact with the reinforcement 1902. The shim 1914 may be any material, such as plastic, metal, foam, etc., and it may rest on another component 1916 (e.g., the bottom case 110, FIG. 1A), or any other component within a base portion of a computing device.

The reinforcement 1902 may be secured (e.g., via an adhesive, fastener, or the like) to the component 1916 or the shim 1914, or it may be unsecured (e.g., it may simply rest on or contact the component 1916 or the shim 1914). The reinforcement 1902 may be unsecured to the component 1916 or shim 1914 to allow some side-to-side or lateral movement of the reinforcement 1902 with respect to the component 1916 or shim 1914. Where the shim 1914 is used (FIG. 19D), the bottom surface of the shim may be secured (e.g., via an adhesive, fastener, or the like) to the component 1916, or it may be unsecured.

Figure 20A:
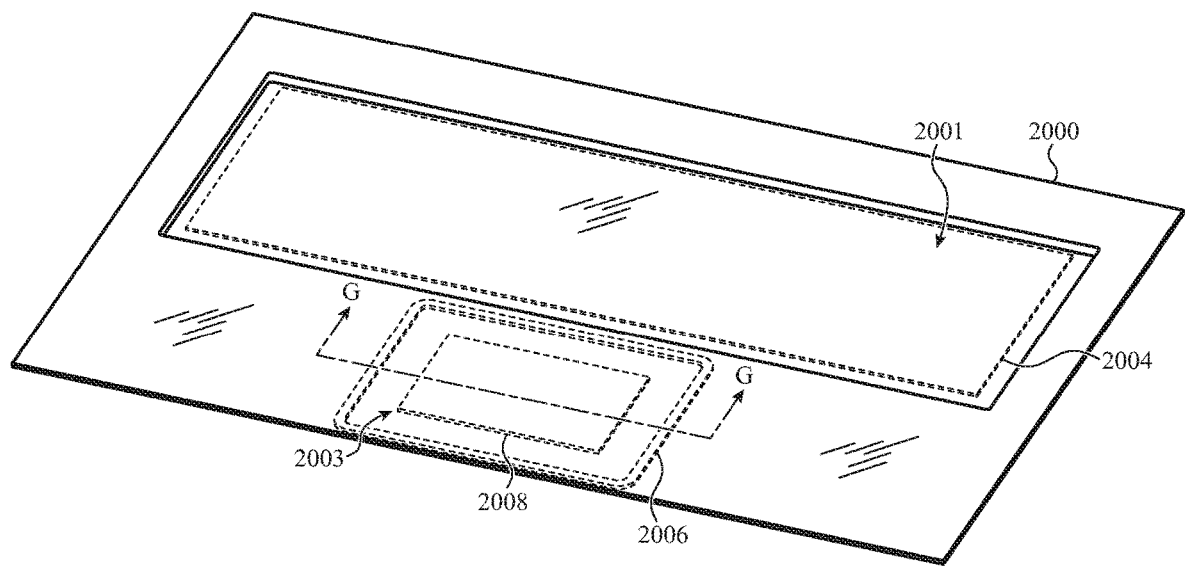
FIG. 20A depicts another example top case for a computing device.
Figure 20B:
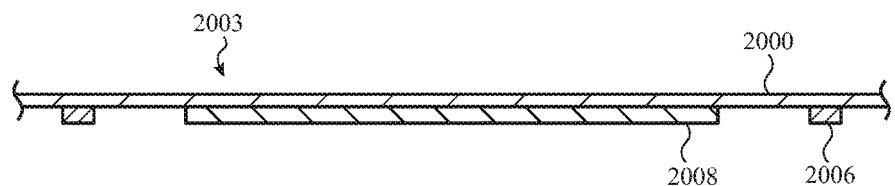
FIGS. 20B-20C depict partial cross-sectional views of the top case of FIG. 20A, viewed along section G-G in FIG. 20A.
Figure 20C:
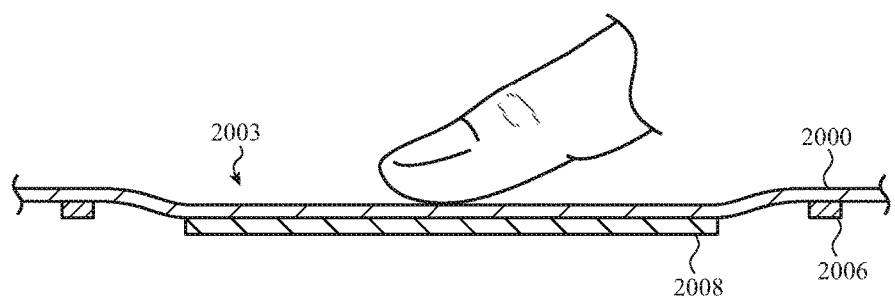

FIGS. 20A-20C depict another example of a top case 2000 having reinforcements. In particular, the top case 2000, which may be similar to the other top cases described herein, may include reinforcements 2006, such as ribs that are attached to the bottom surface of the top case 2000. The reinforcements 2006 may be similar in structure, material, function, etc., to the reinforcements 1902 discussed above.

The top case 2000 may also include reinforcement plates 2004, 2008 attached to the bottom surface of the top case 2000. For example, a first reinforcement plate 2004 may be positioned under a keyboard region 2001, and a second reinforcement plate 2008 may be positioned under a trackpad region 2003.

The reinforcement plates 2004, 2008 may provide more uniform deflections in response to force inputs applied at different locations on the top case 2000. This may help improve force sensing, as a force applied to a corner of the trackpad region 2003 (e.g., at or near a corner of the second reinforcement plate 2008) may cause the entire trackpad region 2003 to move, rather than just a localized portion under the applied force. This may allow for more flexibility in the placement of force sensors, and may result in more consistent and/or accurate detections of force inputs. FIG. 20B depicts a partial cross-sectional view of the top case 2000 viewed along section G-G in FIG. 20A, showing the reinforcements 2006 and the second reinforcement plate 2008. FIG. 20C depicts the same view as FIG. 20B, but shows the top case 2000 when a force is applied to a central portion of the trackpad region 2003. As shown, the local force due to a user's finger in the center of the trackpad region 2003 causes a substantially uniform deflection of the trackpad region 2003, rather than a localized deformation. Moreover, the deflection is substantially isolated to the trackpad region 2003, thus preventing or reducing cross-talk between regions of the top case 2000.

FIGS. 21A-21D depict schematic views of an input surface having an integrated force sensor or force-sensing capabilities. Generally, the input surface may be configured to detect a magnitude or degree of force applied to the surface of a device by measuring a small level of deflection or displacement of the input surface. A force sensor may be configured to measure the deflection or displacement and produce an electrical response or signal that corresponds to the degree or amount of force applied to the surface of the device.

Force sensors and associated processors and circuitry may be configured to register inputs when a determined force satisfies (e.g., meets and/or exceeds) a force threshold (and when the location of the determined force is at a particular location). For example, if a force below a force threshold is determined or detected on a key region, the force sensor may ignore that input or otherwise not cause the device to take a particular action (e.g., the device will not register a key input). If the force on the key region exceeds the threshold, the device may register the input as a key input and take an appropriate action, such as displaying a letter or character corresponding to that key on a display. The particular threshold that must be satisfied in order for a force sensor or device to register an input in response to a particular input may be any suitable threshold, and the threshold may be changed based on various factors. For example, the threshold may be dynamically set to a first value if it is determined (e.g., based on an average force value detected by the force sensor) that a user has a light typing style. That same device may set the threshold to a second value, higher than the first value, if it is determined that a user has a heavier typing style. Dynamically adjusting the threshold for force inputs may help improve the accuracy of key press detection in some circumstances, as it may easier to ignore inadvertent touches, taps, bumps, or other contacts on an input surface when the force associated with the user's typical typing/key input is known to a greater degree. Further, different thresholds may be established for different locations on an input surface. For example, if it is determined that a user applies more force with an index finger than a pinky finger, a device may establish a lower force threshold for keys or input regions that are typically associated with the pinky finger than for those that are typically associated with an index finger. These and other techniques may be implemented using any suitable force sensor or combination of force (and/or other) sensors.

Figure 21A:
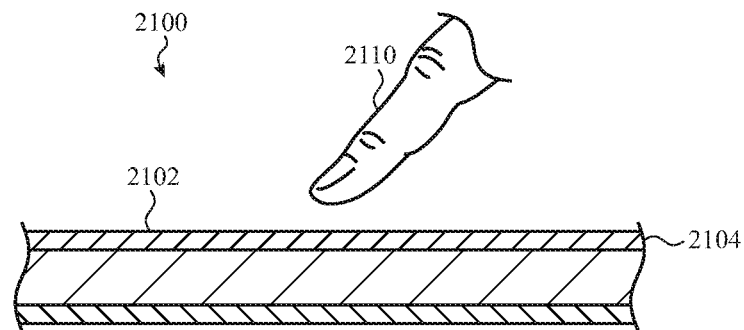
FIGS. 21A-21D depict schematic views of an input surface having an integrated force sensor or force-sensing capabilities.
Figure 21B:
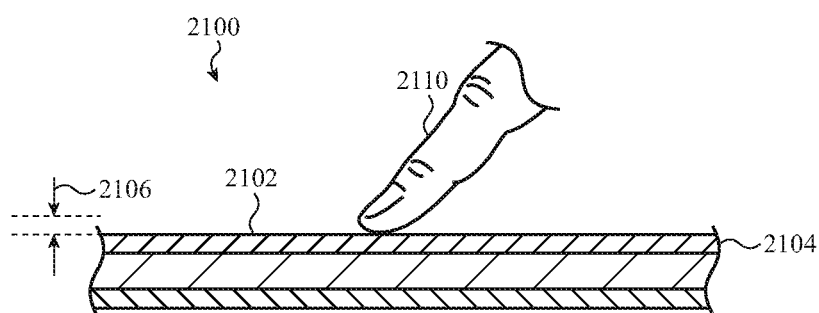
Figure 21C:
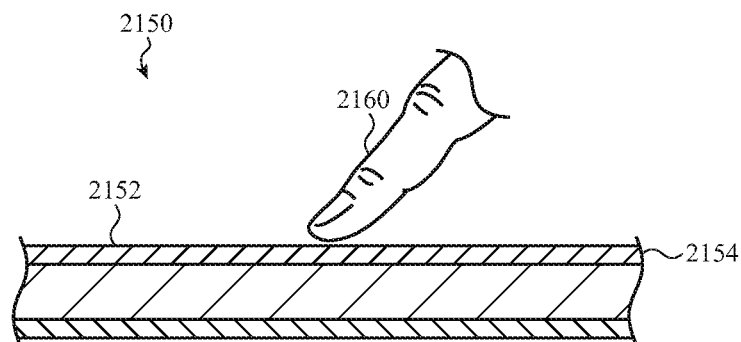
Figure 21D:
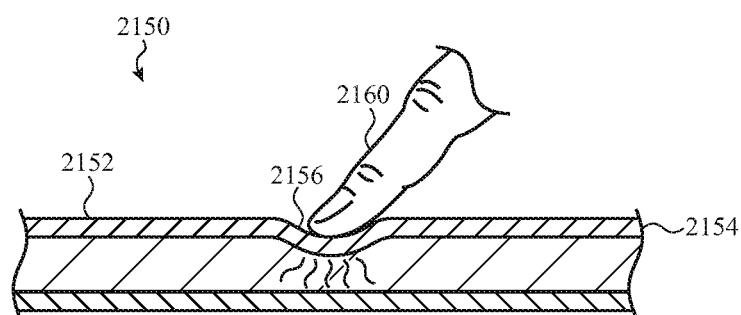

FIGS. 21A-21D depict two example force-sensing configurations that may be used in a computing device as described herein: a global-deflection sensing configuration 2100, as illustrated in FIGS. 21A-21B, and a local-deflection sensing configuration 2150, as illustrated in FIGS. 21C-21D. Either or both of the sensing configurations 2100 and 2150 may be incorporated into the computing device 100 of FIG. 1A. The force-sensing configurations may be used alone or in conjunction with the capacitive touch sensing configurations described herein with respect to other embodiments.

FIGS. 21A-21B depict a sensing configuration 2100 in which a global deflection 2106 of an input surface 2102 of a top case 2104 is measured using an appropriate force sensor positioned below or integrated with the top case 2104. FIG. 21A depicts the configuration 2100 in an undeflected state and FIG. 21B depicts the configuration 2100 in a deflected state (having a displacement or deflection 2106) occurring in response to a force applied by an object 2110 (e.g., a user's finger). By measuring a global deflection 2106 or displacement of the top case 2104, both a location and a magnitude of an applied force may be measured. Furthermore, by measuring a global deflection 2106 of the top case 2104 an average or overall force, that may be generally location independent, may be sensed. Example force sensors that are configured to measure a global deflection 2106 are described below with respect to FIG. 47.

FIGS. 21C-21D depict a sensing configuration 2150 in which a localized deflection 2156 of an input surface 2152 of a top case 2154 is measured using an appropriate force sensor positioned below or integrated with the top case 2154. FIG. 21C depicts the configuration 2150 in an undeflected state and FIG. 21D depicts the configuration 2150 in a deflected state (having deflection 2156) occurring in response to a force applied by an object 2160 (e.g., a user's finger). By measuring a localized deflection 2156 or displacement of the top case 2154, both a location and a magnitude of an applied force may be measured. Furthermore, by measuring a localized deflection 2156 of the top case 2154, multiple forces due to multiple touches along the input surface 2152 may be individually sensed. Example force sensors that are configured to measure a localized deflection 2156 are described below with respect to FIG. 47.

In some instances, the input surface or top case of a device may employ both a global-deflection force-sensing configuration (e.g., 2100 of FIGS. 21A-21B) and a local-deflection force-sensing configuration (e.g., 2150 of FIGS. 21C-21D). In some implementations, the two force-sensing configurations may be used to detect different types of user input. For example, a local force-sensing configuration 2150 may be used to invoke a first type of command. The first type of command may correspond to a location-dependent or cursor-driven action associated with a graphical user interface. Within the same device, a global force-sensing configuration 2100 may be used to trigger a second, different type of command, which may be a location independent action that does not depend on the location of a cursor within a graphical user interface.

Additionally or alternatively, using both force sensing configurations in conjunction may enable the device to determine the type of input or force that is being applied to the input surface, which may be beneficial in distinguishing non-intentional input or inadvertent contact or force from intentional force input. For example, a general or large-area deflection 2106 measured using configuration 2100 may be used to establish a baseline force caused by a portion of the hand (e.g., a palm) resting on the input surface while a localized or small area deflection 2156 measured using configuration 2150 may be used to distinguish a force applied by an input object 2110 (e.g., a user's finger), which may correspond to an intentional force input.

FIGS. 22A-22D depict example force sensors that can be used to implement a force sensing scheme similar to the force sensing configurations 2100 and 2150 described above with respect to FIGS. 21A-21D. As described in more detail below, some of the force sensors are better adapted for sensing a localized deflection while others may be better adapted for sensing a global deflection or displacement.

Figure 22A:
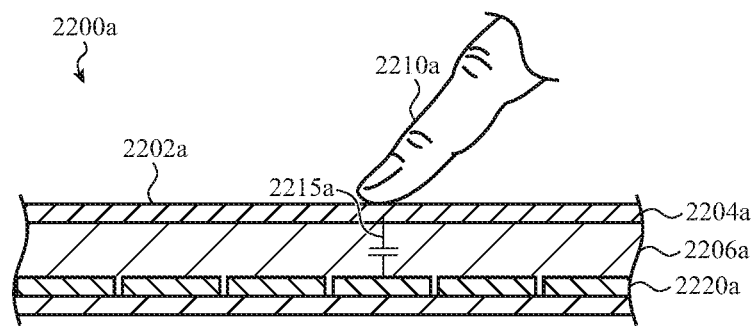
FIGS. 22A-22H and 22J-22M depict example force sensors.

FIG. 22A depicts a first force sensor 2200a that is configured to detect a global or large-area deflection of a top case 2204a having an input surface 2202a. The first force sensor 2200a may operate on a self-capacitive sensing scheme in which one or more electrodes 2220a of an electrode array may be used to detect a change in capacitance 2215a between a respective electrode 2220a and an object 2210a (e.g., a user's finger) applying a force to the input surface 2202a. In an example embodiment, the top case 2204a is separated from the electrodes 2220a by a compressible layer 2206a, which may include a compressible medium or material. Example compressible media include a foam, gel, elastomeric material, air, or other compliant material and combinations thereof.

In the first force sensor 2200a, the capacitance 2215a may change as a force applied by object 2210a depresses or displaces the top case 2204a toward the electrodes 2220a thereby compressing the compressible layer 2206a. The change in capacitance 2215a may correspond to a degree or amount of force applied, which may correspond to a predicable compressibility response or spring force of the compressible layer 2206a. Force-sensing circuitry operably coupled to the first force sensor 2200a may be used to measure the change in capacitance 2215a and produce a signal that corresponds to the amount or degree of force applied by the object 2210a.

In some implementations, the top case 2204a may be substantially rigid or non-compliant over the localized region corresponding to the touch of the object 2210a. Example materials that may be used to form the top case 2204a may include glass, sapphire, polymer, ceramic, metal, and/or composite materials that are configured to produce the corresponding non-deforming structural response to an applied force. In some cases, the top case 2204a is formed from a laminate of materials that is specially configured to reduce or eliminate localized deformation in response to the touch of a finger. Accordingly, the first force sensor 2200a may be used to detect a global or large-area deflection similar to the sensing configuration 2150 described above with respect to FIGS. 21C-21D.

Figure 22B:
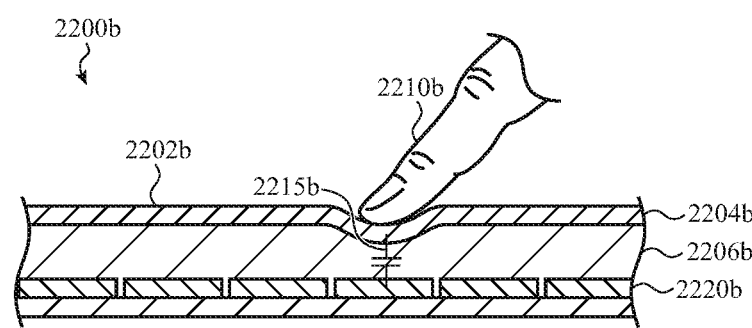

FIG. 22B depicts a second force sensor 2200b that is configured to detect a local or small-area deflection of a top case 2204b having an input surface 2202b. Similar to the previous example, the second force sensor 2200b may operate on a self-capacitive sensing scheme in which one or more electrodes 2220b of an electrode array may be used to detect a change in capacitance 2215b between a respective electrode 2220b and an object 2210b (e.g., a user's finger) applying a force to the input surface 2202b. In an example embodiment, the top case 2204b is separated from the electrode 2220b by a compressible layer 2206b, which may include a compressible medium or material similar to the example provided above with respect to FIG. 22A.

As shown in FIG. 22B, the top case 2204b may be formed from a material or materials that allow for localized deflection or deformation in response to a force applied by an object 2210b, such as a user's finger. Example materials that may be used to form the top case 2204b may include glass, sapphire, polymer, metal, and/or composite materials that are configured to produce the corresponding locally deforming or deflecting structural response to an applied force. In some cases, the top case 2204b is formed from a laminate of materials in which each layer is allowed to slip or shear to provide a localized deformation in response to the touch of a finger. Accordingly, the second force sensor 2200b may be used to detect a localized or small-area deflection similar to the sensing configuration 2100 described above with respect to FIGS. 21A-21B.

Figure 22C:
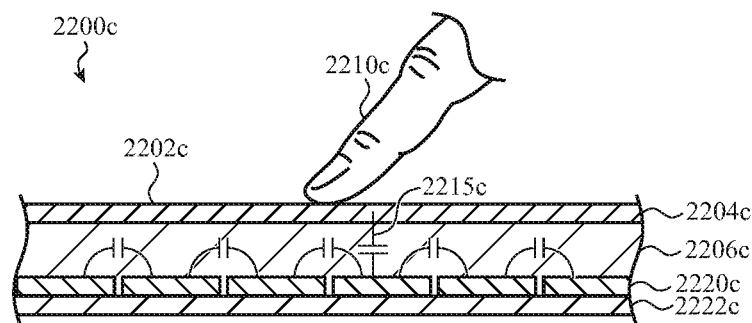

FIG. 22C depicts a third force sensor 2200c that is configured to detect a global or large-area deflection of a top case 2204c having an input surface 2202c. The third force sensor 2200c may operate on a mutual-capacitive sensing scheme in which one or more pairs of electrodes (2220c, 2222c) are used to detect a change in capacitance 2215c due to the presence of an object 2210c (e.g., a user's finger) applying a force to the input surface 2202c. In an example embodiment, the top case 2204c is separated from the electrode pairs (2220c, 2222c) by a compressible layer 2206c, which may include a compressible medium or material similar to the embodiments described above with respect to FIGS. 22A-22B.

In the third force sensor 2200c, the capacitance 2215c may change as a force applied by object 2210c depresses or displaces the top case 2204c toward the electrode pair (2220c, 2222c) thereby compressing the compressible layer 2206c. The capacitance 2215c or charge coupling may be affected by the presence of the object 2210c, which may steal or draw charge away from the electrode pair (2220c, 2222c). The change in the capacitance 2215c may correspond to a degree or amount of force applied, which may correspond to a predicable compressibility response or spring force of the compressible layer 2206c. Force-sensing circuitry operably coupled to the third force sensor 2200c may be used to measure the change in capacitance 2215c (or accumulated charge or any other suitable phenomena) and produce a signal that corresponds to the amount or degree of force applied by the object 2210c.

In some implementations, the top case 2204c may be substantially rigid or non-compliant over the localized region corresponding to the touch of the object 2210c, similar to the example provided above with respect to FIG. 22A. Accordingly, the third force sensor 2200c may be used to detect a global or large-area deflection similar to the force-sensing configuration 2150 described above with respect to FIGS. 21C-21D.

Figure 22D:
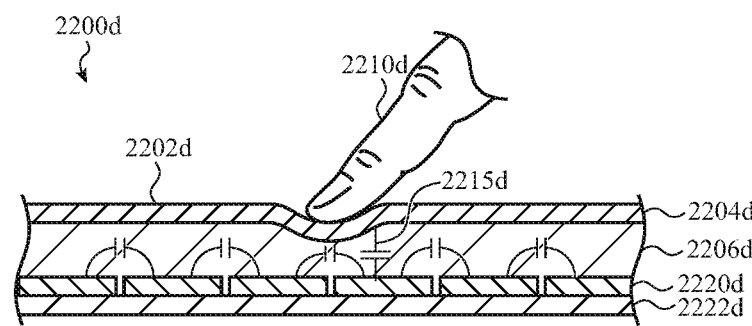

FIG. 22D depicts a fourth force sensor 2200d that is configured to detect a local or small-area deflection of a top case 2204d having an input surface 2202d. Similar to the example of FIG. 22C, the fourth force sensor 2200d may operate on a mutual-capacitive sensing scheme in which one or more pairs of electrodes 2220d, 2222d may be used to detect a change in capacitance 2215d due to the presence of the object 2210d (e.g., a user's finger) applying a force to the input surface 2202d. In an example embodiment, the top case 2204d is separated from the electrode pairs (2220d, 2222d) by a compressible layer 2206d, which may include a compressible medium or material similar to the embodiments described above with respect to FIGS. 22A-22B.

As shown in FIG. 22D, the top case 2204d may be formed from a material or materials that allow for localized deflection or deformation in response to a force applied by an object 2210d, such as a user's finger, similar to the example provided above with respect to FIG. 22B. Accordingly, the fourth force sensor 2200d may be used to detect a localized or small-area deflection similar to the sensing configuration 2100 described above with respect to FIGS. 21A-21B.

Figure 22E:
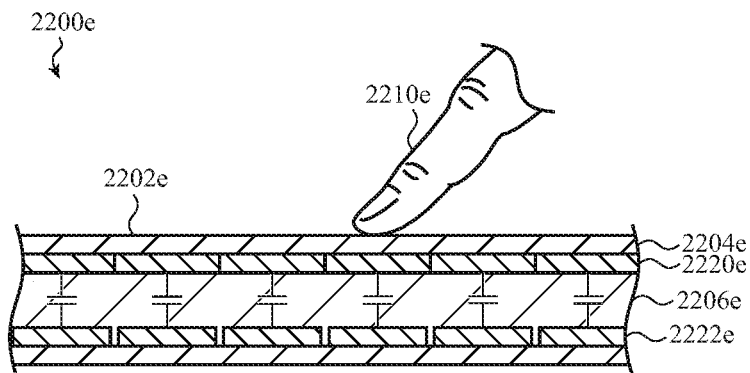
Figure 22F:
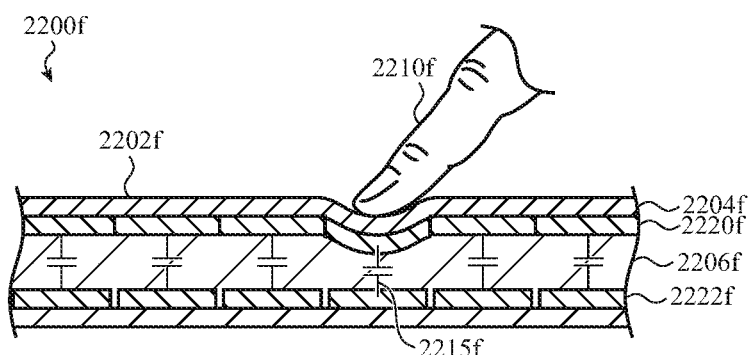

FIGS. 22E-22F depict example force sensors 2200e and 2200f, respectively. Similar to the force sensors 2200c and 2200d of FIGS. 22C and 22D, the force sensors 2200e and 2200f operate using a mutual-capacitive sensing scheme. In particular, the force sensor 2200e depicts a top case 2204e having an input surface 2202e that deflects globally or over a large area in response to a force applied by the object 2210e. The applied force causes relative movement between a respective pair of electrodes 2220e, 2222e, which are separated by compressible layer 2206e. The relative movement between the pair of electrodes 2220e, 2222e or compression of the compressible layer 2206e results in a change in capacitance, which may be sensed using force-sensing circuitry operatively coupled to the pair of electrodes 2220e, 2222e. Similar to the examples provided above with respect to FIGS. 22A and 22C, the top case 2204c may be configured to resist or prevent localized deflection in response to the applied force.

The sixth force sensor 2200f of FIG. 22F operates in a similar fashion except that the top case 2204f having an input surface 2202f is configured to deflect locally in response to a force applied by the object 2210f. A pair of electrodes 2220f, 2222f separated by a compressible layer 2206f deflect in response to the applied force resulting in a change in capacitance 2215f, which may be sensed using force-sensing circuitry. Similar to the examples provided above with respect to FIGS. 22B and 22D, the top case 2204f may be configured to deflect locally in response to the applied force.

Figure 22G:
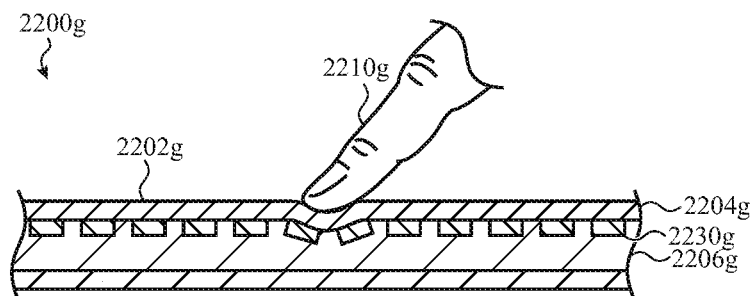

FIG. 22G depicts a seventh force sensor 2200g configured to detect an applied force using a strain-based sensing scheme. Specifically, the seventh force sensor 2200g is configured to detect the magnitude of an applied force using an array of strain-sensor elements 2230g operably coupled to the top case 2204g having an input surface 2202g. As shown in FIG. 22G, the top case 2204g may experience a localized deformation or deflection in response to a force applied by the object 2210g (e.g., a user's finger). The localized deformation or deflection may cause one or more of the strain-sensor elements 2230g to be placed into a strained condition, which may produce an electrical response (e.g., a change in resistance or impedance or any other suitable electrical phenomena) that can be measured using force-sensing circuitry.

In one example, the strain-sensor elements 2230g are formed from a strain-sensitive material that exhibits a change in resistance in response to a change in strain condition. Example strain-sensitive materials include, but are not limited to, indium tin oxide, indium gallium oxide, gallium zinc oxide, indium gallium zinc oxide, metal nanowire, nanotube, carbon nanotube, graphene, conductive polymers, a semiconductor material, a metal oxide material, copper, gold, constantan, karma, isoelastic, or any combination thereof. Depending on the specific composition and thickness of the strain-sensitive material, the strain-sensor elements 2230g may be either light-transmissive or opaque.

In some implementations, the strain-sensor elements 2230g are formed into a two-dimensional array across the area of the input surface 2202g. Each strain-sensor element 2230g may form a pixel or element of the two-dimensional array and may include a strain gauge or similarly shaped strain-sensitive element. The strain gauge may include multiple traces or fingers that are configured to detect strain along a particular direction or multiple directions. If the strain-sensor elements 2230g are arranged in a two-dimensional array, the strain-sensor elements 2230g may be used to determine both the location and the magnitude of multiple forces applied to the input surface 2202g. Some configurations may provide multi-touch, multi-force capability in which the magnitude of each applied force may be calculated or estimated.

With regard to the force sensor 2200g of FIG. 22G, the strain-sensor elements 2230g may also include a temperature-compensating configuration or temperature-compensating elements to reduce the effect of changes in temperature on the force-measurements performed by the force sensor 2200g. For example, the strain-sensor elements 2230g may include additional reference elements that are configured to provide an electrical response due to a change in temperature that can be used to calibrate or compensate for temperature effects on the force measurement. In some cases, the force sensor 2200g includes one or more strain break elements or strain relief features that can be used to isolate the strain-sensor elements 2230g from a temperature or reference element used to compensate for changes in temperature.

Figure 22H:
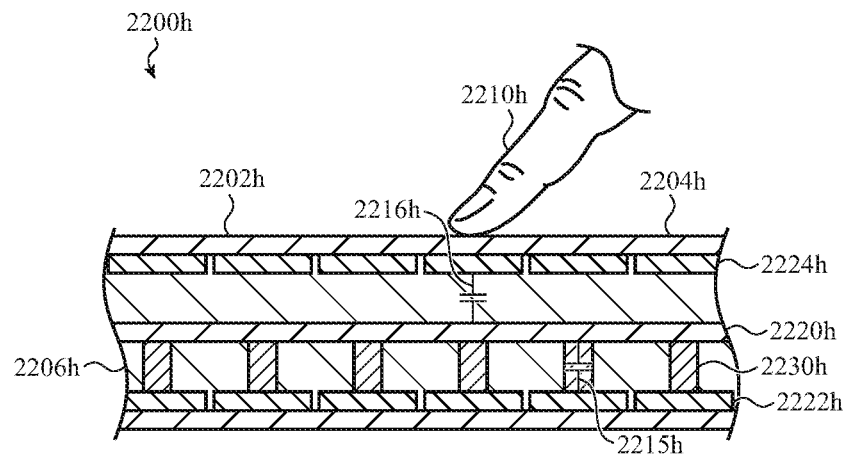
Figure 22J:
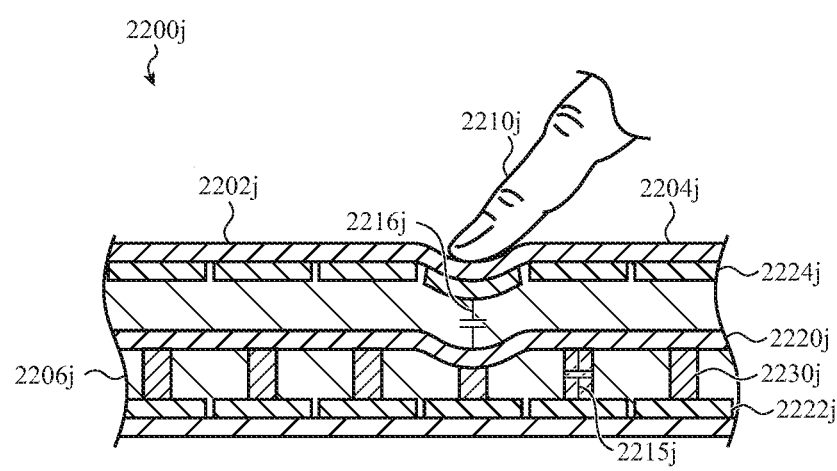

FIGS. 22H and 22J depict example force sensors 2200h and 2200j, respectively. The force sensors 2200h and 2200j depict example configurations in which the force sensors 2200h and 2200j are integrated with a mutual-capacitance sensor. In the eighth force sensor 2200h configuration of FIG. 22H, an array of force-sense electrodes 2222h share a drive electrode layer 2220h with an array of touch-sense electrodes 2224h. The drive electrode layer 2220h may include an array of drive electrodes that are arranged transverse to each of the force-sense electrodes 2222h and the touch-sense electrodes 2224h. The drive electrode layer 2220h may be operatively coupled to force- and/or touch-sensing circuitry that is configured to detect changes in a first touch-sensitive capacitance 2216h and/or a second force-sensitive capacitance 2215h. In some implementations, drive signals transmitted using the drive electrode layer 2220h may be time or frequency multiplexed to facilitate signal differentiation between changes in the touch-sensitive capacitance 2216h and the force-sensitive capacitance. In some implementations, the drive electrode layer 2220h forms an electrical shield or isolation layer between the force-sense electrodes 2222h and the touch-sense electrodes 2224h and/or other electrical components in the device.

Similar to the force sensors 2200e and 2200f of FIGS. 22E and 22F, the force sensors 2200h and 2200j operate using a mutual-capacitive sensing scheme. In particular, the force sensor 2200h depicts a top case 2204h having an input surface 2202h that deflects globally or over a large area in response to a force applied by the object 2210h. In some cases, the touch-sense electrodes 2224h and the drive electrode layer 2220h are separated by a substantially non-compressible layer or substrate that allows the applied force to be transferred and to compress a compressible layer 2206h positioned between the force-sense electrodes 2222h and the drive electrode layer 2220h. The applied force causes relative movement between the drive electrode layer 2220h and the force-sense electrodes 2222h. Similar to other mutual capacitance force sensors described above, the relative movement between the drive electrode layer 2220h and the force-sense electrodes 2222h or compression of the compressible layer 2206h results in a change in the force-sensitive capacitance 2215h, which may be sensed using force-sensing circuitry operatively coupled to the force-sense electrodes 2222h. Similar to the examples provided above with respect to FIGS. 22A, 22C, and 22E, the top case 2204h may be configured to resist or prevent localized deflection in response to the applied force.

The ninth force sensor 2200j of FIG. 22J operates in a similar fashion except that the top case 2204j having an input surface 2202j is configured to deflect locally in response to a force applied by the object 2210j. In this example, the touch-sense electrodes 2224j and the drive electrode layer 2220j may also deflect in response to the applied force. Here, the touch sense electrodes 2224j and the drive electrode layer 2220j are separated by a substantially non-compressible layer that is able to deflect when a force is applied by the object 2210j. In general, the substantially non-compressible layer may maintain the distance between the touch sense electrodes 2224j and the drive electrode layer 2220j but also locally deform to allow for compression of a compressible layer 2206j positioned below the drive electrode layer 2220j. The force-sense electrodes 2222j may be separated from the drive electrode layer 2220j by the compressible layer 2206j, which is configured to deflect in response to the applied force resulting in a change in capacitance 2215j, which may be sensed using force-sensing circuitry. Similar to the examples provided above with respect to FIGS. 22B, 22D, and 22F, the top case 2204j may be configured to deflect locally in response to the applied force.

In the example of FIG. 22J, the compressible layer 2206j includes an array of compressible column structures 2230j arranged over the area of the force sensor 2200j. The compressible column structures 2230j may be formed from a compressible material, including elastomers, foams, or other similar material. In some implementations, the compressible column structures 2230j are formed from a silicone material. The compressible column structures 2230j may be surrounded by air, a gel, or a liquid material. In some cases, the gel or liquid material is optically index-matched to the material that forms the compressible column structures 2230j. Thus, in some implementations, the compressible column structures 2230j are not visually perceptible.

Figure 22K:
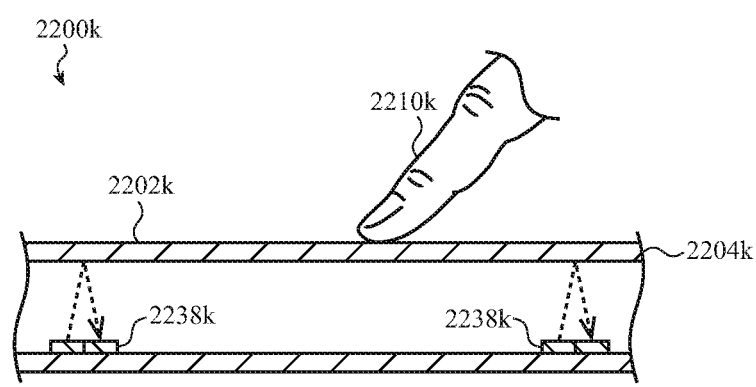

FIG. 22K depicts a tenth force sensor 2200k configured to detect an applied force using an optical sensing scheme. In particular, the force sensor 2200k depicts a top case 2204k having an input surface 2202k that deflects globally or over a large area in response to a force applied by the object

2210k. The applied force causes relative movement between the top case 2204k and one or more optical sensors 2238k. Similar to the examples provided above with respect to FIGS. 22A, 22C, and 22E, the top case 2204k may be configured to resist or prevent localized deflection in response to the applied force.

The optical sensors 2238k may use any suitable optical distance sensing technology, such as time-of-flight sensing, interferometric sensing, intensity-based sensing, confocal sensing, or the like. Multiple optical sensors 2238k may be used, and they may be strategically located below the top case 2204k to facilitate force sensing due to deflection or displacement of the top case 2204k. Also, while other force sensors may include a compressible layer between a top case and a force sensing layer (e.g., an electrode layer), the force sensor 2200k may have an optically transparent gap between the optical sensors 2238 and the top case 2204k. For example, the space between the optical sensors 2238k and the top case 2204k may be an air gap. In some cases, an air gap may exist directly above an optical sensor 2238k and extending to an underside of the top case 2204k, while other areas of the top case 2204k are in contact with a compressible layer. For example, a compressible layer may be positioned under substantially the entire area of the top case 2204k, except holes or air columns that coincide with the optical sensors 2238k may be formed in the compressible layer to allow a direct optical path to the top case 2204k.

Figure 22L:
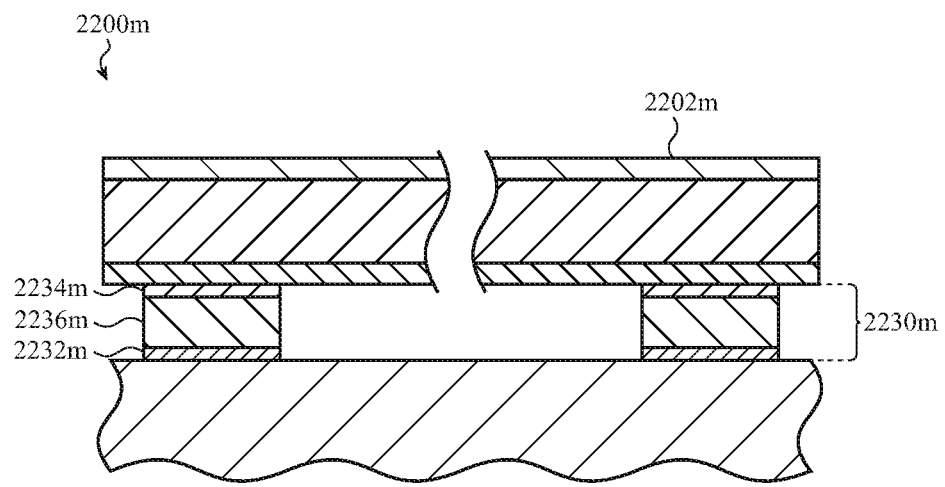
Figure 22M:
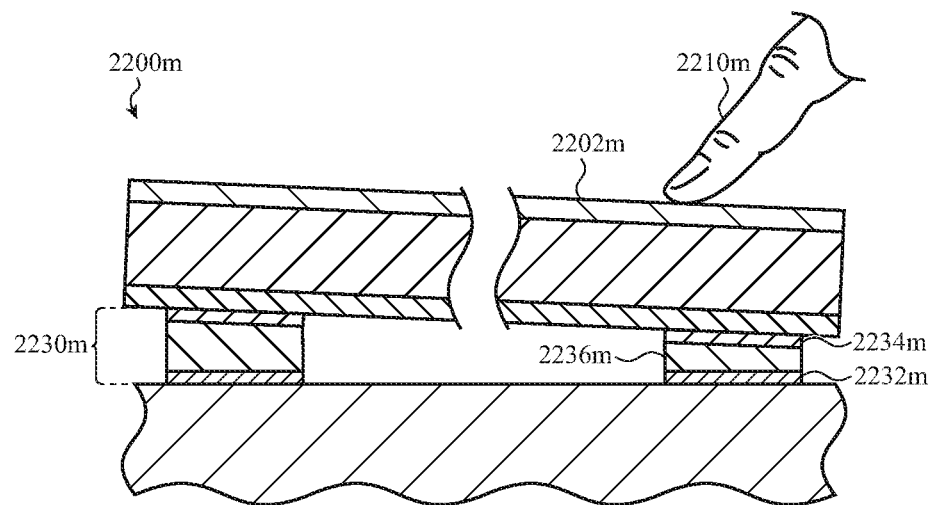

FIGS. 22L and 22M depict an eleventh force sensor 2200m that is configured to detect an applied force using sensing elements located in a foot or support of the device. In particular, the force sensor 2200m includes a force-sensing structure 2230m located in each of the feet or supports of the device. In the present example, the force-sensing structure 2230m is a capacitive sensor having a first capacitive element 2232m and a second capacitive element 2234m separated by a compressible element 2236m. Similar to the capacitive force sensors described above with respect to other embodiments, an applied force causes the compressible element 2236m to compress or deflect, resulting in a reduction in the gap between the first capacitive element 2232m and the second capacitive element 2234m. The relative movement between the first capacitive element 2232m and second capacitive element 2234m may be measured as a change in capacitance using force-sensing circuitry coupled to force-sensing structure 2230m.

FIG. 22L depicts the force sensor 2200m in an undeflected state and FIG. 22M depicts the force sensor 2200m in a deflected or actuated state. As shown in FIG. 22M, a force applied by object 2210m on the input surface 2202m causes compression of one or more of the force-sensing structures 2230m, which may be detected by measuring a change in capacitance. Alternatively, the force-sensing structures 2230m may include one or more strain-sensitive elements that are configured to detect a small amount of compression caused by an applied force. The strain-sensitive elements may include a strain gauge, resistive sensor, or other similar element that exhibits a change in electrical response due to a deflection or strain.

As shown in FIG. 22M, the force applied by the object 2210m may cause a non-uniform or unbalanced deflection or compression between each of the force-sensing structures 2230m. For example, the force-sensing structures 2230m that are closest to an applied force may experience the greatest deflection or compression. As shown in FIG. 22M, because the object 2210m is closest to the force-sensing structure 2230m on the right-hand side of the device, the compressible element 2236m of that force-sensing structure 2230m will experience a greater compression as compared to a force-sensing structure 2230m located on the left-hand side of the device.

The non-uniform or unbalanced compression of the force-sensing structures 2230m may be used to approximate the location of the object 2210m along the input surface 2202m. By way of example, the displacement or compression of the force-sensing structures 2230m may be compared using a ratio of the amount of compression, which may be used to estimate the location of the object 2210m as a percentage or fraction of the distance between the force-sensing structures 2230m. In some cases, a centroid may be computed using the relative output of two or more force-sensing structures 2230m, which may be used to estimate the location of the object 2210m applying the force to the input surface 2202m. Generally, three or more force-sensing structures 2230m would be necessary in order to provide an estimate of the two-dimensional location of the object 2210m along an input surface 2202m of the top case.

In some embodiments, an average or composite of the outputs of all of the force-sensing structures 2230m is used to compute a general or overall force applied to the input surface 2202m. The average or composite of the outputs of the force-sensing structures may be used as a user input (e.g., an item selection). Additionally or alternatively, the general or overall applied force may be used to establish a baseline, calibration, or static input and used to cancel the effects of a user's wrist or other object that is resting or otherwise applying a force on the input surface 2202m or other portion of the device. Examples of palm rejection or other similar non-input user contact are described in more detail below with respect to FIGS. 31A-31B.

With regard to the embodiments of FIGS. 22A-22H and 22J-M discussed above, any of the electrodes or electrically conductive elements may be formed from a variety of conductive materials including, without limitation, indium tin oxide, indium gallium oxide, gallium zinc oxide, indium gallium zinc oxide, metal nanowire, nanotube, carbon nanotube, graphene, conductive polymers, a semiconductor material, a metal oxide material, copper, gold, constantan, karma, isoelastic, or any combination thereof. The conductive materials may be applied to the various layers or substrates of the force sensors using any one of a variety of manufacturing techniques including, for example, chemical vapor deposition (CVD), sputter deposition, printing, or other deposition technique. In some cases, the conductive materials are formed as a separate or distinct layer and applied or attached to a substrate or layer using an adhesive or other bonding technique.

The force sensors of FIGS. 22A-22H and 22J-22M are provided by way of example and are not intended to be limiting in nature. Actual implementations of the examples provided above may vary depending on the structural aspects and components of the device. Additionally, many of the force sensor embodiments described above with respect to FIGS. 22A-22H and 22J-22M may be combined to produce a composite or combination force sensor. For example, one or more of the capacitive-based force sensors described with respect to FIGS. 22A-22F, 22H, and 22J may be combined with one or more strain-based force sensors as described with respect to FIG. 22G.

Figure 23:
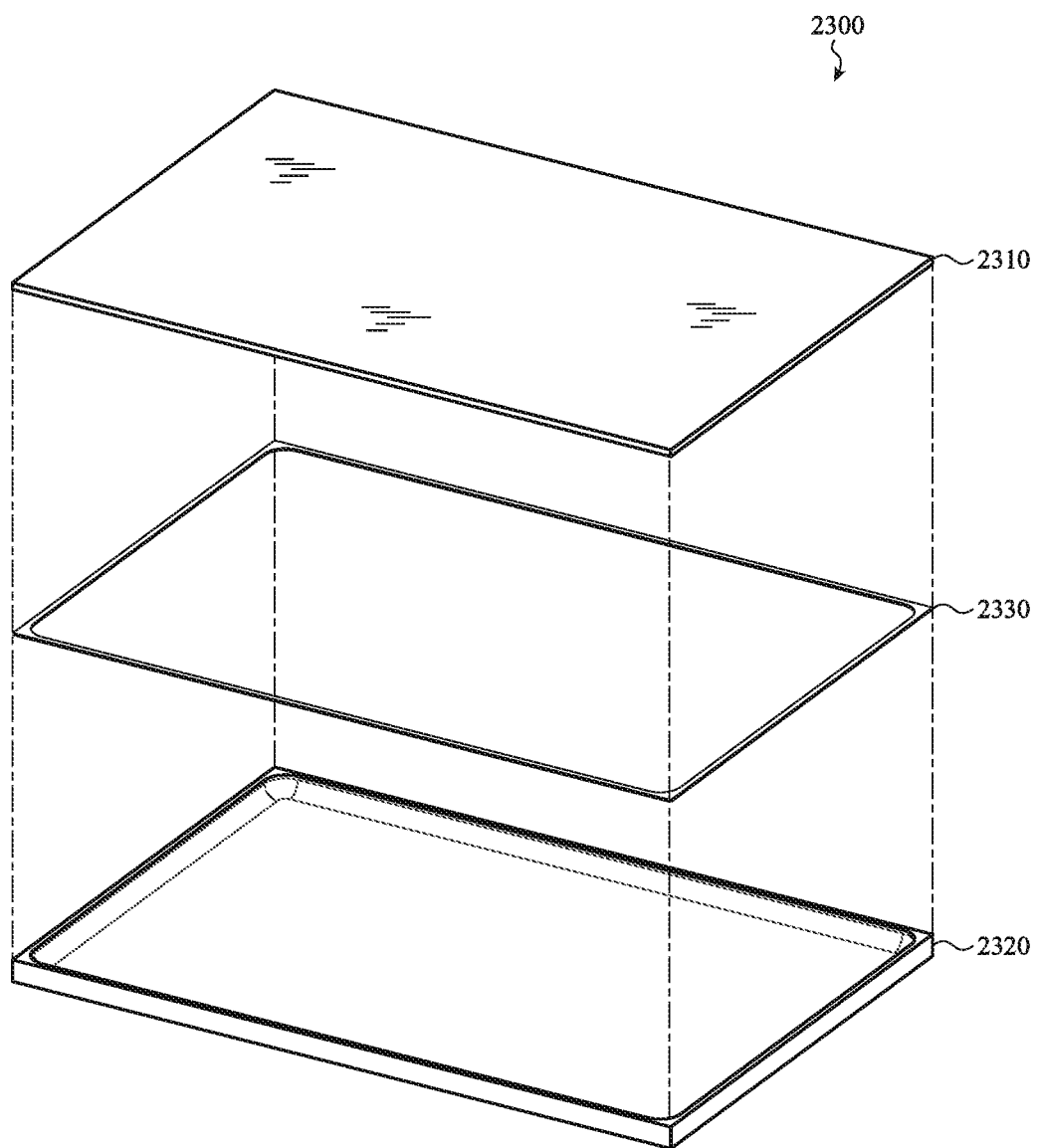
FIG. 23 depicts an example top case having an example force sensor positioned around a perimeter of the top case.

FIG. 23 depicts an example top case having an example force sensor positioned around a perimeter of the top case. More specifically, FIG. 23 depicts a base portion 2300 having a top case 2310 coupled a bottom case 2320 to form an enclosed volume. The base portion 2300 of FIG. 23 may correspond to any one of the base portions described herein.

In particular, while not shown in this figure, the base portion 2300 may include a keyboard, one or more touch-input surfaces, and other components or elements described herein with respect to other embodiments.

As shown in FIG. 23, the base portion 2300 includes a force sensor 2330 positioned along the perimeter of the top case 2310. The force sensor 2330 may be positioned between the top case 2310 and the bottom case 2320 and may be configured to measure an applied force by detecting a compression or relative displacement between the two components. As described below with respect to FIGS. 24A-24B, the force sensor 2330 may include a compressible element or compressible layer that deflects in response to an applied force. The amount of deflection may be measured using one of more of the force-sensing schemes described above with respect to FIGS. 24A-24B and may be used to estimate the amount of force applied to a region or regions of the top case 2310.

In some implementations, the top case 2310 is substantially rigid to facilitate force sensing using the perimeter force sensor 2330. For example, the top case 2310 may be stiffened using a laminate or composite construction to facilitate transfer of a force along an input surface of the top case 2310 to the force sensor 2330 without allowing the top case 2310 to bend or deflect enough to contact an internal component that may interfere with the measurement performed by the force sensor 2330. The top case may include one or more ribs, stiffeners or other structural features to provide the stiffness required for operation of the perimeter force sensor 2330. Example stiffening techniques are described in more detail with respect to FIGS. 8A-10 and 19A-20C.

In some implementations, the force sensor 2330 forms a seal between the top case 2310 and the bottom case 2320. For example, the force sensor 2330 may be formed from a compliant material that is both compressible in response to an applied force and also compliant enough to form a barrier or seal to prevent the ingress of foreign matter into the internal volume defined by the top case 2310 and bottom case 2320. In some cases, the force sensor 2330 is attached to the top case 2310 and bottom case 2320 using an adhesive and forms a waterproof or water-resistant seal between the two components.

Figure 24A:
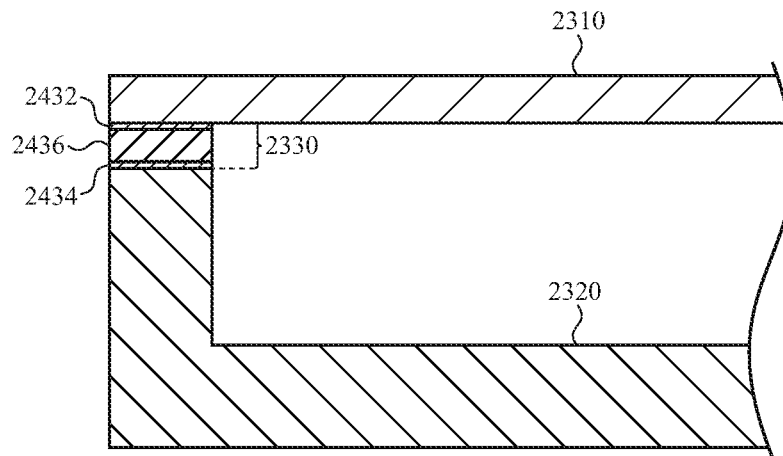
FIGS. 24A and 24B depict cross-sectional views of the top case and force sensor of FIG. 23.
Figure 24B:
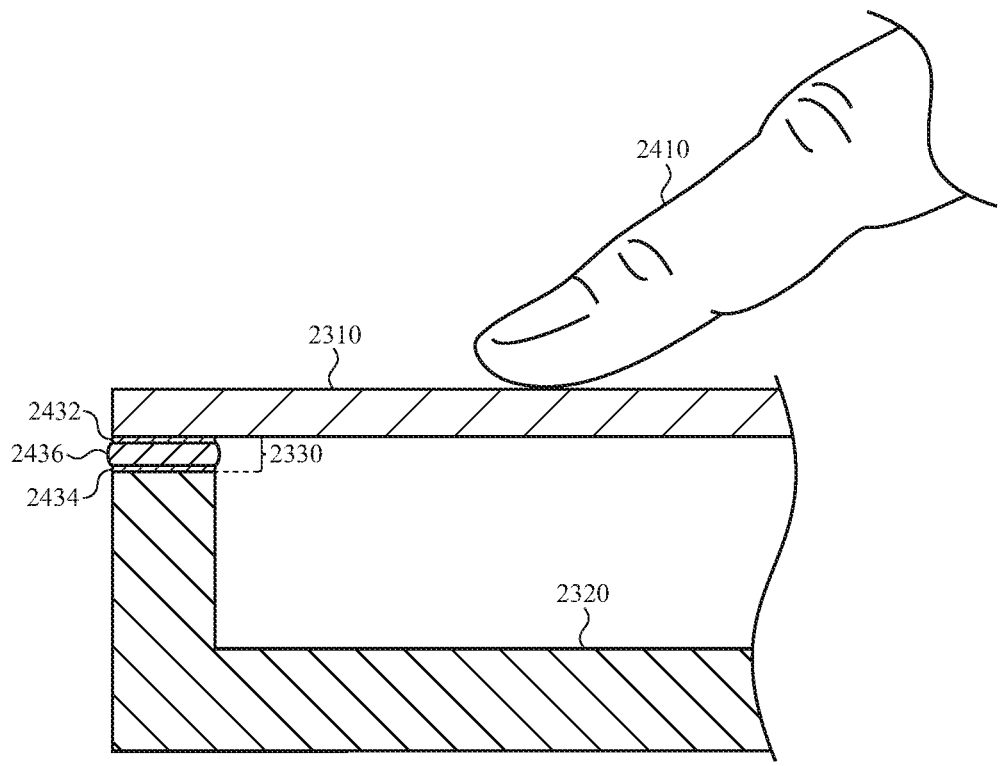

FIGS. 24A and 24B depict cross-sectional views of the top case and force sensor of FIG. 23. Specifically, FIG. 24A depicts an unactuated state of the top case 2310 in which the force sensor 2330 is uncompressed and FIG. 24B depicts an actuated state of the top case 2310 in which the force sensor 2330 is at least partially compressed in response to an applied force. The force may be applied by an object 2410 (e.g., a user's finger). The force sensor 2330 may either deform locally or globally (e.g., substantially uniformly) in response to the applied force.

Similar to the examples provided above with respect to FIGS. 22A-22H and 22J, the force sensor 2330 may include a compressible layer or compressible element 2436 that compresses in response to the applied force. The amount of deflection of the compressible element 2436 may be measured by electrodes 2432, 2434 positioned on opposite sides of the compressible element 2436. The force sensor 2330 may be operatively coupled to force-sensing circuitry that is configured to measure a change in an electrical response due to the deflection. In one example, the force-sensing circuitry is configured to measure a change in capacitance between the electrodes 2432 and 2434 caused by the deflection or compression of the compressible element 2436. In another example, the force-sensing circuitry is configured to measure a change in charge or resistance between the electrodes 2432 and 2434 due to a compression of the compressible element 2436, which may be formed from a piezoelectric or piezoresistive material.

In some implementations, the force sensor 2330 may be formed from a series or array of electrode pairs that are configured to detect the amount of deformation over a respective region or area. Similar to the description above with respect to FIG. 22J, the location of the force applied by the object 2410 may result in a non-uniform or unbalanced deflection between electrode pairs of the force sensor 2330, which may be used to estimate a location of an applied force and/or the magnitude of multiple forces on the top case 2310. In particular, a relative measurement (e.g., a ratio) of the compression of two or more electrode pairs of the force sensor 2330 may be used to estimate the location of the object 2410 as a percentage or fraction of the distance between the respective two or more electrode pairs. In some cases, a centroid may be computed using the relative output of two or more electrode pairs, which may be used to estimate the location of the object 2410 applying the force.

In some embodiments, an average or composite of multiple electrode pairs of the force sensor 2330 may be used to compute a general or overall force applied to the input surface 2202*h* (FIG. 22H). The average or composite of the outputs of the force-sensing structures may be used as a user input (e.g., an item selection). Additionally or alternatively, the general or overall applied force may be used to establish a baseline, calibration, or static input and used to cancel the effects of a user's wrist or other object that is resting or otherwise applying a force to the top case 2310. Examples of palm rejection or other similar non-input user contact are described in more detail below with respect to FIGS. 31A-31B.

Figure 25:
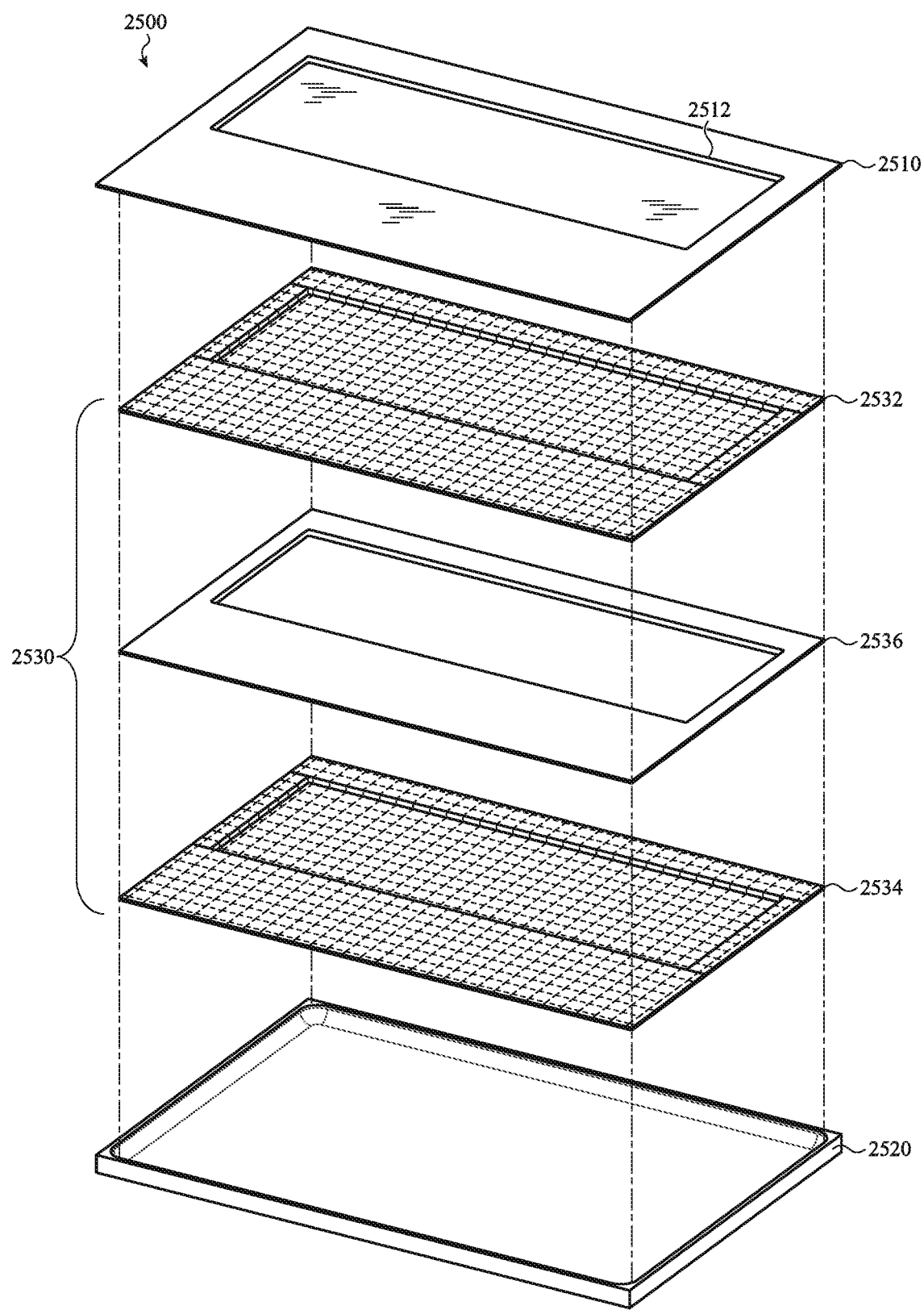
FIG. 25 depicts an exploded view of a top case having an example two-layer force sensor.

FIG. 25 depicts an exploded view of a top case having an example two-layer force sensor. In particular, FIG. 25 depicts an example base portion 2500 having a top case 2510 coupled to a bottom case 2520 to form an enclosed volume. The base portion 2500 of FIG. 25 may correspond to any one of the base portions described herein. In particular, while not shown in this figure, the base portion 2500 may include a keyboard, one or more touch-input surfaces, and other components or elements described herein with respect to other embodiments. In accordance with some embodiments, the top case 2510 may include one or more recesses or a well 2512 formed into the top surface, which may receive components of a keyboard or other elements of the device.

As shown in FIG. 25, a force sensor 2530, having a first sensing layer 2532, a compressible layer 2536, and a second sensing layer 2534, may be coupled or attached to the top case 2510. In some cases, the force sensor 2530 is a flexible laminate and attached to a lower surface of the top case 2510. The flexibility of the force sensor 2530 may allow the force sensor 2530 to comply or conform to the geometry of the top case 2510. In some instances, the force sensor 2530 is formed having a geometry that corresponds to the geometry of the top case 2510. Thus, in the current example, the force sensor 2530 may have a pocket or well that corresponds to the well 2512 of the top case 2510.

Each or both of the layers 2532 and 2534 may include an array of electrodes that are arranged over the area of the force sensor 2530. The layers 2532 and 2534 are positioned on opposite sides of the compressible layer 2536, which may be formed from a single sheet or, alternatively, multiple compressible elements arranged over the area of the force sensor 2530. The compressible layer 2536 may include, without limitation, elastomers, gels, foams, air, compressible columns, or a combination thereof.

Similar to the examples described above with respect to FIGS. 22A-22H and 22J, a force applied to the top case 2510 may be measured by measuring the relative compression between the electrodes of layers 2532 and 2534. The force sensor 2530 may operate in accordance with a self-capacitance scheme, a mutual-capacitance scheme, a strain-based (e.g., piezo) sensing scheme, or any other force sensing schemes described herein. The force sensor 2530 may also be configured to detect a localized or global deflection between the layers 2532 and 2534, depending on the flexibility or compliance of the top case 2510 and/or the elements of the force sensor 2530. In some cases, the force sensor 2530 may be configured to deform locally or over a small area for certain predefined regions and configured to deform globally or over a large area for other predefined regions.

Figure 26A:
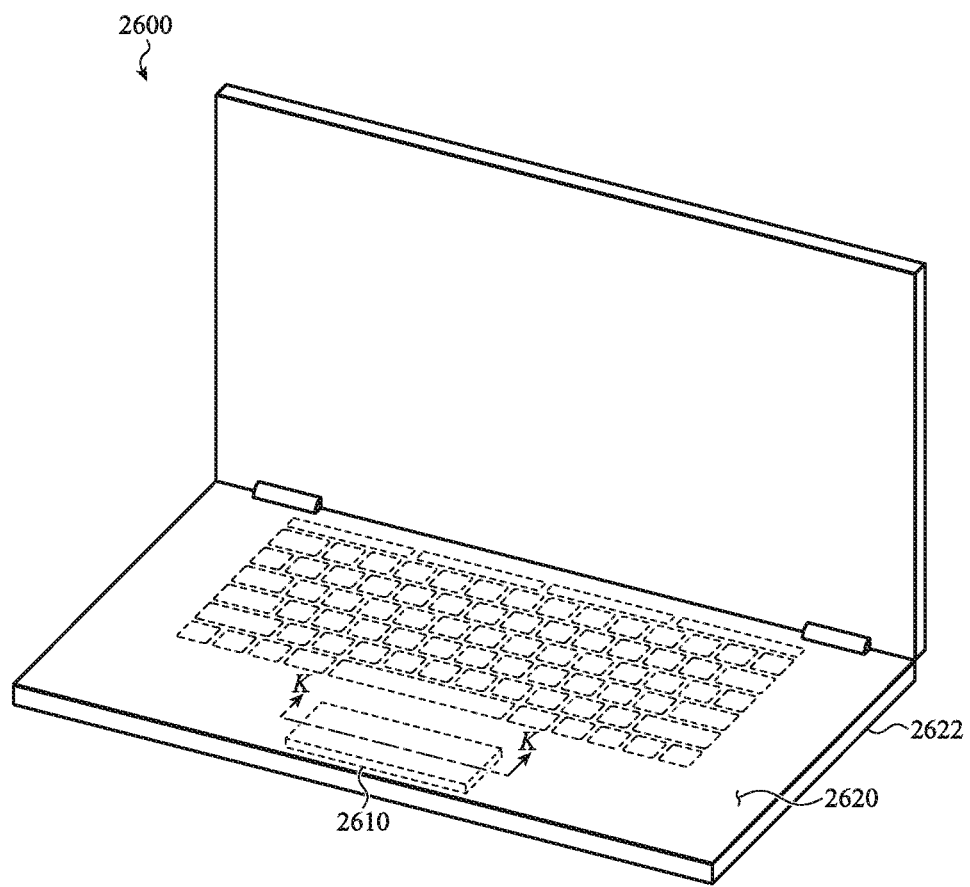
FIGS. 26A-26B depict an example device having a haptic actuator.
Figure 26B:
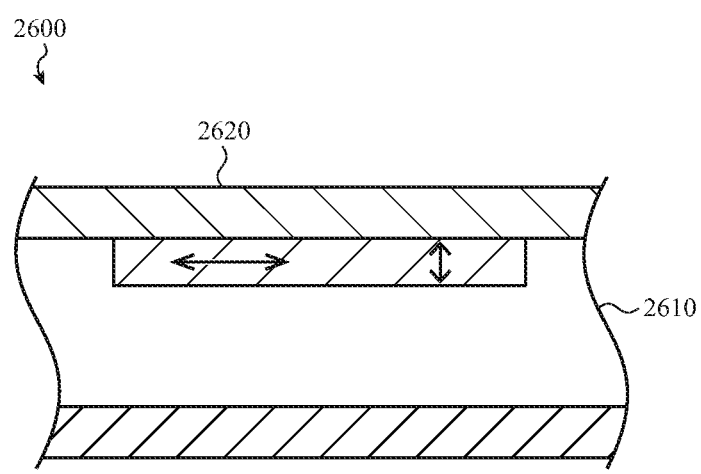

FIGS. 26A-26B depict an example device having a haptic actuator. In particular, FIGS. 26A-26B depict a device 2600 having a haptic device 2610 coupled to the top case 2620 of a base portion 2622. The haptic device 2610 is configured to produce a haptic output that may include movement (e.g., vibration or displacement) of the top case 2620. The movement caused by the haptic device 2610 may be perceptible as tactile feedback to the user when the user is in contact with the top case 2620 or other portion of the device 2600. In some instances, the haptic device 2610 may create a vibration or sound that is perceptible, even when the user is not in contact with the top case 2620.

FIG. 26B depicts a cross-sectional view of the device 2600 of FIG. 26A along section K-K in FIG. 26A. In particular, FIG. 26B depicts a simplified schematic of the haptic device 2610 coupled to the top case 2620. The haptic device 2610 may be configured to produce one or more types of motion. As shown in FIG. 26B, the haptic device 2610 may be configured to produce lateral or side-to-side motion, as indicated by the horizontal arrows. Additionally or alternatively, the haptic device 2610 may be configured to produce a normal or planar movement, as indicated by the vertical arrows. Example hardware implementations of the haptic device 2610 are described below with respect to FIGS. 29A-29H and 29J-29K.

The haptic device 2610 is configured to provide a general and/or local haptic output to the user for a variety of use cases. For example, the haptic device 2610 may provide a general haptic output in the form of a vibration to the exterior surface of the device (via the top case 2620) to notify the user of an event or action. The alert may correspond to any one of a variety of notifications including, for example, a notification that a message has been received, a phone call is incoming, a calendar reminder has been triggered, or that an event has been initiated/completed. The alert may also correspond to a system level event generated by the operating system or a hardware component integrated within the device. For example, the alert may correspond to a signal indicating that the device has been plugged in (outlet power has been coupled to a port of the device), the device has been coupled to an internet connection, the device is in a low-power state, the device is fully charged, and so on. Global haptics may also be used to indicate that an input has been received or triggered. For example, a global haptic output may be used to indicate that a touch force of a virtual button or key has exceeded a threshold resulting in an actuation of the virtual button or key, or that a touch force within a trackpad region has exceeded a threshold resulting in a "click" event.

The haptic device 2610 may also provide a local haptic output in the form of a localized deflection or movement to provide tactile feedback to a user. In some implementations, a local haptic output may be produced in response to user-touch input to indicate that an input has been received or triggered. For example, a local haptic output may be used to indicate that a touch input has been detected or registered on a first key (e.g., by a touch sensing system) or to indicate that a touch force of a virtual button or key has exceeded a threshold resulting in an actuation of the virtual button or key (e.g., as detected by a force sensing system). Similarly, a local haptic output may be used to indicate that a touch force within a trackpad region has exceeded a threshold resulting in a "click" event. A local haptic output may also be used to guide a user's touch along an input surface of the top case 2620 to indicate a tactile fiducial. For example, a local haptic output may be used to indicate the location of a virtual key (e.g., the "F" or "J" on a QWERTY keyboard).

Figure 27A:
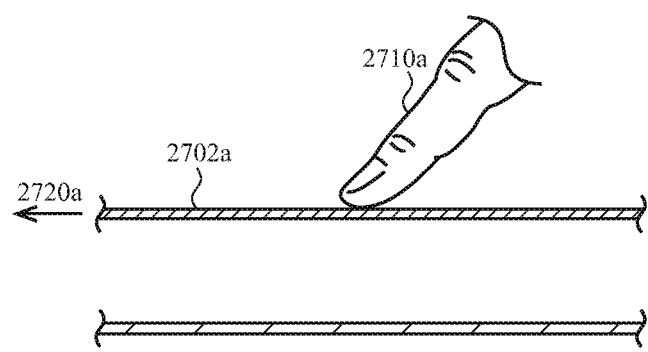
FIGS. 27A-27D depict example global haptic outputs.
Figure 27B:
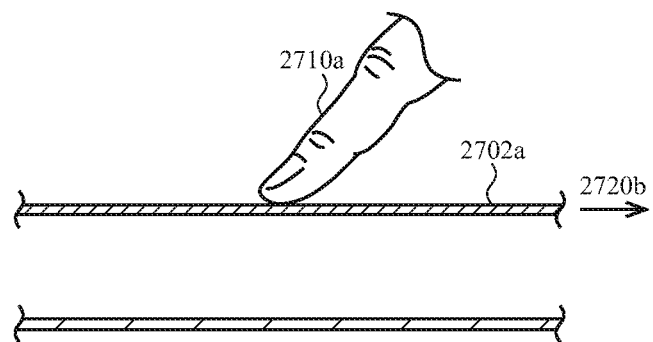
Figure 27C:
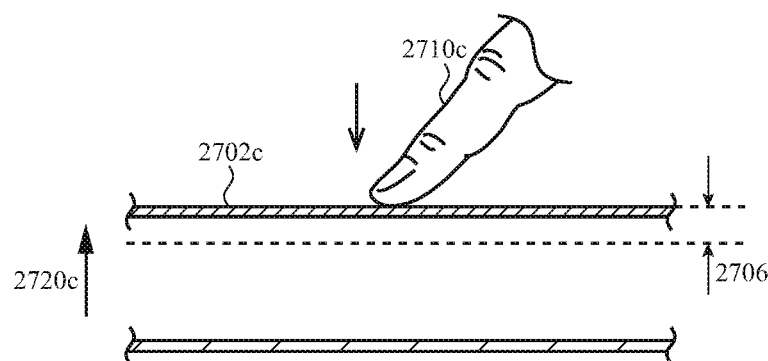
Figure 27D:
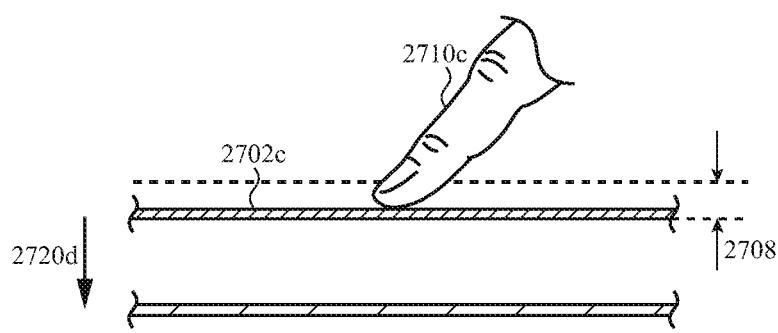
Figure 28A:
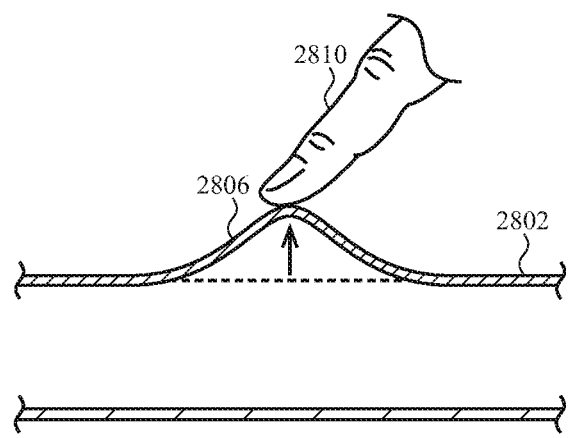
FIGS. 28A-28B depict example localized haptic outputs.
Figure 28B:
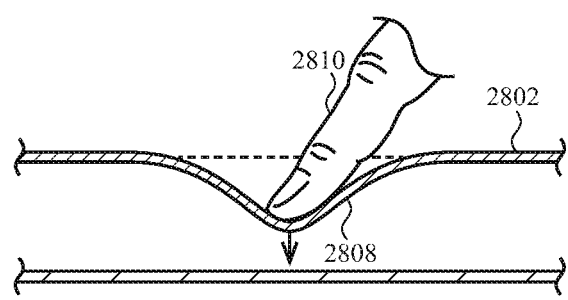

FIGS. 27A-27D and 28A-28B depict example haptic outputs that can be generated using a haptic device (e.g., haptic device 2610 of FIGS. 26A-26B). FIGS. 27A-27D depict a type of haptic output generated by moving or translating an exterior surface of the device. The movement may be performed globally or over a large area or region of the exterior surface. In contrast, FIGS. 28A-28B depict a type of haptic output generated using a localized deflection or deformation of the exterior surface of the device. The haptic outputs may be produced using the example haptic device 2610 discussed above with respect to FIGS. 26A-26B or with one or more of the other example haptic devices described below with respect to FIGS. 29A-29H and 29J-29K and 30A-30B.

FIGS. 27A-27D depict example global or large-area movements that may be produced using a haptic device. More specifically, FIGS. 27A-27B depict a contact surface 2702a that is configured to produce side-to-side or lateral movement (2720a, 2720b), as indicated by the horizontal arrows. The contact surface 2702a may correspond to the input surface or input region of a top case discussed with respect to other embodiments described herein. The lateral movement (2720a, 2720b) of the contact surface 2702a may produce a tactile or perceptible feedback when a body of a user 2710a is in contact with the contact surface 2702a.

With regard to the embodiments of FIGS. 27A-27B, friction between contact surface 2702a and the user 2710a may slightly pull or drag against the skin of the user, which is perceived as a tactile input by the user 2710a. In some implementations, the amount of movement and/or the surface finish of the contact surface 2702a may be configured to produce a particular type of tactile feedback. For example, the surface finish of a glass or composite layer forming the contact surface 2702a may have a roughness or texture that is configured to produce a particular tactile feedback when the haptic output is actuated.

FIGS. 27C-27D depict a contact surface 2702c that is configured to produce perpendicular or normal movement (2720c, 2720d), as indicated by the vertical arrows. Similar to the previous example, the contact surface 2702c may correspond to the input surface or input region of a top case discussed with respect to other embodiments described herein. The normal movement (2720c, 2720d) of the contact surface 2702c may produce a tactile or perceptible feedback when a body of a user 2710c is in contact with the contact surface 2702c.

With regard to the embodiments of FIGS. 27C-27D, relative movement between contact surface 2702c and the user 2710c may create small changes in surface pressure, which is perceived as a tactile input by the user 2710c. In some implementations, the amount of movement (e.g., outward displacement 2706 and/or inward displacement 2708), the speed of the movement, and/or the frequency of the movement (if periodic) of the contact surface 2702c may be configured to produce a particular type of tactile feedback. For example, characteristics of the haptic device and/or the structural constraints on the contact surface 2702c may be configured to produce a particular tactile feedback when the haptic output is actuated. The structural constraints may include, for example, the boundary conditions on the contact surface 2702c, the flexibility or stiffness of the layer or layers forming the contact surface 2702c, and/or the presence of any stiffening components coupled to the contact surface 2702c.

FIGS. 28A-28B depict other example haptic outputs that can be generated using a haptic device (e.g., haptic device 2610 of FIGS. 26A-26B). More specifically, FIGS. 28A-28B depict a haptic output generated by moving, deforming, or translating a localized region or area of an exterior surface of the device. The haptic outputs may be produced using the example haptic device 2610 discussed above with respect to FIGS. 26A-26B or with one or more of the other example haptic devices described below with respect to FIGS. 29A-28H, 29J-29K, and 30A-30B.

FIGS. 28A-28B depict example localized or small-area movements that may be produced using a haptic device. More specifically, FIGS. 28A-28B depict example haptic output that results in a localized displacement or deformation of the contact surface 2802. Localized haptic outputs may be configured to be primarily noticed by a user in a single area of a contact surface, and not significantly noticeable at other areas of the contact surface. In particular, the magnitude of a localized haptic output may be greater at one location than at another adjacent location. Thus, if a localized haptic output is produced on a contact surface in a region that corresponds to a key of a keyboard, the magnitude of the haptic output may be greater within the key region than at an adjacent key region. The magnitude of a haptic output may refer to the deformation or deflection of a contact surface (e.g., the physical distance that a portion of the contact surface moves), or it may refer to the perceived strength of the haptic output by a user. Such localized haptic actuators and haptic outputs may be used to provide a sensation that is similar to or otherwise evokes the feeling of using a mechanical keyboard. For example, when a key input is registered, instead of the entire input surface being subjected to a substantially uniform haptic output, only a localized region associated with the key (which may be as small as a single key) may be subjected to a haptic output. Thus, other fingers that may be resting on or touching the input surface may not detect any haptic output (or as significant of a haptic output) as the finger that selected the key. This may also provide a positive feedback to the user as to which key was selected.

As shown in FIG. 28A, a region or localized area of the contact surface 2802 may be displaced or deformed outwardly to produce a momentarily raised region 2806. Similarly, as shown in FIG. 28B, a region or localized area of the contact surface 2802 may be displaced or deformed inwardly to produce a momentarily depressed or recessed region 2808. Depending on the implementation, the haptic output may include an outward displacement, an inward displacement, or both an inward and an outward displacement. The displacement may extend over any suitable area of an input surface. For example, in some cases a haptic actuator is configured to produce displacements that are aligned with and have substantially the same size as the key regions of a keyboard. Thus, distinct localized displacements, such as those shown in FIGS. 28A-28B may be produced for each key of a keyboard (e.g., the virtual keys of a virtual keyboard). In some cases, the displacements are slightly larger than an individual key, and in some cases a haptic actuator is configured to produce displacements that provide haptic outputs to multiple key regions of a keyboard. Any of the haptic actuators described herein may be configured to produce localized haptic outputs and/or displacements at any particular localized region of an input surface or top case. For example, piezoelectric actuators may be positioned below or near individual key regions of a keyboard to act as the haptic actuator for that particular key region. In some cases, a single piezoelectric actuator may provide haptic outputs to two, three, four, five, six, or more keys (but less than all of the keys of a keyboard).

With regard to the embodiments of FIGS. 28A-28B, relative movement between contact surface 2802 and the body of the user 2810 (e.g., the user's finger) may create small changes in surface pressure, which may be perceived as a tactile input by the user 2810. In some implementations, the amount of movement (e.g. outward displacement 2806 and/or inward displacement 2808), the speed of the movement, and/or the frequency of the movement (if periodic) of the contact surface 2802 may be configured to produce a particular type of tactile feedback. For example, characteristics of the haptic device and/or the flexibility the contact surface 2802 may be configured to produce a particular tactile feedback when the haptic output is actuated. The flexibility of the contact surface 2802 may be driven by the structural configuration and/or constraints of the layer or layers forming the contact surface 2802.

FIGS. 29A-29H and 29J-29K depict example haptic devices that can be used to produce one or more of the haptic outputs described above with respect to FIGS. 27A-27D and 28A-28B. The following haptic devices are provided by way of illustrative example and are not intended to be limiting. In some implementations, a portable computing device (also referred to as a portable computer) may include more than one haptic device and possibly more than one type of haptic device. Each haptic device may be configured to produce a certain type of haptic output over different regions or overlapping regions of an exterior surface of a portable computer or other portable electronic device.

Figure 29A:
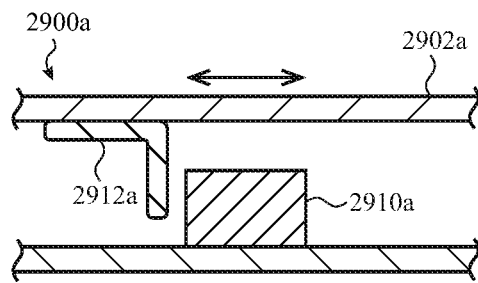
FIGS. 29A-29H and 29J-29K depict example haptic devices.

FIG. 29A depicts an example haptic device 2900a that may be used to impart an in-plane force (relative to a plane defined by the contact surface) to the contact surface 2902a, thereby displacing or moving the contact surface 2902a in a lateral or side-to-side (e.g., in-plane) motion, as indicated by the arrows. In the present implementation, the haptic device 2900a includes an electromagnetic actuator having an electromagnetic element 2910a that is magnetically coupled to a magnet or attractor plate 2912a. The electromagnetic element 2910a may be driven by an electrical current or electrical signal, which may generate a magnetic field that attracts or repels the attractor plate 2912a. The magnetic coupling between the electromagnetic element 2910a and the attractor plate 2912a results in the lateral or side-to-side motion of the contact surface 2902a. The electrical current or electrical signal may be periodic or alternating, which results in periodic or oscillatory movement of the contact surface 2902a. The haptic device 2900a may be driven to produce an impulse movement, series of impulse movements, and/or a vibration of the contact surface 2902a.

Figure 29B:
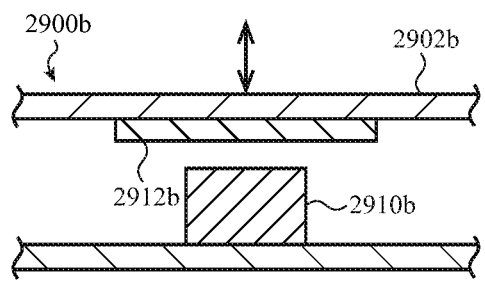

FIG. 29B depicts another example haptic device 2900b that may be used to displace or move the contact surface 2902*b*. Similar to the previous example, the haptic device 2900*b* includes an electromagnetic actuator having an electromagnetic element 2910*b* that is magnetically coupled to a magnet or attractor plate 2912*b*. The electromagnetic element 2910*b* may be driven by an electrical current or electrical signal resulting in a magnetic field that attracts or repels the attractor plate 2912*b*. The magnetic coupling between the electromagnetic element 2910*b* and the attractor plate 2912*b* may be configured to impart an out-of-plane force (relative to a plane defined by the contact surface) to the contact surface 2902*b*, thereby producing a normal or perpendicular (or out-of-plane) movement of the contact surface 2902*b*. The electrical current or electrical signal may be periodic or alternating, which results in periodic or oscillatory movement of the contact surface 2902*b*. Thus, similar to the example described above, the haptic device 2900*b* may be driven to produce an impulse movement, series of impulse movements, and/or a vibration of the contact surface 2902*b*.

The haptic devices 2900*a* and 2900*b* of FIGS. 29A and 29B, respectively, may be used to generate either a global (e.g., large-area) or local (e.g., small-area) haptic output along a contact surface. For example, the haptic device 2900*a* may be used to induce lateral motion over an entire contact surface or a large area of the contact surface 2902*a* if the haptic device 2900*a* is coupled to a substantially rigid or stiff layer that forms the contact surface 2902*a*. The haptic device 2900*a* may also be configured to induce lateral motion over a localized or small area of the contact surface 2902*a* if the layer or layers that form the contact surface 2902*a* are allowed to deflect or displace with respect to the larger surface. The localized deflection may be provided by a strain relief or flexible feature integrally formed within or coupled to the layer or layers that define the contact surface 2902*a*. Similarly, the haptic device 2900*b* may be configured to produce a global or localized haptic output depending on the structural constraints of the system that may allow or prevent localized displacement or movement of the contact surface 2902*b*.

Figure 29C:
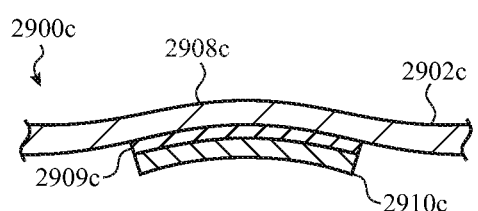
Figure 29D:
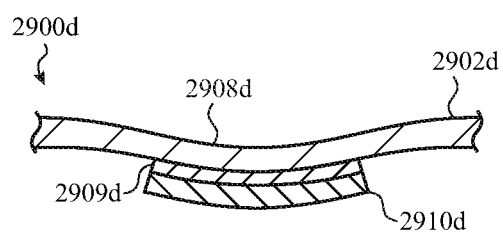

FIGS. 29C and 29D depict other example haptic devices 2900*c* and 2900*d*. The haptic devices 2900*c* and 2900*d* may be configured to produce a localized deflection or displacement of the contact surfaces (2902*c*, 2902*d*) using an actuator strip (2910*c*, 2910*d*), which may be formed from a piezoelectric material. Force spreading layers 2909*c*, 2909*d* may be disposed between the actuator strips 2910*c*, 2910*d* and the contact surfaces 2902*c*, 2902*d*. The force spreading layers 2909*c*, 2909*d* may increase the area of influence of the actuator strips 2910*c*, 2910*d*. More particularly, the force spreading layers 2909*c*, 2909*d* may increase the area of the contact surfaces 2902*c*, 2902*d* on which the motions, deflections, or vibrations produced by the actuator strips 2910*c*, 2910*d* is detectable by a user (e.g., a user's finger). The force spreading layers 2909*c*, 2909*d* may be formed from or include any suitable material, such as silicone, metal, glass, elastomeric materials, polymers, or the like.

In the implementation depicted in FIG. 29C, a voltage may be applied across the piezoelectric material of the actuator strip 2910*c* causing the actuator strip 2910*c* to shrink or reduce in length. If the actuator strip 2910*c* is not allowed to shear with respect to the layer forming the contact surface 2902*c*, the change in length may produce a momentarily raised or protruding region 2908*c*. The localized deformation may also be characterized as convex or proud of the contact surface 2902*c*.

In the implementation depicted in FIG. 29D, a voltage may be applied across the piezoelectric material of the actuator strip 2910*d* causing the actuator strip 2910*d* to grow or increase in length. Similar to the previous example, if the actuator strip 2910*d* is not allowed to shear with respect to the layer forming the contact surface 2902*d*, the change in length may produce a momentarily depressed or recessed region 2908*d*. The localized deformation may also be characterized as concave or recessed with respect to the contact surface 2902*d*. As described above with respect to FIGS. 28A-28B, above, a localized deflection or deformation of a contact surface may be tactically perceived by a user in contact with a corresponding region of the contact surface.

In the examples depicted in FIGS. 29C-29D, the haptic devices 2900*c* and 2900*d* may be configured to cause local deflections and/or deformations that are substantially isolated to or contained within an area of a key region. For example, in the case of a device with a glass surface that defines non-mechanical keys (e.g., virtual keys or key regions that are displayed by an underlying display, or that are defined by a mask, paint, ink, or dye on the glass surface), each key may be associated with a haptic device similar to the haptic devices 2900*c*, 2900*d*. In such cases, each key, or at least a subset of the keys, may be associated with a distinct haptic actuator that produces a haptic output designed to be felt by a user only within that key region. Moreover, the key-specific haptic actuators may be configured to produce a haptic output for its associated key in response to a touch and/or force sensor detecting a key input applied to the corresponding key. Accordingly, distinct haptic outputs may be produced for each key region, which may mimic or suggest the sensation of typing on a mechanical keyboard, in which a key strike on one key produces a tactile feel that is primarily and/or substantially felt only at the key being struck.

Figure 29E:
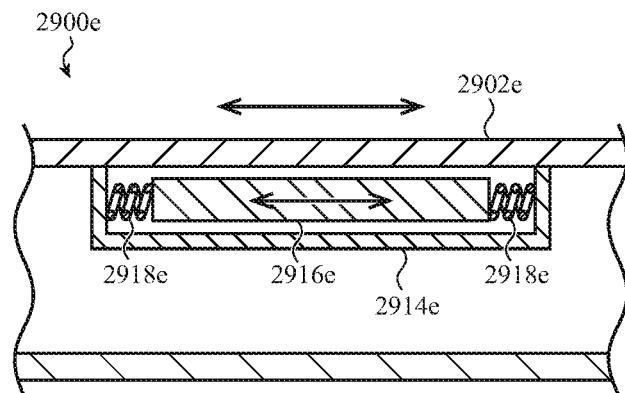

FIG. 29E depicts another example haptic device 2900*e* that may be used to displace or move the contact surface 2902*e* or otherwise produce a tactile output via the contact surface 2902*e*. The haptic device 2900*e* may include a mass 2916*e* coupled to a housing 2914*e* (or other structure) via spring members 2918*e*. The spring members 2918*e* are shown as coil springs, but other spring types and/or resilient members may be used (e.g., foams, disc springs, torsion springs, elastomer bumpers, etc.). The haptic device 2900*e* also includes an electromagnetic actuator configured to oscillate or otherwise move the mass 2916*e* relative to the housing 2914*e*, thereby imparting an impulse movement, a series of impulse movements, and/or a vibration to the contact surface 2902*e*. The electromagnetic actuator may move the mass 2916*e* in a direction that is substantially parallel to a plane defined by the contact surface 2902*e*. The electromagnetic actuator may be incorporated with the haptic device 2900*e* in any suitable manner, and may include magnets, ferromagnetic materials, electromagnetic coils, and the like. For example, the mass 2916*e* may be or may include a magnet, and a coil may be wrapped around the mass 2916*e* or positioned next to the mass 2916*e*, thus allowing the coil and the magnet to influence one another to produce motion and thus haptic output. While FIG. 29E shows the housing 2914*e* attached to the contact surface 2902*e*, it may be attached to another component within a device, and the impulse(s) and/or vibrations may be detectable by a user via the contact surface 2902*e* via the physical path between the mounting location and the contact surface 2902*e*.

Figure 29F:
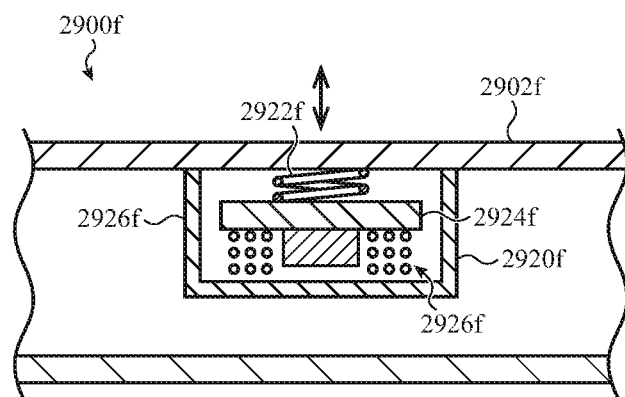

FIG. 29F depicts another example haptic device 2900*f* that may be used to displace or move the contact surface 2902*f* or otherwise produce a tactile output via the contact surface 2902*f*. The haptic device 2900*f* may include a housing 2920*f*, a mass 2924*f*, and an electromagnetic actuator 2926*f* (e.g., a voice coil motor or any other suitable actuator) that is configured to move the mass 2924*f* relative to the housing 2920*f* (or other structure) and/or the contact surface 2902*f*. The electromagnetic actuator 2926*f* may be configured to move the mass 2924*f* in a direction substantially perpendicular to a plane defined by the contact surface 2902*f*.

The haptic device 2900*f* also includes a spring member 2922*f* contacting the mass 2924*f* and the contact surface 2902*f*. The spring member 2922*f* is shown as a coil spring, but other spring types and/or resilient members may be used (e.g., foams, disc springs, torsion springs, elastomer bumpers, etc.). The spring member 2922*f* may impart an impulse movement, a series of impulse movements, and/or a vibration to the contact surface 2902*f*, thereby producing a tactile output. The tactile output from a single haptic device 2900*f* may be detectable by a user at substantially any location along the contact surface (e.g., anywhere on a top case of a device), or it may be detectable substantially only locally. In the latter case, multiple haptic devices 2900*f* may be incorporated with a device to provide local haptic outputs via the contact surface 2902*f*.

Figure 29G:
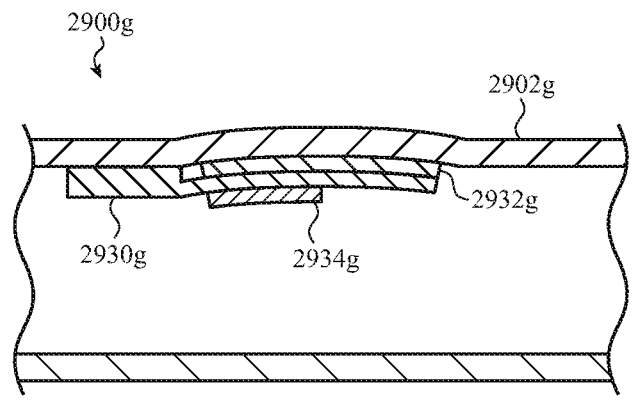

FIG. 29G depicts another example haptic device 2900*g* that may be used to displace or move the contact surface 2902*g* or otherwise produce a tactile output via the contact surface 2902*g*. The haptic device 2900*g* may be configured to produce a localized deflection or displacement of the contact surface, similar to the haptic devices 2900*c*, 2900*d*, using an actuator strip 2934*g*, which may be formed from a piezoelectric material. The actuator strip 2934*g* may be attached to a beam 2930*g* that is in turn coupled to the contact surface 2902*g* via a force spreading layer 2932*g*. The beam 2930*g* may amplify the displacement of the actuator strip 2934*g*, and/or convert the deflection of the actuator strip 2934*g* to a directional motion that produces a more detectable haptic output than would the actuator strip 2934*g* alone. The haptic device 2900*g* may also include a force spreading layer 2932*g* between the beam 2930*g* and the contact surface 2902*g*, which may increase the area of influence of the beam 2930*g*. More particularly, the force spreading layer 2932*g* may increase the area of the contact surface 2902*g* on which the motions, deflections, or vibrations produced by the actuator strip 2934*g* and/or beam 2930*g* are detectable by a user (e.g., a user's finger). The force spreading layer 2932*g* may be formed from or include any suitable material, such as silicone, metal, glass, elastomeric materials, polymers, or the like.

Figure 29H:
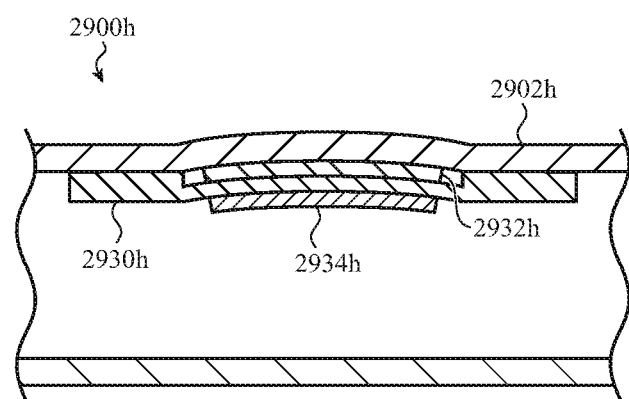

FIG. 29H depicts another example haptic device 2900*h* that may be used to displace or move the contact surface 2902*h* or otherwise produce a tactile output via the contact surface 2902*h*. The haptic device 2900*h* may be substantially similar to the haptic device 2900*g*, but instead of the beam 2930*g* being having a free end (e.g., having a cantilevered configuration), the beam 2930*h* may be attached to the top case at multiple locations (e.g., at two opposite ends). In some cases, the beam 2930*h* may resemble a plate with a recess that is defined by walls around the entire periphery of the recess. In other respects, the haptic device 2900*h* may be the same as or similar to the haptic device 2900*g*, and may include an actuator strip 2934*h* and a force spreading layer 2932*h* which may be the same as or similar to the corresponding components in FIG. 29G.

Figure 29J:
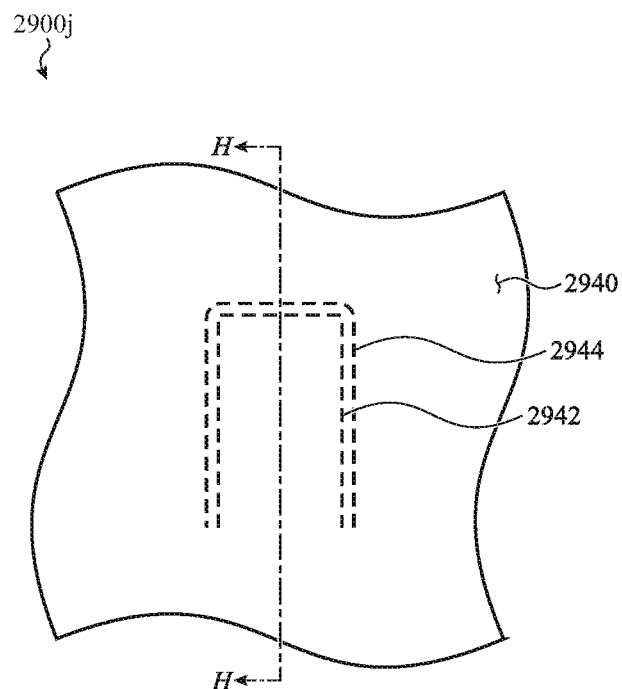
Figure 29K:
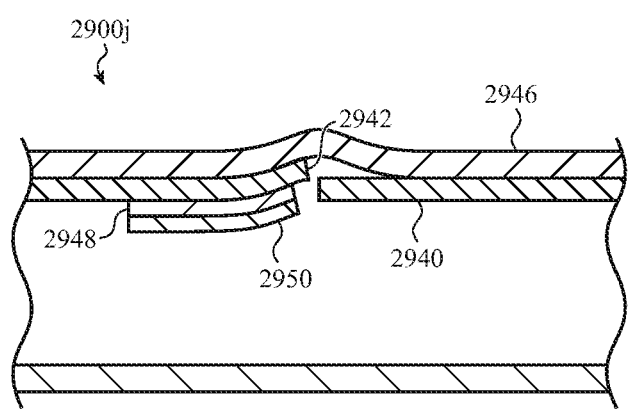

FIGS. 29J and 29K illustrate another example haptic device 2900*j* that may be used to displace or move a contact surface or otherwise produce a tactile output via the contact surface. FIG. 29J shows a partial top view of a contact surface 2940, which may correspond to a top case of a computing device, as described herein. FIG. 29K shows a partial cross-sectional view of the haptic device 2900*j*, viewed along section H-H in FIG. 29J. An opening or slit 2944 may be formed in the contact surface 2940 to define a beam 2942 (or other cantilevered or flexible member). As shown in FIG. 29K, an actuator strip 2950 (which may be similar to the actuator strips 2909*c*, 2909*d*, above, and may be formed from or include a piezoelectric material) may be coupled to the contact surface 2940 via a force spreading layer 2948 (which may be the same as or similar to the force spreading layers 2909*c*, 2909*d*, above). When the actuator strip 2950 is actuated, it may cause the beam 2942 to deflect upwards (as shown) or downwards to produce a localized deformation that can be detected by a user (e.g., by a user's finger). FIG. 29K also shows an optional cover 2946 which may overlie at least the beam 2942 (and optionally an entire top case or keyboard region) to prevent dust, liquid, and/or other debris or contaminants from entering the device through the slit 2944. The cover 2946 may be any suitable material, such as a polymer film, and may be adhered to or otherwise secured to the contact surface 2940. In some cases, such as where no cover 2946 is used, the slit 2944 is sufficiently small to substantially prevent contaminants from entering the device absent additional external forces, pressures, or the like (e.g., outside of normal operating conditions for a typical computing device such as a notebook computer).

Figure 30A:
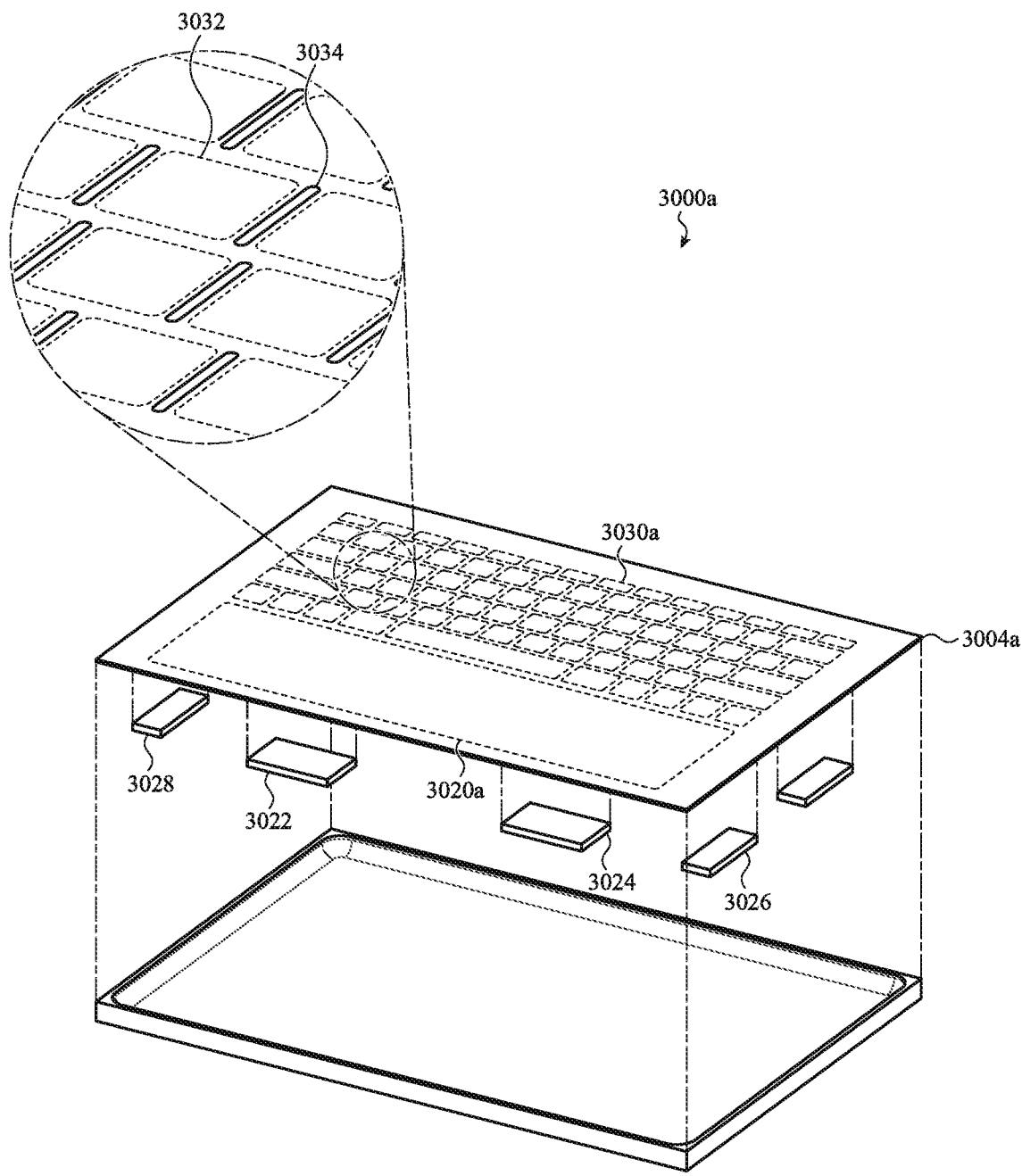
FIGS. 30A-30B depict example arrangements of different haptic devices over a contact surface of an example top case.

In a given implementation, one or more of the haptic devices of FIGS. 29A-29H and 29J-29K may be arranged with respect to a top case of a portable computer or other electronic device. The arrangement of the haptic devices may enable different haptic feedback over different portions of the top case. For example, haptic devices that are configured to produce small, localized deformations and/or haptic outputs may be used to produce haptic outputs that are detectable on individual key regions of a keyboard. This may include positioning one haptic actuator at or below each of at least a subset of key regions of a keyboard, and/or assigning a single haptic actuator to a small group of keys or key regions (e.g., one haptic actuator for a group of two, three, four, five, six, or seven keys). In addition, haptic devices that are configured to produce larger scale deformations and/or deflections of an input surface may be used to provide other types of feedback other than or in addition to key press feedback. FIG. 30A depicts an example arrangement of different haptic devices over a contact surface of an example top case of a device, including devices that produce localized haptic outputs and devices that produce more global haptic outputs. The contact surface of the top case shown and described with respect to FIG. 30A may correspond to the input surface described above with respect to other embodiments.

As shown in FIG. 30A, the device 3000*a* may include multiple electromagnetic actuators 3022, 3024, 3026, 3028 arranged along regions of the top case that are adjacent a keyboard region 3030*a*. The electromagnetic actuators 3022, 3024, 3026, 3028 may include more than one type of actuator, each type configured to produce a different type of haptic feedback in response to a different event or action.

The electromagnetic actuators 3022, 3024 may be a first type of haptic device configured to produce a first type of haptic output. For example, the electromagnetic actuators 3022, 3024, positioned within a trackpad region (shown in front of the keyboard region 3030*a* as shown in FIG. 30A, but which also may include areas on the sides and along the back of the keyboard region 3030*a*), may be lateral-actuating haptic devices that are configured to produce a lateral or side-to-side (e.g., in-plane) movement of the top case 3004a. The haptic output produced by the electromagnetic actuators 3022, 3024 may be detectable at any location in the trackpad region.

The electromagnetic actuators 3022, 3024 may be similar to the haptic devices described above with respect to FIG. 29A and/or FIG. 29E. The electromagnetic actuators 3022, 3024 may be configured to produce a haptic output that simulates the mechanical actuation of a traditional trackpad. The haptic output may include an impulse or multiple impulses that simulate the actuation of a physical metal dome used in some traditional button devices. The haptic output of the electromagnetic actuators 3022, 3024 may be isolated from regions outside of the trackpad region 3020a using strain relief or flex regions 3034 that allow relative movement within the regions of the top case 3004a.

The electromagnetic actuators 3026, 3028 may be a second type of haptic device configured to produce a second type of haptic output. For example, the electromagnetic actuators 3026, 3028, positioned within auxiliary input regions (along the sides the keyboard region 3030a), may be surface-normal-actuating haptic devices that are configured to produce a perpendicular or surface-normal (e.g., out-of-plane) movement of the top case 3004a. The electromagnetic actuators 3026, 3028 may be similar to the haptic devices described above with respect to FIG. 29B and/or FIG. 29F. The electromagnetic actuators 3026, 3028 may be configured to produce a haptic output that provides a global or large-area vibration across the surface of the top case 3004a.

As shown in FIG. 30A the device 3000a may also include multiple piezoelectric actuators 3032 arranged throughout the keyboard region 3030a of the top case 3004a to form a set of virtual keys. The multiple piezoelectric actuators 3032 may correspond to the haptic devices 2900c, 2900d, 2900g, 2900h, and 2900j described above with respect to FIGS. 29C, 29D, 29G, 29H, and 29J, respectively. The piezoelectric actuators 3032 may be arranged in locations that correspond to the position of keys of a traditional QWERTY keyboard and configured to produce a localized haptic feedback in response to the detection of a key-press on the surface of the top case 3004a within a virtual key within the keyboard region 3030a. To help isolate or localize the haptic feedback to the area of the virtual key, the top case 3004a may include reliefs or flex regions 3034 between the virtual keys to provide some relative motion between the surface of each virtual key. In some cases, the flex regions 3034 are arranged along a direction that is substantially aligned with the length of piezoelectric actuator 3032 in order to facilitate local buckling of the virtual key.

Figure 30B:
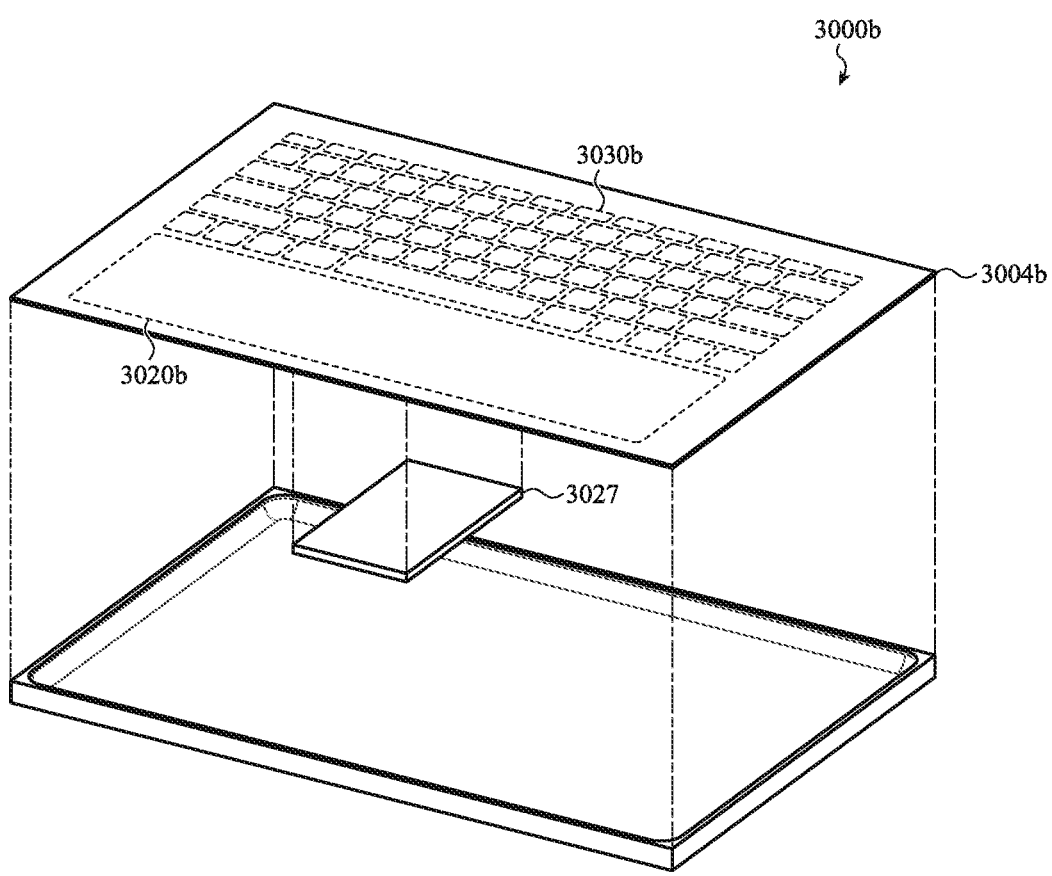

While FIG. 30A shows an example device 3000a that includes multiple haptic actuators, FIG. 30B shows an example device 3000b that includes a single haptic actuator 3027. The single haptic actuator 3027 may be configured to produce haptic outputs (e.g., in-plane and/or out-of-plane motions or impulses) to the top case 3004b. In other respects, the device 3000b may include components similar to the device 3000a, including for example the top case 3004b (which may exclude the flex regions 3034a shown in FIG. 30A), a keyboard region 3030b, and a trackpad region 3020b on the top case 3004b.

Figure 30C:
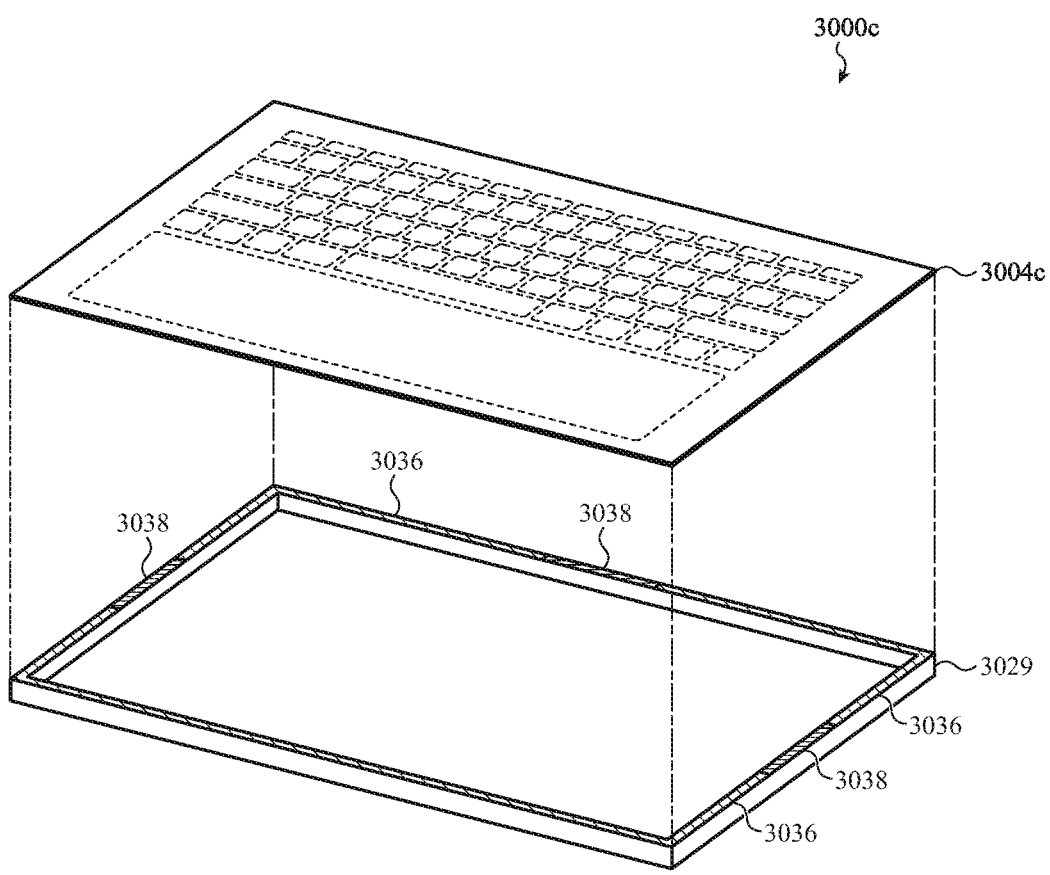
FIG. 30C depicts an example joining technique for a top case and a bottom case.

FIG. 30C depicts an exploded view of part of a base portion 3000c, showing a bottom case 3029 (which may be the same as or similar to any other bottom case described herein) and a top case 3004c that may be used in implementations where haptic actuators, such as any of the foregoing actuators, are included. The top case 3004c may be attached to the bottom case 3029 using multiple adhesives having different properties. For example, while some adhesives may provide a strong bond between the top case 3004c and the bottom case 3029, they may not allow the top case 3004c to move relative to the bottom case 3029 a sufficient amount for haptic outputs to be sufficiently uniform across the entire top case. Thus, as shown in FIG. 30C, different regions of an interface between the top case 3004c and the bottom case 3029 may use different adhesives. More particularly, a first adhesive 3036 may be applied to some portions of the interface, and a second, different adhesive 3038 may be applied to other portions of the interface. The different adhesives 3036, 3038 may have different properties, such as bond strength, rigidity, compliance, or the like. In some cases, the second adhesive 3038 is more compliant than the first adhesive. The locations and sizes of the regions having the first and second adhesives may be selected to produce a desired combination of bond strength and compliance between the top case 3004c and the bottom case 3029, and may be different from the particular arrangement shown in FIG. 30C. The use of multiple adhesives having different properties to facilitate a desired haptic response described with respect to FIG. 30C may also be applied to any of the techniques for joining a top case and a bottom case (and/or a display housing and a display component) described above with respect to FIGS. 4A-6J.

The foregoing haptic devices and/or actuators are described as producing deformations, deflections, impulses, or other phenomena that are tactilely detectable by a user. In addition to such haptic and/or tactile outputs, haptic devices and actuators are also capable of producing audible outputs. For example, when a haptic device produces a haptic output, it may necessarily produce an audible output (e.g., corresponding to a fundamental frequency associated with the actuation of the haptic device and/or harmonic oscillations of the overall device). Additionally, haptic devices may be configured to produce audible outputs regardless of their haptic or tactile content. Such audible outputs may be produced at any time for any suitable reason or function. For example, haptic devices may be configured to produce audible outputs in conjunction with speakers or other audio output devices of an electronic device. The audio outputs that are produced by haptic devices may be triggered by, correspond to, or otherwise coordinate with the audio output produced by speakers. As a particular example, a haptic device may produce oscillations that substantially match at least a portion of a frequency spectrum that is being produced by a speaker.

Audio outputs and haptic outputs may be produced by a haptic device substantially simultaneously. For example, when a haptic output is generated by a haptic device (e.g., by oscillating the haptic device at a first frequency), an audible output may also be generated by the haptic device (e.g., by overlaying a second frequency on the signal being applied to the haptic device). The audible output may be functionally related or unrelated to the haptic output. For example, in some cases the audible output is designed to accompany the haptic output (e.g., so that a key press on a virtual key both feels and sounds like a key press of a conventional mechanical key). In other cases, the audible output may be unrelated, such as when a haptic output is being generated while the haptic device is producing audio that corresponds to active music playback. Moreover, as noted above, audible outputs from haptic devices may be produced independently of any haptic outputs (e.g., the haptic device may be used to produce audible outputs even when no haptic outputs are being produced).

Figure 31A:
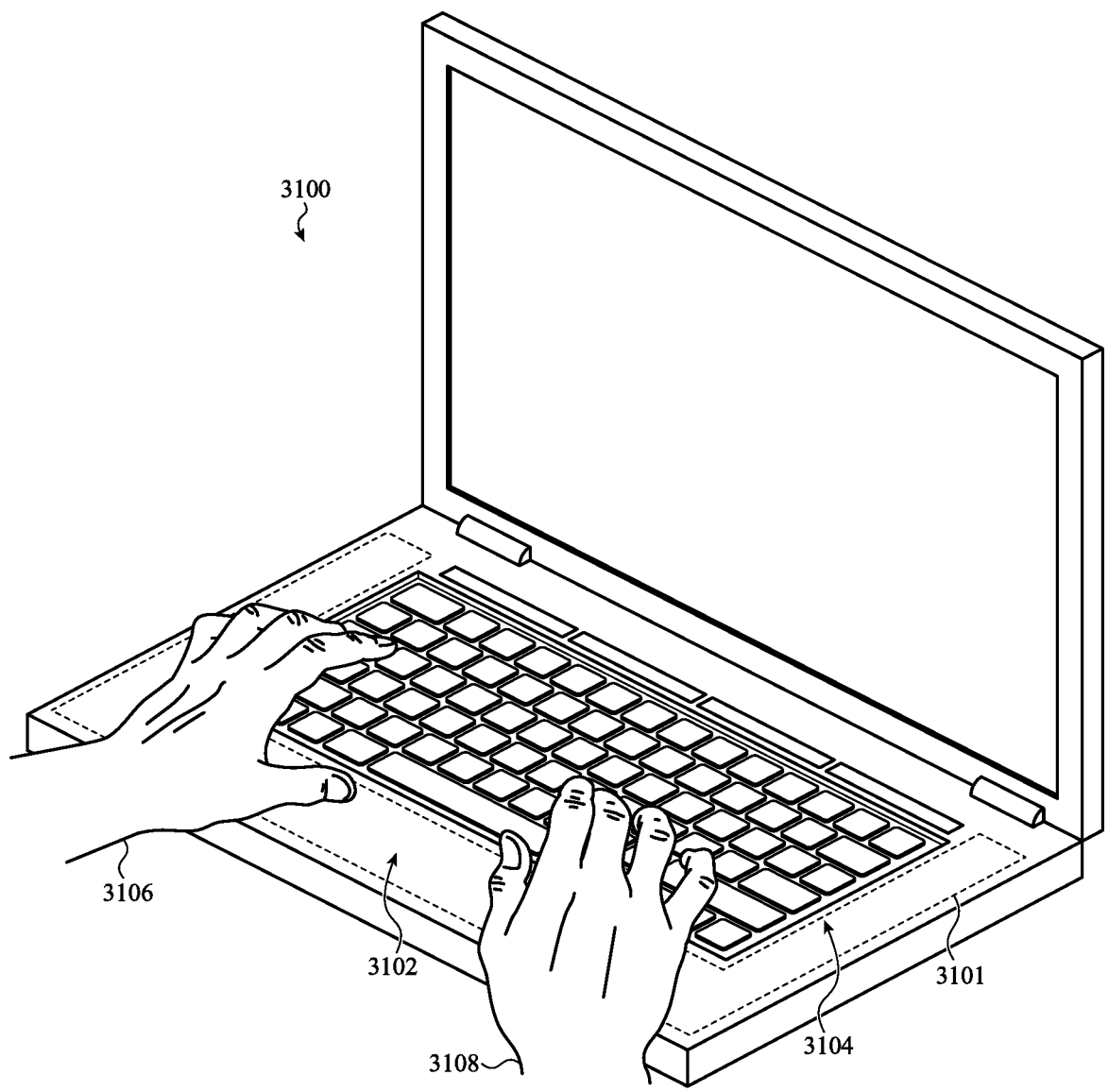
FIGS. 31A-31B depict an example computing device being used for text and/or touch input.

Touch sensors of an integrated interface system as described herein may detect whether a user is touching a surface, such as a key or a trackpad region, but may not be capable of differentiating between light touches and more forceful touches. Force sensors enable a device to differentiate between such inputs. For example, force sensors, such as those described above with respect to FIGS. 21A-22J, may be used to determine whether a touch input applied to a touch-input region is a gesture input (e.g., a swipe) or a "click" type of input (which may correspond to a key input or a trackpad input).

Where force sensors are used in regions of a computing device where only fingers are typically applied, such as a small trackpad adjacent a keyboard on a notebook computer, the maximum amount of force that is typically applied to the trackpad during normal use may be at or near the amount of force applied by a finger during a click event. For example, the highest force experienced by a trackpad is typically near the force applied by a finger during a selection (e.g., a click) applied to the trackpad. On the other hand, where a larger force sensitive region is used, such as the non-keyboard region of an integrated interface system as described herein, the maximum force applied to the force sensitive region may be higher than a finger press, making individual finger presses less identifiable. For example, FIG. 31A illustrates an example computing device 3100 that includes an integrated interface system with a trackpad region 3102 that extends along substantially an entire width of a top case 3101 of the device 3100, as well as along sides of the keyboard 3104. The whole top surface of the top case 3101 (or substantially all of the top surface) of the computing device 3100 may be force sensitive, thus facilitating detection of force inputs both on a keyboard 3104 (which may be a mechanical keyboard or a virtual keyboard) as well as the trackpad region 3102.

As described herein, the integrated interface system may be configured to distinguish between different types of inputs, such as inputs applied to the keyboard 3104 and the trackpad region 3102 using touch and/or force sensing systems. For example, if the force and/or touch sensing system determines an input that satisfies a particular force threshold being applied to the trackpad region 3102, a trackpad input (e.g., a "click") may be registered. If the force and/or touch sensing system determines an input that satisfies a particular force threshold being applied to the keyboard region 3104, a key input may be registered. Accordingly, the touch and force sensing systems may be used to distinguish between several different types of inputs that may be applied to the top case 3101 and to cause the device to react differently based on the location of the input. For example, a key input may cause a letter or character to be displayed on a display, and a trackpad input may correspond to a mouse click or otherwise cause a selection event in a user interface of a device. As used herein, inputs applied to functionally different regions of an integrated interface system (e.g., a keyboard region, a trackpad region, a virtual key region, etc.) may be referred to as different types of inputs, and inputs having different forces (e.g., taps versus presses) may be referred to as different types of inputs. This may largely mirror the expectation of a user that providing inputs to different regions (and/or providing different amounts of force) will cause the device to perform different types of functions. Further, as described herein, different types of haptic outputs may be associated with or produced in response to the detection of different types of inputs.

Because of the size and locations of the force sensitive input regions of the device 3100, the force from a user's hands 3106, 3108 resting on the top case 3101 (and in particular on the trackpad region 3102) during typing may make it more difficult to differentiate or detect the relatively smaller forces applied by each finger during typing. More particularly, force sensors may not be able to determine with sufficient accuracy where a particular force is being applied, and thus cannot determine whether a force is due to typing or a tap input, or due to the weight of a user's palms. This may occur, for example, where a single force sensor or global force sensing system is used, instead of having different force sensors for different regions of the top case 3101. Accordingly, techniques are used to ignore or reduce the effects of forces that do not correspond to actual inputs (e.g., palm forces) in order to better identify forces that do correspond to actual inputs (e.g., actuations of keys or taps on virtual keys).

For example, the influence of palm weight may be cancelled or ignored by using touch and/or force sensors to determine whether a user's palms are resting on the trackpad region 3102 at a given time, and then changing a threshold force that causes an input to be registered. The presence of a user's palms can be determined in a variety of ways. For example, a touch sensor associated with the trackpad region 3102 may identify a touch input that is indicative of a large object (such as a palm, as compared to a finger) being in contact with the trackpad region 3102. As another example, a keyboard contact sensor may determine that a user's fingers are in contact with one or more keys of the keyboard 3104, which can indicate that a user's palms are most likely resting on the trackpad region 3102. Other techniques for determining whether a user's hands are resting on the top case 3101 may be used, including proximity sensors, force sensors, operational heuristics (e.g., whether typing input is being detected), or the like. Moreover, any combination of these (or other) techniques may be used together.

Once it is determined that a user's hands are resting on the top case 3101 or the trackpad region 3102, the device 3100 may operate in a palm-reject mode in which a different algorithm or technique is used to detect typing or other touch inputs. For example, when operating in the palm-reject mode, a force threshold that causes a device to register a touch or typing input may be raised by a certain amount. For example, if a single tap for a typing input typically results in a 100 gram force (not including any contribution from a user's hands on the top case 3101), and the weight of a user's hands typically results in a 3000 gram force on the top case, the force threshold may be raised to 3100 grams. That is, only forces that are at or above 3100 grams will be registered as inputs. When the palm-reject mode is not active, the force threshold for determining or detecting a typing input may be different than when the palm-reject mode is active. Thus, continuing the example above, if the user's palms are not detected, the threshold force for registering an input from a touch event may be 100 grams.

In some cases, the forces associated with typing inputs and a user's palms resting on the top case 3101 are determined in real time, for individual users, by one or more force sensors or sensing systems. Accordingly, force thresholds for detecting typing inputs may also be based on the characteristics of a particular user. For example, a force sensor may determine that when a user is resting his or her hands on the top case, there is a 2000 gram force associated with just the user's hands, and when the user types, individual typing inputs correspond to an 80 gram force. Accordingly, the device may set a threshold at 2080 grams for that particular user. The forces associated with a user's hands and/or typing input may be determined dynamically and without the user's knowledge, or there may be a calibration routine in which a user rests his or her hands on the top case and/or provides typing inputs. The device may then determine appropriate force thresholds for typing inputs when the user's hands are or are not resting on the top case.

As another example, the force of a particular user's hands may be measured by determining that the user's hands are in a typing position but no input is being provided (e.g., by determining that the detected force is not changing), and then storing the detected force as a personalized baseline value. When the device 3100 is in the palm-reject mode, the force threshold may be increased by the baseline value. Thus, the force threshold can be changed by a customized amount to accommodate users that apply different weights with their hands during typing.

Another technique for differentiating typing or other touch inputs (e.g., clicks) from palm forces or other continuous, non-input related forces is to use accelerometers to differentiate between different types of forces. For example, a typing or click input may impart an impulse to the top case 3101 that may cause the top case 3101 and/or the device 3100 to move, even a very small amount, over a short time period. On the other hand, the weight of a user's palms during typing or other use of the device 3100 may not produce such impulses, or may produce impulses that are distinguishable from those produced by typing or clicking inputs. Accordingly, the device 3100 may include accelerometers that detect impulses. When the device 3100 detects an impulse, it may register or detect a force input in response to detecting the impulse. Where it is desired to know the location of the force input, the device 3100 may use location information from a touch sensor in conjunction with the accelerometer information to determine where the force input was applied. Accelerometers may be coupled to the top case 3101, or any other suitable location within the device 3100.

Yet another technique for determining when a force input is being applied to the device 3100 includes using microphones to detect when a force input is being applied. In particular, whereas a user's palms resting on the top case 3101 may be relatively silent, force inputs from a user's fingers striking keys (mechanical or virtual) or tapping on a trackpad or other touch or force sensitive region may produce more distinct and/or detectable sounds. Accordingly, the device 3100 may include one or more microphones that detect the sounds associated with typing events. Force inputs that are not coincident with sounds (e.g., from hands resting on the top case 3101) are ignored, while force inputs that are coincident with sounds (e.g., from typing or clicking) are registered as an input.

Figure 31B:
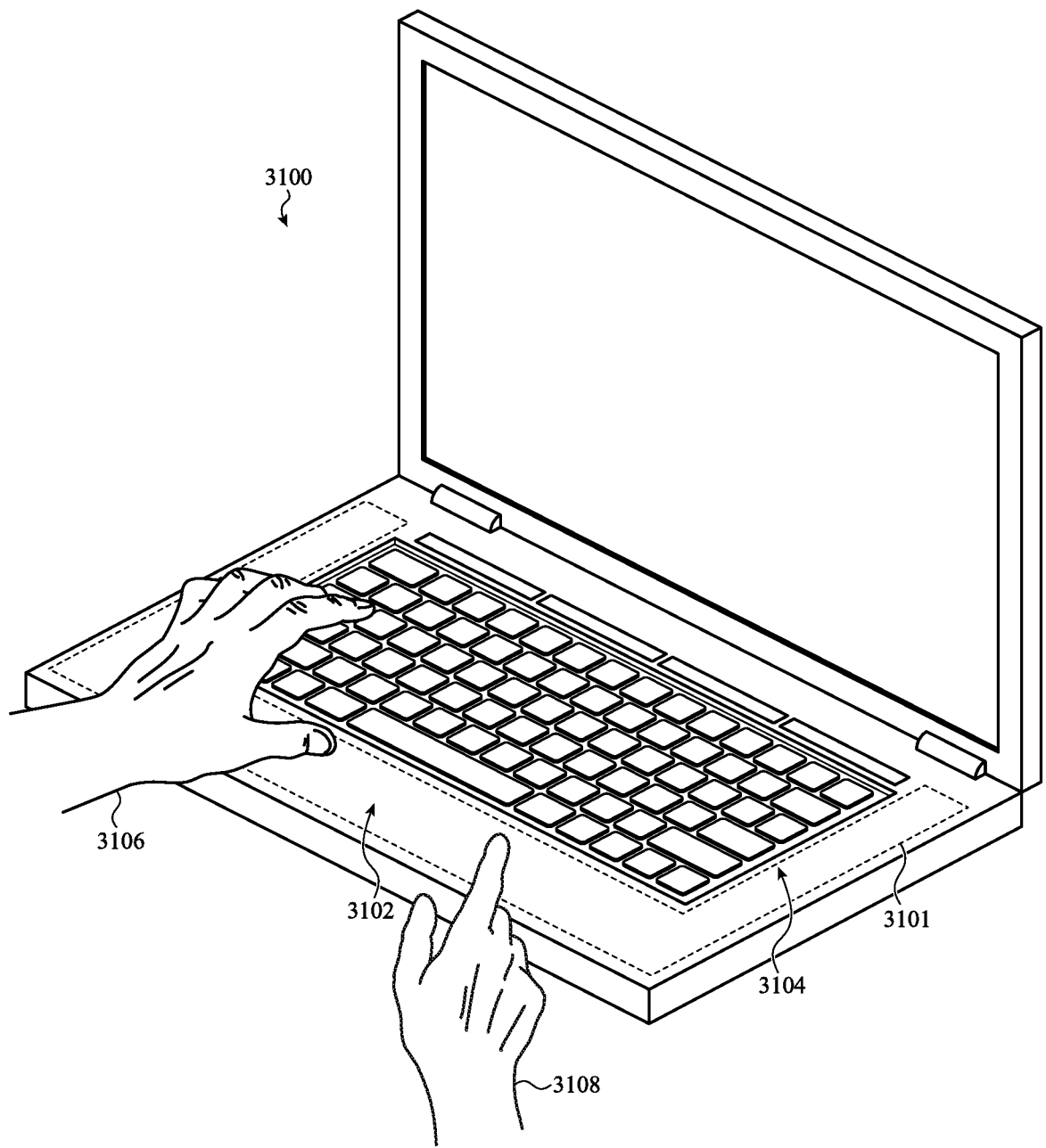

FIG. 31A illustrates a scenario where a user is typing while the user's hands 3106, 3108 are resting on the trackpad region 3102. In this case, palm-rejection techniques are used to ignore the force of the user's hands on the trackpad region 3102 while detecting force inputs applied to the keyboard 3104. FIG. 31B illustrates another scenario, where one hand 3106 is resting on the trackpad region 3102 and the other hand 3108 is providing a force input to the trackpad region 3102. Similar palm-rejection techniques may be used in this scenario to detect the input to the trackpad region 3102 while ignoring the force from the resting hand 3106. Indeed, palm-rejection techniques may be used to ignore the force from resting hands while detecting inputs at other locations, such as on a virtual key region, regions of the top case that are on a side of the keyboard, or the like.

In order to effectively detect the varied types of touch and force inputs that may be applied to a computing device as described herein, it may be advantageous to know when a user is in a typing position, such as when the user's fingers are on the keyboard. This information may be used, for example, to determine whether or not the device should be operating in a palm-reject mode, or any other appropriate operating mode (e.g., a "typing" mode).

Figure 32A:
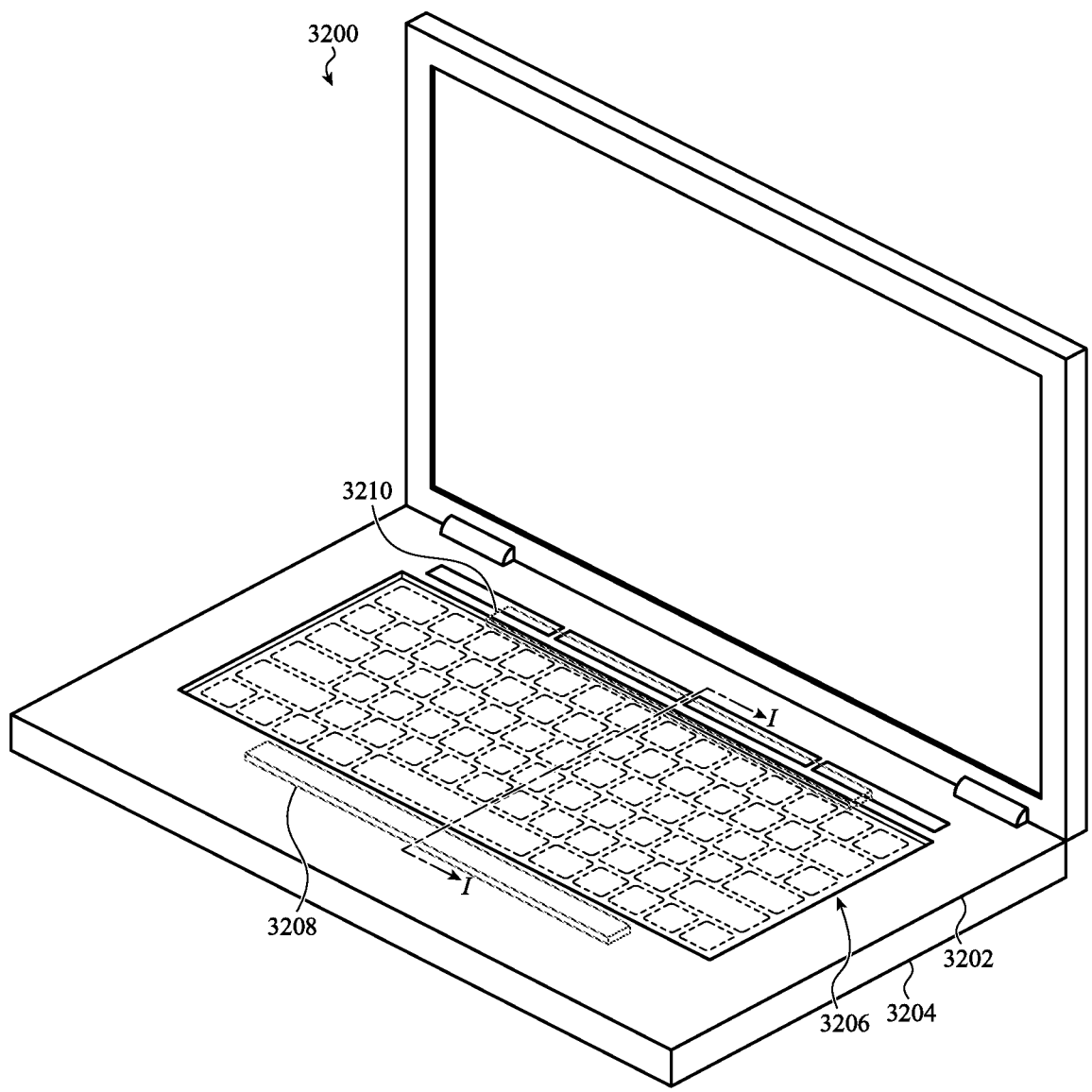
FIG. 32A depicts an example computing device with a finger sensing system.

FIG. 32A depicts an example computing device 3200 that includes a sensor system for determining when a user's hands are in a typing position. The computing device 3200 includes a top case 3202 and a bottom case 3204, which are similar to other top and bottom cases described herein. The computing device 3200 also includes a keyboard 3206 (which may be a mechanical keyboard, a virtual keyboard, or a hybrid of these types) and a sensor system that detects the presence of a user's fingers on the keyboard 3206. The sensor system may include a light curtain sensor that includes a light emitter 3208 and a detector 3210. As shown, the light emitter 3208 is positioned along one side (e.g., a bottom side) of the keyboard 3206, and the detector 3210 is positioned along an opposite side (e.g., a top side) of the keyboard 3206, though other configurations and placements are also contemplated.

Figure 32B:
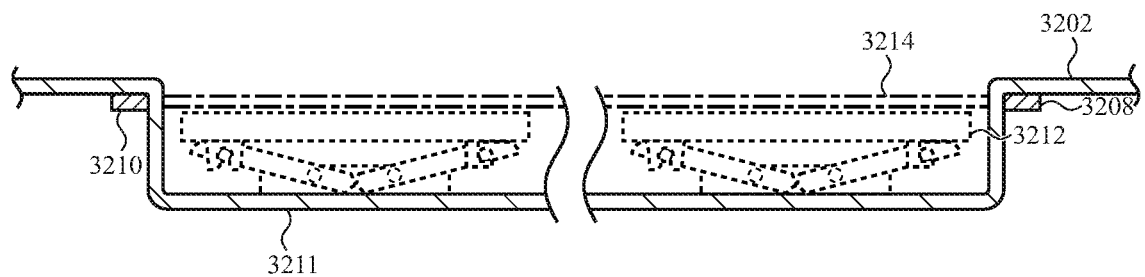
FIGS. 32B-32E depict partial cross-sectional views of the computing device of FIG. 32A, viewed along section I-I in FIG. 32A.
Figure 32C:
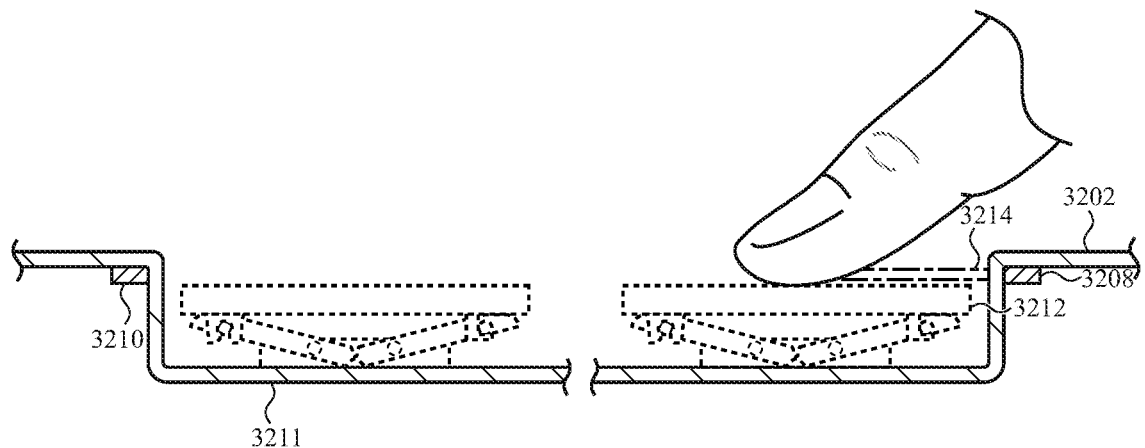

FIGS. 32B-32C depict partial cross-sectional views of the device 3200, viewed along section I-I in FIG. 32A. The light emitter 3208 and the detector 3210 may be coupled to the top case 3202 on opposite sides of a recessed region 3211 in which the keyboard 3206 (FIG. 32A) is positioned. In particular, the light emitter 3208 may be positioned such that light 3214 is emitted through the top case 3202 (which may be glass, ceramic, or another light-transmissive material) above the keys of the keyboard. When a user places a finger on or near a key, the finger may interrupt the light 3214 so that the light 3214 is no longer detected by the detector 3210, as shown in FIG. 32C. When the detector 3210 no longer detects the light 3214, the computing device 3200 may determine that a user's hands are in a typing position, with his or her fingers on (or very close to) the keycaps. When the computing device 3200 determines that the user's hands are in a typing position, it may enter a palm rejection mode, or launch an application or a text input box (e.g., a search input field), or perform any other desired action.

The light emitter 3208 and detector 3210 may be configured to emit and detect multiple light beams, so that even a single finger on a single key can be detected. For example, the light emitter 3208 may produce a series of parallel light beams that are separated by a distance that is less than the average (or the smallest) human finger. For example, the light beams may be separated by between about 1.0 and 10.0 mm.

Figure 32D:
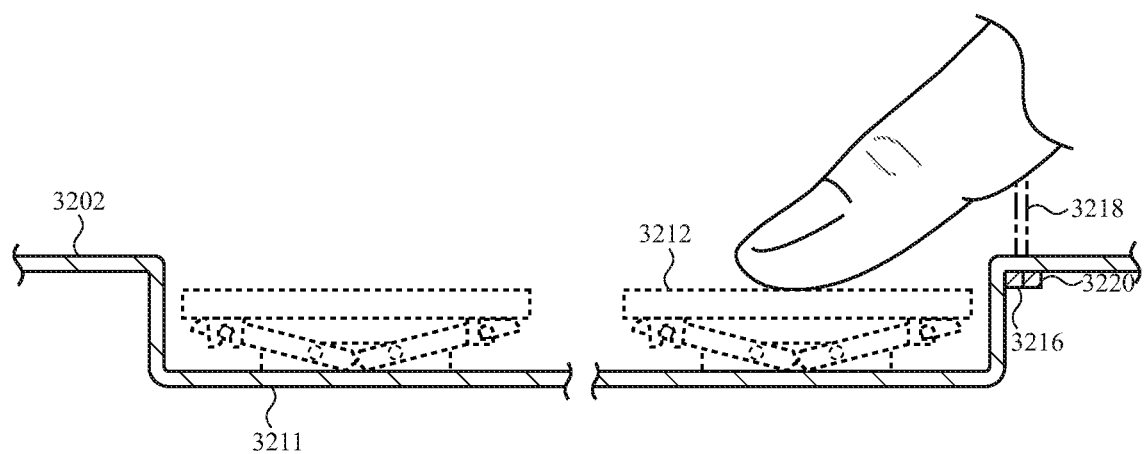

FIG. 32D depicts a partial cross-sectional view of the device 3200, viewed along section I-I in FIG. 32A, showing an example in which a light emitter 3216 emits light 3218 substantially vertically (or otherwise non-horizontally) through the top case 3202. A detector 3220 (which may be part of a single sensor that includes both the emitter 3216 and the detector 3220) may determine whether an object has interrupted the light 3218 in an area above the keyboard (e.g., within about 6 inches above the keyboard, or any other suitable distance), and as such, can be used to determine whether a user's hands have been placed on the keyboard. As noted above, the top case 3202 may be glass, ceramic, or another light-transmissive material, thus allowing the emitter 3216 and the detector 3220 to emit and detect light through the top case 3202. FIG. 32D shows the emitter 3216 and detector 3220 positioned next to a sidewall that defines the recessed region 3211. In other examples, the emitter 3216 and detector 3220 may be positioned elsewhere, such as along a bottom surface of the recessed region 3211, or any other suitable location. Where the emitter 3216 and detector 3220 are positioned on the bottom surface of the recessed region 3211, the light 3218 may be projected through a gap between the sidewall of the recessed region 3211 and a side of the keycap 3212.

Figure 32E:
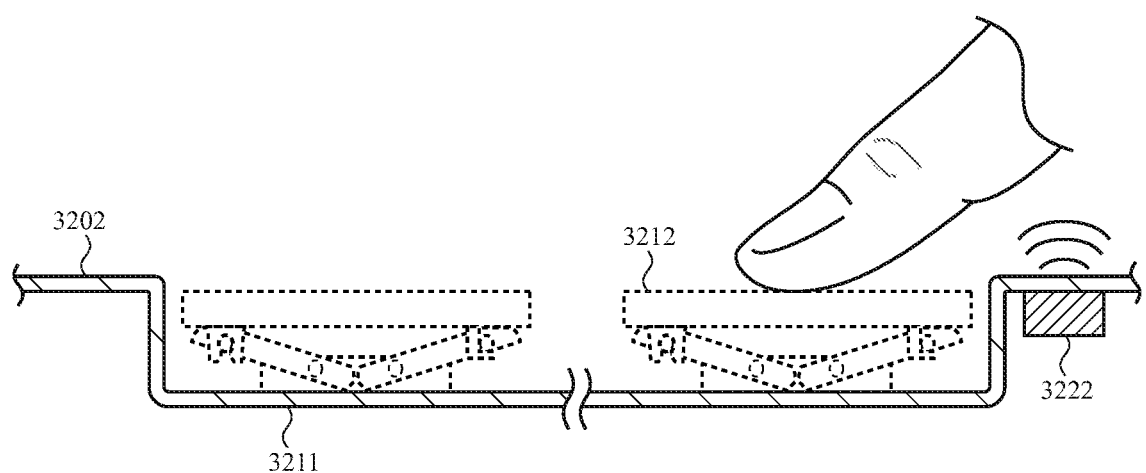

FIG. 32E depicts a partial cross-sectional view of the device 3200, viewed along section I-I in FIG. 32A, showing an example in which a proximity sensor 3222 is used to detect the presence or absence of a user's fingers near the keyboard. The proximity sensor 3222 may use any suitable sensing technology to detect the user's hands, including ultrasonic sensing, capacitive sensing, optical sensing, infrared sensing, thermal sensing, cameras or other imaging sensors, radar, light detection and ranging (LIDAR), or the like. While the proximity sensor 3222 is shown as sensing through the top case 3202, in other examples the top case 3202 may have one or more openings to allow the proximity sensor 3222 to sense the presence or absence of a user's fingers. Further, while FIG. 32E shows the proximity sensor 3222 directed upwards, a proximity sensor may be directed in another direction. The proximity sensor 3222 may also be positioned elsewhere in a device, and may determine whether a user is interacting with a keyboard by detecting other areas of a user's hands, arms, fingers, and/or wrists.

Figure 33A:
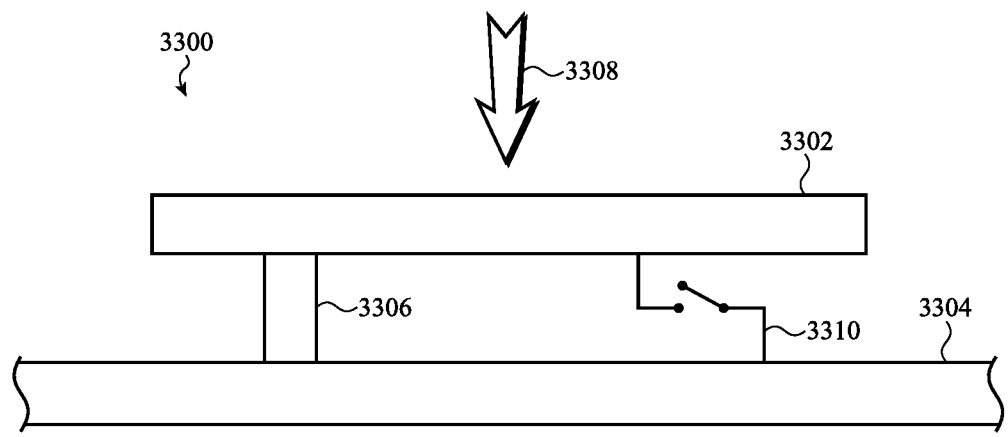
FIGS. 33A-33B depict schematic views of an input key.
Figure 33B:
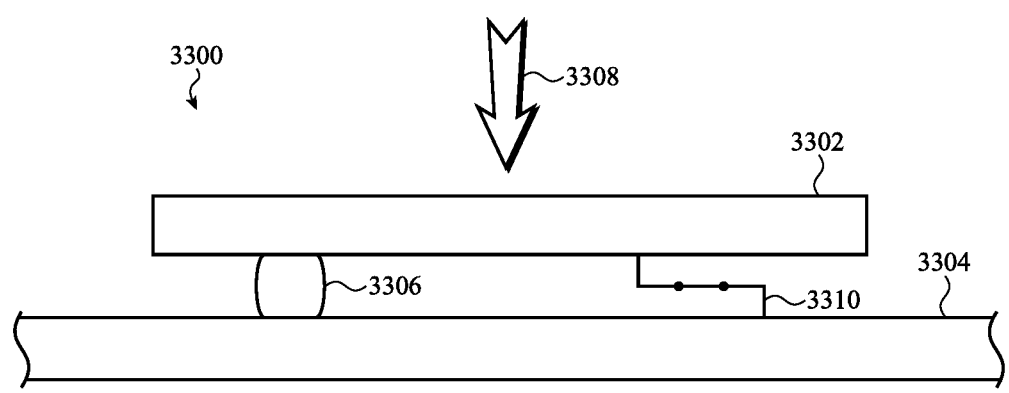

As noted above, keyboards for computing devices described herein may include virtual or mechanical keys (or both). Mechanical keys provide several functionalities, as illustrated in FIGS. 33A-33B, which are schematic illustrations of a mechanical input key 3300. The key 3300 includes an interface member 3302 that a user contacts or presses in order to register an input. In some cases, the interface member 3302 is a keycap. The interface member 3302 is mechanically coupled to a computing device (represented by the base 3304) with a mechanism 3306. The mechanism 3306 produces a tactile response when the interface member 3302 is depressed, as shown in FIG. 33B, and also imparts a returning force on the interface member 3302 to return the interface member 3302 to an unactuated state. The tactile response may be represented or defined by a particular force response curve. For example, the force response curve for a key 3300 may be substantially flat, such that the force imparted by the mechanism 3306 in opposition to an actuation force (indicated by arrow 3308) does not change throughout the travel of the interface member 3302. Alternatively, the force response of the key 3300 may cause the opposing force to increase as the interface member 3302 is pressed, until a release point is reached at which point the opposing force may decrease (e.g., similar to a "buckling" response). This type of force response curve may produce an audible and/or physical click that is characteristic of some mechanical keys. Any suitable mechanism or combination of mechanisms may be used for the mechanism 3306, including scissor mechanisms, hinge mechanisms, rubber domes, coil springs, collapsible metal domes, elastomer members, magnets, and so on.

The key 3300 also includes a key make sensor 3310 that is used to determine when the key 3300 is pressed sufficiently for a device to register an input. In FIGS. 33A-33B, the key make sensor 3310 is shown in schematic form. The key make sensor 3310 may include any suitable combination of electrical, mechanical, and/or electromechanical components, some examples of which are described herein.

FIG. 33A depicts the key 3300 in an unactuated state with the key make sensor 3310 shown in an open state. FIG. 33B depicts the key 3300 in an actuated state (e.g., pressed downward) with the key make sensor 3310 in a closed state. The key make sensor 3310 may be closed when the interface member 3302 reaches the end of its travel (e.g., when it bottoms out), or at another point along its travel (e.g., coincident with or immediately after an audible or physical click is produced).

Computing devices described herein may have top cases formed from glass (or other material) that have no openings or holes in the top surface to allow keys to mechanically access the interior of the computing device. For these computing devices, the mechanism 3306 and the key make sensor 3310 are selected to provide functionality described above without mechanically coupling to the inside of the computing device through an opening in the top case.

Figure 34A:
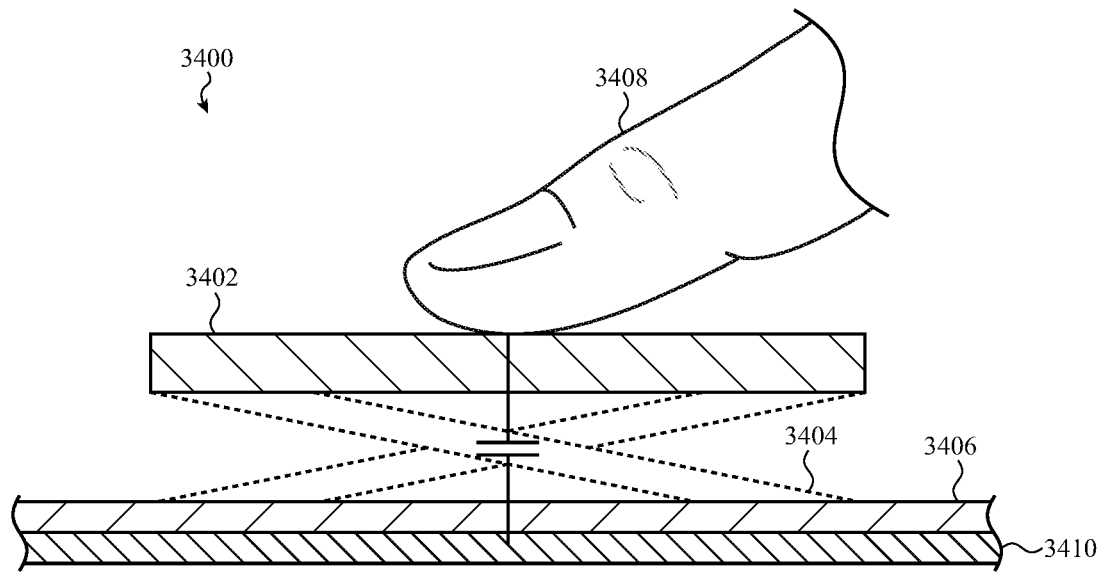
FIGS. 34A-34B depict partial cross-sectional views of an example input key, viewed along section J-J in FIG. 13A.
Figure 34B:
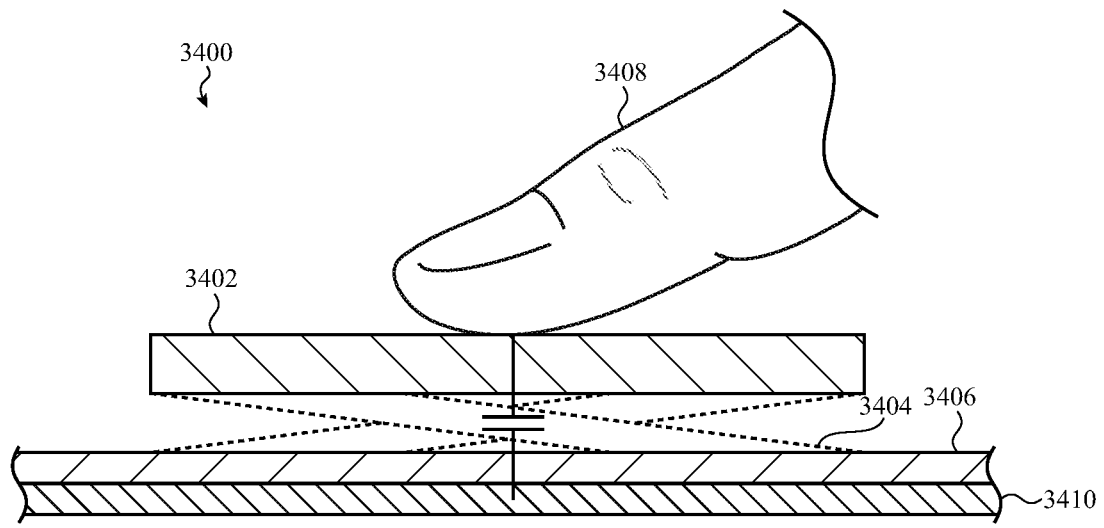

FIGS. 34A-34B depict partial cross-sectional views of an example computing device 3400, showing an example system for detecting key makes through a top case. The cross-sectional views may correspond to a view of a computing device viewed along section J-J in FIG. 13A. The computing device 3400 includes a keycap 3402 (an interface member), a top case 3406, and a support mechanism 3404 movably coupling the keycap 3402 to the top case 3406. The computing device 3400 further includes a sensor 3410, or a portion of a sensor such as an electrode layer, positioned below the top case 3406.

The top case 3406 may correspond to top cases described above, and may be formed from glass, ceramic, plastic, or any other suitable material. As shown, the top case 3406 does not include an opening through which the keycap 3402, or any other component above the top case 3406, can pass through.

The support mechanism 3404 may be any suitable mechanism, such as a scissor mechanism, a butterfly hinge, or the like. The support mechanism 3404 may be configured to produce tactile or audible clicks or other feedback when the keycap 3402 is depressed. The support mechanism 3404 may also include a resilient member that opposes forces applied to the keycap 3402, thereby producing a suitable force response by producing a force that opposes an actuation force and/or returns the keycap 3402 to an unactuated position when the actuation force is removed. The resilient member may be a coil spring, an elastomer member, a rubber dome, or the like.

The sensor 3410 may detect the presence or proximity of objects above the top case 3406, and may use any suitable mechanism or rely on any suitable phenomena to do so. For example, the sensor 3410 may be or may be part of a capacitive sensing system that can detect changes in electrical fields above the top case 3406 caused by nearby objects such as fingers, styli, etc. The sensor 3410 may use self-capacitance, mutual capacitance, or any other technique for capacitively coupling to a finger or object.

To allow the sensor 3410 to capacitively couple to a user's finger 3408 (or otherwise use capacitive sensing principles to detect the user's finger 3408), the top case 3406, the keycap 3402, and the support mechanism 3404 may be substantially nonconductive (e.g., they may be formed from dielectric materials). More particularly, by using substantially nonconductive materials, such as glass, plastic, ceramic, sapphire, or the like, the top case 3406, keycap 3402, and support mechanism 3404 may not interfere with a capacitive coupling between the finger 3408 and the sensor 3410, thus allowing the sensor 3410 to capacitively couple directly to the finger 3408 through the intervening components.

As shown in FIG. 34A, when the finger 3408 is on the keycap 3402 and the keycap 3402 is unactuated (e.g., not depressed), the sensor 3410 capacitively couples to the finger 3408. Nevertheless, the sensor 3410 (or circuitry of the sensor 3410) may determine that the capacitive influence of the finger 3408 is not indicative of an actuated key. When the keycap 3402 is sufficiently depressed, as shown in FIG. 34B, the sensor 3410 may determine that the capacitive influence of the finger 3408 has satisfied a threshold value, and the sensor or sensor circuitry may register an actuation of the key.

The sensor 3410 and the support mechanism 3404 may be configured so that a key make, or actuation of the key, is sensed at a particular point along the travel of the keycap 3402. For example, the sensor 3410 may be configured to register an actuation of the key when the keycap 3402 reaches an end of its travel (e.g., when the finger 3408 is at its closest possible point to the sensor 3410). In some cases, the point at which a key actuation is registered may be variable, and need not be at the end of the key travel. For example, the keycap travel at which the key actuation is registered may be established at a lower value (e.g., less keycap travel) for users who type with lower force than for users who type with higher force. The particular travel target for registering a key actuation may be determined dynamically by determining an average key travel of a user during typing and setting the travel target to the average travel (or some other value based on the user's typing style).

As another example, where the support mechanism 3404 produces a click or other audible or tactile feedback at an intermediate travel of the keycap 3402, the sensor 3410 may register actuation of the key when the finger 3408 is at or immediately past the point where the click is produced. In some cases, the sensor 3410 (and/or associated circuitry of the sensor 3410) can also detect the presence of a user's finger on or above the keycap 3402 without the keycap 3402 being moved. Such sensing may be used to determine whether or not a user's hands are in a typing position, to detect gesture inputs applied to or above the keycap 3402, and/or to determine an intended key target based on the actual location of the user's contact with the keycap 3402 (e.g., when two adjacent keys are pressed at substantially the same time, a key that is pressed only at its edge may have been struck by mistake; by detecting the location of the contact such key actuations can be ignored).

The sensor 3410 may also be able to determine the particular location of a particular input. In this way, the sensor 3410 can determine what key is being selected. More particularly, when the sensor 3410 detects an actuation event, it may compare the location of the actuation event with a key map that correlates each key of a keyboard to a particular location or position on the top case 3406, and determine what key was actuated.

Figure 35A:
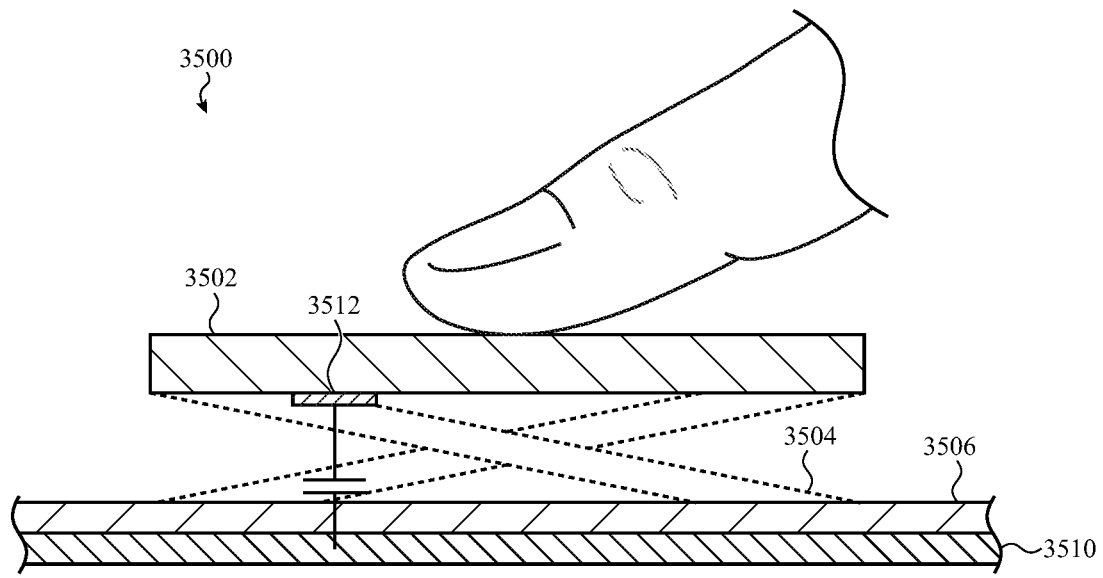
FIGS. 35A-35B depict partial cross-sectional views of another example input key, viewed along section J-J in FIG. 13A.
Figure 35B:
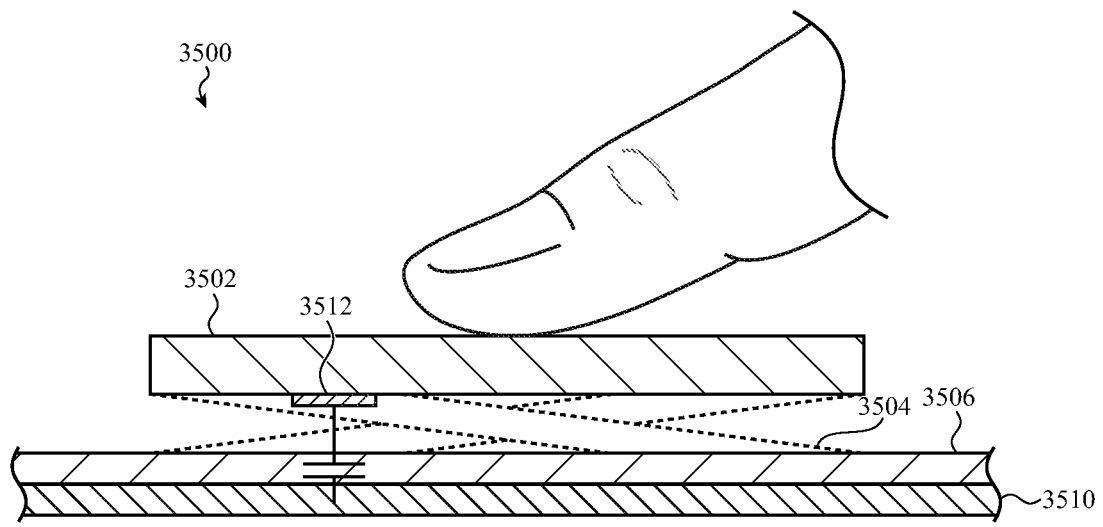

FIGS. 35A-35B depict partial cross-sectional views of an example computing device 3500, showing another example system for detecting key makes through a top case. The cross-sectional views may correspond to a view of a computing device along section J-J in FIG. 13A. The computing device 3500 is similar to the computing device 3400 described with respect to FIGS. 34A-34B, but instead of the sensor capacitively coupling to a user's finger or other object that is placed on a keycap, the sensor capacitively couples to a conductive or other capacitively detectable portion of the keycap.

More particularly, the computing device 3500 includes a keycap 3502 (an interface member), a top case 3506, and a support mechanism 3504 movably coupling the keycap 3502 to the top case 3506. The computing device 3500 further includes a sensor 3510, or a portion of a sensor such as an electrode layer, positioned below the top case 3506. These components are the same as or similar to the analogous components described above with respect to FIGS. 34A-34B.

The computing device 3500 also includes an electrode 3512 coupled to a movable part of a key, such as the keycap 3502. The sensor 3510 capacitively couples to or otherwise detects the proximity of the electrode 3512, and can determine a distance, or a value indicative of the distance, between the electrode 3512 and the sensor 3510. Thus, the sensor 3510 can determine when the key is unactuated, as shown in FIG. 35A, and when the key is actuated, as shown in FIG. 35B.

The electrode 3512 may be formed from or include any suitable material or materials, including ITO, indium gallium oxide, gallium zinc oxide, indium gallium zinc oxide, metal nanowire, nanotube, carbon nanotube, graphene, conductive polymers, a semiconductor material, a metal oxide material, copper, gold, constantan, or the like. The electrode 3512 may use light-transmissive materials or opaque materials, depending on the application (such as whether a display is positioned below the electrode). Also, the electrode 3512 may be any suitable size or have any suitable dimensions. In some cases, the electrode 3512 is smaller than the keycap 3502, as shown in FIGS. 35A-35B. In other cases, the electrode 3512 covers substantially the entire bottom or top surface of the keycap 3502. Furthermore, the electrode 3512 is shown attached to the keycap 3502, but it may be positioned in any movable part of a key mechanism, including the top surface of the keycap 3502, an arm of the support mechanism 3504, or the like. The electrode 3512 may be a glyph on the keycap 3502, where the glyph is formed from or includes a conductive material, such as a conductive paint or a conductive dopant applied to a material that forms the glyph.

Figure 36A:
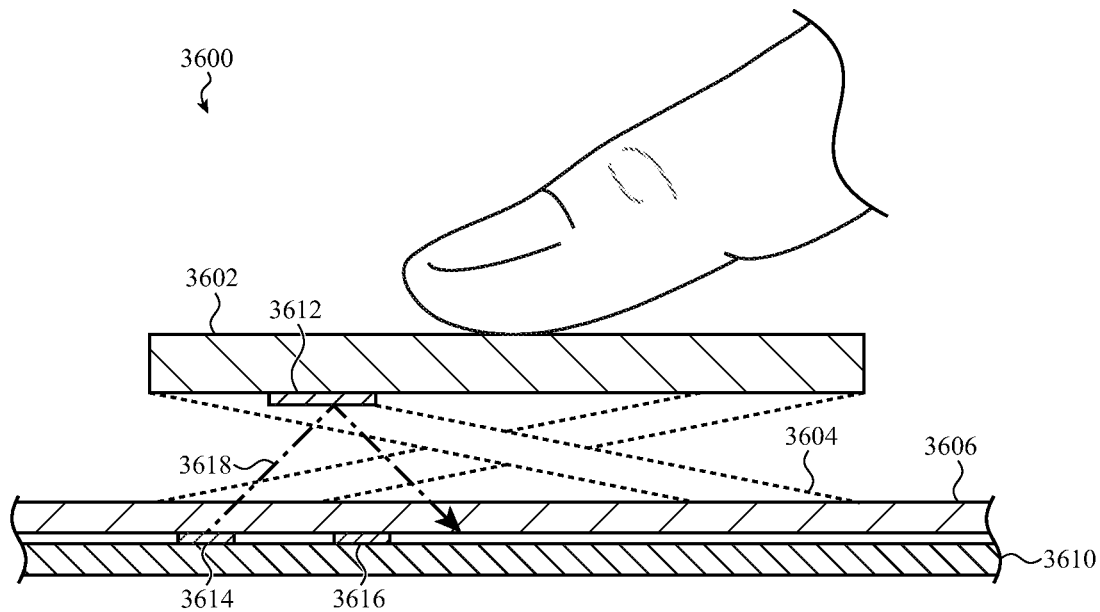
FIGS. 36A-36B depict partial cross-sectional views of another example input key, viewed along section J-J in FIG. 13A.
Figure 36B:
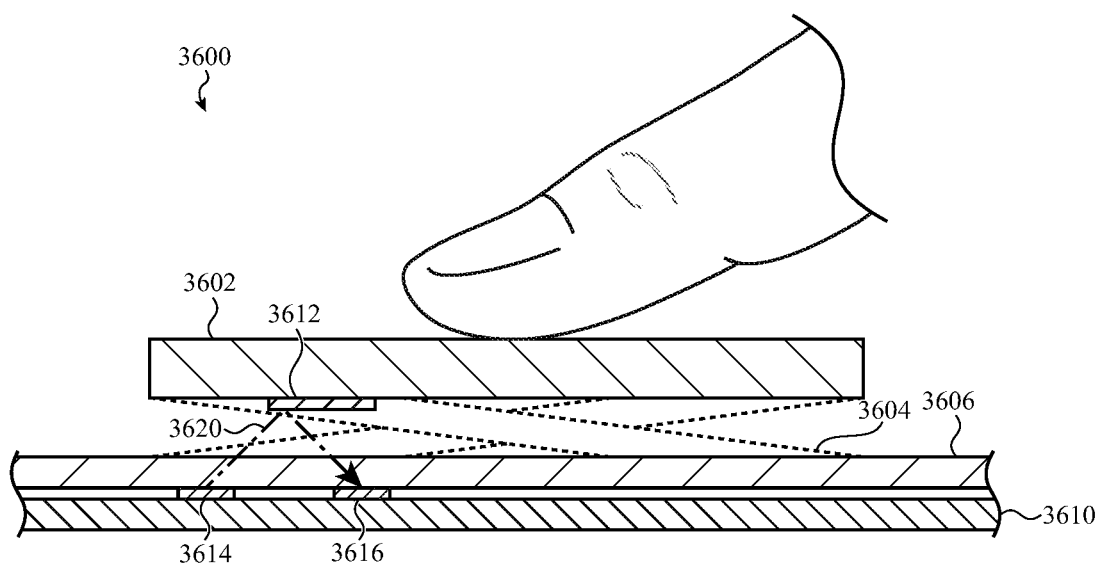

FIGS. 36A-36B depict partial cross-sectional views of an example computing device 3600, showing another example system for detecting key makes through a top case. The cross-sectional view may correspond to a view of a computing device along section J-J in FIG. 13A. The computing device 3600 is similar to the computing devices 3400 and 3500 described with respect to FIGS. 34A-35B, but instead of a capacitive sensor, an optical sensor is used to detect a key make.

The computing device 3600 includes a keycap 3602 (an interface member), a top case 3606, and a support mechanism 3604 movably coupling the keycap 3602 to the top case 3606. These components are the same as or similar to the analogous components described above with respect to FIGS. 34A-35B.

The computing device 3600 further includes an optical emitter 3614 and an optical detector 3616 positioned below the top case 3606 (and positioned on a circuit board or other substrate 3610). The optical emitter 3614 is configured to emit light through the top case 3606 and towards the keycap 3602, while the optical detector 3616 is configured to detect light passing through the top case 3606. Because light must pass through the top case 3606 in order for the depicted optical sensing system to operate, the top case 3606 must be at least partially light-transmissive or transparent. Accordingly, the top case 3606 may be formed from glass, plastic, ceramic, or any other suitable light-transmissive material. While some portions of the top case 3606 may not be light-transmissive (e.g., they may be painted or coated), at least the portions above the emitter 3614 and the detector 3616 are light-transmissive (e.g., at least partially transparent).

The optical sensor operates by causing the emitter 3614 to emit light towards the keycap 3602, and monitoring the detector 3616 to determine whether a threshold amount or intensity of light has been detected. The amount or intensity of light detected by the detector 3616 may depend on how far the keycap 3602 is from the emitter 3614 and detector 3616. For example, when the keycap 3602 is in an unactuated state, as shown in FIG. 36A, light emitted by the emitter 3614 may be reflected from a surface 3612 of the keycap 3602 such that a threshold amount or intensity of light does not reach the detector 3616. FIG. 36A depicts a light path 3618 where the light does not reach the detector 3616 at all. Where the emitter 3614 emits a focused or directed light beam, the path 3618 may be representative of an actual light path. However, the light emitted from the emitter 3614 may not be a single focused or directed beam, but rather may have a more diffuse or unfocused shape. In such cases, the light path 3618 represents a state in which the detector 3616 does not detect a threshold value of light, and does not necessarily correspond to a particular beam path.

When the keycap 3602 is moved downwards (e.g., when it is pressed downwards by a finger or other object), the surface 3612 reflects more light into the detector 3616, as illustrated by the light path 3620 in FIG. 36B. Once a threshold amount or intensity of light is detected, the detector 3616 may register a key press.

The surface 3612 may be part of (e.g., integral with) the keycap 3602. For example, the surface 3612 may be a bottom surface of the keycap 3602. Alternatively, the surface 3612 may be attached or coupled to the keycap 3602, such as with an adhesive film, a tape, a paint or coating, an additional member, or the like. The surface 3612 may be selected to have a particular optical property, such as a particular reflectance, a particular focusing or defocusing (e.g., diffusing) effect, or the like. For example, the surface 3612 may be a reflective coating or film that is applied to the bottom surface of the keycap 3602.

Other types of optical or other sensors may be used instead of or in addition to the emitter/detector arrangement described with respect to FIGS. 36A-36B. Such sensors may include ultrasonic sensors, infrared sensors, thermal sensors, cameras or other imaging sensors, radar sensors, or the like.

Figure 37A:
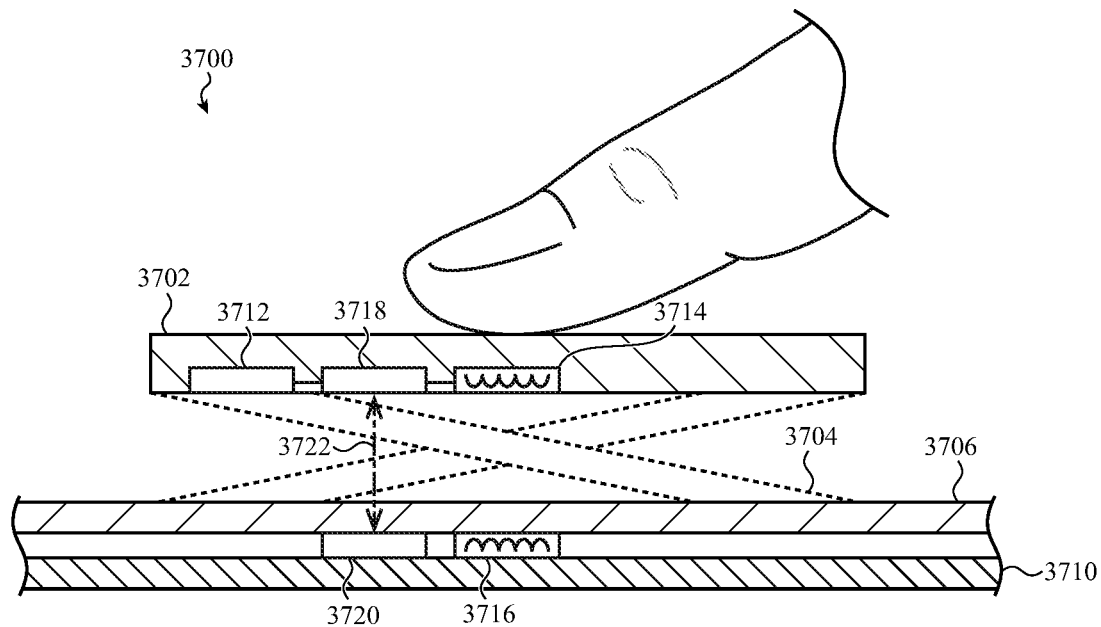
FIGS. 37A-37B depict partial cross-sectional views of another example input key, viewed along section J-J in FIG. 13A.
Figure 37B:
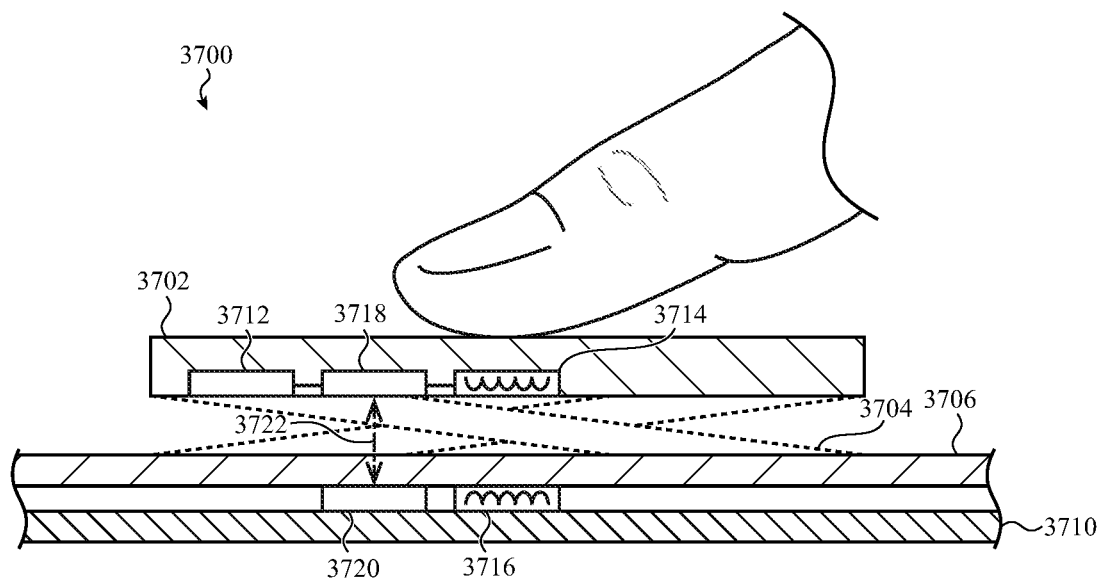

FIGS. 37A-37B depict partial cross-sectional views of an example computing device 3700, showing another example system for detecting key makes through a top case. The cross-sectional views may correspond to a view of a computing device along section J-J in FIG. 13A. The computing device 3700 is similar to the computing devices 3400, 3500, and 3600 described with respect to FIGS. 34A-36B, but the key make sensor is disposed on or coupled to the key mechanism rather than within a base portion of the computing device 3700 (e.g., under the top case of the computing device 3700). FIG. 37A shows the key mechanism in an undepressed or unactuated state, and FIG. 37B shows the key mechanism in a depressed or actuated state.

The computing device 3700 includes a keycap 3702 (an interface member), a top case 3706, and a support mechanism 3704 movably coupling the keycap 3702 to the top case 3706. These components are the same as or similar to the analogous components described above with respect to FIGS. 34A-36B.

The computing device 3700 includes a key make sensor 3712 coupled to or integrated with the keycap 3702 (or any other suitable portion of the key mechanism). The key make sensor 3712 may be any suitable sensor or mechanism that can detect when the keycap 3702 has been actuated, and produce a signal that can be transmitted (or can cause transmission of a signal) to a receiver within the computing device 3700. For example, the key make sensor 3712 may be an optical sensor, such as the optical sensor described above with respect to FIGS. 36A-36B. In such cases, the key make sensor 3712 may include both an optical emitter and an optical detector, and the computing device 3700 may include a reflective material or surface to reflect light from the optical emitter into the optical detector when the keycap 3702 is depressed. Alternatively, the key make sensor 3712 may be a switch, dome, capacitive sensor, inductive sensor, acoustic sensor (e.g., a microphone, ultrasonic transducer), piezoelectric sensor, accelerometer, or any other suitable sensor.

The computing device 3700 includes a transmitter 3718 coupled to or integrated with the keycap 3702 (or any other suitable portion of the key mechanism). The transmitter 3718 communicates with or otherwise receives information or signals from the key make sensor 3712, and sends signals, data, or other information to a receiver 3720 that is within the computing device 3700 (on a circuit board or other substrate 3710). The signals, data, or other information (indicated by arrow 3722) may indicate when and/or whether a key make has been detected by the key make sensor 3712. The computing device 3700 may take various actions in response to detecting a key make via the receiver 3720, such as displaying a letter or other character in a graphical user interface, manipulating a graphical user interface, or performing any other operation or action.

The receiver 3720 may be positioned below the top case 3706. Because the top case 3706 may be continuous (e.g., having no openings beneath the keycap 3702), there may be no physical or wired connection between the receiver 3720 and the transmitter 3718. Accordingly, the transmitter 3718 and receiver 3720 may communicate wirelessly through the material of the top case 3706. Example wireless communication techniques that may permit trans-top-case communications include electromagnetic communications (e.g., radio, optical, inductive, or any other suitable electromagnetic communication type.), ultrasonic communication, and the like. For example, the transmitter 3718 may be a radio transmitter and the receiver 3720 may be a radio receiver. As another example, the transmitter 3718 may be an optical emitter and the receiver 3720 may be an optical detector. Also, the transmitter 3718 and the receiver 3720 may be transmitter/receivers, providing bi-directional communications between the keycap 3702 and components within the base portion of the computing device 3700 (e.g., a processor).

The computing device 3700 may also include a power receiver 3714 that electromagnetically couples to a power transmitter 3716 that is positioned below the top case 3706 (on a circuit board or other substrate 3710). The power transmitter 3716 transfers power to the power receiver 3714, which in turn powers the key make sensor 3712 and the transmitter 3718. (The power receiver 3714 may also charge an energy storage device, such as a battery or capacitor, that powers the key make sensor 3712 and the transmitter 3718.) More particularly, the power transmitter 3716 transfers power wirelessly, through the top case 3706, to the power receiver 3714.

Power may be transferred between these components by using any suitable wireless power transfer techniques, including inductive coupling, capacitive coupling, or the like. In the case of inductive and capacitive coupling, the power transmitter 3716 and the power receiver 3714 may include complementary coils or other electrical components that inductively and/or capacitively couple to another through the top case 3706. In such cases, the top case 3706 may be formed from or include a dielectric (e.g., glass, plastic, ceramic, sapphire, plastic, etc.), thereby facilitating the inductive and/or capacitive coupling between the power transmitter 3716 and power receiver 3714 (as well as the wireless communications between transmitter and receiver 3718, 3720 discussed above).

The components shown on the keycap 3702, including the power receiver 3714, the transmitter 3718 (e.g., for transmitting indications of a key make), and the key make sensor 3712, may be coupled to or integrated with the keycap 3702 in any suitable manner. For example, they may be attached to the keycap 3702 using adhesives, fasteners, or the like. As another example, they may be at least partially encapsulated in the material of the keycap 3702. This may be accomplished with insert molding techniques. Alternatively, they may be coupled to or integrated with any other suitable component or part of the key mechanism instead of the keycap 3702. For example, the power receiver 3714 may be coupled to a top surface of the top case 3706 and may be electrically coupled to the transmitter 3718 and/or the key make sensor 3712 via a flexible circuit board, wire, or the like.

FIGS. 37A-37B show an example where each individual key mechanism of a keyboard may independently communicate key makes to components within the computing device 3700 (e.g., receivers, such as the receiver 3720). In some cases, multiple keys or key mechanisms (such as the entire keyboard) may be communicatively coupled together, and a single communication link may be used to communicate key make information for multiple keys. For example, a key assembly may include multiple keys coupled to a base layer or structure. The key assembly may include all of the mechanical keys of a particular computing device, such as an entire notebook computer keyboard, or a subset of keys (e.g., a row of keys or any other grouping of keys). The keys of the key assembly may include key make sensors including optical sensors, dome switches, capacitive or inductive sensors, or any other suitable sensor or combinations of sensors. A single transmitter coupled to the key assembly may receive or detect key make indications from the key make sensors, and transmit data or other information indicative of the key makes to components within the computing device 3700. The receiver and transmitter of such a keyboard may use any suitable wireless communication technique that can communicate through the material of the top case 3706, such as optical communications, radio communications, or the like. Key assemblies such as the foregoing may reduce the number of wireless receivers and transmitters that are used to communicate key makes, and may simplify assembly and manufacturing processes. For example, instead of coupling multiple individual key mechanisms to a device, the keys can be pre-assembled on a base structure that can more easily or quickly be coupled to a top case of the device.

Computing devices may be configured to illuminate portions of a keyboard. For example, in order to improve the readability of the keys or otherwise produce a particular visual appearance, keycap glyphs and the spaces or gaps between keycaps (e.g., a keyboard web) may be illuminated. In cases where a computing device includes a continuous top case, it may not be possible to mount electrical light emitting components on the top surface of the top case and power them via mechanical connections to the interior of the computing device. Accordingly, computing devices with continuous top cases as described herein may include lighting systems that transfer light, or power for light emitters, through the top case and without mechanical couplings.

Figure 38:
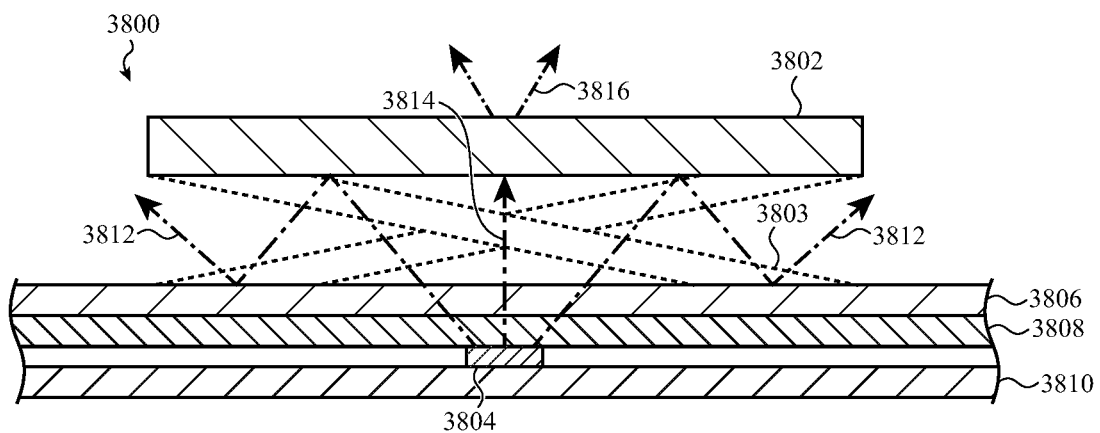
FIG. 38 depicts a partial cross-sectional view of an example computing device with an illuminated keyboard, viewed along section J-J in FIG. 13A.

FIG. 38 depicts a partial cross-sectional view of an example computing device 3800, showing an example lighting system for a keyboard. The cross-sectional view shown in FIG. 38 may correspond to a view of a computing device along section J-J in FIG. 13A.

The computing device 3800 may include a keycap 3802, a top case 3806, and a support mechanism 3803 movably coupling the keycap 3802 to the top case 3806. The computing device 3800 further includes a sensor 3808 (e.g., a portion of a sensor such as an electrode layer), positioned below the top case 3806. These components are the same or similar to the analogous components described above with respect to FIGS. 34A-35B. The computing device 3800 further includes a lighting layer 3810 below the sensor 3808 (or anywhere below the top case 3806) that includes a light source 3804. The lighting layer 3810 may include multiple light sources 3804, such as at least one light source 3804 for each key of a keyboard.

The light source 3804 may be a light emitting element, such as an LED, OLED, incandescent or fluorescent element, or the like. Alternatively, the light source 3804 may be an end of a light guide or light pipe that guides light from a light emitting element located at a different location within the computing device 3800. In some cases, the light source 3804 is an LED (or other light source) mounted to a substrate such as a circuit board (e.g., a flex circuit).

As noted above, the top case 3806 and the sensor 3808 may be light-transmissive (e.g. transparent or translucent), thus allowing light from the light source 3804 to pass therethrough and towards the keycap 3802. A first portion of the light, represented by light paths 3814 and 3816, may pass through the keycap 3802, such as through a transparent or translucent glyph portion of the keycap 3802, to illuminate the glyph. A second portion of the light, represented by light paths 3812, may be configured to reflect off of the bottom surface of the keycap 3802 and illuminate the top case 3806 and/or otherwise illuminate the gaps between adjacent keycaps of the keyboard (e.g., the keyboard web). The light paths 3812 may produce a halo or frame of light around the keycap 3802. The bottom surface of the keycap 3802 and/or portions of the top case 3806 may include reflective materials, coatings, or the like to improve the efficiency of light transfer and/or to direct light in desired directions.

FIG. 38 depicts light paths that illuminate both a keycap glyph and the gaps between keycaps (or the top case more generally). However, a computing device may use either of these light paths exclusively. For example, the keycaps may be opaque such that light only illuminates the keyboard web (e.g., producing halos or frames of light around each keycap). As another example, the light sources may direct light in a focused beam or path towards a keycap glyph, and may not illuminate the keyboard web (or may only illuminate the keyboard web or other keyboard components only an insignificant amount).

Figure 39A:
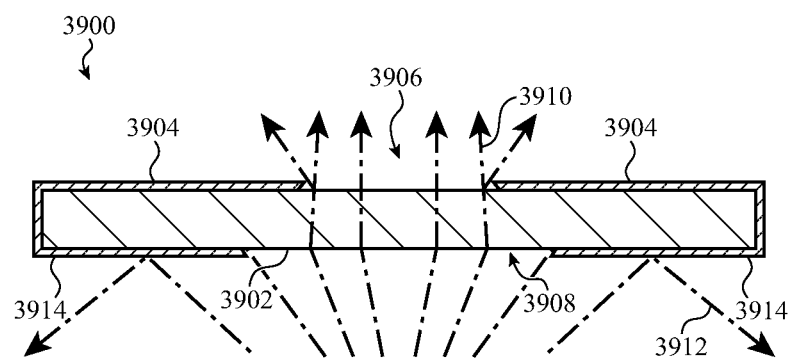
FIG. 39A depicts a cross-sectional view of an example keycap for an illuminated keyboard.

FIG. 39A depicts a cross-sectional view of an example keycap 3900, showing an example masking configuration that may define a glyph that can be illuminated by a light source. The keycap 3900 may correspond to the keycap 3802 shown in FIG. 38.

The keycap 3900 includes a light-transmissive (e.g., transparent or translucent) body portion 3902 and a mask 3904. The body portion 3902 may act as a light guide or light pipe to transmit or otherwise allow light to pass therethrough. Accordingly, the body portion 3902 may be formed from or include a light-transmissive material, such as glass, plastic, polycarbonate, ceramic (e.g., a transparent or translucent ceramic), or the like.

The mask 3904 may be formed from or include any suitable opaque or substantially opaque material, such as a paint, ink, dye, film, or other material. As noted above, the body portion 3902 may act as a light guide or light pipe. In order to improve light transmission (and/or prevent light absorption by the mask 3904), the surface of the mask 3904 that faces the body portion 3902 may be reflective or otherwise configured to reduce light absorption. For example, the mask 3904 may include a film, coating, paint, dye, or any other suitable material or treatment on the inner surface of the mask 3904.

A top opening 3906 in the mask 3904 may be in the shape of a glyph, such as a letter, number, character, function, icon, or any other symbol or shape. The glyph may indicate or suggest what operation the key performs when actuated. The mask 3904 may also form a bottom opening 3908 that allows light to enter the keycap 3900 and pass through the top opening 3906, thereby illuminating the glyph, as illustrated by the light path 3910.

In some cases, a bottom portion 3914 of the mask 3904 is configured to reflect light towards the top case or otherwise away from the keycap 3900, for example to illuminate the gaps between adjacent keycaps, as illustrated by the light path 3912. In such cases, the bottom portion 3914 of the mask 3904 may be formed from or include a reflective material. Alternatively, the bottom portion 3914 of the mask 3904 may be configured to absorb light to prevent or limit light from reflecting off of the bottom portion 3914. In some cases, there is no mask on the bottom surface of the keycap 3900.

Figure 39B:
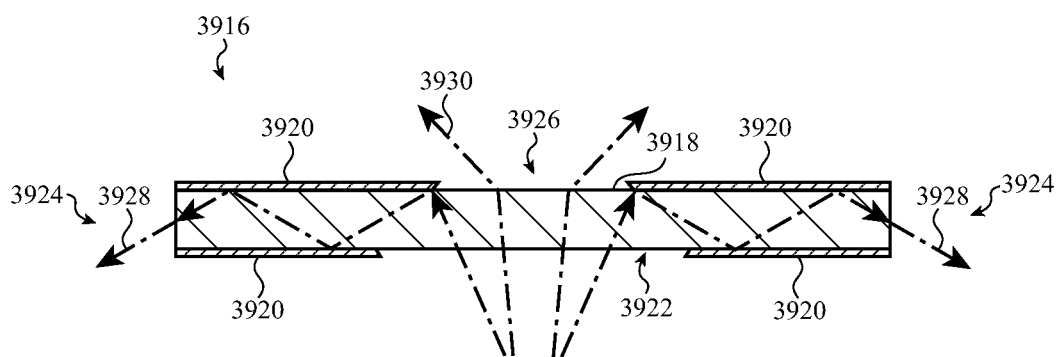
FIG. 39B depicts a cross-sectional view of another example keycap for an illuminated keyboard.

FIG. 39B depicts a cross-sectional view of another example keycap 3916, showing an example masking configuration that may define a glyph that can be illuminated by a light source, as well as an unmasked side region that may allow light to escape from the sides of the keycap 3916, thus illuminating the area surrounding the keycap 3916 (e.g., the keyboard web).

The keycap 3916 includes a light-transmissive body portion 3918 and a mask 3920. The body portion 3918 may act as a light guide or light pipe to transmit or otherwise allow light to pass therethrough. Accordingly, the body portion 3918 may be formed from or include a light-transmissive material, such as glass, plastic, polycarbonate, ceramic (e.g., a transparent or translucent ceramic), or the like.

The mask 3920 may be formed from or include any suitable opaque or substantially opaque material, such as a paint, ink, dye, film, or other material. As noted above, the body portion 3918 may act as a light guide or light pipe. In order to improve light transmission (and/or prevent light absorption by the mask 3920), the surface of the mask 3920 that faces the body portion 3918 may be reflective or otherwise configured to reduce light absorption. For example, the mask 3920 may include a film, coating, paint, dye, or any other suitable material or treatment on the inner surface of the mask 3920. Further, the mask 3920 may be configured to direct light out of openings in the mask 3920, such as glyph openings and side openings, as described herein.

A top opening 3926 in the mask 3920 may be in the shape of a glyph, such as a letter, number, character, function, icon, or any other symbol or shape. The glyph may indicate or suggest what operation the key performs when actuated. The mask 3920 may also form a bottom opening 3922 that allows light to enter the keycap 3916 and pass through the top opening 3926, thereby illuminating the glyph, as illustrated by the light path 3930.

In some cases, the mask 3920 may define side openings 3924 along one or more sides of the body portion 3918. The side openings 3924 allow light that enters the body portion 3918 through the bottom opening 3922 to pass through the body portion 3918 and exit the body portion 3918 around the sides, as illustrated by the light path 3928. The light exiting the side of the body portion 3918 may illuminate the spaces between the keys (e.g., the keyboard web), and may produce a halo or frame of light around each key. The side openings 3924 may extend around an entire outer periphery of the body portion 3918 (e.g., such that the entire periphery or substantially the entire periphery allows light to pass therethrough), or only a portion of the periphery. For example, in cases where the body portion 3918 has a substantially square or rounded square shape with four sides, the mask may have side openings 3924 on one, two, three, or all four sides.

Whereas in the keycap 3900 (FIG. 39A) light is reflected off of the bottom portion of the mask, in FIG. 39B light is not shown reflecting off of the bottom portion of the mask 3920. In particular, the light guide effect of the body portion 3918 and the side openings 3924 may illuminate the areas surrounding and/or between keycaps without reflecting light underneath the keycap. In such cases, a light source may direct light substantially only into the bottom opening 3922.

The keycaps 3900 and 3916 may be used in any key mechanism or keyboard described herein. For example, the computing device shown in FIG. 38 may include the keycap 3900 or the keycap 3916. Also, a keyboard may include both types of keycaps in a single keyboard, or may include only one type of keycap for all of the keys of the keyboard.

Figure 40A:
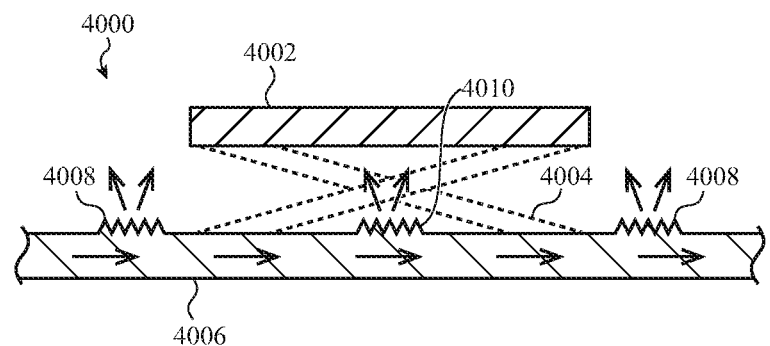
FIG. 40A depicts a partial cross-sectional view of another example computing device with an illuminated keyboard, viewed along section J-J in FIG. 13A.

FIG. 40A depicts a partial cross-sectional view of an example computing device 4000, showing another example system for illuminating a keycap and/or parts of a top case. The cross-sectional view may correspond to a view of a computing device along section J-J in FIG. 13A.

The computing device 4000 includes a keycap 4002 (an interface member), a top case 4006, and a support mechanism 4004 movably coupling the keycap 4002 to the top case 4006. These components are the same or similar to the analogous components described above with respect to FIGS. 34A-35B.

The top case 4006 may be transparent (such as a transparent glass, ceramic, plastic, etc.), translucent, or may otherwise be configured to act as a light guide to guide light from a light source, through the top case (e.g., along a planar direction), to light extraction features such as lens features 4008, 4010. The lens features 4008, 4010 may be configured to direct from within the top case 4006 outwards. For example, the first lens feature 4008 may direct light towards a gap between two adjacent keycaps (or between a keycap and another adjacent component), and the second lens feature 4010 may direct light towards the underside of the keycap 4002. Other types of light extraction features such as surface texturing, etching, doped regions, coatings, or the like may be used instead of or in addition the lens features shown in the figures.

The lens features 4008, 4010 may have any suitable shape or configuration to direct light along a desired path or direction. For example, the lens features 4008, 4010 may have a saw tooth profile, or may include one or more bumps, grooves, spikes, peaks, channels, or any other suitable shape or configuration.

Figure 40B:
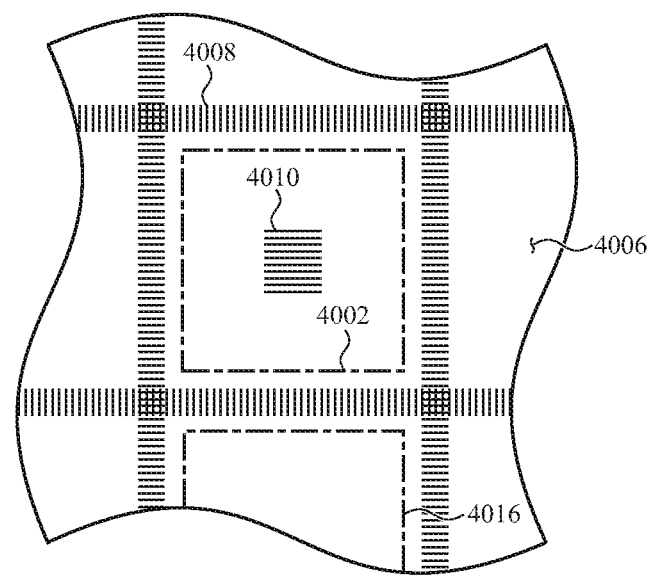
FIG. 40B depicts a top view of the top case of FIG. 40A.

FIG. 40B is a top view of the top case 4006 shown in FIG. 40A, showing an example arrangement of the first lens feature 4008 and the second lens feature 4010. The first lens feature 4008 may substantially surround the keycap 4002 (shown in phantom lines) to illuminate the area surrounding the keycap (e.g., the keyboard web). The first lens feature 4008 may form a grid pattern, with each cell surrounding a different keycap (such as an additional keycap 4016 partially shown in FIG. 40B). The grid-patterned first lens feature 4008 may thus illuminate the gaps between multiple (or all) of the keys of a keyboard. The second lens feature 4010 may be positioned under the keycap 4002 to illuminate the keycap glyph, as described above.

Figure 41A:
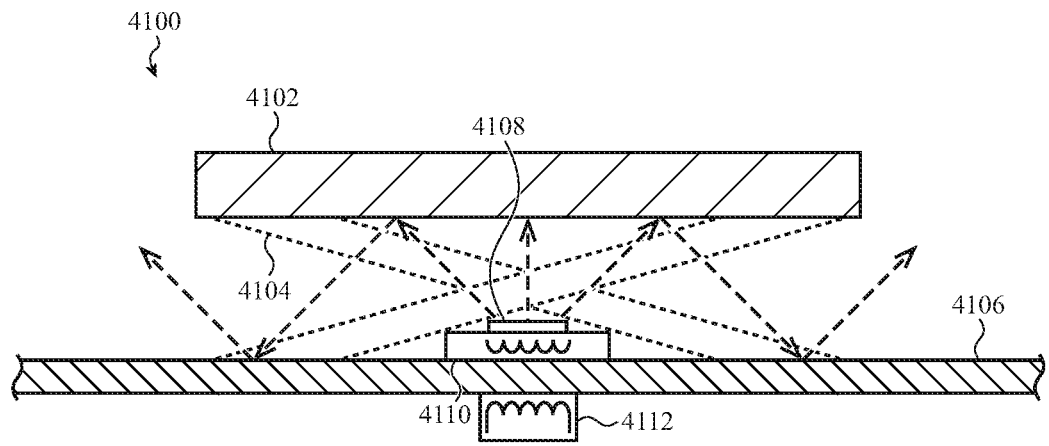
FIG. 41A depicts a partial cross-sectional view of another example computing device with an illuminated keyboard, viewed along section J-J in FIG. 13A.

FIG. 41A depicts a cross-sectional view of an example computing device 4100, showing another example system for illuminating a keycap and/or parts of a top case. The cross-sectional view may correspond to a view of a computing device along section J-J in FIG. 13A.

The computing device 4100 includes a keycap 4102 (an interface member), a top case 4106, and a support mechanism 4104 movably coupling the keycap 4102 to the top case 4106. The keycap 4102 may be the same as or similar to the keycap 3900 described above with respect to FIG. 39A, and the top case and support mechanism may be the same as or similar to the analogous components described above with respect to FIGS. 34A-35B.

The computing device 4100 also includes a light source 4108 positioned above the top case 4106. The light source may be an LED, OLED, incandescent or fluorescent element, or the like. The light source may be associated with a power receiver 4110 that electromagnetically couples to a power transmitter 4112 that is positioned below the top case 4106. The power transmitter 4112 transfers power to the power receiver 4110, which in turn powers the light source 4108. (The power receiver 4110 may also charge an energy storage device, such as a battery or capacitor, that powers the light source 4108.) More particularly, the power transmitter 4112 transfers power wirelessly, through the top case 4106, to the power receiver 4110.

Power may be transferred between these components by using any suitable wireless power transfer techniques, including inductive coupling, capacitive coupling, or the like. In the case of inductive and capacitive coupling, the power transmitter 4112 and the power receiver 4110 may include complementary coils or other electrical components that inductively and/or capacitively couple to another through the top case 4106. In such cases, the top case 4106 may be formed from or include a dielectric (e.g., glass, plastic, ceramic, sapphire, plastic, etc.), thereby facilitating the inductive and/or capacitive coupling between the power transmitter 4112 and the power receiver 4110.

In any of the illumination systems described above, components between the top case and the keycap, such as a support mechanism, dome housings, compliant members (e.g., rubber domes), or the like, may be transparent or translucent to allow light to pass therethrough to reach the keycap. Any such components may also act as light guides and may include lens features to direct light through or out of the components and in desired directions.

Figure 41B:
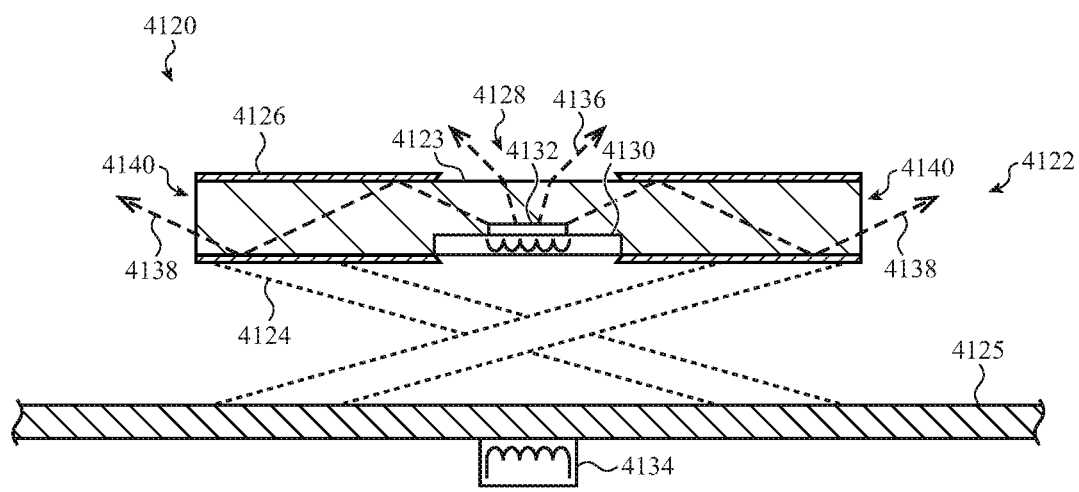
FIG. 41B depicts a partial cross-sectional view of another example computing device with an illuminated keyboard, viewed along section J-J in FIG. 13A.

FIG. 41B depicts a cross-sectional view of another example computing device 4120, showing another example system for illuminating a keycap and/or parts of a top case. The computing device 4120 is similar to the computing device 4100 in FIG. 41A in that it uses a wireless power transfer system to provide power, through the material of a top case, to a light source. However, as described below, the light source is coupled to the keycap rather than to the top case. The cross-sectional view may correspond to a view of a computing device along section J-J in FIG. 13A.

The computing device 4120 includes a keycap 4122 (an interface member), a top case 4125, and a support mechanism 4124 movably coupling the keycap 4122 to the top case 4125. The keycap 4122 may be the same as or similar to the keycap 3916 described above with respect to FIG. 39B, and the top case and support mechanism may be the same as or similar to the analogous components described above with respect to FIGS. 34A-35B.

The computing device 4120 also includes a light source 4132 above the top case 4125. The light source may be coupled to or otherwise integrated with the keycap 4122. The light source may be an LED, OLED, incandescent or fluorescent element, or the like. The light source 4132 may be associated with a power receiver 4130 that electromagnetically couples to a power transmitter 4134 that is positioned below the top case 4125. The power transmitter 4134 transfers power to the power receiver 4130, which in turn powers the light source 4132, as described above. The power receiver 4130 may also charge an energy storage device, such as a battery or capacitor, that powers the light source 4132. More particularly, the power transmitter 4134 transfers power wirelessly through the top case 4125 to the power receiver 4130. Power may be transferred between these components by using any suitable wireless power transfer techniques as described above with respect to the power transmitter 4112 and the power receiver 4110. Further, the top case 4125 may be formed from or include a dielectric (e.g., glass, plastic, ceramic, sapphire, plastic, etc.), thereby facilitating the wireless coupling between the power transmitter 4112 and the power receiver 4110.

The light source 4132 may direct light into a body portion 4123 of the keycap 4122. The body portion 4123 may be formed from or include a light-transmissive material that acts as a light guide or light pipe, as described above with respect to FIG. 39B. The material may be glass, plastic, polycarbonate, ceramic (e.g., a light-transmissive ceramic), or the like. The keycap 4122 may also include an opaque or light shielding mask 4126 that defines a top opening 4128 (e.g., in the shape of a glyph or other symbol indicative of a character or key function) and one or more side openings 4140. The body portion 4123, the mask 4126, and the top and side openings 4128, 4140 may function similar to the analogous components of the keycap 3916 in FIG. 39B. For example, the body portion 4123 and the mask 4126 may direct light from the light source 4132 out of the top opening 4128 (illustrated by the light path 4136) and out of the side openings 4140 (illustrated by the light path 4138).

The power receiver 4130 and the light source 4132 may be incorporated in the keycap 4122 in any suitable way. For example, they may be attached to the body portion 4123 using adhesive, fasteners, interlocking structures (e.g., clips, latches, posts, heat stake joints), rivets, or the like. The power receiver 4130 and the light source 4132 may also be at least partially encapsulated in the body portion 4123, such as by insert molding. More particularly, the power receiver 4130 and the light source 4132 may be placed into a mold, and the material for the body portion 4123 may subsequently be introduced into the mold. The material may form at least partially around the power receiver 4130 and the light source 4132, thereby at least partially encapsulating the power receiver 4130 and the light source 4132 and retaining these components to the body portion 4123.

In any of the illumination systems described above, components between the top case and the keycap, such as a support mechanism, dome housings, compliant members (e.g., rubber domes), or the like, may be light-transmissive to allow light to pass therethrough to reach the keycap. Any such components may also act as light guides and may include lens features to direct light through or out of the components and in desired directions.

Figure 41C:
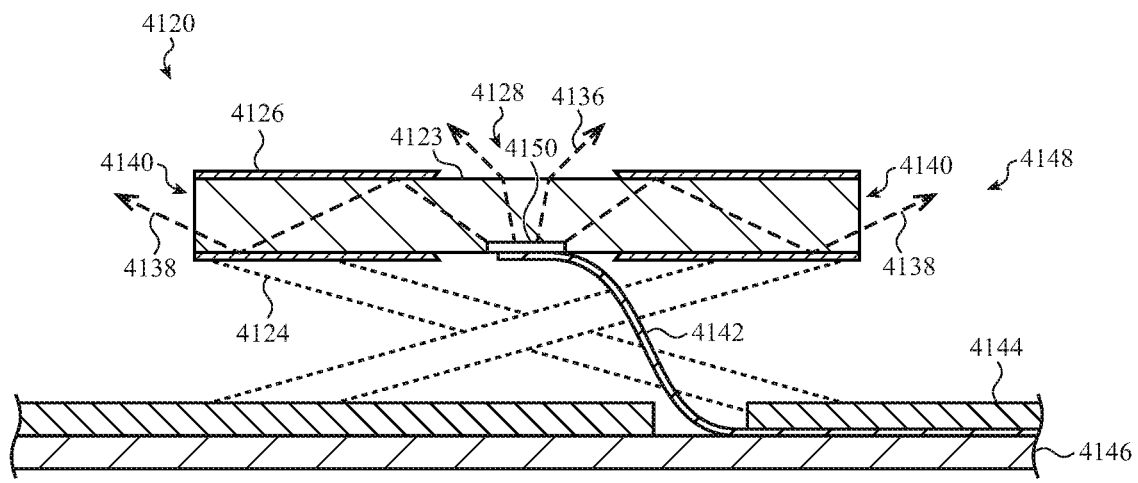
FIG. 41C depicts a partial cross-sectional view of another example computing device with an illuminated keyboard, viewed along section J-J in FIG. 13A.

While FIG. 41B shows an example in which a keycap-mounted light source 4132 is powered wirelessly (e.g., using trans-top-case power transfer), keycap-mounted light sources may also be powered using physical conductors. FIG. 41C depicts a cross-sectional view of another example computing device showing another example system for illuminating a keycap and/or parts of a top case. In particular, a keycap 4148 (which may be similar to the keycap 4122 in FIG. 41B) may include a light source 4150 (which may be similar to the light source 4132 in FIG. 41B). The light source 4150 may be electrically connected to a circuit board 4146 through an opening in a top case 4144 via a flexible conductor 4142. The flexible conductor 4142 may be any suitable material, such as a flexible circuit board material with a conductive trace. The flexible conductor 4142 may be configured to tolerate repeated flexing due to actuation of the keycap 4148 during normal typing use. In some cases, the flexible conductor 4142 may be configured to sustain up to 20 million keypresses (or more) without failing or breaking.

Figure 42A:
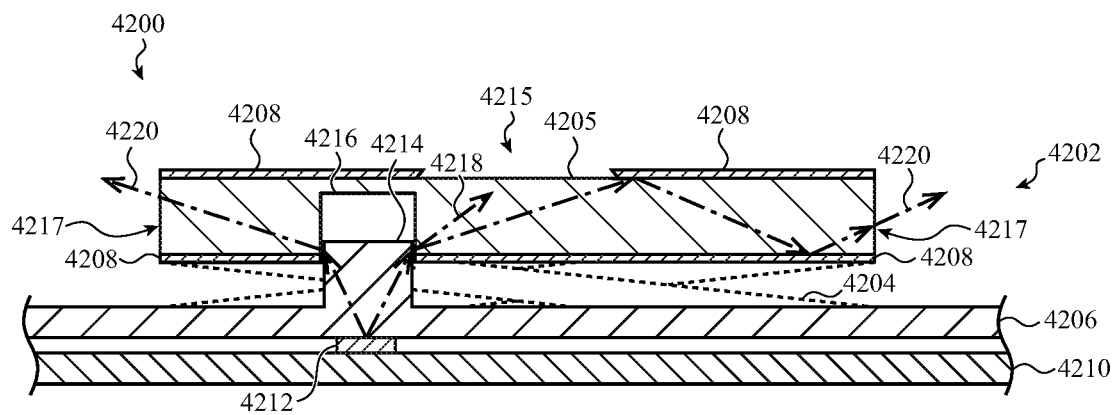
FIG. 42A-42B depict partial cross-sectional views of another example computing device with an illuminated keyboard, viewed along section J-J in FIG. 13A.
Figure 42B:
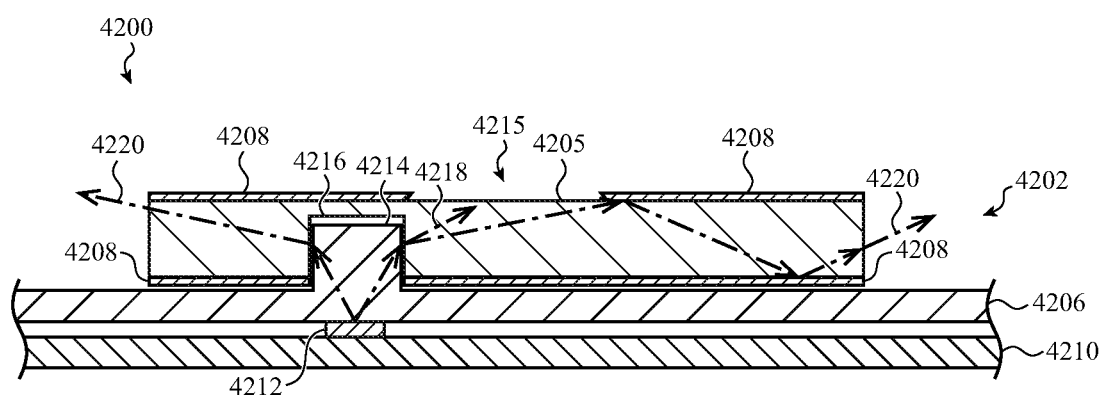

FIGS. 42A-42B depict partial cross-sectional views of another example computing device with an illuminated keyboard, viewed along section J-J in FIG. 13A. In particular, FIGS. 42A-42B depict a computing device in which a portion of a top case acts as a light guide or light pipe to direct light into a body of a keycap of a key mechanism. FIG. 42A shows the key mechanism in an undepressed or unactuated state, and FIG. 42B shows the key mechanism in a depressed or actuated state.

The computing device 4200 includes a keycap 4202 (an interface member), a top case 4206, and a support mechanism 4204 movably coupling the keycap 4202 to the top case 4206. The top case 4206 and support mechanism 4204 may be the same as or similar to the analogous components described above with respect to FIGS. 34A-35B.

The computing device 4200 also includes a light source 4212 positioned below the top case 4206. The light source 4212 may be an LED, OLED, incandescent or fluorescent element, or the like. In some cases, the light source 4212 is an LED (or other light source) mounted to a substrate such as a circuit board 4210 (e.g., a flex circuit).

The light source 4212 directs light into a light guide feature 4214 formed into or coupled to the top case 4206. The light guide feature 4214 may be a protrusion having a square or cylindrical shape, or any other suitable shape or configuration. The light guide feature 4214 may be a lens or may include lens elements (e.g., Fresnel lens elements), or it may be a rounded bump (e.g., a convex semicircular protrusion). The light guide feature 4214 may be configured to direct light into the keycap 4202.

The keycap 4202 may include a body portion 4205 formed from or including a light-transmissive material that acts as a light guide or light pipe. The body portion 4205 may define a recess 4216 that receives the light guide feature 4214 therein. The computing device 4200 may be configured so that the light guide feature 4214 is at least partially received in the recess 4216 when the key mechanism is unactuated or undepressed, as shown in FIG. 42A. Accordingly, light may exit the light guide feature 4214 through surfaces that overlap or face surfaces of the recess 4216, and enter the body portion 4205 via the overlapping or facing surfaces, as illustrated by the light paths 4220, 4218. (In other configurations, the light guide feature 4214 is not received in the recess 4216 when the key is undepressed.)

The keycap 4202 may also include a mask 4208 defining a top opening 4215 and side openings 4217. The body portion 4205 may direct light through the body portion 4205 and out of the top and side openings 4215, 4217, as described herein. For example, the mask 4208 may include reflective materials to assist in the reflection and/or direction of light through the body portion 4205, as described herein (e.g., with respect to FIGS. 39B and 41B). The light paths 4218, 4220 indicate example light paths through the body portion 4205 and out of the top and side openings 4215, 4217. These light paths may illuminate a glyph in the keycap 4202 and the space between keys of a keyboard, for example.

FIG. 42B shows the computing device 4200 when the keycap 4202 is in a depressed or actuated state. The light guide feature 4214 is received further in the recess 4216 as compared to the undepressed or unactuated state. The light guide feature 4214 and the recess 4216 may be configured so that the intensity and/or amount of light emitted through the top and side openings 4215, 4217 does not change substantially when the key is actuated. In other cases, they may be configured so that the intensity and/or amount of light does change between actuated and unactuated states. For example, when the key is actuated, the intensity and/or amount of light exiting the side openings 4217 may increase, providing a visual indication that the key has been actuated.

Figure 42C:
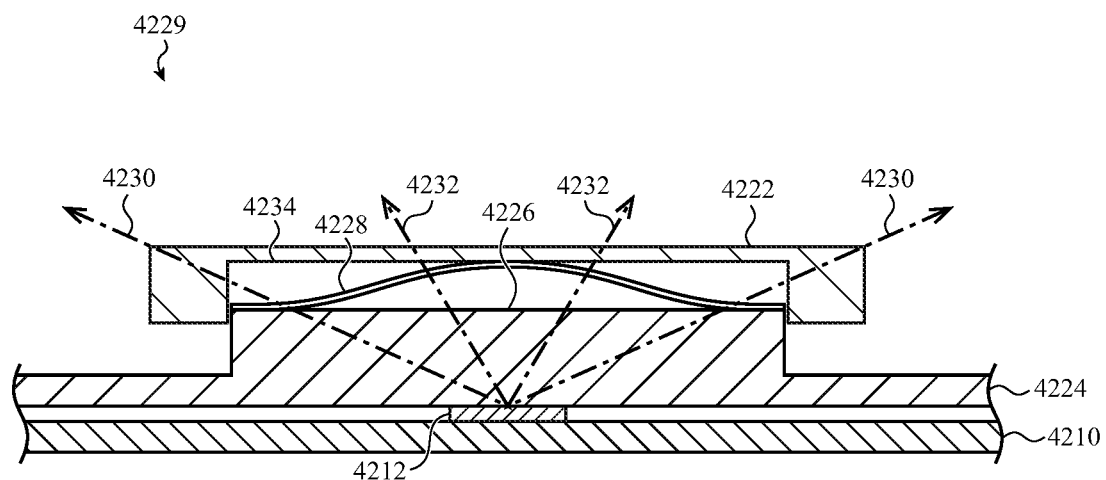
FIG. 42C depicts a partial cross-sectional view of another example computing device with an illuminated keyboard, viewed along section J-J in FIG. 13A.

FIG. 42C depicts a partial cross-sectional view of another example computing device with an illuminated keyboard, viewed along section J-J in FIG. 13A. In particular, FIG. 42C depicts a computing device 4229 in which a portion of a top case acts as a light guide or light pipe to direct light into a body of a keycap of a key mechanism, and includes a guide and/or support for the keycap. FIG. 42C shows the key mechanism in an undepressed or unactuated state.

The computing device 4229 includes a keycap 4222 (an interface member), a top case 4224, a light guide support 4226, and a spring member 4228. The top case 4224 may be the same as, or similar to, the analogous components described above with respect to FIGS. 34A-35B. The computing device 4229 also includes a light source 4212 positioned below the top case 4224. The light source 4212 may be mounted to a substrate such as a circuit board 4210 (e.g., a flex circuit). The light source 4212 and the circuit board 4210 are described above with respect to FIGS. 42A-42B.

The light source 4212 directs light into a light guide support 4226 formed into or coupled to the top case 4224. The light guide support 4226 may be a protrusion having a square or cylindrical shape, or any other suitable shape or configuration. The light guide support 4226 may be a lens or may include lens elements (e.g., Fresnel lens elements). The light guide support 4226 may be configured to direct light into the keycap 4222.

The keycap 4222 may include or be formed from a light-transmissive material that acts as a light guide or light pipe, and may include masked and unmasked regions (e.g., defining glyph openings, side openings, etc.), reflective regions, and the like, as described above with respect to the keycap 4202. The keycap 4222 may define a recess 4234 that receives the light guide support 4226 therein. Accordingly, light may exit the light guide support 4226 through surfaces that overlap or face surfaces of the recess 4234, and enter the keycap 4222 via the overlapping or facing surfaces, as illustrated by the light paths 4230, 4232.

The light guide support 4226 may engage the recess 4234 of the keycap 4222 to support and guide the keycap 4222 relative to the top case 4224. For example, surfaces of the recess 4234 may contact surfaces of the light guide support 4226 to help maintain a lateral position of the keycap 4222 relative to the top case 4224 (e.g., in plane with an interface surface of the keycap 4222), and may slide against the surfaces of the light guide support 4226 when the key is actuated, thus providing a substantially linear actuation travel of the keycap 4222.

The spring member 4228 is positioned on the light guide support 4226 and in the recess 4234. The spring member 4228 biases the keycap 4222 towards an unactuated or undepressed state. The spring member 4228 may also provide a tactile and optionally audible feedback when the keycap 4222 is actuated. In particular, the spring member 4228 may produce a tactile response when the keycap 4222 is depressed. The tactile response may be represented or defined by a particular force response curve, as described above with respect to FIGS. 33A-33B. The spring member 4228 may be any suitable spring member, such as a coil spring, a rubber dome, a collapsible metal dome, an elastomer member, magnets (e.g., magnets configured to repel one another), or the like.

FIGS. 42A-42C show a light source 4212 positioned below the top case directly below a light guide feature. In other example computing devices, however, it may be positioned elsewhere. For example, the light source 4212 may be offset from the light guide feature. As another example, one light source may illuminate multiple keys. In such cases, the planar portion of the top case may itself act as a light guide to direct light through the top case and into light guide features of multiple key mechanisms.

Support mechanisms (e.g., for movably supporting a keycap relative to a base plate) in some conventional keyboards and/or computing devices may be positioned in or below an opening in a top case to couple to an interior component of the computing device. Where a continuous top case is used, as described herein, there are no openings that allow access to the interior of the computing device from the top of the top case. Accordingly, support mechanisms may be mounted directly to the top case, as described below with respect to FIGS. 43A-44D.

Figure 43A:
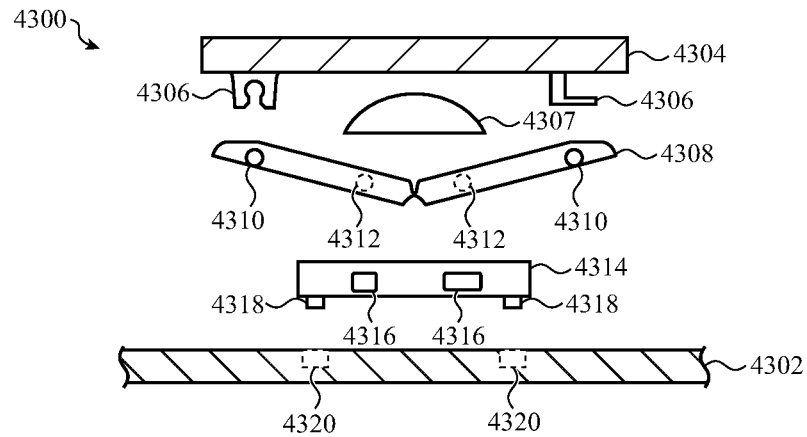
FIGS. 43A-43C depict cross-sectional views of an example key of a computing device.
Figure 43B:
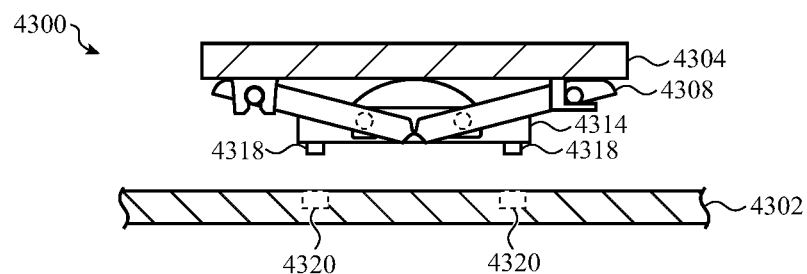
Figure 43C:
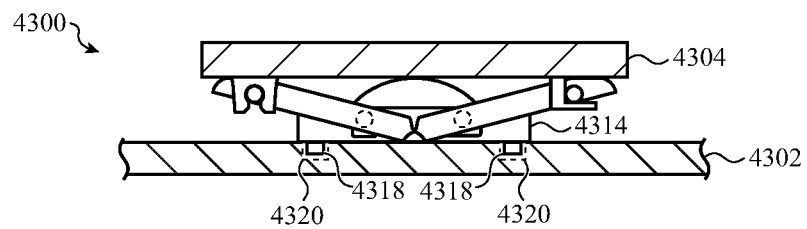

FIGS. 43A-43C depict cross-sectional views of an example key 4300 at various stages of assembly to a top case of a computing device. The cross-sectional views may correspond to a view of a computing device along section J-J in FIG. 13A.

In particular, FIG. 43A depicts an exploded view of a key 4300 above a top case 4302. The top case 4302 may define a continuous top surface (e.g., lacking openings for keyboards, keys, trackpads, buttons, etc.), and may be formed from glass, ceramic, plastic, or any other suitable material, as described herein. While the unassembled, exploded key 4300 is shown above the top case 4302, this is merely to show the components and relative positioning of the components, and may not correspond to any actual positioning during an assembly process.

The key 4300 includes a keycap 4304 (which may be similar in structure, material, function, etc., to any of the keycaps described herein), a base structure 4314, a hinge mechanism 4308, and a spring member 4307. The keycap 4304 includes first retention features 4306 that couple to second retention features 4310 (e.g., pins) on the hinge mechanism 4308. The first retention features 4306 may have any shape or configuration that retains the keycap 4304 to the hinge mechanism 4308 while allowing the second retention features 4310 to rotate and/or slide during actuation of the key (if necessary or desirable).

The hinge mechanism 4308 may also include third retention features 4312 (e.g., pins) that couple to fourth retention features 4316 formed in the base structure 4314. The fourth retention features 4316 may be channels, recesses, openings, grooves, or other features that receive the third retention features or pins 4312 therein. Where the fourth retention features 4316 are recesses, as shown, they may include an opening along one edge to allow the third retention features 4312 to slide into the recesses. The third retention features 4312 may be retained in the recesses by walls or ridges that surround and/or define the recesses and hold the third retention features 4312 captive against the top case 4302 when the base structure 4314 is attached to the top case 4302.

The spring member 4307 may be attached to the base structure 4314 and may be configured to contact the keycap (or any other part of the key 4300) to bias the keycap towards an unactuated or undepressed state. The spring member 4307 may have any shape or configuration, such as a dome, a coil spring, a leaf spring, a layer of compliant material, and may be formed from or include any suitable material, such as metal, rubber, foam, plastic, or the like.

The base structure 4314 may include first alignment features 4318 that mechanically engage with second alignment features 4320 on the top case 4302. For example, the first alignment features 4318 may be pins and the second alignment features 4320 may be recesses (e.g., blind holes) formed in the top case 4302. In some cases, the first alignment features 4318 may be recesses and the second alignment features 4320 may be pins or protrusions. Other types of alignment features may also be used. The first and second alignment features 4318, 4320 may aid in positioning and securing the keys of a keyboard (e.g., the key 4300) on the top case 4302. For example, the second alignment features 4320 may be located with a high dimensional accuracy and/or tolerance such that the operation of applying a base structure 4314 to the top case 4302 does not need to be as accurate. More particularly, the second alignment features 4320 act as a physical and optionally an optical guide to correctly position the base structure 4314 on the top case 4302. As such, some degree of error in the application of the key 4300 will be corrected for or eliminated once the first and second alignment features 4318, 4320 are engaged with one another.

The first and second alignment features 4318, 4320 may also act as retention features. For example, the first and second alignment features 4318, 4320 may have complementary shapes (e.g., protrusions and recesses or undercuts) that physically retain the features together. As another example, the first and second alignment features 4318, 4320 may be bonded together with an adhesive, such as an epoxy, cyanoacrylate, or any other suitable bonding agent. Staking (e.g., heat staking) may be used to mechanically engage the first alignment features 4318 with the second alignment features 4320. In such cases the second alignment features 4320 may be through holes or blind holes.

As shown in FIG. 43B, the key 4300 may be assembled prior to being attached to the top case 4302. The components of the key 4300 may be configured so that, in an assembled state, the components are held captive as a single structure. This may allow the entire key 4300 to be applied to the top case 4302 in an assembled state, which may reduce assembly and manufacturing time, expense, complexity, or the like.

FIG. 43C depicts the key 4300 attached to the top case 4302. The first alignment features 4318 are engaged with the second alignment features 4320, thereby aligning and optionally securing the key 4300 to the top case 4302. The base structure 4314 may also be secured to the top case 4302 using an adhesive or other bonding agent between a top surface of the top case 4302 and a bottom surface of the base structure 4314. Suitable bonding agents may include HSA, PSA, cyanoacrylate, epoxy, or the like.

FIGS. 44A-44D depict cross-sectional views of an example key 4400 at various stages of assembly to a top case of a computing device. The cross-sectional views may correspond to a view of a computing device along section J-J in FIG. 13A.

The key 4400 in FIGS. 44A-44D is similar to the key 4300 except that it includes a different base portion. In particular, the key 4400 includes the keycap 4304, the hinge mechanism 4308, and the spring member 4307. The keycap 4304 includes the first retention features 4306, and the hinge mechanism 4308 includes the second and third retention features 4310, 4312. The hinge mechanism 4308 movably couples the keycap 4304 to a base structure 4404.

The base structure 4404 includes fourth retention features 4406 that receive and engage the third retention features 4312, and retain the hinge mechanism 4308 to the base structure 4404. The fourth retention features 4406 may lack the opening that is included in the fourth retention features 4316 (e.g., to allow pins to slide freely into the fourth retention features 4316), as the key 4400 may be assembled in a way that renders the openings superfluous.

Figure 44A:
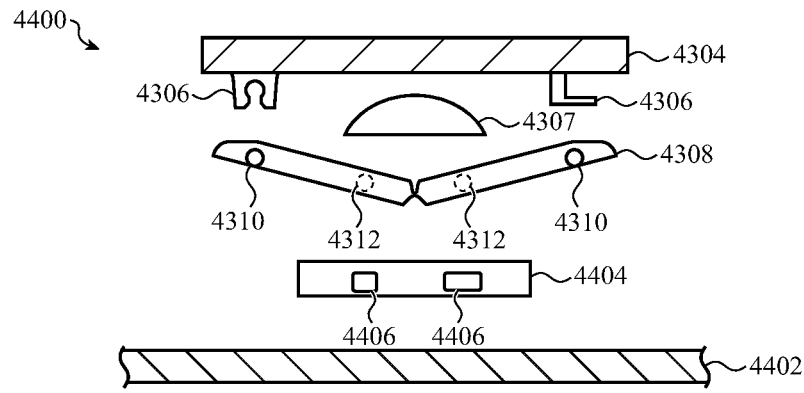
FIGS. 44A-44D depict cross-sectional views of another example key of a computing device.
Figure 44B:
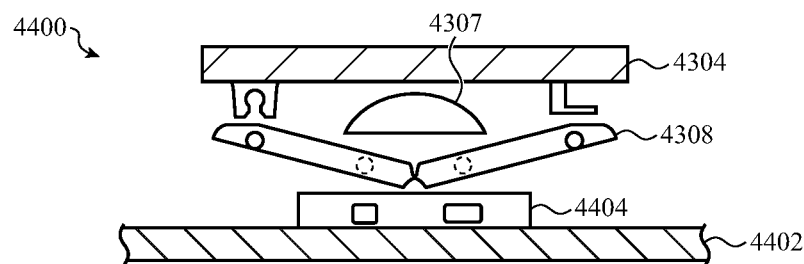
Figure 44C:
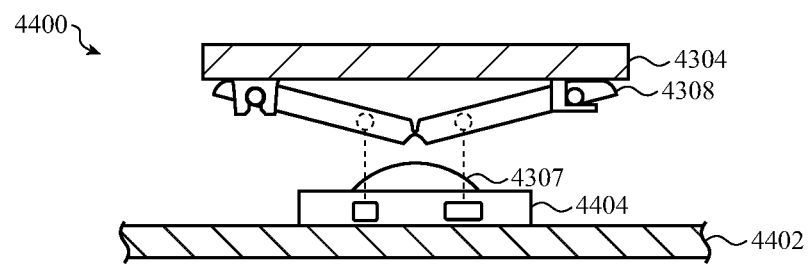
Figure 44D:
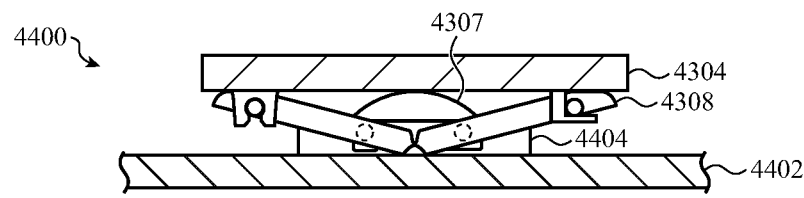

The base structure 4404 may have a substantially planar or featureless bottom surface, and the top case 4402 may have a substantially planar or featureless top surface. For example, the base structure 4404 may lack the first alignment features that are on the bottom surface of the base structure 4314 in FIGS. 43A-43C, and the top case 4402 may lack the second alignment features that are on the top case 4302 in FIGS. 43A-43C. Like the base structure 4314 and top case 4302, however, the base structure 4404 and the top case 4402 may be attached to one another with a suitable bonding agent, such as HSA, PSA, cyanoacrylate, epoxy, or the like.

Where there are no physical alignment features to aid in the alignment of the key on the top case, the key may be assembled as shown through FIGS. 44A-44D. In particular, the base structure 4404 may be attached to the top case 4402 before the base structure 4404 is assembled with the other components of the key 4400, as shown in FIG. 44B. Once the base structure 4404 is attached to the top case 4402, the spring member 4307 may be positioned on the base structure 4404 and the hinge mechanism 4308 may be coupled to the keycap 4304, as shown in FIG. 44C. The hinge mechanism 4308 may then be coupled to the base structure 4404 to complete the key 4400, as shown in FIG. 44D.

FIGS. 43A-44D depict states of assembly for several example keys. However, the keys shown in these figures may be assembled in manners and using operations different than those shown. Also, different keys may be assembled according to the operations shown in these figures.

Figure 45A:
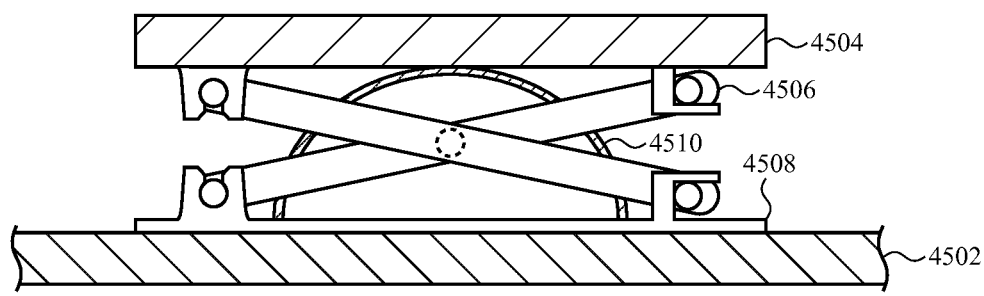
FIG. 45A depicts a cross-sectional view of another example key of a computing device.
Figure 45B:
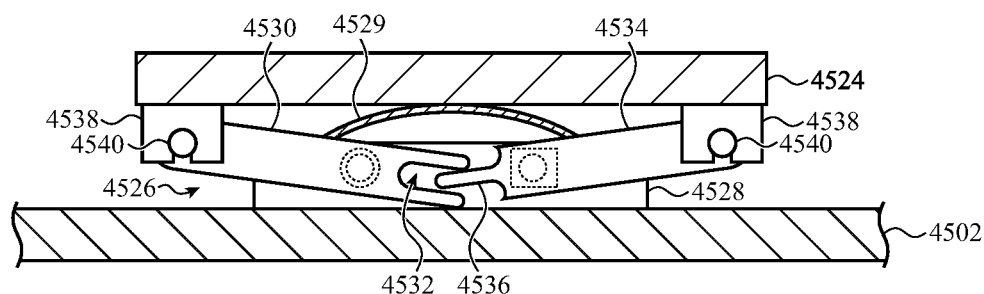
FIG. 45B depicts a cross-sectional view of another example key of a computing device.
Figure 46:
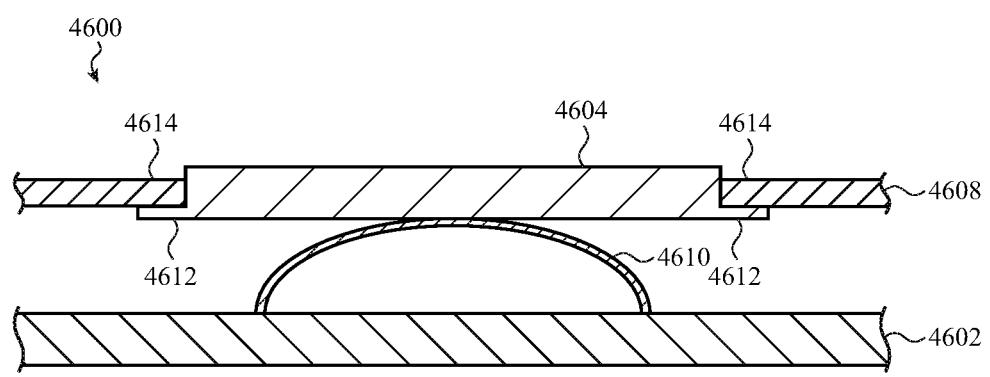
FIG. 46 depicts a cross-sectional view of another example key of a computing device.

FIGS. 45A-46 depict cross-sectional views of additional example keys that may be coupled to a top case or a keyboard accessory, as described herein. The keys depicted in FIGS. 45-46 may incorporate any of the concepts, components, or techniques described herein. For example, any of the keycaps, keycap masking structures, illumination techniques, key make sensing techniques, etc., may be used in conjunction with the keys depicted in FIGS. 45-46.

With reference to FIG. 45A, a key 4500 may include a keycap 4504, a scissor mechanism 4506, and a base 4508. The scissor mechanism 4506 may include multiple members pivotally coupled to one another and coupled to the base 4508 and the keycap 4504 to movably couple the keycap 4504 to the base 4508, and thus the top case 4502 (which may be a light-transmissive top case, as described herein). The base 4508 may be coupled to the top case 4502 in any suitable way, such as via adhesive, ultrasonic welding/bonding, heat staking, etc. The base 4508 and the top case 4502 may include alignment features, such as the alignment features 4318, 4320, described with respect to FIGS. 43A-43C.

The key 4500 may also include a spring member 4510 attached to the base 4508 and configured to bias the keycap 4504 towards an unactuated or undepressed state. The spring member 4510 may have any shape or configuration, such as a dome, a coil spring, a leaf spring, or a layer of compliant material, and may be formed from or include any suitable material, such as metal, rubber, foam, plastic, or the like.

The key 4500 may be completely assembled prior to being coupled to the top case 4502. For example, the keycap 4504, scissor mechanism 4506, spring member 4510, and base 4508 may be assembled together, and thereafter coupled to the top case 4502. In other cases, the base 4508 may be attached to the top case 4502 before the key 4500 is completely assembled (e.g., the keycap 4504, scissor mechanism 4506, and/or spring member 4510 may be coupled to the base 4508 after the base 4508 is coupled to the top case 4502).

With reference to FIG. 45B, a key 4520 may include a keycap 4524, a hinge mechanism 4526, and a base structure 4528. The hinge mechanism 4526 may include a first wing 4530 that is pivotally coupled to both the base structure 4528 and the keycap 4524, and includes a slot 4532 in the end of the first wing that is proximate the base structure 4528 and a complementary end of a second wing 4534. The second wing 4534 may also be pivotally coupled to both the base structure 4528 and the keycap 4524, and includes a protrusion 4536 at the end of the second wing 4534 that is proximate the base structure 4528 and the complementary end of a first wing 4530. The protrusion 4536 may be positioned in the slot 4532 to mechanically engage the first and second wings 4530, 4534. The slot and protrusion 4532, 4536 may be configured to substantially synchronize the motions of the first and second wings 4530, 4534 when the key is actuated, and may generally help maintain the keycap 4524 in a substantially flat configuration when it is being pressed, even if the force applied to the keycap 4524 is not centered over the middle of the keycap 4524.

The slot and protrusion 4532, 4536 may also be shaped so that the protrusion 4536 can slide within the slot 4532 during key actuation to prevent binding or other physical interference that may increase the actuation force or otherwise interfere with the action of the key. For example, as shown in FIG. 45B, both the first and second wings 4530, 4534 are attached to the keycap 4524 via clips 4538 and pins 4540 that allow rotation of the pins 4540 within the clips 4538, but generally does not allow lateral movement (e.g., left-to-right, as shown in FIG. 45B) of the pins 4540 within the clips 4538. Accordingly, the slot and the protrusion 4532, 4536 (as well as a sliding connection between the second wing 4534 and the base structure 4528) provide sufficient freedom of motion to allow the hinge mechanism 4526 to move without binding (e.g., the hinge mechanism 4526 is not over constrained), while the first wing 4530 and the second wing 4534 are mechanically engaged such that they move in a synchronized manner when the key is actuated. Moreover, because the clips 4538 have downward-facing openings, the keycap 4524 may be attached to the hinge mechanism 4526 with a direct downward motion, which may be a simpler and more efficient assembly technique than is possible with keycaps that have a clip and slot configuration (such as that shown in FIG. 45A).

The key 4520 may also include a spring member 4529 configured to bias the keycap 4504 towards an unactuated or undepressed state. The spring member 4529 may have any shape or configuration, such as a dome, a coil spring, a leaf spring, or a layer of compliant material, and may be formed from or include any suitable material, such as metal, rubber, foam, plastic, or the like. The spring member 4529 may be a dome switch for facilitating electrical detection of key presses.

FIG. 46 depicts a key 4600 that includes a keycap 4604, key web 4608, and spring member 4610. The spring member 4610 biases the keycap 4604 towards an unactuated or undepressed state. The spring member 4610 may have any shape or configuration, such as a dome, a coil spring, a leaf spring, or a layer of compliant material, and may be formed from or include any suitable material, such as metal, rubber, foam, plastic, or the like.

The keycap 4604 may include flanges 4612 that engage upstops 4614 of the key web 4608 (e.g., portions of the key web 4608 that are adjacent or proximate the opening that receives the keycap 4604) to define an upper travel limit of the keycap 4604 and to retain the keycap 4604 to the keyboard. The key web 4608 may be coupled to the top case 4602 in any suitable way, such as via adhesive, ultrasonic welding/bonding, heat staking, etc. The key web 4608 and/or the keycap 4604 may be formed from or include dielectric or nonconductive materials, which may facilitate sensing or detection of key presses, gestures, and other touch-based inputs through the keycap 4604, key web 4608, and top case 4602.

Figure 47A:
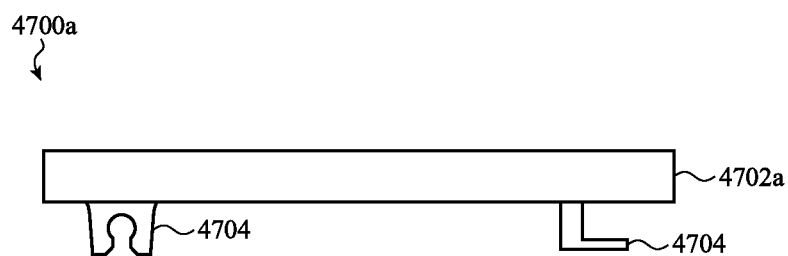
FIGS. 47A-47B depict side views of example keycaps.
Figure 47B:
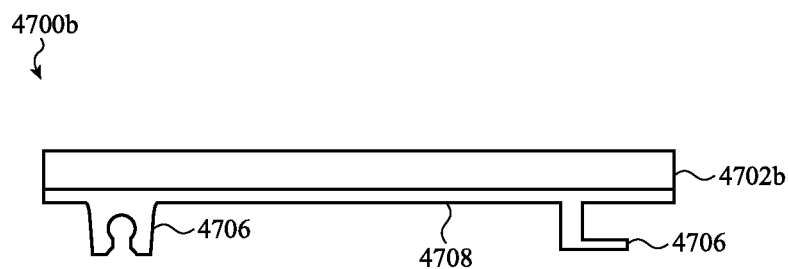

FIGS. 47A-47B depict side views of example keycaps that may be used with any of the keys described herein. FIG. 47A depicts a keycap 4700a that includes a body portion 4702a and retention features 4704. The body portion 4702a may be formed from a first material, and the retention features 4704 may be formed from a second material and attached to the body portion 4702a. Alternatively, the body portion 4702a and the retention features 4704 may be formed from the same material and then attached together.

Both the body portion 4702a and the retention features 4704 may be formed from dielectric or nonconductive materials. Accordingly, when the keycap 4700a is used in a keyboard that uses capacitive touch sensing to sense key makes, or otherwise relies on electromagnetic sensing through the keycap 4700a, the keycap 4700a will not shield objects above the keycap 4700a or otherwise prevent the electromagnetic sensing. For example, the body portion 4702a and the retention features 4704 may be formed from or include any of glass, ceramic, plastic, sapphire, or any other suitable dielectric material. More particularly, the body portion 4702a may be glass and the retention features 4704 may be plastic. As another example, either or both the body portion 4702a and the retention features 4704 (or any portion thereof) may be formed from a metal or other conductive material that capacitively or electrically couples to a sensor below a top case to facilitate detection of key makes.

The retention features 4704 may be coupled to the body portion 4702a in any suitable way. For example, they may be retained mechanically, with clips, screws, complementary mating or engaging features, threads, fasteners, or the like. Alternatively or additionally, they may be bonded together, for example, with an adhesive such as HSA, PSA, cyanoacrylate, epoxy, or the like.

The retention features 4704 are shown as clips and channels that are configured to engage pins of a support mechanism (e.g., the hinge mechanism 4308, FIGS. 43A-44D, the scissor mechanism 4506, FIG. 45A, the hinge mechanism 4526, FIG. 45B) to retain the keycap 4700a to the hinge mechanism and allow the hinge mechanism to articulate during a key actuation (e.g., when the key is depressed). While particular configurations of retention features are shown, other types of retention features may also be used.

FIG. 47B depicts a keycap 4700b that includes a body portion 4702b and an attachment portion 4708 attached to the body portion 4702b. The attachment portion 4708 includes retention features 4706 extending from a base portion. As described with respect to FIG. 47A, the attachment portion 4708 and the body portion 4702b may be formed from or include any suitable dielectric material that will not shield objects above the keycap 4700b from sensors below the keycap 4700b, such as glass, ceramic, plastic, sapphire, or the like. More particularly, the body portion 4702b may be formed from glass and the attachment portion 4708 may be plastic. As another example, either or both the body portion 4702b and the attachment portion 4708 (or any portion thereof) may be formed from or include a metal or other conductive material (e.g., conductive coatings, paints, components, etc.) that capacitively or electrically couples to a sensor below a top case to facilitate detection of key makes.

The attachment portion 4708 may be monolithic, as shown, such as a single, injection molded component. Alternatively, the retention features 4706 may be formed separately from the base portion and then attached to the base portion to form the attachment portion 4708.

The foregoing description describes computing devices, such as notebook computers, some of which may detect touch inputs anywhere above the top case, including on a keyboard (even a mechanical keyboard) as well as any non-keyboard regions of the top case. Such computing devices may enable new and different ways of interacting with a computing device. FIGS. 48A-48F illustrate various techniques for providing inputs to a computing device, as well as example actions that the computing device may perform in response to the inputs.

Figure 48A:
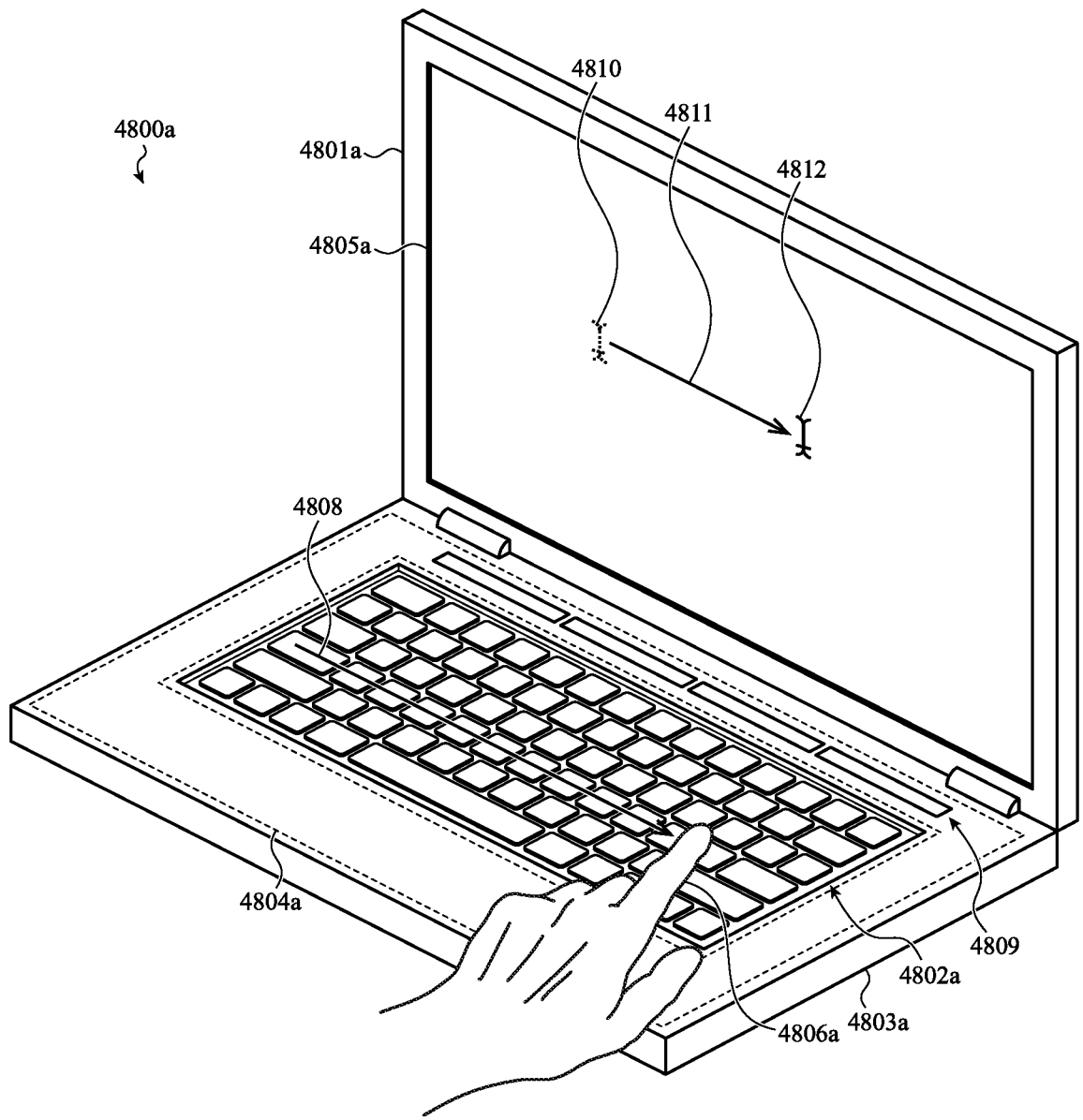
FIGS. 48A-48F depict example computing devices receiving various touch inputs.

FIG. 48A depicts a computing device 4800a that includes a base portion 4803a flexibly coupled (e.g., with a hinge) to a display portion 4801a. The display portion 4801a includes a display 4805a. The base portion 4803a includes a keyboard 4802a (which may be a mechanical keyboard or a virtual keyboard, as described above) and a trackpad region 4804a. Where the keyboard 4802a is a mechanical keyboard, it may be positioned at least partially in a rectangular opening in the top case of the base portion 4803a.

The trackpad region 4804a may correspond to the non-keyboard region of the top surface of the top case (e.g., all or substantially all of the top surface of the case except for the keyboard 4802a and/or a virtual key region). In some cases, the trackpad region 4804a also encompasses a virtual key region 4809 that is positioned above the keyboard 4802a, or the trackpad region 4804a may otherwise extend along a top side of the keyboard 4802a (e.g., between the keyboard 4802a and the display portion 4801a) to define a continuous four-sided frame that surrounds or otherwise frames the keyboard 4802a. FIG. 48A shows the trackpad region 4804a extending along the top side of the keyboard 4802a and encompassing a virtual key region, while FIGS. 48B-48E show trackpad regions that do not extend along the top side of the keyboard, and thus extend along three sides of a keyboard (e.g., a left, right, and bottom side of the respective keyboards). Where the trackpad region 4804a (or any other trackpad region) encompasses the virtual key region, the trackpad may be used to detect inputs applied to the virtual keys, including selections of virtual keys and/or gesture inputs that are applied to the virtual key region but are not intended as selections of particular virtual keys. In some cases, force and/or touch sensors are positioned under the top case and are configured to detect touch and/or force inputs applied to any portion of the trackpad region 4804a.

FIG. 48A depicts a finger 4806a swiping across the keyboard 4802a along a path 4808. For example, the finger 4806a may be swiped along physical keycaps of the keyboard 4802a without actuating the keys themselves (e.g., without pressing on the keys sufficiently for the keycap to move or a key input to be registered). Touch sensors within the base portion, such as the touch sensors described above with respect to FIGS. 18A-18D, detect the user's finger through the top case and the keycaps (and any other components of a keyboard, such as a fabric or other flexible cover), and may detect properties of the input gesture, such as a starting location, an ending location, and the path between them.

The computing device 4800a may receive the properties of the input gesture and perform an operation in accordance with the input. For example, the computing device 4800a may manipulate or change what is displayed on the display 4805a in response to the input. FIG. 48A, for example, shows a cursor 4812 having been moved along a path 4811 from an initial position 4810 to a second position. The path 4811 may correspond to the path 4808. For example, the path 4811 may have a direction and length that is the same as or is a scaled representation of the path 4808. The cursor path 4811 shown in FIG. 48A is merely an example of an operation that the computing device 4800a may perform in response to the depicted input, and other user interface manipulations or functional operations are also possible.

Figure 48B:
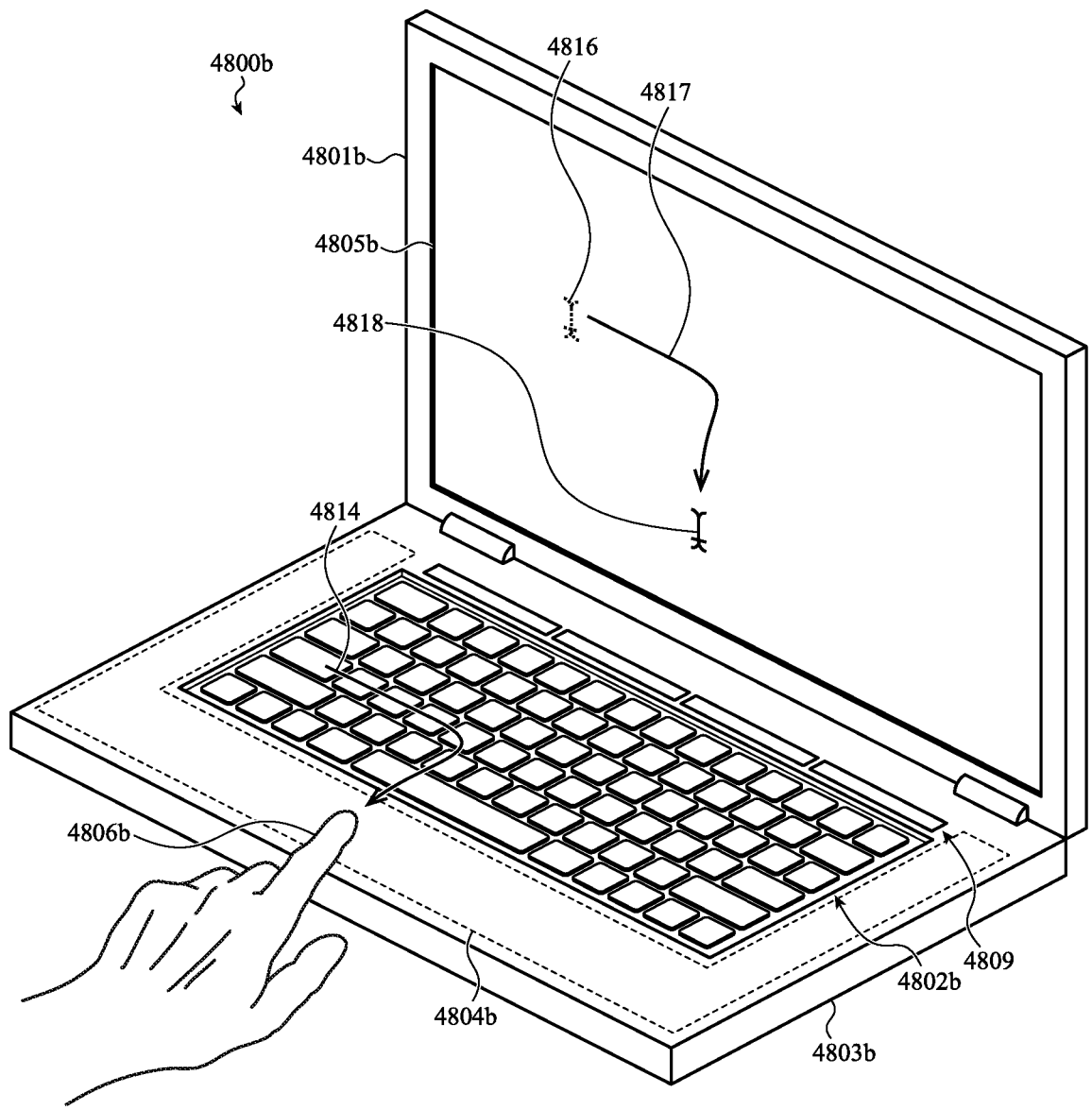

FIG. 48B depicts a computing device 4800b, similar to the computing device 4800a, that includes a base portion 4803b with a keyboard 4802b and a trackpad region 4804b, and a display portion 4801b with a display 4805b. In FIG. 48B, a finger 4806b has swiped on the base portion 4803b along a path 4814 that begins on the keyboard 4802b and extends into the trackpad region 4804b.

As noted above, the computing device 4800b may include one or more touch sensors below both the keyboard 4802b and the trackpad region 4804b. These touch sensors may be programmatically or physically integrated such that gestures and other inputs can span these regions without interruption and cause the computing device to produce a single, uninterrupted output. For example, as shown in FIG. 48B, a cursor 4818 displayed on the display 4805b may move from an initial position 4816 along a path 4817 to a second position. The path 4817 may correspond to (e.g., it may be the same as or a scaled representation of) the path 4814, despite the path 4814 having portions in two physically different input regions of the top case. The cursor path 4817 shown in FIG. 48B is merely an example of an operation that the computing device 4800b may perform in response to the depicted input, and other user interface manipulations or functional operations are also possible.

Figure 48C:
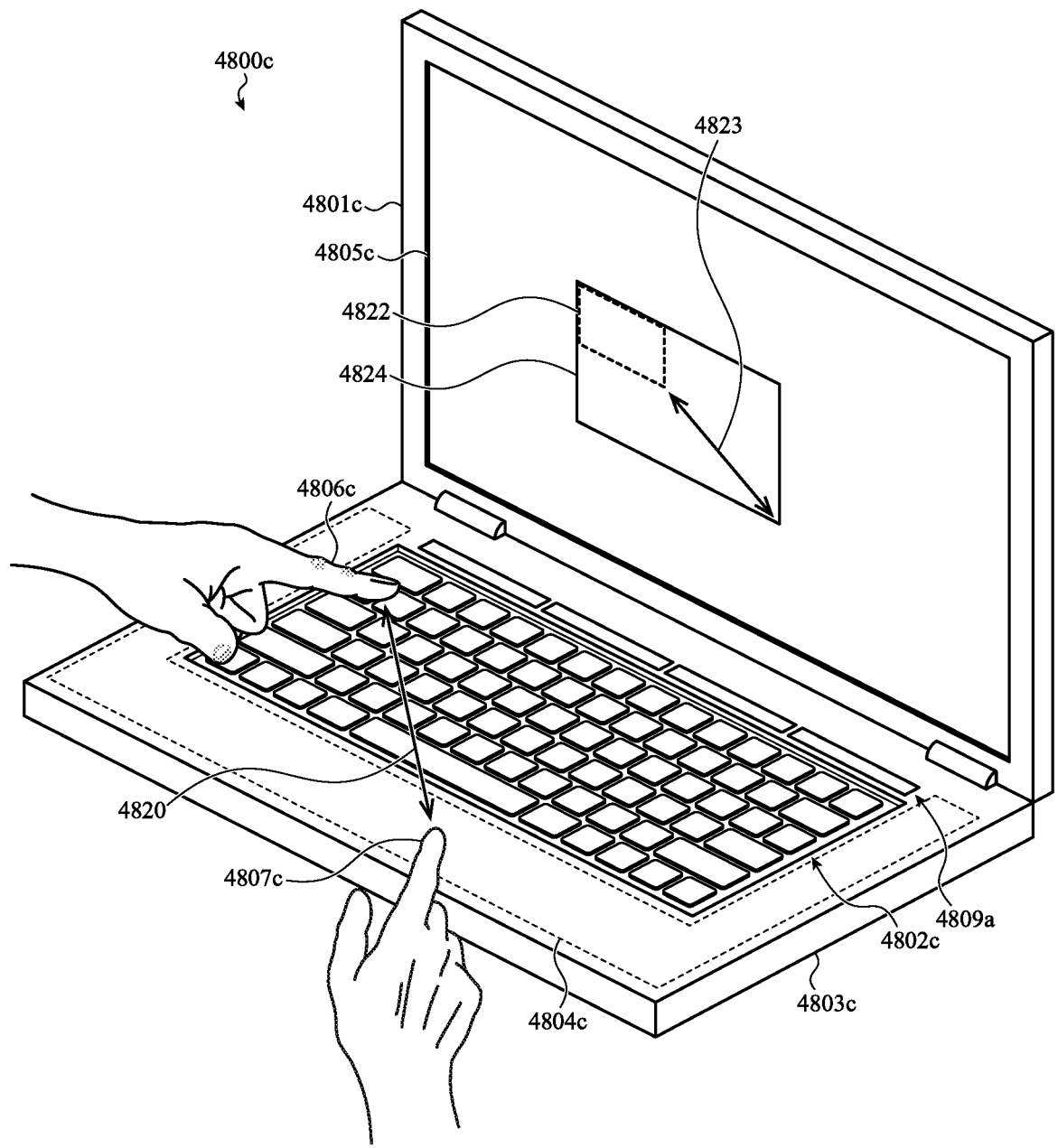

FIG. 48C depicts a computing device 4800c, similar to the computing device 4800a, that includes a base portion 4803c with a keyboard 4802c and a trackpad region 4804c, and a display portion 4801c with a display 4805c. FIG. 48C illustrates an example multi-touch gesture that includes inputs applied to both the keyboard 4802c and the trackpad region 4804c. For example, a first finger 4806c may be placed on a key of the keyboard 4802c, while a second finger 4807c is swiped away from the first finger 4806c, across part of the keyboard 4802c, and into the trackpad region 4804c. This type of input embodies both multi-touch input detection (e.g., detecting two simultaneous touch inputs) as well as multi-region input detection (e.g., detecting simultaneous touch inputs in different input regions on a top case).

The first finger 4806c may be actuating a key or it may simply be resting on a key without actuating the key. For example, if the key is a mechanical key, the key may be depressed or undepressed. Also, while the first finger 4806c is described above as stationary, it may also be moved across the keyboard 4802c at the same time as the second finger 4807c.

The computing device 4800c may take any action in response to detecting the input shown in FIG. 48C. One example, as shown in FIG. 48C, is changing the size of a user interface element on the display 4805c. For example, a user interface element 4824 may be resized from an initial size 4822 to a second size, expanding along the path 4823. The amount and direction of the resizing of the interface element 4824 may correspond to the path 4820 of the input gesture. As noted above, the element resizing shown in FIG. 48C is merely an example of an operation that the computing device 4800c may perform in response to the depicted input, and other user interface manipulations or functional operations are also possible.

Figure 48D:
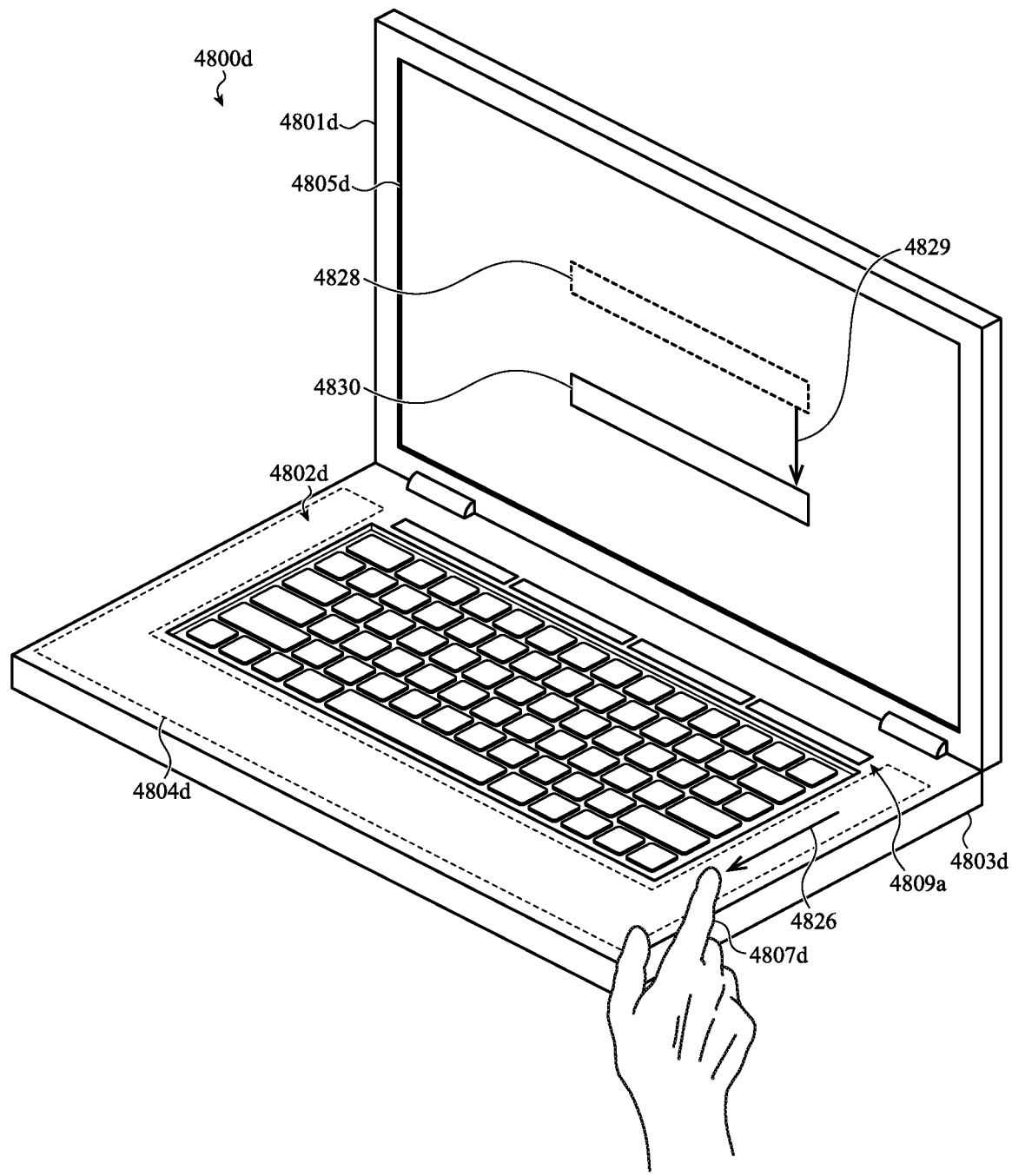

FIG. 48D depicts a computing device 4800d, similar to the computing device 4800a, that includes a base portion 4803d with a keyboard 4802d and a trackpad region 4804d, and a display portion 4801d with a display 4805d. FIG. 48D illustrates an example input gesture that is applied to a portion of the top case that is along a side of the keyboard. For example, a finger 4807d is swiped downward along the side of the top case, along input path 4826.

The computing device 4800d may take any action in response to detecting the input shown in FIG. 48D. One example, as shown in FIG. 48D, is scrolling or moving a user interface element on the display 4805d. For example, a user interface element 4830, such as a graphical object (e.g., an image), a document, a web page, or the like, may be moved from an initial position 4828 to a second position along the path 4829.

Figure 48E:
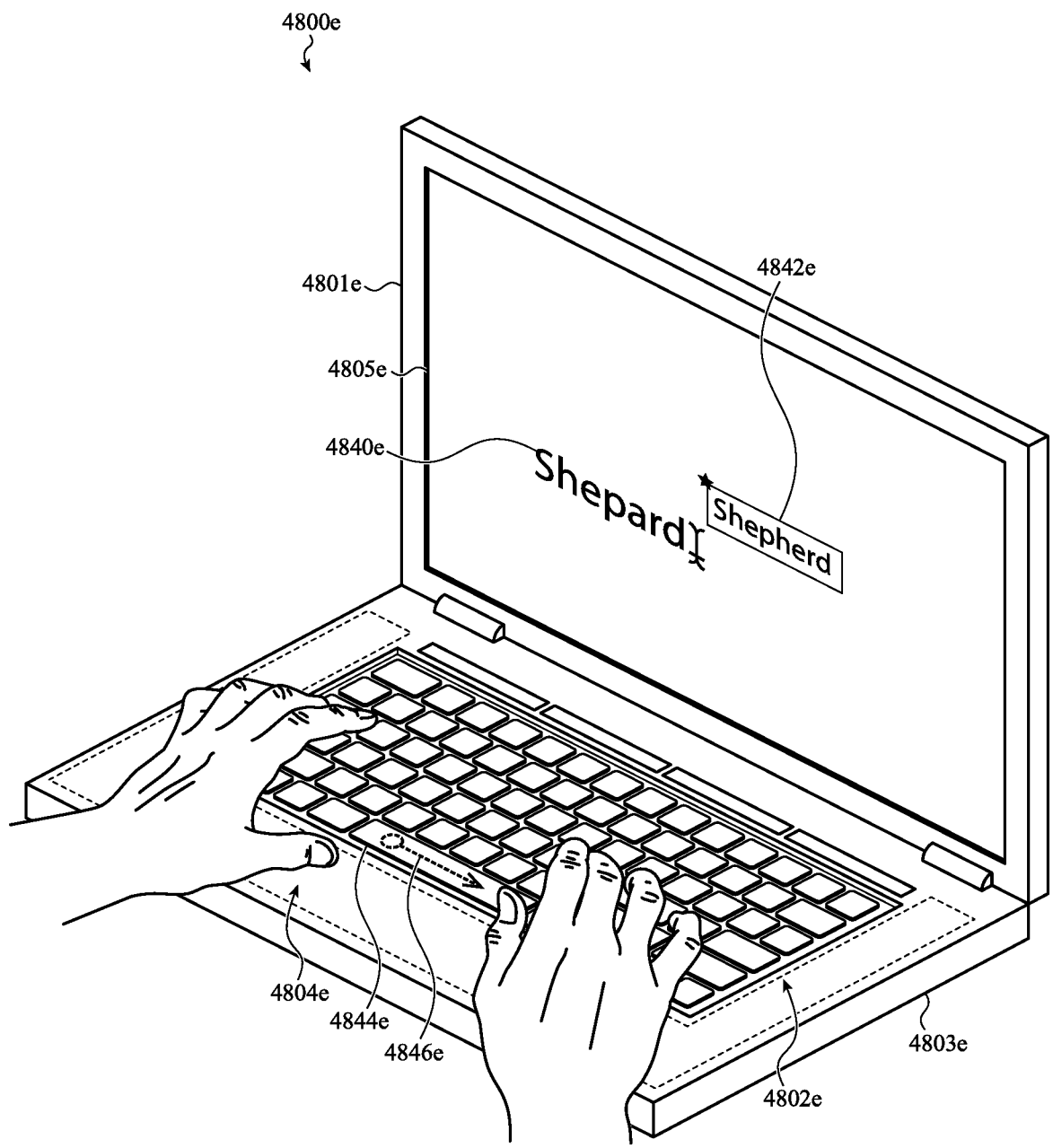

FIG. 48E depicts a computing device 4800e, similar to the computing device 4800a, that includes a base portion 4803e with a keyboard 4802e and a trackpad region 4804e, and a display portion 4801e with a display 4805e. FIG. 48E illustrates an example input gesture that is applied to a touch sensitive key of the keyboard 4802e. The key 4844e may be a mechanical key that is associated with a touch sensor, as described in various embodiments herein, or it may be a virtual key region (e.g., an input region on a top case and associated with touch and/or force sensors and haptic output devices).

The key 4844e (shown as a space bar, though any other key may be used for this or similar input gestures) may be capable of receiving traditional key inputs as well as gesture inputs. More particularly, when a user strikes the key 4844e in a conventional typing manner, the computing device 4800e may respond in a conventional way (e.g., taking an action that results from selection of the space bar, such as inserting a space in a text input, selecting an on-screen affordance, etc.). When the user applies a touch gesture to the key 4844e, however, the computing device 4800e may perform a different action. For example, as shown in FIG. 48E, a gesture input such as a user sliding a finger or thumb along a path 4846e may result in a user accepting a suggested spelling 4842e of a misspelled word 4840e in a word processing application or other text input field.

Gestures other than the sliding gesture shown may also be used. For example, a user may also be able to slide a finger or thumb along the path 4846e in an opposite direction to perform a function (e.g., to decline a proposed spelling correction, to delete a character or word, highlight the previous word, or the like). As another example, a user may be able to slide two fingers or thumbs towards each other (e.g., a pinch gesture), or away from each other (e.g., an unpinch gesture) along the key 4844e, which may cause a displayed graphical output to be increased or decreased in size (e.g., zoomed out or in). These or other gestures may be used to perform other functions instead of or in addition to those described. For example, a swipe up gesture applied to a letter input key may cause the corresponding capital letter to be input rather than the lower case letter. Similarly, a swipe gesture applied to a shift key may cause the computing device to switch between a foreground and a background application interface (e.g., switching between active applications). Other gestures and functions are also possible.

FIG. 48E describes how gesture inputs, which may be enabled by touch and/or force sensors associated with an electronic device, may be used to improve the speed and ease with which words and text may be inputted into a device. The integrated interface system described herein may also facilitate other techniques for improving text input to a computing device. For example, in some cases, a force sensor may detect or determine an input at a location that is proximate to multiple neighboring key regions. In such cases, a touch sensor may be used to determine a more accurate location for the centroid of the touch input, which may be used to determine which of the neighboring key regions was the likely target of the user. For example, if a user touches an area that is close to the border between the "f" and "d" keys of a keyboard, it may be ambiguous which key was the user's target based on force sensor data alone. The touch sensor may be used to break the tie between the "f" and "d" keys based on the centroid of the touch input. If the centroid is closer to the "f" key, then the computing device may register the input as a selection of the "f" key and ignore the "d" key (and vice versa). This tie-break process may be used without reference to any prior inputs, and as such may allow for more accurate typing inputs without regard to spelling and/or grammar analysis to determine a user's intended target key. This may improve on existing methods whereby mistyped words are essentially only correctable by the computing device based on spelling and/or grammar of the inputs, and not based on the actual physical inputs. More particularly, a device with only a conventional mechanical keyboard may detect the string "cvomputer" and recommend that it be replaced with "computer," while the tie-break functionality enabled by the touch and force sensing system can determine, before the word is even completed, that the user intended to select only the "c" key. This may provide more accurate typing, as certain words might otherwise not be identifiable by a spelling or grammar based system. For example, if a user inputs a string such as "cvomnputrer," the word may not be similar enough to "computer" for a device to suggest the correct spelling. Because the tie-break system described above can determine which keys were actually intended to be selected, the incorrect string may be avoided in the first place (e.g., the incorrect letters would have been ignored from the outset).

Of course, a computing device may use prior inputs to help break ties and/or determine likely intended inputs. For example, if a user has typed the letters "keyboar", a force input that may be interpreted as a selection of either an "f" or a "d" key may be determined to be the "d" based on the fact that it correctly spells a word (and optionally because the centroid of the input was detected closer to the "d" than the "f" key).

Figure 48F:
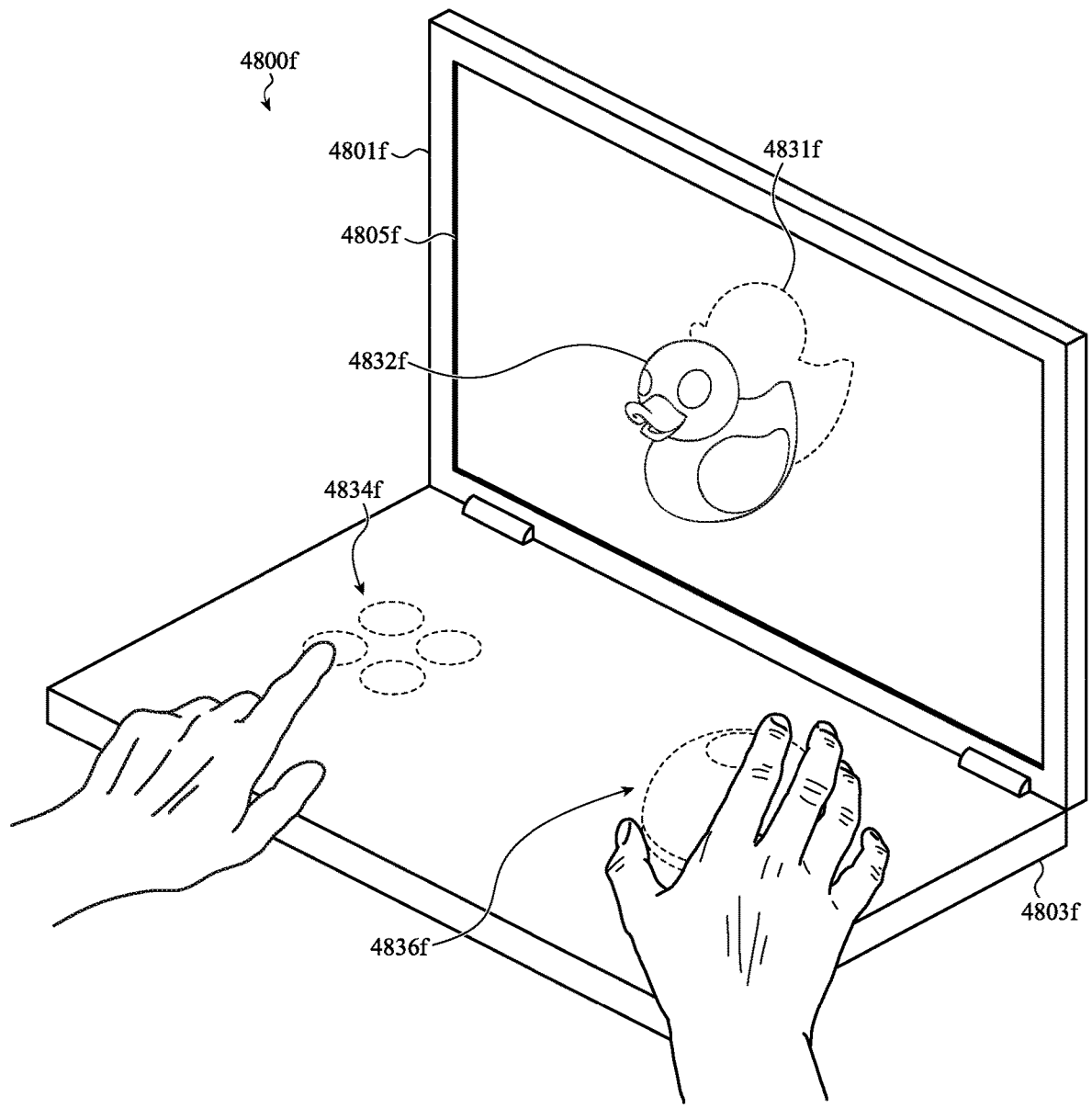

FIG. 48F depicts a computing device 4800f, similar to the computing device 4800a, that includes a base portion 4803f and a display portion 4801f with a display 4805f. The base portion 4803f may include a display in the base portion 4803f that is visible through a top case (e.g., a transparent glass or plastic top case) of the base portion 4803f. The display in the base portion 4803f may display affordances on the base portion 4803f with which a user can interact. As shown, the affordances include a button array 4834f and a rotatable dial 4836f. A user can interact with both of the affordances either individually or simultaneously to provide varying types of inputs and cause the computing device 4800f to perform varying functions. For example, FIG. 48F illustrates the display 4805f showing a three dimensional model of an object, and the affordances may be used to manipulate the view of the object. For example, a user selection of a button in the button array 4834f, as shown in FIG. 48F, may cause the computing device 4800f to interpret an input to the rotatable dial 4836f in one of various possible ways. More particularly, the buttons of the button array 4834f may determine whether inputs to the rotatable dial 4836f cause the three dimensional model to rotate horizontally, rotate vertically, be zoomed in or out, or the like. As shown in FIG. 48F, the selection of the particular button and the rotation of the rotatable dial 4836f results in a displayed object being rotated or otherwise manipulated from an initial orientation 4831f to a final orientation 4832f. Other types of affordances may also be displayed, and other functions may be performed in response to user manipulations of the affordances (e.g., touch and/or force inputs applied to the displayed affordances).

In FIGS. 48A-48F, fingers are shown as providing the touch inputs. It will be understood that other objects or implements may be used instead of or in addition to a finger, such as a stylus or any other suitable object that is detectable by the touch sensors within the computing devices. Moreover, the computing devices may take other actions or perform other functions in response to the inputs shown in FIGS. 48A-48F, such as changing a volume of an audio output, changing the brightness or any other output property of the display, moving a different user interface element (e.g., a slider bar for a media playback application) across the display, or the like.

As described herein, a top case for an computing device may be formed of or include a dielectric material, such as glass, plastic, ceramic, or the like. The dielectric and/or nonconductive properties of such material may allow various types of components that are below the top case to effectively communicate through the top case. For example, electromagnetic signals and/or fields may be able to pass through the top case to facilitate communication between devices, wireless power transfer (e.g., inductive charging), optical and/or capacitive sensing, and the like.

Figure 49A:
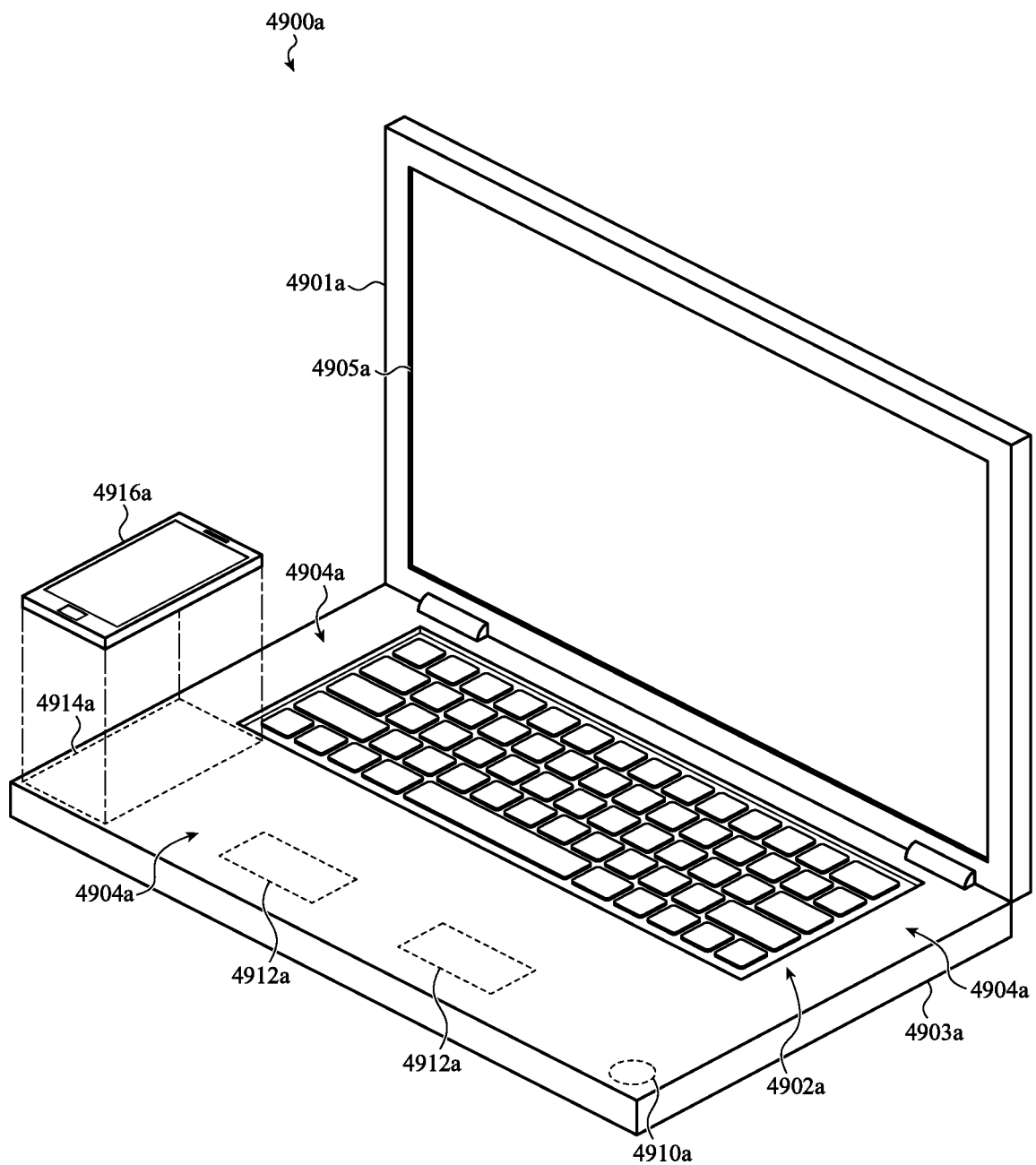
FIGS. 49A-49B depict example computing devices interfacing with external objects.

FIG. 49A depicts an example computing device 4900a that interfaces with external objects through a top case. The computing device 4900a includes a base portion 4903a flexibly coupled (e.g., with a hinge) to a display portion 4901a. The display portion 4901a includes a display 4905a. The base portion 4903a includes a keyboard 4902a (which may be a mechanical keyboard or a virtual keyboard, as described above) and a trackpad region 4904a. The trackpad region 4904a may correspond to the non-keyboard region of the top surface of the top case (e.g., all or substantially all of the top surface of the case except for the keyboard 4902a and/or a virtual key region).

The device 4900a may include various components within the base portion 4903a that are configured to interact with external objects through the top case of the base portion 4903a. For example, the device 4900a includes biometric sensors 4912a, a fingerprint sensor 4910a, and a wireless charger 4914a. The biometric sensors 4912a may be positioned where a user typically rests his or her palms or wrists when typing on the keyboard 4902a. The biometric sensors 4912a may be configured to detect biometric information about the user through the top case. For example, the biometric sensors 4912a may detect palm- or wrist-prints, detect a user's heart rate, blood oxygenation levels, temperature, and the like. Such information may be used for authentication purposes, to determine the user's hand position relative to the device, and/or to record health data for the user to track. As noted, the biometric sensors 4912a may use any suitable sensing techniques, such as optical sensors (e.g., photoplethysmographs, cameras, etc.), capacitive sensors, or the like. The biometric sensors 4912a may also include facial-recognition sensors, which may include cameras, lenses, projectors (e.g., microdot projectors), infrared sensors, and the like, which may also communicate through the top case to provide facial recognition functionality. In some cases, the regions associated with the biometric sensors 4912a may remain touch and/or force sensitive, as described herein.

The computing device 4900a may also include a fingerprint sensor 4910a. The fingerprint sensor 4910a may detect a user's fingerprint to authenticate the user to the device 4900a. The fingerprint sensor 4910a may use any suitable sensing technology, including optical, capacitive, inductive, ultrasonic and/or acoustic, or the like.

The computing device 4900a may also include a wireless charger 4914a within the base portion 4903a. The wireless charger 4914a may be configured to transfer power to an external device 4916a (e.g., a smartphone, a music player, or the like), or receive power from an external source (e.g., a charger that is coupled to a power source, a portable battery, etc.). The wireless charger 4914a may use inductive coils to transmit and/or receive power between two devices. As noted above, the dielectric properties of the top case may allow electromagnetic fields to pass therethrough with sufficiently little attenuation to allow inductive coupling between two coils.

The biometric sensors 4912a, fingerprint sensor 4910a, and wireless charger 4914a may be at any suitable position in the base portion 4903a or the display portion 4901a. Moreover, the biometric sensors 4912a, fingerprint sensor 4910a, and wireless charger 4914a may be associated with a graphic, border, or other visual indicator of its location, allowing users to easily and quickly locate the components. The visual indicators may be defined by microperforations in a mask layer, which may be lit from below to define an illuminated visual indicator, as described above.

Figure 49B:
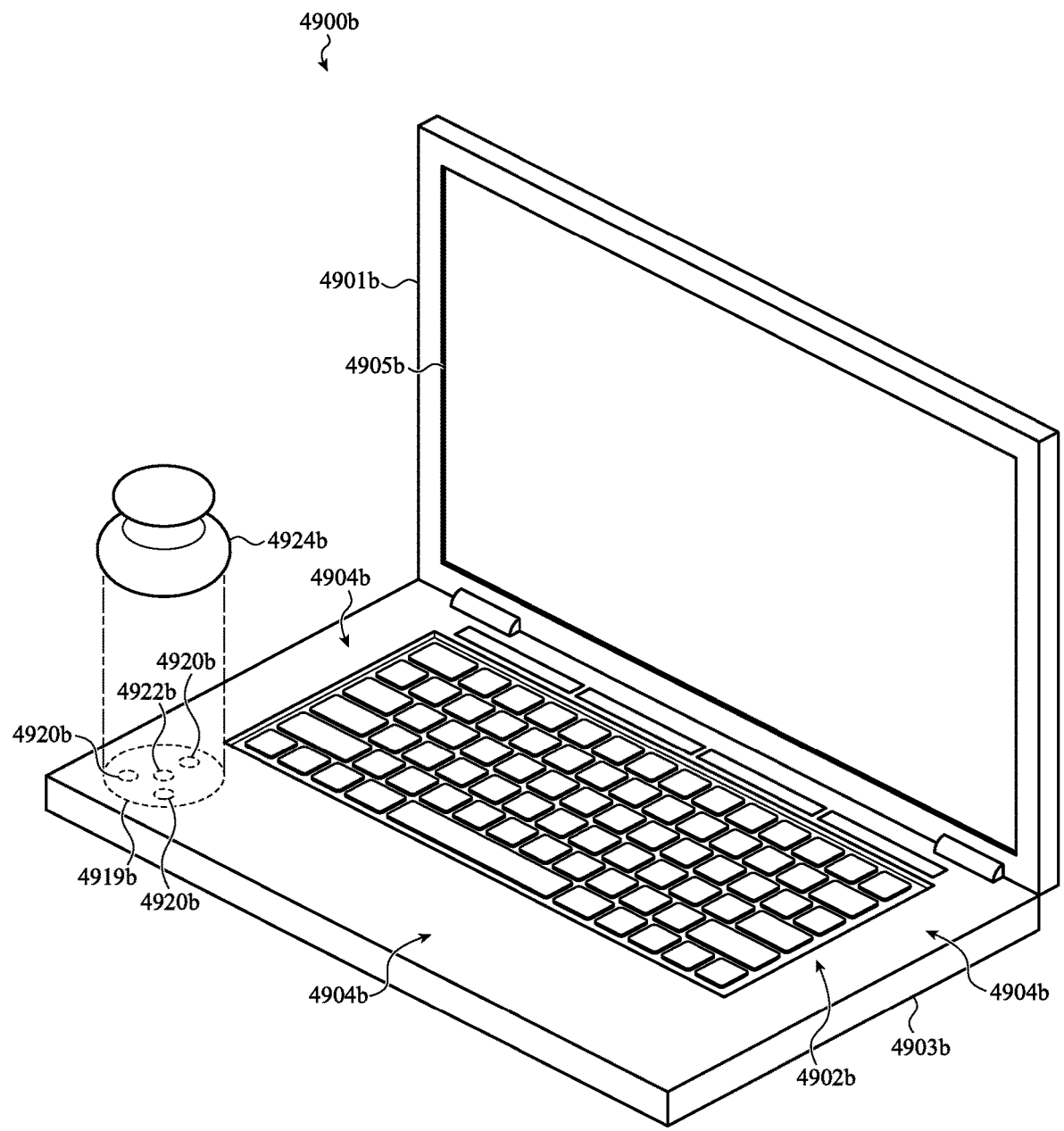

FIG. 49B depicts an example computing device 4900b that is configured to communicate through the top case to a removable peripheral input device. The computing device 4900b includes a base portion 4903b flexibly coupled (e.g., with a hinge) to a display portion 4901b. The display portion 4901b includes a display 4905b. The base portion 4903b includes a keyboard 4902b (which may be a mechanical keyboard or a virtual keyboard, as described above) and a trackpad region 4904b. The trackpad region 4904b may correspond to the non-keyboard region of the top surface of the top case (e.g., all or substantially all of the top surface of the case except for the keyboard 4902b and/or a virtual key region).

The computing device 4900b may include in the base portion 4903b a connection region 4919b, which may be configured to receive thereon a peripheral input unit 4924b (or any other suitable electronic device). As shown, the peripheral input unit 4924b is a joystick that may be used, for example, to manipulate displays of three dimensional objects, provide input for gaming applications, navigate user interfaces, or the like.

The computing device 4900b may further include alignment components 4920b within the base portion 4903b. The alignment components 4920b, which may be magnets or magnetic materials, may be attracted to corresponding magnets or magnetic materials in the peripheral input unit 4924b to properly align the peripheral input unit 4924b relative to the base portion 4903b and otherwise retain the peripheral input unit 4924b to the base portion 4903b. The computing device 4900b may also include a wireless communication module 4922b, which may include an antenna for transmitting and receiving wireless signals as well as associated processors and circuitry to facilitate communications. As shown, the wireless communication module 4922b is positioned under the peripheral input unit 4924b, but it may be positioned elsewhere. When the peripheral input unit 4924b is attached to the base portion 4903b, it may communicate with the computing device 4900b via the wireless communication module 4922b to provide input signals to the computing device 4900b. The computing device 4900b may also include sensors that detect when the peripheral input unit 4924b is attached to the top case at the connection region 4919b. The computing device 4900b may automatically initiate communications with and/or begin accepting inputs from the peripheral input unit 4924b once its presence is detected on the connection region 4919b.

Figure 50:
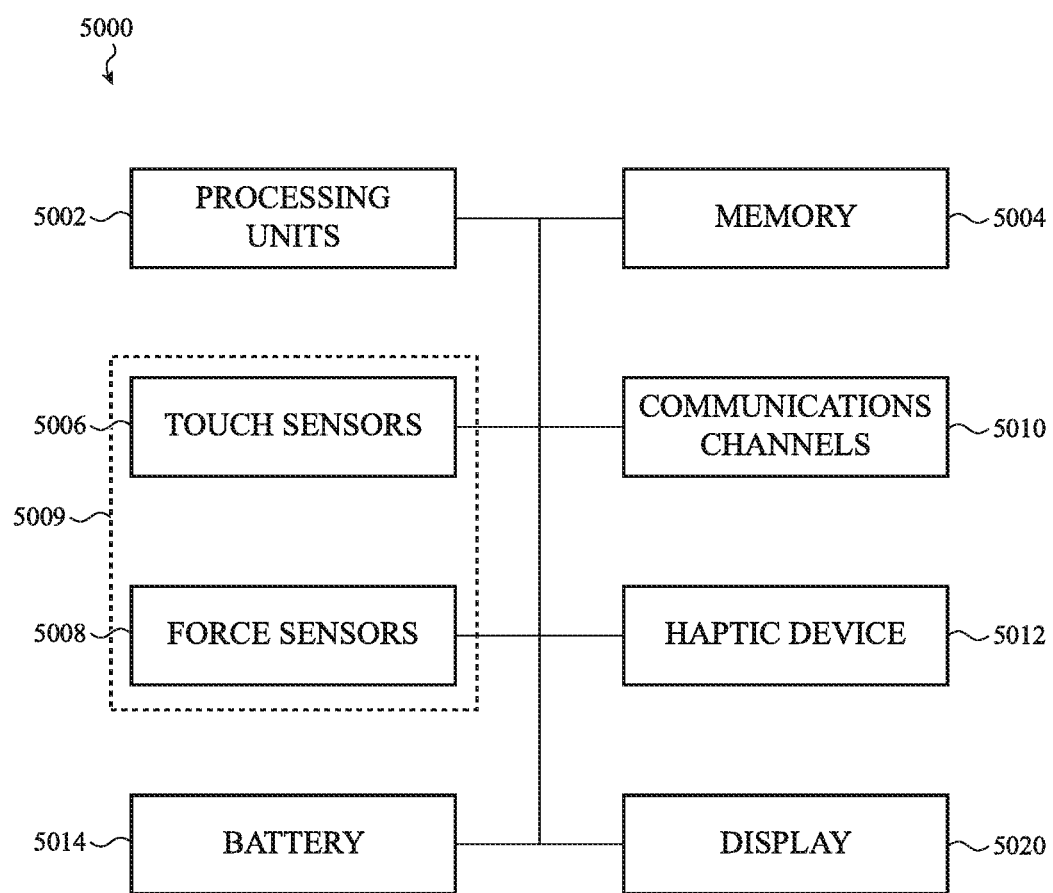
FIG. 50 depicts a schematic diagram of an electronic device.

FIG. 50 depicts an example schematic diagram of an electronic device 5000. By way of example, device 5000 of FIG. 50 may correspond to the computing device 100 shown in FIG. 1A. To the extent that multiple functionalities, operations, and structures are disclosed as being part of, incorporated into, or performed by the device 5000, it should be understood that various embodiments may omit any or all such described functionalities, operations, and structures. Thus, different embodiments of the device 5000 may have some, none, or all of the various capabilities, apparatuses, physical features, modes, and operating parameters discussed herein.

As shown in FIG. 50, the device 5000 includes one or more processing units 5002 that are configured to access a memory 5004 having instructions stored thereon. The instructions or computer programs may be configured to perform one or more of the operations or functions described with respect to the device 5000. For example, the instructions may be configured to control or coordinate the operation of one or more displays 5020, one or more touch sensors 5006, one or more force sensors 5008, one or more communication channels 5010, and/or one or more haptic feedback devices 5012.

The processing units 5002 of FIG. 50 may be implemented as any electronic device capable of processing, receiving, or transmitting data or instructions. For example, the processing units 5002 may include one or more of: a microprocessor, a central processing unit (CPU), an application-specific integrated circuit (ASIC), a digital signal processor (DSP), or combinations of such devices. As described herein, the term "processor" is meant to encompass a single processor or processing unit, multiple processors, multiple processing units, or any other suitably configured computing element or elements.

The memory 5004 can store electronic data that can be used by the device 5000. For example, a memory can store electrical data or content such as, for example, audio and video files, documents and applications, device settings and user preferences, timing and control signals or data for the various modules, data structures or databases, and so on. The memory 5004 can be configured as any type of memory. By way of example only, the memory can be implemented as random access memory, read-only memory, Flash memory, removable memory, or other types of storage elements, or combinations of such devices.

The touch sensors 5006 may detect various types of touch-based inputs and generate signals or data that are able to be accessed using processor instructions. The touch sensors 5006 may use any suitable components and may rely on any suitable phenomena to detect physical inputs. For example, the touch sensors 5006 may be capacitive touch sensors, resistive touch sensors, acoustic wave sensors, or the like. The touch sensors 5006 may include any suitable components for detecting touch-based inputs and generating signals or data that are able to be accessed using processor instructions, including electrodes (e.g., electrode layers), physical components (e.g., substrates, spacing layers, structural supports, compressible elements, etc.), processors, circuitry, firmware, and the like. The touch sensors 5006 may be used in conjunction with various input mechanisms to detect various types of inputs. For example, the touch sensors 5006 may be used to detect touch inputs (e.g., gestures, multi-touch inputs, taps, etc.), keyboard inputs (e.g., actuations of mechanical or virtual keys), and the like. The touch sensors 5006 may be integrated with or otherwise configured to detect touch inputs applied to a top case of a computing device (e.g., the top case 112 discussed above). The touch sensors 5006 may operate in conjunction with the force sensors 5008 to generate signals or data in response to touch inputs.

The force sensors 5008 may detect various types of force-based inputs and generate signals or data that are able to be accessed using processor instructions. The force sensors 5008 may use any suitable components and may rely on any suitable phenomena to detect physical inputs. For example, the force sensors 5008 may be strain-based sensors, piezoelectric-based sensors, piezoresistive-based sensors, capacitive sensors, resistive sensors, or the like. The force sensors 5008 may include any suitable components for detecting force-based inputs and generating signals or data that are able to be accessed using processor instructions, including electrodes (e.g., electrode layers), physical components (e.g., substrates, spacing layers, structural supports, compressible elements, etc.), processors, circuitry, firmware, and the like. The force sensors 5008 may be used in conjunction with various input mechanisms to detect various types of inputs. For example, the force sensors 5008 may be used to detect clicks, presses, or other force inputs applied to a trackpad, a keyboard, a virtual key region, a touch- or force-sensitive input region, or the like, any or all of which may be located on or integrated with a top case of a computing device (e.g., the top case 112 discussed above). The force sensors 5008 may be configured to determine a magnitude of a force input (e.g., representing an amount of force along a graduated scale, rather than a mere binary "force/no-force" determination). The force sensors 5008 and/or associated circuitry may compare the determined force magnitude against a threshold value to determine what, if any, action to take in response to the input. As described herein, force thresholds may be selected dynamically or otherwise changed based on the location of the input, whether a user's palms are detected resting on the top case, or any other suitable factor(s). The force sensors 5008 may operate in conjunction with the touch sensors 5006 to generate signals or data in response to touch- and/or force-based inputs.

The touch sensors 5006 and the force sensors 5008 (which may also be referred to as touch and force sensing systems) may be considered part of a sensing system 5009. The sensing system 5009 may include touch sensors alone, force sensors alone, or both touch and force sensors. Moreover, the sensing system 5009 may provide touch sensing functions and/or force sensing functions using any configuration or combination of hardware and/or software components, systems, subsystems, and the like. For example, some force sensing components and associated circuitry may be capable of determining both a location of an input as well as a magnitude of force (e.g., a non-binary measurement) of the input. In such cases, a distinct physical touch-sensing mechanism may be omitted. In some examples, physical mechanisms and/or components may be shared by the touch sensors 5006 and the force sensors 5008. For example, an electrode layer that is used to provide a drive signal for a capacitive force sensor may also be used to provide the drive signal of a capacitive touch sensor. In some examples, a device includes functionally and/or physically distinct touch sensors and force sensors to provide the desired sensing functionality.

The device 5000 may also include one or more haptic devices 5012. The haptic device 5012 may include one or more of a variety of haptic technologies such as, but not necessarily limited to, rotational haptic devices, linear actuators, piezoelectric devices, vibration elements, and so on. In general, the haptic device 5012 may be configured to provide punctuated and distinct feedback to a user of the device. More particularly, the haptic device 5012 may be adapted to produce a knock or tap sensation and/or a vibration sensation. Such haptic outputs may be provided in response to detection of touch- and/or force-based inputs, such as detection of key actuations on a virtual or mechanical keyboard, detection of force inputs on a trackpad region, or the like. Haptic outputs may be local or global, as described herein, and may be imparted to a user through various physical components, such as a top case of a notebook computer, as described herein.

The one or more communication channels 5010 may include one or more wireless interface(s) that are adapted to provide communication between the processing unit(s) 5002 and an external device. In general, the one or more communication channels 5010 may be configured to transmit and receive data and/or signals that may be interpreted by instructions executed on the processing units 5002. In some cases, the external device is part of an external communication network that is configured to exchange data with wireless devices. Generally, the wireless interface may include, without limitation, radio frequency, optical, acoustic, and/or magnetic signals and may be configured to operate over a wireless interface or protocol. Example wireless interfaces include radio frequency cellular interfaces, fiber optic interfaces, acoustic interfaces, Bluetooth interfaces, infrared interfaces, USB interfaces, Wi-Fi interfaces, TCP/IP interfaces, network communications interfaces, or any other conventional communication interfaces.

As shown in FIG. 50, the device 5000 may include a battery 5014 that is used to store and provide power to the other components of the device 5000. The battery 5014 may be a rechargeable power supply that is configured to provide power to the device 5000 while it is being used by the user.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings. Also, when used herein to refer to positions of components, the terms above and below, or their synonyms, do not necessarily refer to an absolute position relative to an external reference, but instead refer to the relative position of components with reference to the figures.

Moreover, the foregoing figures and descriptions include numerous concepts and features, which may be combined in numerous ways to achieve numerous benefits and advantages. Thus, features, components, elements, and/or concepts from various different figures may be combined to produce embodiments or implementations that are not necessarily shown or described together in the present description. Further, not all features, components, elements, and/or concepts shown in a particular figure or description are necessarily required in any particular embodiment and/or implementation. It will be understood that such embodiments and/or implementations fall within the scope of this description.

What is claimed is:

1. A portable computer comprising:
   a display portion comprising a display; and
   a base portion pivotally coupled to the display portion and comprising:
      a bottom case; and
      a top case, formed from a dielectric material and configured to locally deform in response to a touch input applied to a top surface of the top case, the top case coupled to the bottom case and comprising:
         a top member defining a top surface of the base portion; and
         a sidewall integrally formed with the top member and defining a side surface of the base portion; and
      a sensing system comprising:
         a first sensing system configured to determine a location of the touch input; and
         a second sensing system configured to determine a force of the touch input and to register an input at the location of the touch input if the determined force exceeds a threshold force; and
      a haptic device configured to produce a haptic output at the top case in response to registering the input at the location of the touch input.

2. The portable computer of claim 1, wherein the top case is formed from a single glass member.

3. The portable computer of claim 2, wherein:
   the sidewall is a first sidewall;
   the side surface is a first side surface; and
   the top case further comprises:
      a second sidewall integrally formed with the first sidewall and the top member and defining a second side surface of the base portion; and
      a third sidewall integrally formed with the first sidewall, the second sidewall, and the top member and defining a third side surface of the base portion.

4. The portable computer of claim 3, wherein:
   the first sensing system is positioned below the top member and extends over an entire area of the top member; and
   the second sensing system is positioned below the top member and extends over the entire area of the top member.

5. The portable computer of claim 3, wherein:
   the top member defines an opening; and
   the portable computer further comprises a keyboard positioned in the opening.

6. The portable computer of claim 3, wherein:
   the display is a first display; and
   the portable computer further comprises a second display within the base portion and viewable through the top case.

7. The portable computer of claim 6, wherein the second display is configured to display an image of a keyboard in a keyboard region of the top case.

8. The portable computer of claim 7, wherein:
   the image of the keyboard includes an image of a key; and
   the second sensing system is configured to register a key input in response to detecting an input applied to the key and having a force exceeding a force threshold.

9. A device comprising:
   a display portion comprising:
      a display housing; and
      a display within the display housing; and
   a base portion coupled to the display portion and comprising:
      a bottom case; and
      a glass top case coupled to the bottom case and defining a top exterior surface of the base portion;
   a sensing system configured to:
      determine a location of a touch input applied to any location on the top exterior surface of the base portion;
      determine a force of the touch input applied to any location on the top exterior surface of the base portion; and
      register an input at the location of the touch input if the determined force exceeds a threshold force; and
   a haptic device configured to produce a haptic output at the glass top case in response to registering the input at the location of the touch input;
   wherein the glass top case is configured to locally deform in response to the touch input.

10. The device of claim 9, wherein:
    the sensing system comprises:
       a touch sensing system configured to determine the location of the touch input; and
       a force sensing system configured to determine the force of the touch input and to determine the location of the touch input.

11. The device of claim 9, wherein the haptic output produces a localized haptic output such that a magnitude of the haptic output at the location is greater than the magnitude of the haptic output at a different location adjacent to the location.

12. The device of claim 9, wherein:
    the glass top case defines an opening; and the device further comprises a keyboard positioned at least partially in the opening.

13. The device of claim 9, wherein:
the bottom case defines:
 a bottom member;
 a first sidewall integrally formed with the bottom member;
 a second sidewall integrally formed with the bottom member; and
 a third sidewall integrally formed with the bottom member; and
the glass top case is attached to the bottom case via the first, second, and third sidewalls.

14. The device of claim 9, wherein the haptic output is localized to the location of the touch input.

15. A notebook computer comprising:
a display portion comprising a display; and
a base portion flexibly coupled to the display portion and comprising:
 a bottom case; and
 a glass top case coupled to the bottom case and defining substantially an entire top surface of the base portion, the glass top case configured to locally deform in response to a touch event applied to the glass top case;
a touch sensing system configured to determine a location of the touch event; and
a force sensing system configured to cause the notebook computer to register an input in response to a force associated with the touch event exceeding a threshold; and
a haptic device configured to produce a haptic output at the glass top case in response to registering the input at the location of the touch event.

16. The notebook computer of claim 15, wherein:
the glass top case defines a keyboard region and a trackpad region; and
the notebook computer is configured to register the input as a key input if the location of the touch event is within the keyboard region.

17. The notebook computer of claim 16, wherein:
the force sensing system is configured to determine if a palm of a user is resting on the trackpad region;
in response to the force sensing system determining that the palm of the user is not resting on the trackpad region, the notebook computer sets the threshold to a first threshold; and
in response to the force sensing system determining that the palm of the user is resting on the trackpad region, the notebook computer sets the threshold to a second threshold different from the first threshold.

18. The notebook computer of claim 16, wherein the notebook computer is configured to register the input as a trackpad input if the location of the touch event is within the trackpad region.

19. The notebook computer of claim 18, wherein the notebook computer is configured to take a first action in response to registering the input as the key input and to take a second action different from the first action in response to registering the input as a trackpad input.

20. The notebook computer of claim 15, wherein the haptic output is localized to the location of the touch event.

* * * * *